US012584068B2

(12) United States Patent
Yu et al.

(10) Patent No.: US 12,584,068 B2
(45) Date of Patent: Mar. 24, 2026

(54) DIPHENYLFLUORENYL COMPOUND, AND ORGANIC ELECTRIC ELEMENT AND ELECTRONIC DEVICE COMPRISING THE COMPOUND

(71) Applicant: DUK SAN NEOLUX CO., LTD., Cheonan-si (KR)

(72) Inventors: Jeong Wan Yu, Cheonan-si (KR); Je Woo Lee, Cheonan-si (KR); Hyun Ji Oh, Cheonan-si (KR)

(73) Assignee: DUK SAN NEOLUX CO., LTD., Cheonan-si (KR)

(*) Notice: Subject to any disclaimer, the term of this patent is extended or adjusted under 35 U.S.C. 154(b) by 0 days.

(21) Appl. No.: 19/036,118

(22) Filed: Jan. 24, 2025

(65) Prior Publication Data

US 2025/0163319 A1 May 22, 2025

Related U.S. Application Data

(63) Continuation of application No. PCT/KR2023/008343, filed on Jun. 16, 2023.

(30) Foreign Application Priority Data

Jul. 25, 2022 (KR) ........................ 10-2022-0091984

(51) Int. Cl.
*C09K 11/06* (2006.01)
*H10K 50/11* (2023.01)
*H10K 85/60* (2023.01)

(52) U.S. Cl.
CPC .............. *C09K 11/06* (2013.01); *H10K 50/11* (2023.02); *H10K 85/657* (2023.02); *C09K 2211/1025* (2013.01)

(58) Field of Classification Search
CPC ............. H01L 51/0054; H01L 51/5036; H01L 51/506; H01L 51/5088; H01L 51/0051; H01L 51/0059; H01L 51/0072; H01L 51/5278; C07C 255/35; C07C 2603/40; C07C 255/34; C07C 255/37; C09K 11/06; C09K 2211/1011; C09K 2211/1025; H10K 50/11; H10K 85/657; H10K 85/6572; H10K 50/13; H10K 85/636; H10K 85/60;

(Continued)

(56) References Cited

U.S. PATENT DOCUMENTS 10,505,121 B2 * 12/2019 Song .................... H10K 85/633
10,777,748 B2 * 9/2020 Song .................... C07D 409/12

(Continued)

FOREIGN PATENT DOCUMENTS

CN 111233674 A 6/2020
CN 112250585 A 1/2021

(Continued)

*Primary Examiner* — Caleb E Henry
(74) *Attorney, Agent, or Firm* — Vorys, Sater, Seymour and Pease LLP; Mih Suhn Koh

(57) ABSTRACT

Provided are a compound represented by Formula 1, an organic electric element including a first electrode, a second electrode, and an organic material layer between the first electrode and the second electrode, and an electronic device thereof, wherein the compound represented by Formula 1 is included in the organic material layer, thereby the driving voltage of the organic electric element can be lowered, and the luminous efficiency and life time can be improved.

17 Claims, 2 Drawing Sheets

(58) Field of Classification Search
CPC ............... H10K 85/615; H10K 85/633; H10K 85/6574; H10K 85/6576; H10K 50/15; H10K 50/16; H10K 50/81; H10K 50/82; H10K 50/85; C07D 311/96; C07D 333/76; C07D 405/04; C07D 307/91; C07D 409/12; C07D 407/04; C07D 407/12; C07D 409/04; Y02E 10/549
See application file for complete search history.

(56) References Cited

U.S. PATENT DOCUMENTS

| | | | | |
|---|---|---|---|---|
| 11,008,280 | B2 * | 5/2021 | Mun | C07D 401/14 |
| 11,121,329 | B2 | 9/2021 | Uno | |
| 2009/0105488 | A1 * | 4/2009 | Cheng | C09K 11/06 548/440 |
| 2014/0191214 | A1 * | 7/2014 | Kim | H10K 85/633 257/40 |
| 2015/0236267 | A1 * | 8/2015 | Hiroaki | H10K 85/636 257/40 |
| 2016/0181542 | A1 * | 6/2016 | Kawamura | C09K 11/025 585/27 |
| 2016/0197277 | A1 * | 7/2016 | Kato | H10K 50/17 548/440 |
| 2016/0268509 | A1 * | 9/2016 | Buesing | H10K 85/622 |
| 2016/0372666 | A1 * | 12/2016 | Ryu | C07D 307/91 |
| 2017/0166581 | A1 * | 6/2017 | Kim | H10K 50/10 |
| 2017/0170402 | A1 * | 6/2017 | Itoi | C09K 11/06 |
| 2017/0213968 | A1 * | 7/2017 | Park | H10K 85/6576 |
| 2017/0271610 | A1 * | 9/2017 | Takahashi | H10K 50/15 |
| 2018/0309057 | A1 * | 10/2018 | Ikeda | H10K 50/12 |
| 2018/0309081 | A1 * | 10/2018 | Ikeda | H10K 85/623 |
| 2019/0010256 | A1 * | 1/2019 | Lee | C08F 10/02 |

FOREIGN PATENT DOCUMENTS

| | | | |
|---|---|---|---|
| CN | 113045434 | A | 6/2021 |
| KR | 10-2019-0060914 | A | 6/2019 |
| KR | 10-2021-0015616 | A | 2/2021 |
| KR | 10-2021-0053209 | A | 5/2021 |
| KR | 10-2374470 | B1 | 3/2022 |
| KR | 10-2024-0001563 | A | 1/2024 |
| WO | 2022/080715 | A1 | 4/2022 |

* cited by examiner

DIPHENYLFLUORENYL COMPOUND, AND ORGANIC ELECTRIC ELEMENT AND ELECTRONIC DEVICE COMPRISING THE COMPOUND

TECHNICAL FIELD

The present invention relates to a compound for an organic electric element, an organic electric element using the same, and an electronic device thereof.

BACKGROUND ART

Generally, organic luminescence refers to the phenomenon of converting electrical energy into light energy using organic materials. An organic electronic element that utilize the organic light-emitting phenomenon typically has a structure that includes an anode, a cathode, and an organic material layer between them. Here, the organic material layer is often composed of a multilayer structure composed of different materials to increase the efficiency and stability of the organic electric element, and may be composed of, for example, a hole injection layer, a hole transport layer, a light-emitting layer, an electron transport layer, and an electron injection layer.

The biggest issues in organic electroluminescent element are life and efficiency, and as the display becomes larger, these efficiency and life problems must be solved.

Efficiency, life span, driving voltage, and the like are correlated with each other. If efficiency is increased, then driving voltage is relatively lowered, and the crystallization of an organic material due to Joule heating generated during operation is reduced as driving voltage is lowered, as a result of which life span shows a tendency to increase.

However, efficiency cannot be maximized only by simply improving the organic material layer. This is because long life span and high efficiency can be simultaneously achieved when energy levels and T1 values among the respective layers included in the organic material layer, inherent material properties (mobility, interfacial properties, etc.) and the like are optimal combination.

Therefore, in order to fully demonstrate the excellent characteristics of organic electric element, it is necessary to develop materials that form the organic material layer of the element, especially a light-emitting auxiliary layer.

DETAILED DESCRIPTION OF THE INVENTION

Technical Challenge

The object of the present invention is to provide a compound capable of lowering the driving voltage of an element and improving the luminous efficiency and life time of an element, an organic electric element using the same, and an electronic device thereof.

Means of Solving Problems

In an aspect of the present invention, the present invention provides compound represented by the following formula.

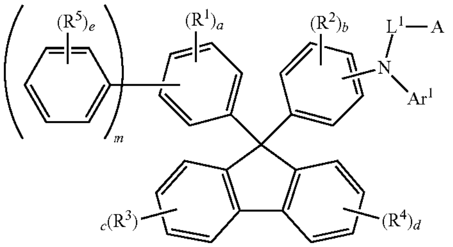

In another aspect of the present invention, the present invention provides an organic electric element comprising compound represented by formula above and an electronic device thereof.

Effect of Invention

By using the compound according to embodiment of the present invention, a driving voltage of an organic electric element can be lowered and the luminous efficiency and lifetime of the element can be improved.

Figure 1:
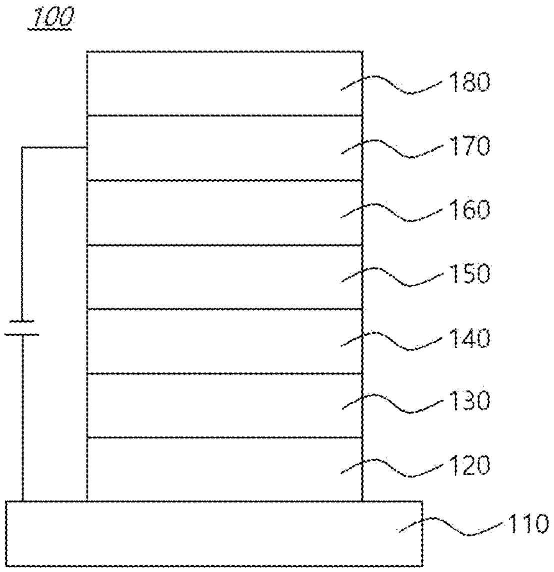
FIGS. 1 to 3 illustrate examples of organic electroluminescent element according to the present invention.

| [Description of Reference Numerals] | |
|---|---|
| 100, 200, 300: organic electric element | 110: first electrode |
| 120: hole injection layer | 130: hole transport layer |
| 140: light-emitting layer | 150: electron transport layer |
| 160: electron injection layer | 170: second electrode |
| 180: layer for improving light efficiency | 210: buffer layer |
| 220: light-emitting auxiliary layer | 320: first hole injection layer |
| 330: first hole transport layer | 340: first light-emitting layer |
| 350: first electron transport layer | 360: first charge generation layer |
| 361: second charge generation layer | 420: second hole injection layer |
| 430: second hole transport layer | 440: second light-emitting layer |
| 450: second electron transport layer | CGL: charge generation layer |
| ST1: first stack | ST2: second stack |

DETAILED DESCRIPTION

Unless otherwise stated, the term "aryl group" or "arylene group" as used herein has, but not limited to, 6 to 60 carbon atoms. The aryl group or arylene group in the present invention may comprise a monocyclic ring, ring assemblies, a fused polycyclic system, spiro compound and the like.

As used herein, the term "fluorenyl group" refers to a substituted or unsubstituted fluorenyl group, and "fluorenylene group" refers to a substituted or unsubstituted fluorenylene group. The fluorenyl group or fluorenylene group used in the present invention comprises a spiro compound formed by combining R and R' with each other in the following structure, and also comprises compound formed by linking adjacent R"s to each other. "Substituted fluorenyl group", "substituted fluorenylene group" means that at least one of R, R', R" in the following structure is a substituent other than hydrogen, and R" may be 1 to 8 in the following formula. In this specification, a fluorenyl group, a fluorenylene group, and the like may be referred to as a fluorene group or fluorene regardless of the valence.

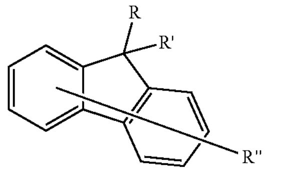

The term "spiro compound" as used herein has a spiro union which means union having one atom as the only common member of two rings. Here, the atom shared between the two rings is called as a 'spiro atom' and the compounds are called as 'monospiro-', 'dispiro-' or 'trispiro-' depending on the number of spiro atoms in one compound.

The term "heterocyclic group" used in the specification comprises a non-aromatic ring as well as an aromatic ring like "heteroaryl group" or "heteroarylene group". Unless otherwise stated, the term "heterocyclic group" means, but not limited to, a ring containing one or more heteroatoms and having 2 to 60 carbon atoms. Unless otherwise stated, the term "heteroatom" as used herein represents, for example, N, O, S, P or Si and may comprise a heteroatom group such as $SO_2$, P═O etc. instead of carbon forming a ring such as the following compound. In the specification, "heterocyclic group" comprises a monocyclic, ring assemblies, fused polycyclic system, a spiro-compound and the like.

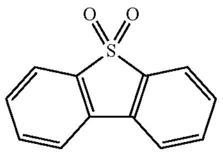 [SMILES: O=S1(=O)c2ccccc2-c2ccccc21]

The term "aliphatic ring group" as used herein refers to a cyclic hydrocarbon except for aromatic hydrocarbons, and comprises a monocyclic ring, ring assemblies, a fused polycyclic system, a spiro-compound and the like, and unless otherwise specified, it means, but not limited thereto, a ring of 3 to 60 carbon atoms. For example, a fused ring of benzene being an aromatic ring and cyclohexane being a non-aromatic ring corresponds to aliphatic ring group.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and as 'phenanthrylene (group)' when it is 'divalent group', and it may also be described as a parent compound name, 'phenanthrene', regardless of its valence. Similarly, in the case of pyrimidine, it may be described as 'pyrimidine' regardless of its valence, and it may also be described as the name of corresponding functional group such as pyrimidinyl (group) when it is 'monovalent group', and as 'pyrimidylene (group)' when it is 'divalent group'.

In addition, in the present specification, the numbers and alphabets indicating a position may be omitted when describing a compound name or a substituent name, For example, pyrido[4,3-d]pyrimidine, benzopuro[2,3-d]pyrimidine and 9,9-dimethyl-9H-fluorene can be described as pyridopyrimidine, benzofurropyrimidine and dimethylfluorene, respectively. Therefore, both benzo[g]quinoxaline and benzo[f]quinoxaline can be described as benzoquinoxaline.

In addition, unless otherwise expressed, where any formula of the present invention is represented by the following formula, the substituent according to the index may be defined as follows.

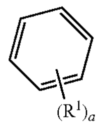

In the above formula, where a is an integer of zero, the substituent $R^1$ is absent, that is, hydrogen atoms are bonded to all the carbon constituting the benzene ring. Here, chemical formulas or compounds may be written without indicating the hydrogen bonded to carbon. In addition, when a is an integer of 1, one substituent $R^1$ is bonded to one of the carbons forming the benzene ring, and when a is an integer of 2 or 3, for example, it can be bonded as follows, it is bonded to the carbon of the benzene ring in a similar manner when a is an integer from 4 to 6, and when a is an integer greater than or equal to 2, $R^1$s may be the same or different.

(a=2)

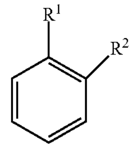

(a=3)

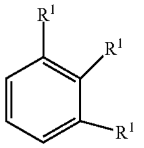

In addition, unless otherwise specified in the specification, the term 'ring' refers to an aryl ring, heteroaryl ring, fluorene ring, aliphatic ring, etc., and a number-membered (atom) ring may refer to the shape of a ring. For example, naphthalene corresponds to a two-fused (condensed) ring, anthracene to a three-fused (condensed) ring, thiophene or furan corresponds to a five-membered ring, and benzene or pyridine corresponds to a six-membered ring.

In addition, unless otherwise specified in the present specification, when adjacent groups are linked to each other to form a ring, the ring may be selected from the group consisting of a $C_6$-$C_{60}$ aromatic ring group, a fluorenyl group, a $C_2$-$C_{60}$ heterocyclic group containing at least one heteroatom selected from the group consisting of O, N, S, Si and P, and a $C_3$-$C_{60}$ aliphatic ring. Here, the aromatic ring group may include an aryl ring, and the heterocyclic group may include a heteroaryl ring.

Unless otherwise stated, the term "between adjacent groups", for example, in case of the following Formulas, comprises not only "between $R_1$ and $R_2$", "between $R_2$ and $R_3$", "between $R_5$ and $R_4$", "between $R_5$ and $R_6$", but also "between $R_7$ and $R_8$" sharing one carbon, and may comprise "between substituents" attached to atom (carbon or nitrogen) consisting different ring, such as "between $R_1$ and $R_7$", "between $R_1$ and $R_8$", or "between $R_4$ and $R_5$" and the like. That is, when the substituents substituted on the elements forming the ring are not directly adjacent to each other, any one substituent may be adjacent groups to the substituent bonded to the next element forming the ring, and substituents bonded to the same ring constituent carbons may also correspond to neighboring groups. In the following Formula, when the substituents bonded to the same carbon, such as $R_7$ and $R_8$, are linked to each other to form a ring, a compound containing a spiro-moiety may be formed.

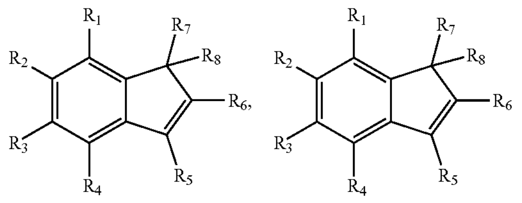

In addition, in the present specification, the expression 'adjacent groups may be linked to each other to form a ring' is used in the same sense as 'adjacent groups are linked selectively to each other to form a ring', and a case where at least one pair of adjacent groups may be bonded to each other to form a ring.

In addition, unless otherwise specified in the present specification, substituents such as an aryl group, an arylene group, a fluorenyl group, a fluorenylene group, a heterocyclic group, an aliphatic ring group, an alkyl group, an alkenyl group, an alkynyl group, an alkoxyl group, an aryloxyl group, alkylthio group, arylthio group, etc., and a ring formed by adjacent groups may be each optionally substituted with one or more substituents selected from the group consisting of deuterium, halogen, a cyano group, a nitro group, siloxane group, a $C_6$-$C_{30}$ aryl group, a fluorenyl group, a $C_2$-$C_{30}$ heterocyclic group containing at least one heteroatom of O, N, S, Si and P, a $C_3$-$C_{30}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, a $C_1$-$C_{20}$ alkylthio group, a $C_6$-$C_{20}$ arylthio group, a silane group unsubstituted or substituted with a $C_1$-$C_{20}$ alkyl group or a $C_6$-$C_{20}$ aryl group, and a phosphine oxide group unsubstituted or substituted with a $C_1$-$C_{20}$ alkyl group or a $C_6$-$C_{20}$ aryl group.

Hereinafter, referring to FIGS. 1 to 3, a lamination structure of an organic electric element including the compound of the present invention will be described.

In designation of reference numerals to components in respective drawings, it should be noted that the same elements will be designated by the same reference numerals although they are shown in different drawings. In addition, in the following description of the present invention, a detailed description of known functions and configurations incorporated herein will be omitted when it may make the subject matter of the present invention rather unclear.

Terms, such as first, second, A, B, (a), (b) or the like may be used herein when describing components of the present invention. Each of these terminologies is not used for defining an essence, order or sequence of a corresponding component but used merely to distinguish the corresponding component from other component(s). It will be understood that the expression 'one component is "connected," "coupled" or "joined" to another component' comprises the case where a third component may be "connected," "coupled" or "joined" between a first component and a second component as well as the case where the first component may be directly connected, coupled or joined to the second component.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

Figure 2:
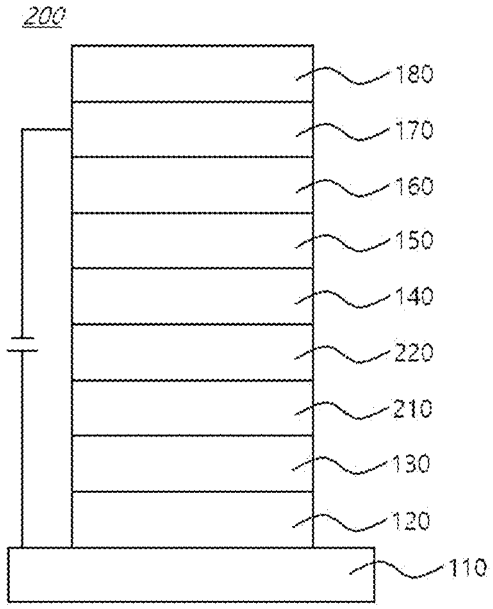
Figure 3:
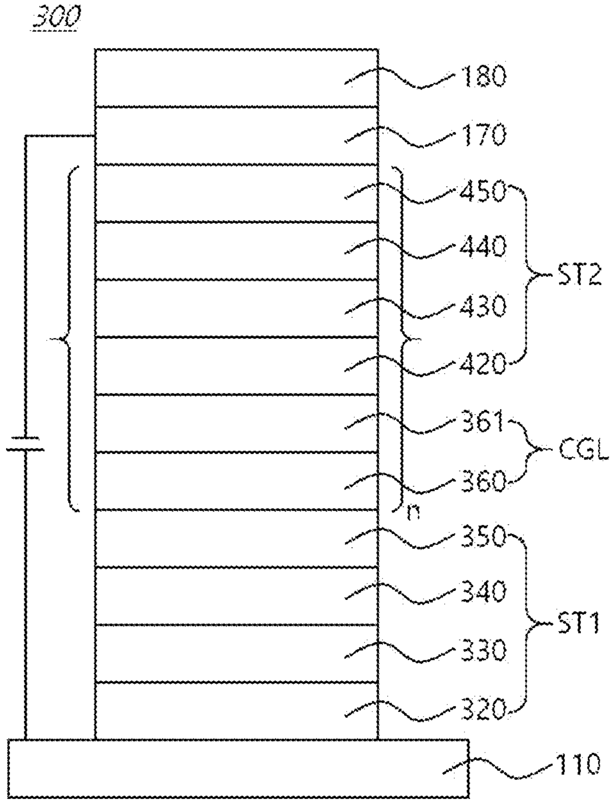

The FIGS. 1 to 3 show an example of an organic electric element according to an embodiment of the present invention, respectively.

Referring to the FIG. 1, an organic electric element 100 according to an embodiment of the present invention includes a first electrode 110 formed, a second electrode 170, and an organic material layer between the first electrode 110 and the second electrode 170 on a substrate (not shown), and an inorganic material layer may be included between the first electrode 110 and the second electrode 120.

For example, the first electrode 110 may be an anode (positive electrode), and the second electrode 170 may be a cathode (negative electrode). In the case of an inverted organic electric element, the first electrode may be a cathode, and the second electrode may be an anode.

The organic material layer refers to a layer containing at least one organic substance. For example, the organic material layer may include a hole injection layer 120, a hole transport layer 130, a light-emitting layer 140, an electron transport layer 150, and an electron injection layer 160. Further, the electron injection layer 160 may be an inorganic material layer that does not contain organic material.

Specifically, a hole injection layer 120, a hole transport layer 130, a light-emitting layer 140, an electron transport layer 150, and an electron injection layer 160 may be formed on the first electrode 110 in sequence.

Preferably, a layer for improving the luminous efficiency 180 may be formed one side of sides of the first electrode 110 and the second electrode 170, wherein the one side is not facing an organic material layer or an inorganic material layer. When a layer for improving the luminous efficiency 180 is formed, the luminous efficiency of an organic electric element can be improved.

For example, the light efficiency improving layer 180 may be formed on the second electrode 170, as a result, in the case of a top emission organic light emitting element, the optical energy loss due to Surface Plasmon Polaritons (SPPs) at the second electrode 170 may be reduced and in the case of a bottom emission organic light emitting element, the light efficiency improving layer 180 may serve as a buffer for the second electrode 170.

A buffer layer 210 or a light-emitting auxiliary layer 220 may be further formed between the hole transport layer 130 and the light-emitting layer 140, which will be described with reference to FIG. 2.

Referring to FIG. 2, the organic electric element 200 according to another embodiment of the present invention may include a hole injection layer 120, a hole transport layer 130, a buffer layer 210, a light-emitting auxiliary layer 220, a light-emitting layer 140, the electron transport layer 150, the electron injection layer 160, and a second electrode 170 formed on a first electrode 110 in sequence, and a layer for improving light efficiency 180 may be formed on the second electrode.

Although not shown in FIG. 2, an electron transport auxiliary layer may be further formed between the light-emitting layer 140 and the electron transport layer 150.

In addition, according to another embodiment of the present invention, the organic material layer may be a form consisting of multiple stacks, wherein the stacks comprise a hole transport layer, a light-emitting layer, and an electron transport layer, respectively. This will be described with reference to FIG. 3.

Referring to FIG. 3, two or more sets of stacks of the organic material layers ST1 and ST2 may be formed between the first electrode 110 and the second electrode 170 in the organic electric element 300 according to another embodiment of the present invention, wherein the organic material layers may be consisted of multiple layers, respectively, and the charge generation layer CGL may be formed between the stacks of the organic material layer.

Specifically, the organic electric element according to the embodiment of the present invention may comprise a first electrode 110, a first stack ST1, a charge generation layer CGL, a second stack ST2, and a second electrode 170 and a layer for improving light efficiency 180.

The first stack ST1 is an organic material layer formed on the first electrode 110, and the first stack ST1 may comprise the first hole injection layer 320, the first hole transport layer 330, the first light-emitting layer 340 and the first electron transport layer 350 and the second stack ST2 may comprise a second hole injection layer 420, a second hole transport layer 430, a second light-emitting layer 440 and a second electron transport layer 450. As such, the first stack and the second stack may be the organic material layers having the same or different stacked structures.

The charge generation layer CGL may be formed between the first stack ST1 and the second stack ST2. The charge generation layer CGL may comprise a first charge generation layer 360 and a second charge generation layer 361. The charge generating layer CGL is formed between the first light-emitting layer 340 and the second light-emitting layer 440 to increase the current efficiency generated in each light-emitting layer and to smoothly distribute charges.

The first light-emitting layer 340 may comprise a light emitting material comprising a blue host doped with a blue fluorescent dopant and the second light-emitting layer 440 may comprise a light emitting material comprising a green host doped with a greenish yellow dopant and a red dopant together, but the material of the first light-emitting layer 340 and the second light-emitting layer 440 according to an embodiment of the present invention is not limited thereto.

In FIG. 3, n may be an integer of 1 to 5 and the charge generation layer CGL and the third stack may be further stacked on the second stack ST2 when n is 2.

When a plurality of light-emitting layers are formed in a multi-layer stack structure as shown in FIG. 3, it is possible to manufacture an organic electroluminescent element that emits not only white light but also various colors, wherein the white light is emitted by the mixing effect of light emitted from each light-emitting layer.

Compound(s) represented by Formula 1 of the present invention may be included in an organic material layer. For example, the compounds represented by Formulas 1 of the present invention can be used as a material for a hole injection layer 120, 320, 420, a hole transport layer 130, 330, 430, a buffer layer 210, a light-emitting auxiliary layer 220, and an electron transport layer 150, 350, 450, an electron injection layer 160, a light-emitting layer 140, 340, 440, or a layer for improving light efficiency 180, preferably, a light-emitting auxiliary layer 220 or/and a layer for improving light efficiency 180, more preferably, a light-emitting auxiliary layer 220.

Even if the cores of compounds are identical or similar to each other, the band gap, the electrical characteristics, the interface characteristics and the like may be different depending on which substituent is bonded at which position. Therefore, it is necessary to study the selection of the core and the combination with sub-substituent bonded to the core. In particular, long life span and high efficiency can be simultaneously achieved when the optimal combination of energy levels and $T_1$ values, inherent material properties (mobility, interfacial properties, etc.), and the like among the respective layers of an organic material layer is achieved.

Therefore, the energy level and $T_1$ value between the respective layers of the organic material layer, inherent material properties (mobility, interfacial properties, etc.) and the like can be optimized by using the compound represented by Formula 1 as a material for a light-emitting auxiliary layer 220.

The organic electric element according to an embodiment of the present invention may be manufactured using various deposition methods. The organic electric element according to an embodiment of the present invention may be manufactured using a PVD (physical vapor deposition) method or CVD (chemical vapor deposition) method. For example, the organic electric element may be manufactured by depositing a metal, a conductive metal oxide, or a mixture thereof on the substrate to form the anode 110, forming the organic material layer comprising the hole injection layer 120, the hole transport layer 130, the light-emitting layer 140, the electron transport layer 150, and the electron injection layer 160 thereon, and then depositing a material, which can be used as the cathode 170, thereon. In addition, a light-emitting auxiliary layer 220 may be formed between a hole transport layer 130 and a light-emitting layer 140, and an electron transport auxiliary layer (not shown) may be further formed between a light-emitting layer 140 and an electron transport layer 150 and, as described above, a stack structure may be formed.

In addition, the organic material layer may be manufactured in such a manner that the fewer layers are formed using various polymer materials by a soluble process or solvent process, for example, spin coating, nozzle printing, inkjet printing, slot coating, dip coating, roll-to-roll, doctor blading, screen printing, or thermal transfer, instead of deposition. Since the organic material layer according to the present invention may be formed in various ways, the scope of protection of the present invention is not limited by a method of forming the organic material layer.

The organic electric element according to an embodiment of the present invention may be of a top emission type, a bottom emission type, or a dual emission type depending on the material used.

In addition, the organic electric element according to an embodiment of the present invention may be selected from the group consisting of an organic electroluminescent element, an organic solar cell, an organic photo conductor, an organic transistor, an element for monochromatic illumination and an element for a quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a navigation unit, a game player, various kinds of TVs, and various kinds of computers.

Hereinafter, compound according to one aspect of the present invention will be described.

Compound according to an aspect of the present invention is represented by Formula 1 below.

<Formula 1>

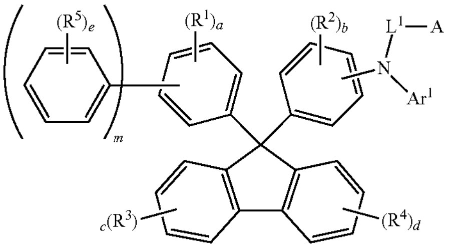

In Formula 1, each of symbols may be defined as follows.

A is the following Formula A-1 or Formula A-2.

<Formula A-1>

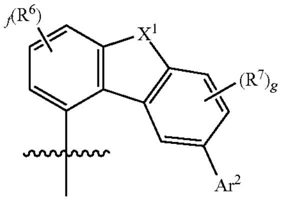

<Formula A-2>

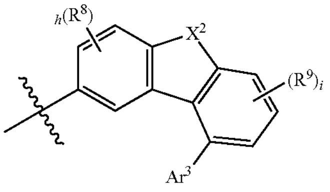

$R^1$ to $R^9$ are each independently selected from the group consisting of hydrogen, deuterium, halogen, a cyano group, a nitro group, a $C_6$-$C_{60}$ aryl group, a fluorenyl group, a $C_2$-$C_{60}$ heterocyclic group containing at least one heteroatom of O, N, S, Si and P, a $C_3$-$C_{60}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{60}$ aryloxy group and -L'-N($R_a$)($R_b$), and adjacent groups may be bonded to each other to form a ring.

a is an integer of 0 to 5, b to d are each an integer of 0 to 4, e is an integer of 0 to 5, m is an integer of 0 to 2, f to i are each an integer of 0 to 3, and when each of these is an integer of 2 or more, a plurality of $R^1$ each, $R^2$ each, $R^3$ each, $R^4$ each, $R^5$ each, $R^6$ each, $R^7$ each, $R^8$ each, and $R^9$ each are equal to or different from each other.

A ring formed by at least one pair of adjacent groups, such as adjacent $R^1$s, adjacent $R^2$s, adjacent $R^3$s, adjacent $R^4$s, adjacent $R^5$s, adjacent $R^6$s, adjacent $R^7$s, adjacent $R^8$s, and adjacent $R^9$s, may be selected from the group consisting of a $C_6$-$C_{60}$ aromatic ring group, a fluorenylene group, a $C_3$-$C_{60}$ heterocyclic group containing at least one heteroatom of O, N, S, Si and P, and a $C_6$-$C_{60}$ aliphatic ring.

When an aromatic ring is formed by adjacent groups, the aromatic ring may be, for example, a $C_6$-$C_{20}$, a $C_6$-$C_{18}$, a $C_6$-$C_{16}$, a $C_6$-$C_{14}$, a $C_6$-$C_{13}$, a $C_6$-$C_{12}$, a $C_6$-$C_{10}$, a $C_6$, a $C_{10}$, a $C_{12}$, a $C_{14}$, a $C_{15}$, a $C_{16}$, or a $C_{18}$ aromatic ring, specifically, an aryl ring such as benzene, naphthalene, anthracene, phenanthrene, pyrene, etc.

$X^1$ and $X^2$ are independently O or S.

$L^1$ and L' are each independently selected from the group consisting of a single bond, $C_6$-$C_{60}$ arylene group, a fluorenylene group, a $C_3$-$C_{60}$ aliphatic ring group, and a $C_2$-$C_{60}$ heterocyclic group containing at least one heteroatom of O, N, S, Si and P.

$Ar^1$, $Ar^2$, $Ar^3$, $R_a$ and $R_b$ are each independently selected from the group consisting of a $C_6$-$C_{60}$ aryl group, a fluorenyl group, a $C_3$-$C_{60}$ aliphatic ring group, and a $C_2$-$C_{60}$ heterocyclic group containing at least one heteroatom of O, N, S, Si and P. Both $Ar^2$ and $Ar^3$ may be a $C_6$-$C_{60}$ aryl group.

When at least one of $R^1$ to $R^9$, $Ar^1$, $Ar^2$, $Ar^3$, $R_a$ and $R_b$ is an aryl group, the aryl group may be, for example, a $C_6$-$C_{30}$, a $C_6$-$C_{29}$, a $C_6$-$C_{28}$, a $C_6$-$C_{27}$, a $C_6$-$C_{26}$, a $C_6$-$C_{25}$, a $C_6$-$C_{24}$, a $C_6$-$C_{23}$, a $C_6$-$C_{22}$, a $C_6$-$C_{21}$, a $C_6$-$C_{20}$, a $C_6$-$C_{19}$, a $C_6$-$C_{18}$, a $C_6$-$C_{17}$, a $C_6$-$C_{16}$, a $C_6$-$C_{15}$, a $C_6$-$C_{14}$, a $C_6$-$C_{13}$, a $C_6$-$C_{12}$, a $C_6$-$C_{11}$, a $C_6$-$C_{10}$, a $C_6$, a $C_{10}$, a $C_{12}$, a $C_{13}$, a $C_{14}$, a $C_{15}$, a $C_{16}$, a $C_{17}$, or a $C_{18}$ aryl group, specifically, phenyl, biphenyl, naphthyl, terphenyl, phenanthrene, triphenylene, or the like.

When at least one of $L^1$ and L' is an arylene group, the arylene group may be, for example, a $C_6$-$C_{30}$, a $C_6$-$C_{29}$, a $C_6$-$C_{28}$, a $C_6$-$C_{27}$, a $C_6$-$C_{26}$, a $C_6$-$C_{25}$, a $C_6$-$C_{24}$, a $C_6$-$C_{23}$, a $C_6$-$C_{22}$, a $C_6$-$C_{21}$, a $C_6$-$C_{20}$, a $C_6$-$C_{19}$, a $C_6$-$C_{18}$, a $C_6$-$C_{17}$, a $C_6$-$C_{16}$, a $C_6$-$C_{15}$, a $C_6$-$C_{14}$, a $C_6$-$C_{13}$, a $C_6$-$C_{12}$, a $C_6$-$C_{11}$, a $C_6$-$C_{10}$, a $C_6$, a $C_{10}$, a $C_{12}$, a $C_{13}$, a $C_{14}$, a $C_{15}$, a $C_{16}$, a $C_{17}$, a $C_{18}$ arylene group, specifically, phenylene, biphenyl, naphthylene, terphenyl, phenanthrene, triphenylene, or the like. Preferably, $L^3$ may be phenyl, biphenyl or terphenyl.

When at least one of $R^1$ to $R^9$, $Ar^1$, $Ar^2$, $Ar^3$, $R_a$, $R_b$, $L^1$ and L' is a heterocyclic group, the heterocyclic group may be, for example, a $C_2$-$C_{30}$, a $C_2$-$C_{29}$, a $C_2$-$C_{28}$, a $C_2$-$C_{27}$, a $C_2$-$C_{26}$, a $C_2$-$C_{25}$, a $C_2$-$C_{24}$, a $C_2$-$C_{23}$, a $C_2$-$C_{22}$, a $C_2$-$C_{21}$, a $C_2$-$C_{20}$, a $C_2$-$C_{19}$, a $C_2$-$C_{18}$, a $C_2$-$C_{17}$, a $C_2$-$C_{16}$, a $C_2$-$C_{15}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$, a $C_{19}$, a $C_{20}$, a $C_{21}$, a $C_{22}$, a $C_{23}$, a $C_{24}$, a $C_{25}$, a $C_{26}$, a $C_{27}$, a $C_{28}$, or a $C_{29}$ heterocyclic group, specifically, pyridine, pyrimidine, pyrazine, pyridazine, triazine, furan, pyrrole, silole, indene, indole, phenyl-indole, benzoindole, phenyl-benzoindole, pyrazinoindol, quinoline, isoquinoline, benzoquinoline, pyridoquinoline, quinazoline, benzoquinazoline, dibenzoquinazoline, phenanthroquinazoline, quinoxaline, benzoquinoxaline, dibenzoquinoxaline, benzofuran, naphthobenzofuran, dibenzofuran, dinaphthofuran, thiophene, benzothiophene, dibenzothiophene, naphthobenzothiophene, dinaphthothiophene, carbazole, phenyl-carbazole, benzocarbazole, phenyl-benzocarbazole, naphthyl-benzocarbazole, dibenzocarbazole, indolocarbazole, benzofuropyridine, benzothienopyridine, benzofuropyridine, benzothienopyrimidine, benzofuropyrimidine, benzothienopyrazine, benzofuropyrazine, benzoimidazole, benzothiazole, benzooxazole, benzosiloe, phenanthroline, dihydro-phenylphenazine, 10-phenyl-10H-phenoxazine, phenoxazine, phenothiazine, dibenzodioxin, benzodibenzodioxin, thianthrene, 9,9-dimethyl-9H-xanthene, 9,9-dimethyl-9H-thioxanthene, dihydrodimethylphenylacridine, spiro[fluorene-9,9'-xanthene] and the like.

When at least one of $R^1$ to $R^9$, $Ar^1$, $Ar^2$, $Ar^3$, $R_a$ and $R_b$ is a fluorenyl group or at least one of $L^1$ and L' are a fluorenylene group, the fluorenyl group or the fluorenylene group may be, for example, 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl) 9-phenyl-9H-fluorene, and the like.

When at least one of $R^1$ to $R^9$, $Ar^1$, $Ar^2$, $Ar^3$, $R_a$ and $R_b$ is an aliphatic ring group, the aliphatic ring group, may be, for example, a $C_3$-$C_{20}$, a $C_3$-$C_{19}$, a $C_3$-$C_{18}$, a $C_3$-$C_{17}$, a $C_3$-$C_{16}$, a $C_3$-$C_{15}$, a $C_3$-$C_{14}$, a $C_3$-$C_{13}$, a $C_3$-$C_{12}$, a $C_3$-$C_{11}$, a $C_3$-$C_{10}$, a $C_3$-$C_8$, a $C_3$-$C_6$, a $C_6$, a $C_{10}$, a $C_{11}$, a $C_{12}$, a $C_{13}$, a $C_{14}$, a $C_{15}$, a $C_{16}$, a $C_{17}$ or a $C_{18}$ aliphatic ring group.

When at least one of $R^1$ to $R^9$ is an alkyl group, the alkyl group may be, for example, a $C_1$-$C_{20}$, a $C_1$-$C_{10}$, a $C_1$-$C_4$, a $C_1$, a $C_2$, a $C_3$ and a $C_4$ alkyl group, for example, methyl, ethyl, t-butyl, etc.

The aryl group, the arylene group, the fluorenyl group, the fluorenylene group, the heterocyclic group, the aliphatic ring group, the alkyl group, the alkenyl group, the alkynyl group, the alkoxyl group, the aryloxyl group, and the ring formed by adjacent groups may be each optionally substituted with one or more substituents selected from the group consisting of deuterium, halogen, a cyano group, a nitro group, siloxane group, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, a $C_1$-$C_{20}$ alkylthio group, and a $C_6$-$C_{30}$ arylthio group.

When at least one of the aryl group, the arylene group, the fluorenyl group, the fluorenylene group, the heterocyclic group, the aliphatic ring group, the alkyl group, the alkenyl group, the alkynyl group, the alkoxyl group, the aryloxyl group, the ring formed by adjacent groups is substituted with an aryl group, the aryl group may be, for example, a $C_6$-$C_{30}$, a $C_6$-$C_{29}$, a $C_6$-$C_{28}$, a $C_6$-$C_{27}$, a $C_6$-$C_{26}$, a $C_6$-$C_{25}$, a $C_6$-$C_{24}$, a $C_6$-$C_{23}$, a $C_6$-$C_{22}$, a $C_6$-$C_{21}$, a $C_6$-$C_{20}$, a $C_6$-$C_{19}$, a $C_6$-$C_{18}$, a $C_6$-$C_{17}$, a $C_6$-$C_{16}$, a $C_6$-$C_{15}$, a $C_6$-$C_{14}$, a $C_6$-$C_{13}$, a $C_6$-$C_{12}$, a $C_6$-$C_{11}$, a $C_6$-$C_{10}$, a $C_6$, a $C_{10}$, a $C_{12}$, a $C_{13}$, a $C_{14}$, a $C_{15}$, a $C_{16}$, a $C_{17}$, a $C_{18}$, a $C_{19}$, a $C_{20}$, a $C_{21}$, a $C_{22}$, a $C_{23}$, a $C_{24}$, a $C_{25}$, a $C_{26}$, a $C_{27}$, a $C_{28}$, a $C_{29}$, or a $C_{30}$ aryl group.

When at least one of the aryl group, the arylene group, the fluorenyl group, the fluorenylene group, the heterocyclic group, the aliphatic ring group, the alkyl group, the alkenyl group, the alkynyl group, the alkoxyl group, the aryloxyl group, the ring formed by adjacent groups is substituted with a heterocyclic group, the heterocyclic group may be, for example, a $C_2$-$C_{30}$, a $C_2$-$C_{29}$, a $C_2$-$C_{28}$, a $C_2$-$C_{27}$, a $C_2$-$C_{26}$, a $C_2$-$C_{25}$, a $C_2$-$C_{24}$, a $C_2$-$C_{23}$, a $C_2$-$C_{22}$, a $C_2$-$C_{21}$, a $C_2$-$C_{20}$, a $C_2$-$C_{19}$, a $C_2$-$C_{18}$, a $C_2$-$C_{17}$, a $C_2$-$C_{16}$, a $C_2$-$C_{15}$, a $C_2$-$C_{14}$, a $C_2$-$C_{13}$, a $C_2$-$C_{12}$, a $C_2$-$C_{11}$, a $C_2$-$C_{10}$, a $C_2$-$C_9$, a $C_2$-$C_8$, a $C_2$-$C_7$, a $C_2$-$C_6$, a $C_2$-$C_5$, a $C_2$-$C_4$, a $C_2$-$C_3$, a $C_2$, a $C_3$, a $C_4$, a $C_5$, a $C_6$, a $C_7$, a $C_8$, a $C_9$, a $C_{10}$, a $C_{11}$, a $C_{12}$, a $C_{13}$, a $C_{14}$, a $C_{15}$, a $C_{16}$, a $C_{17}$, a $C_{18}$, a $C_{19}$, a $C_{20}$, a $C_{21}$, a $C_{22}$, a $C_{23}$, a $C_{24}$, a $C_{25}$, a $C_{26}$, a $C_{27}$, a $C_{28}$, a $C_{29}$, or a $C_{30}$ heterocyclic group.

When at least one of the aryl group, the arylene group, the fluorenyl group, the fluorenylene group, the heterocyclic group, the aliphatic ring group, the alkyl group, the alkenyl group, the alkynyl group, the alkoxyl group, the aryloxyl group, the ring formed by adjacent groups is substituted with a fluorenyl group, the fluorenyl group may be 9,9-dimethyl-9H-fluorene, 9,9-diphenyl-9H-fluorene, 9,9'-spirobifluorene, spiro[benzo[b]fluorene-11,9'-fluorene], benzo[b]fluorene, 11,11-diphenyl-11H-benzo[b]fluorene, 9-(naphthalen-2-yl) 9-phenyl-9H-fluorene, and the like.

When at least one of the aryl group, the arylene group, the fluorenyl group, the fluorenylene group, the heterocyclic group, the aliphatic ring group, the alkyl group, the alkenyl group, the alkynyl group, the alkoxyl group, the aryloxyl group, the ring formed by adjacent groups is substituted with an aliphatic ring group, the aliphatic ring group may be, for example, a $C_3$-$C_{20}$, a $C_3$-$C_{19}$, a $C_3$-$C_{18}$, a $C_3$-$C_{17}$, a $C_3$-$C_{16}$, a $C_3$-$C_{15}$, a $C_3$-$C_{14}$, a $C_3$-$C_{13}$, a $C_5$-$C_{12}$, a $C_5$-$C_{11}$, a $C_3$-$C_{10}$, a $C_3$-$C_8$, a $C_3$-$C_6$, a $C_6$, a $C_{10}$, a $C_{11}$, a $C_{12}$, a $C_{13}$, a $C_{14}$, a $C_{15}$, a $C_{16}$, a $C_{17}$ or a $C_{18}$ aliphatic ring group.

When at least one of the aryl group, the arylene group, the fluorenyl group, the fluorenylene group, the heterocyclic group, the aliphatic ring group, the alkyl group, the alkenyl group, the alkynyl group, the alkoxyl group, the aryloxyl group, the ring formed by adjacent groups is substituted with an alkyl group, the alkyl group may be, for example, a $C_1$-$C_{20}$, a $C_1$-$C_{10}$, a $C_1$-$C_4$, a $C_1$, a $C_2$, a $C_3$, or a $C_4$ alkyl group.

Formula 1 may be represented by one of Formula 2-1 to Formula 2-6.

<Formula 2-1>

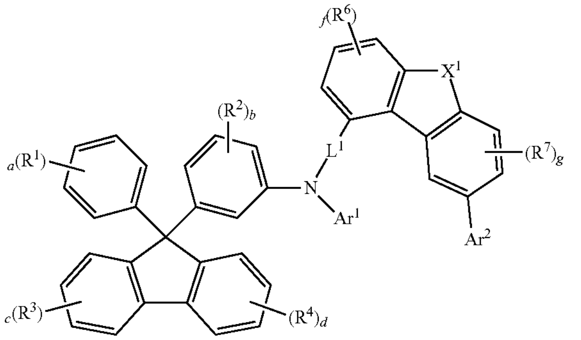

<Formula 2-2>

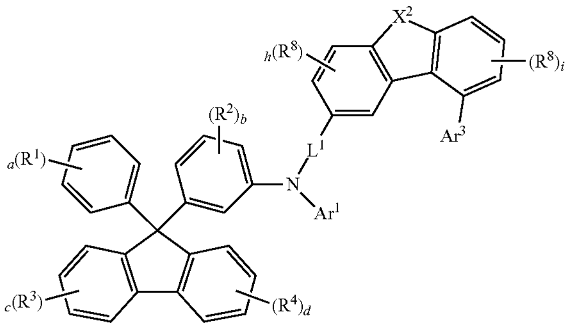

<Formula 2-3>

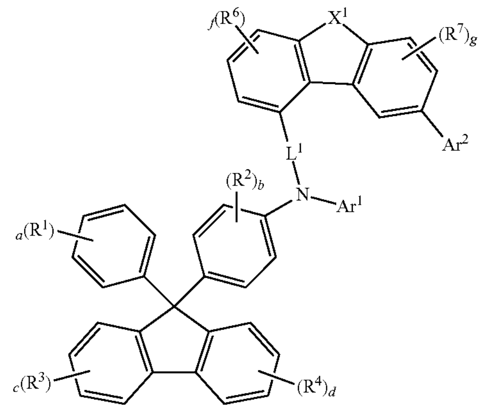

-continued
<Formula 2-4>
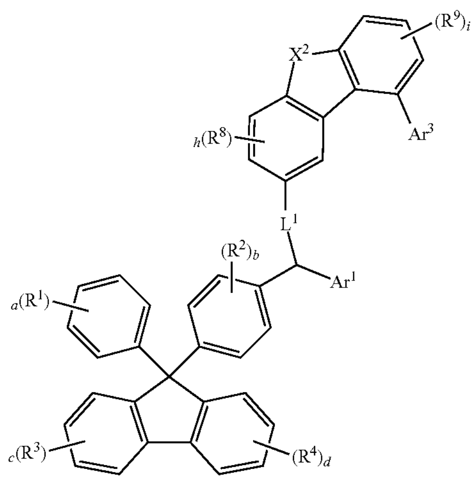
<Formula 2-5>
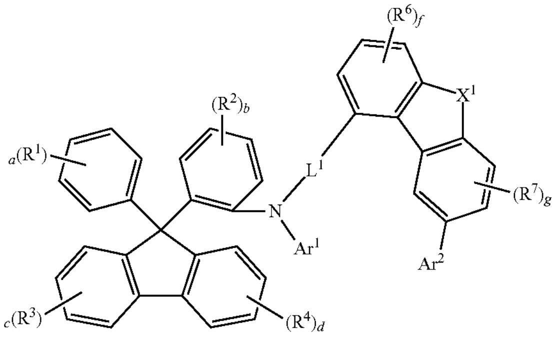
<Formula 2-6>
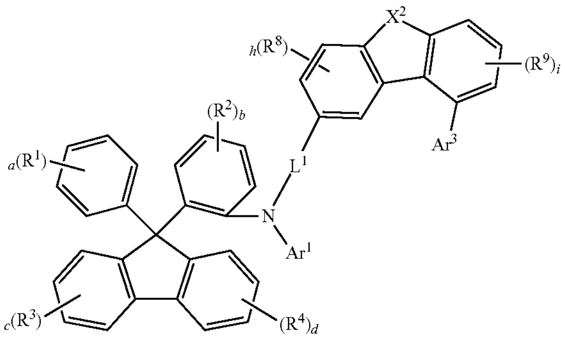
In Formula 2-1 to Formula 2-6, $R^1$ to $R^4$, $R^6$ to $R^9$, $X^1$, $X^2$, $L^1$, $Ar^1$ to $Ar^3$, a to d, f to i are the same as defined for Formula 1.
In addition, Formula 1 may be represented by one of Formula 3-1 to Formula 3-8.
<Formula 3-1>
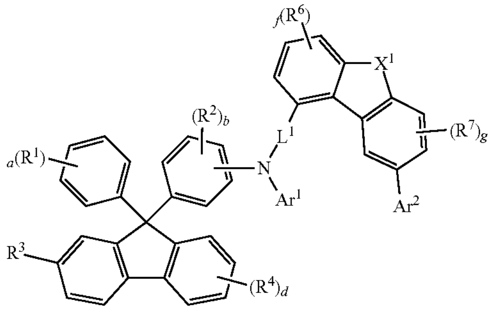
<Formula 3-2>
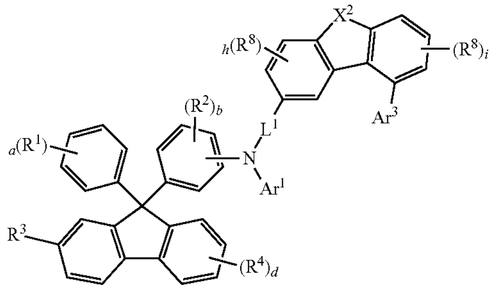
<Formula 3-3>
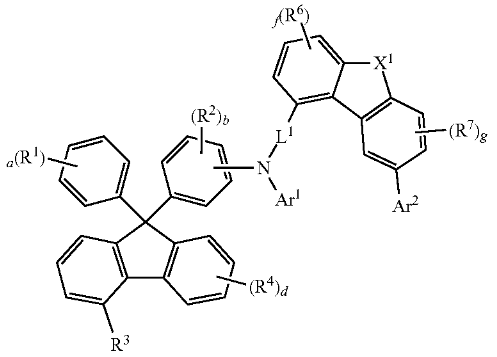
<Formula 3-4>
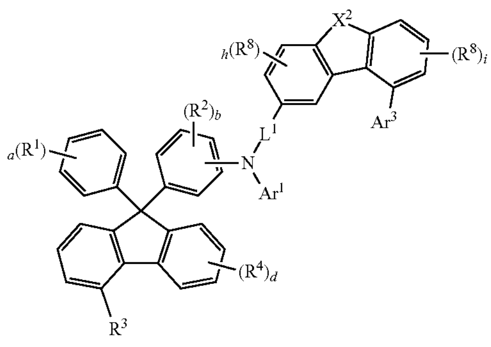

-continued

<Formula 3-5>

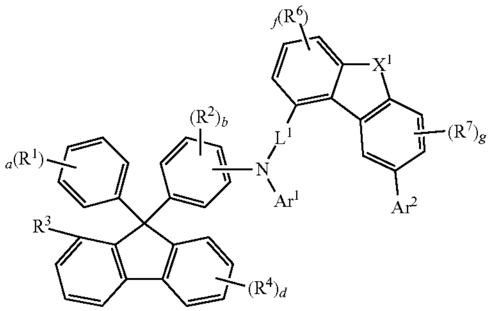

<Formula 3-6>

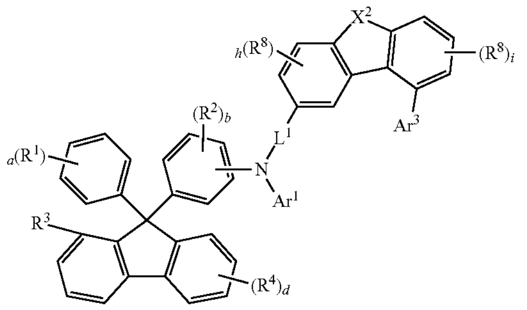

<Formula 3-7>

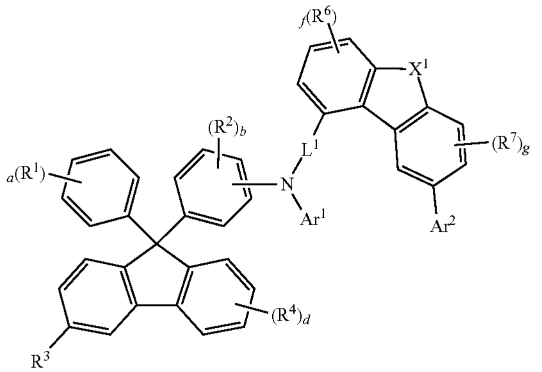

<Formula 3-8>

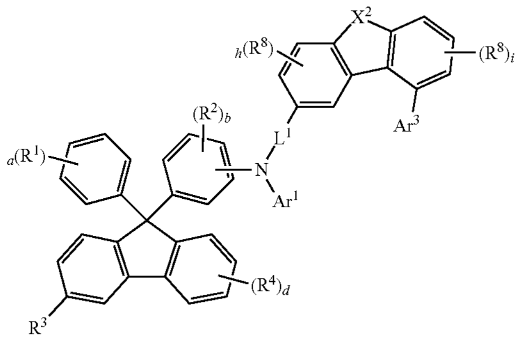

In Formula 3-1 to Formula 3-8, $R^1$, $R^2$, $R^4$, $R^6$ to $R^9$, $X^1$, $X^2$, $L^1$, $Ar^1$ to $Ar^3$, a, b, d, f to i are the same as defined for Formula 1.

$R^3$ is selected from the group consisting of deuterium, halogen, a cyano group, a nitro group, a $C_6$-$C_{60}$ aryl group, a fluorenyl group, a $C_2$-$C_{60}$ heterocyclic group containing at least one heteroatom of O, N, S, Si and P, a $C_3$-$C_{60}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, and -L'-N($R_a$) ($R_b$).

In addition, Formula 1 may be represented by one of Formula 4-1 to Formula 4-8.

<Formula 4-1>

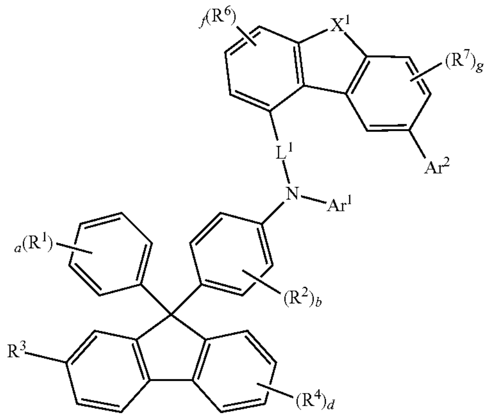

<Formula 4-2>

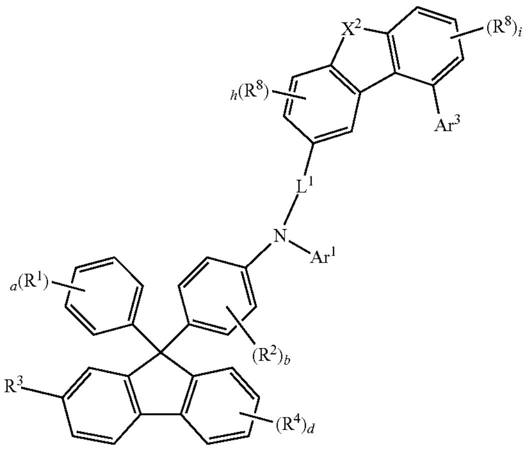

<Formula 4-3>

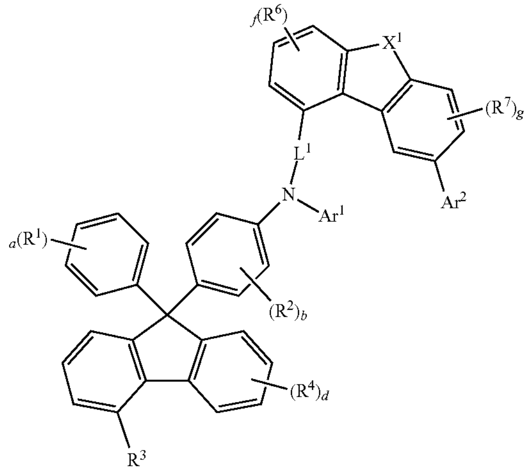

-continued

<Formula 4-4>

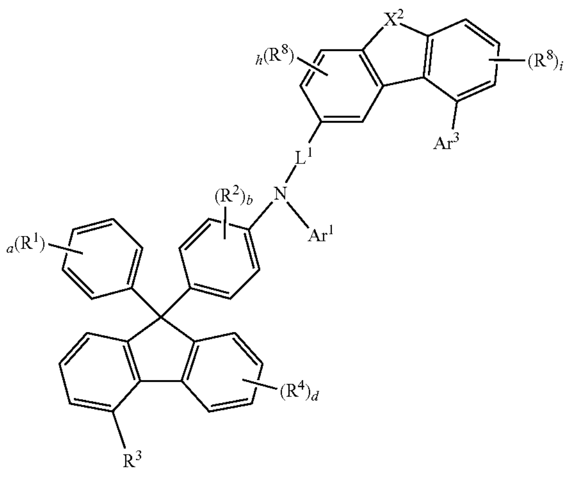

<Formula 4-5>

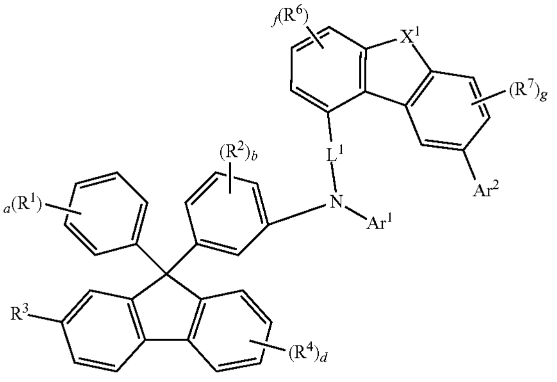

<Formula 4-5>

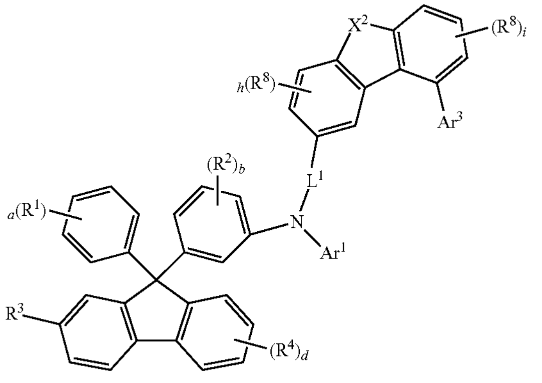

-continued

<Formula 4-7>

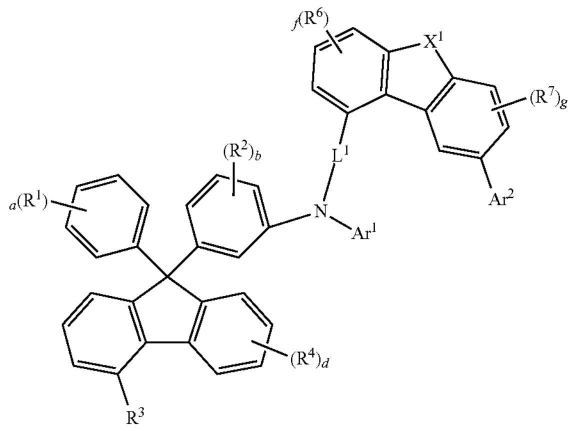

<Formula 4-8>

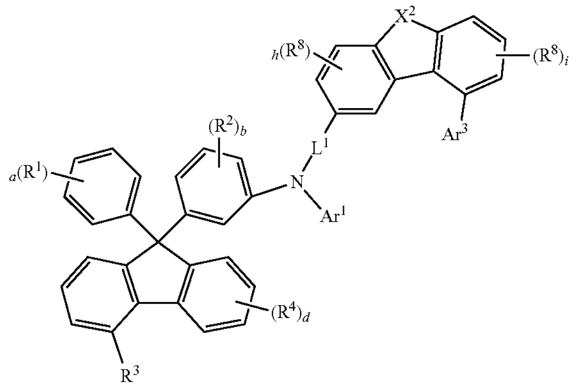

In Formula 4-1 to Formula 4-8, $R^1$, $R^2$, $R^4$, $R^6$ to $R^9$, $X^1$, $X^2$, $L^1$, $Ar^1$ to $Ar^3$, a, b, d, f to i are the same as defined for Formula 1.

$R^3$ is selected from the group consisting of deuterium, halogen, a cyano group, a nitro group, a $C_6$-$C_{60}$ aryl group, a fluorenyl group, a $C_2$-$C_{60}$ heterocyclic group containing at least one heteroatom of O, N, S, Si and P, a $C_3$-$C_{60}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, and -L'-N($R_a$) ($R_b$).

In addition, Formula 1 may be represented by Formula 5-1 or Formula 5-2.

<Formula 5-1>

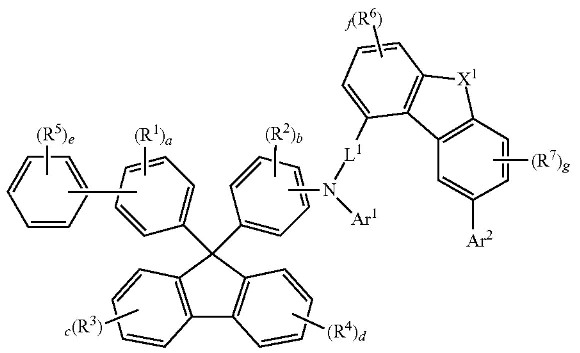

-continued

<Formula 5-2>

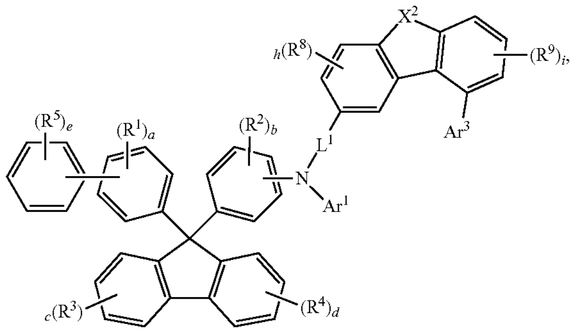

In Formula 5-1 and Formula 5-2, $R^1$ to $R^9$, $X^1$, $X^2$, $L^1$, $Ar^1$ to $Ar^3$, a to i are the same as defined for Formula 1.

In addition, Formula 1 may be represented by one of Formula 6-1 to Formula 6-6.

<Formula 6-1>

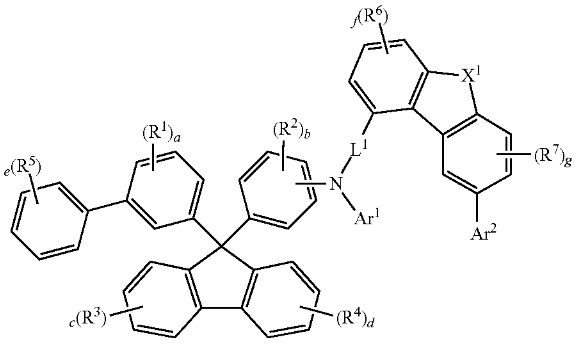

<Formula 6-2>

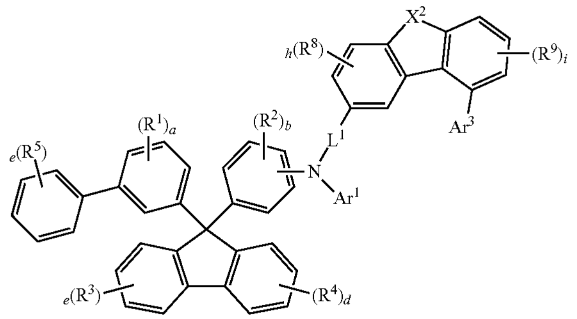

<Formula 6-3>

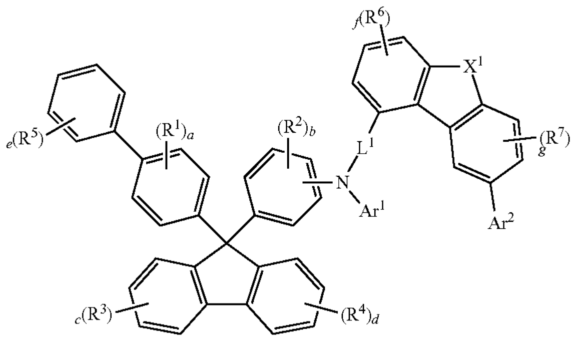

-continued

<Formula 6-4>

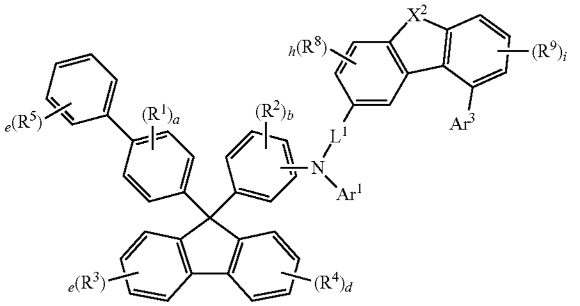

<Formula 6-5>

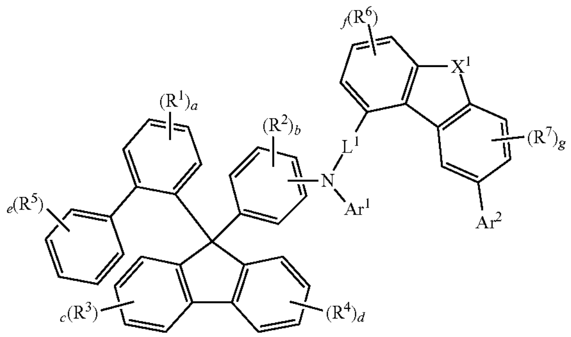

<Formula 6-6>

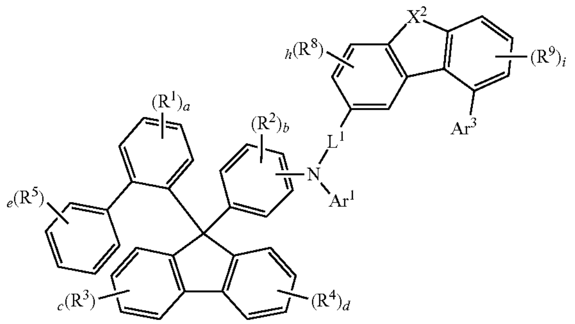

In Formula 6-1 to Formula 6-8, $R^1$ to $R^9$, $X^1$, $X^2$, $L^1$, $Ar^1$ to $Ar^3$, a to i are the same as defined for Formula 1.

In addition, Formula 1 may be represented by one of Formula 7-1 to Formula 7-6.

<Formula 7-1>

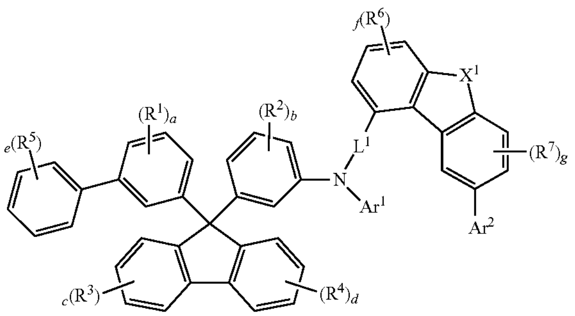

-continued
<Formula 7-2>
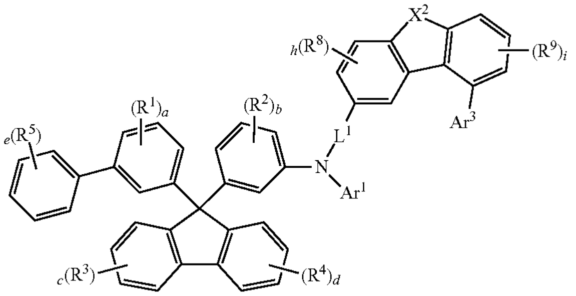
<Formula 7-3>
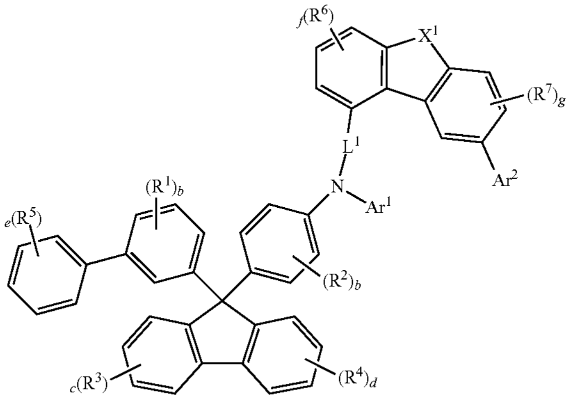
<Formula 7-4>
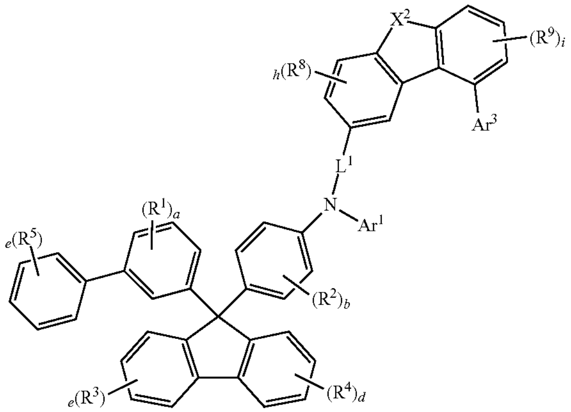
<Formula 7-5>
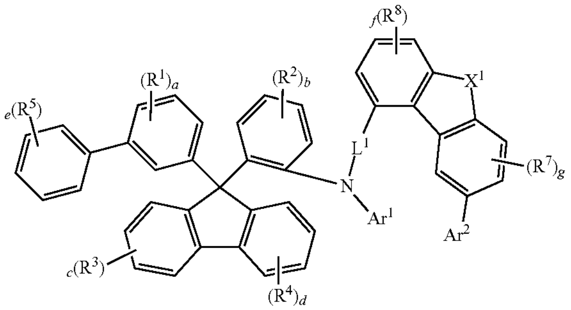
-continued
<Formula 7-6>
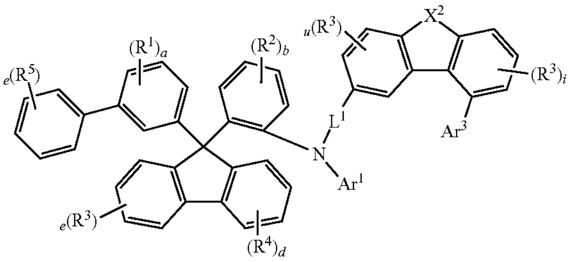
In Formula 7-1 to Formula 7-6, $R^1$ to $R^9$, $X^1$, $X^2$, $L^1$, $Ar^1$ to $Ar^3$, a to i are the same as defined for Formula 1.
The above Formulae, at least one of $Ar^1$ to $Ar^3$ may be selected from the group consisting of Formula Ar-1 to Ar-6.
<Formula Ar-1>
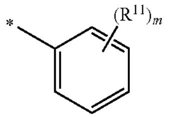
<Formula Ar-2>
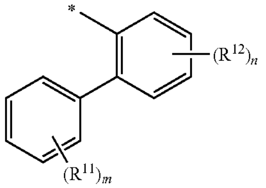
<Formula Ar-3>
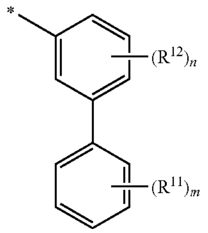
<Formula Ar-4>
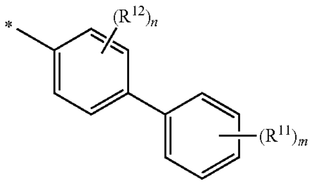
<Formula Ar-5>
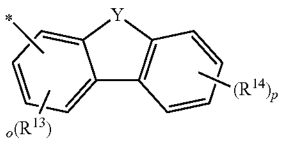
<Formula Ar-6>
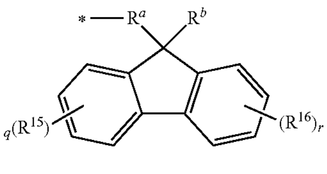

In Formula Ar-1 to Formula Ar-6, each of symbols may be defined as follows.

$R^{11}$ to $R^{16}$ are each independently selected from the group consisting of deuterium, halogen, a cyano group, a nitro group, siloxane group, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, a $C_1$-$C_{20}$ alkylthio group, and a $C_6$-$C_{20}$ arylthio group, and adjacent groups may be bonded to each other to form a ring, m is an integer of 0 to 5, n, p, q and r are each an integer of 0 to 4, o is an integer of 0 to 3, and when each of these is an integer of 2 or more, each of $R^{13}$s, each of $R^{14}$s, each of $R^{15}$s, each of $R^{16}$s are the same as or different from each other, A ring formed by adjacent groups may be selected from the group consisting of a $C_6$-$C_{60}$ aromatic ring group, a fluorenyl group, a $C_3$-$C_{60}$ heterocyclic group containing at least one heteroatom of O, N, S, Si and P, and a $C_6$-$C_{60}$ aliphatic ring.

When an aromatic ring is formed by adjacent groups, the aromatic ring may be, for example, a $C_6$-$C_{20}$, a $C_6$-$C_{18}$, a $C_6$-$C_{16}$, a $C_6$-$C_{14}$, a $C_6$-$C_{13}$, a $C_6$-$C_{12}$, a $C_6$-$C_{10}$, a $C_6$, a $C_{10}$, a $C_{12}$, a $C_{14}$, a $C_{15}$, a $C_{16}$, or a $C_{18}$ aromatic ring, specifically, an aryl ring such as benzene, naphthalene, anthracene, phenanthrene, pyrene, etc.

Y is S, O, C ($R_1$) ($R_2$) or N ($R_3$).

$R^a$ is selected from the group consisting of a single bond, a $C_1$-$C_{20}$ alkylene group, a $C_6$-$C_{30}$ arylene group, a fluorenylene group, a $C_2$-$C_{30}$ heterocyclic group comprising at least one heteroatom selected from the group consisting of O, N, S, Si and P, and a $C_3$-$C_{30}$ aliphatic ring group.

$R_1$ to $R_3$, $R^b$ are each independently selected from the group consisting of deuterium, halogen, a cyano group, a nitro group, siloxane group, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, a $C_1$-$C_{20}$ alkylthio group, and a $C_6$-$C_{20}$ arylthio group, and $R_1$ and $R_2$ may be bonded to each other to form a ring. When $R_1$ and $R_2$ are bonded to each other to form a ring, a spiro compound, for example, spirobifluorene, may be formed.

Specifically, the compound represented by Formula 1 may be one of the following compounds, but there is no limitation thereto.

P1-1

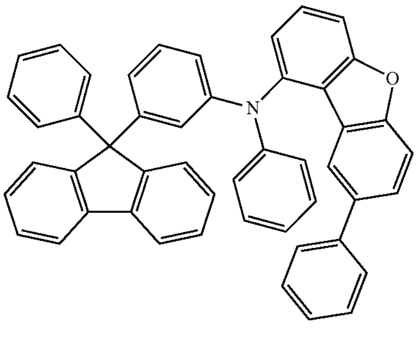

-continued

P1-2

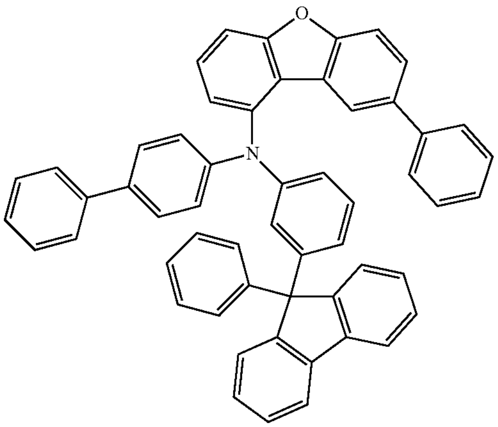

P1-3

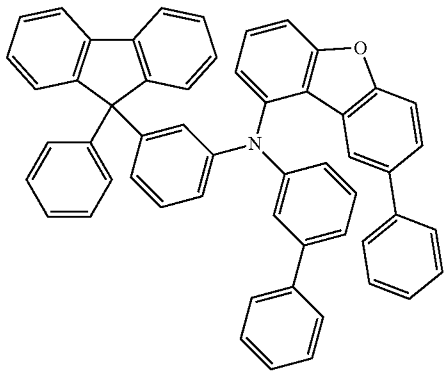

P1-4

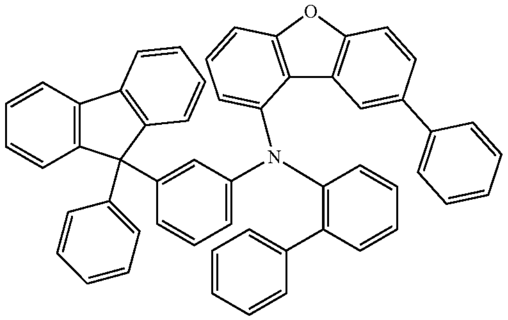

P1-5

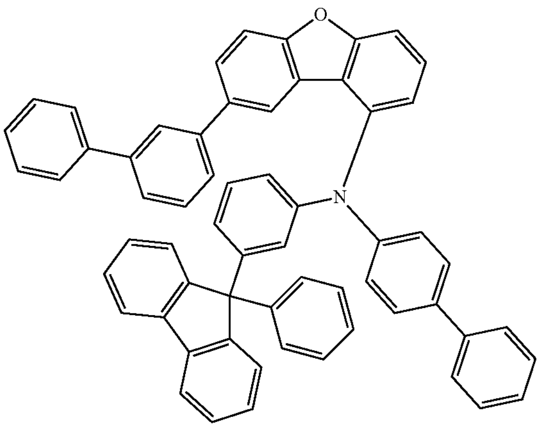

-continued
P1-6
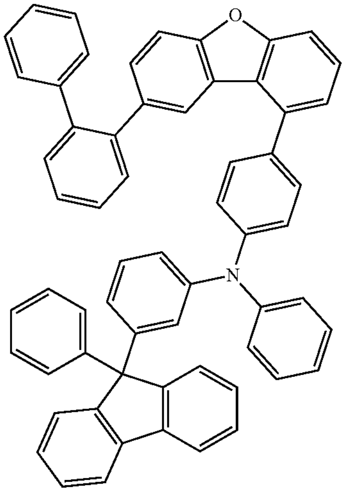
P1-7
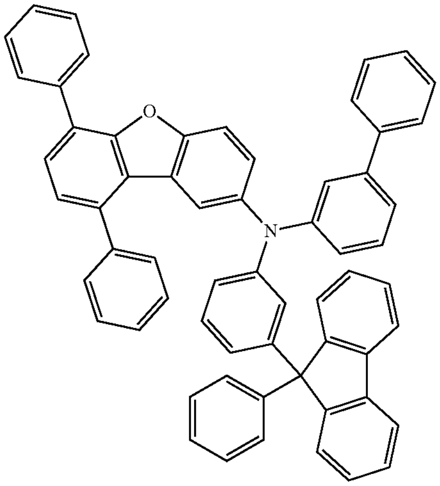
P1-8
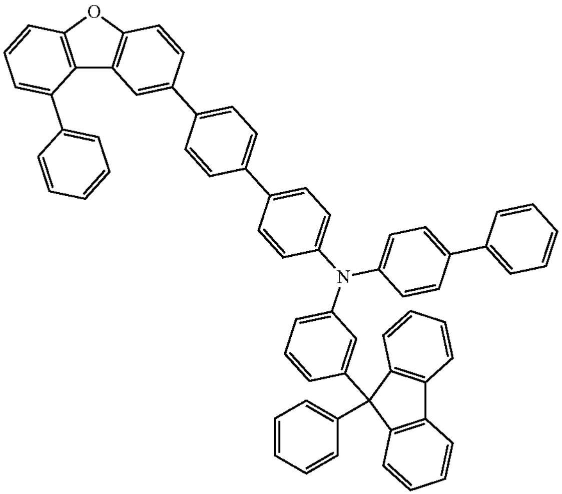
-continued
P1-9
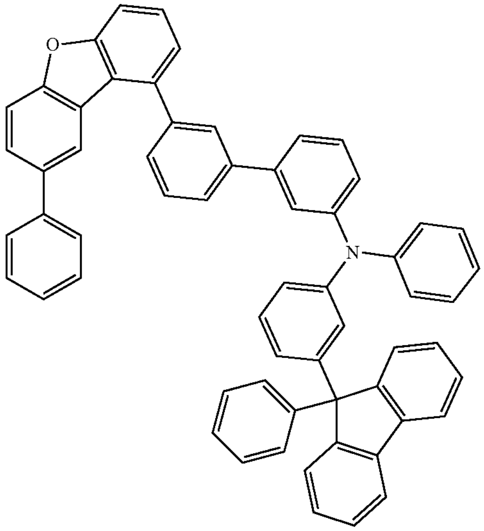
P1-10
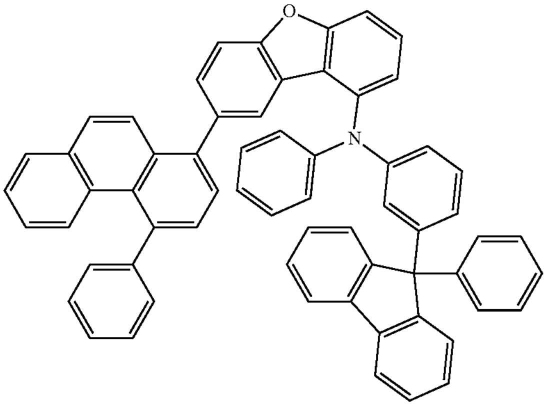
P1-11
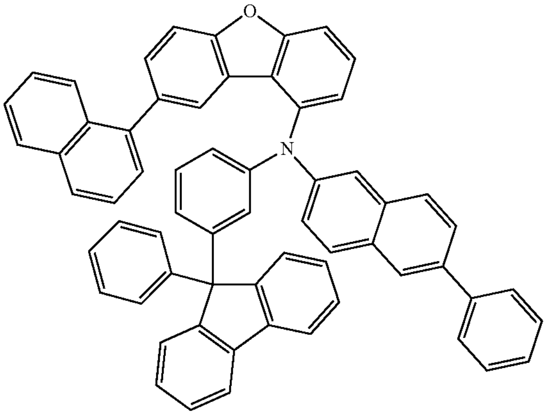

-continued
P1-12
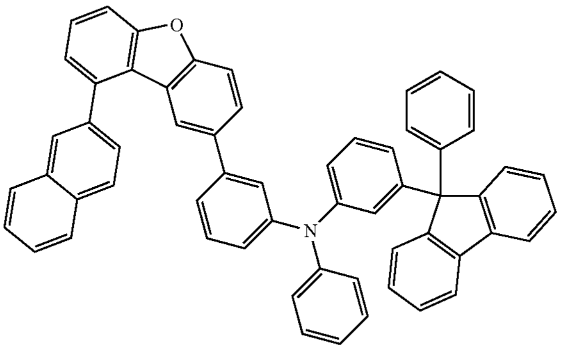
P1-13
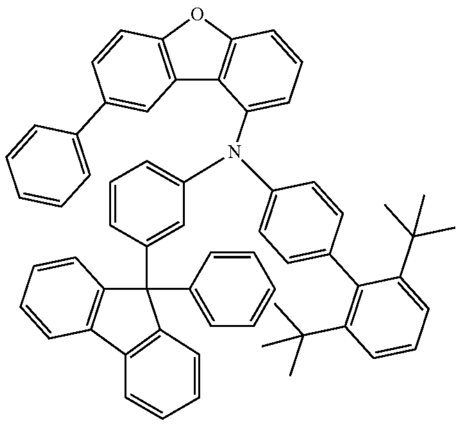
P1-14
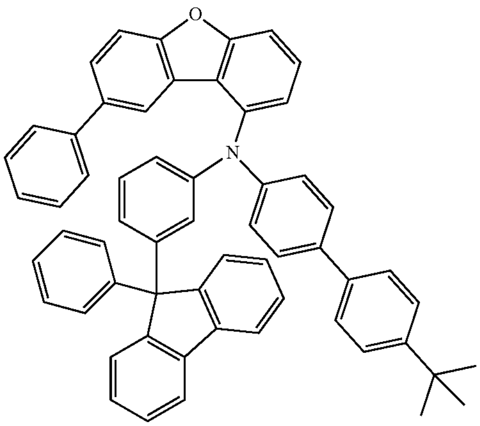
-continued
P1-15
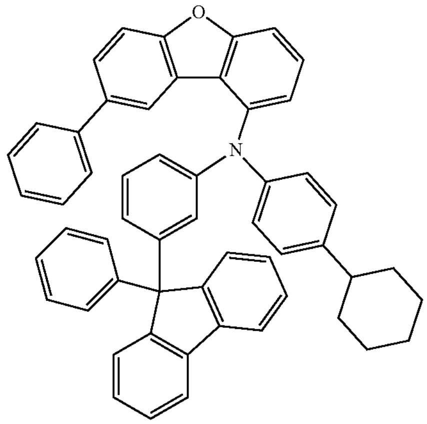
P1-16
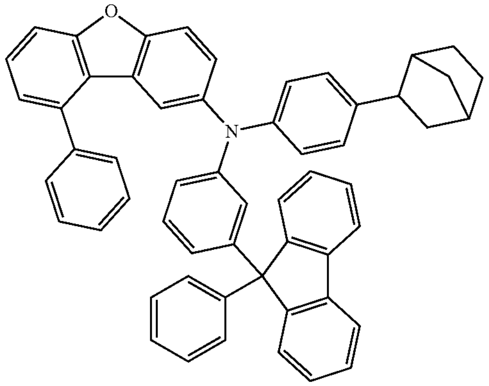
P1-17
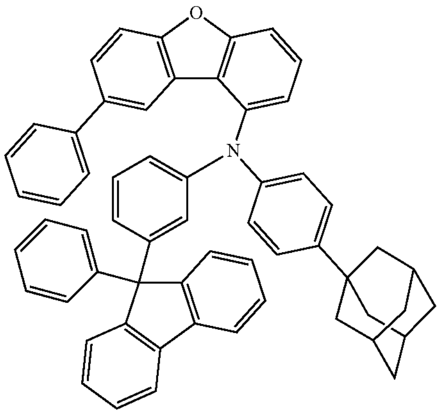

-continued
P1-18
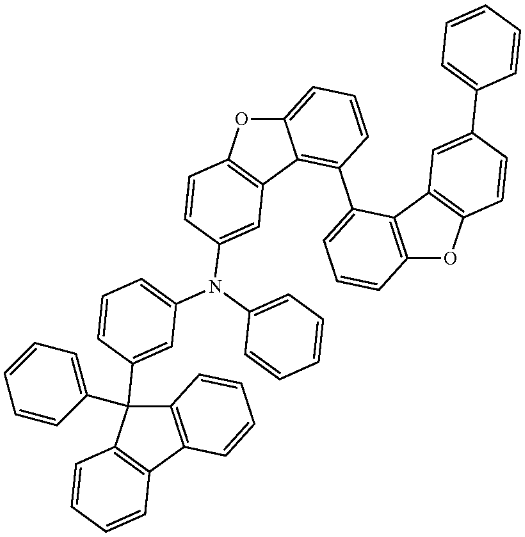
P1-19
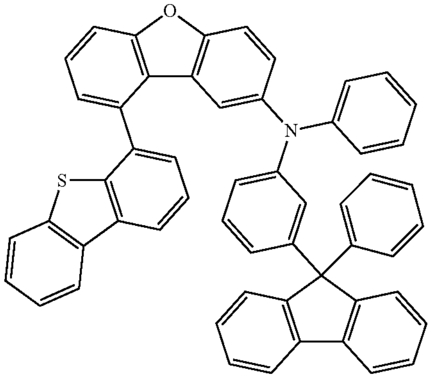
P1-20
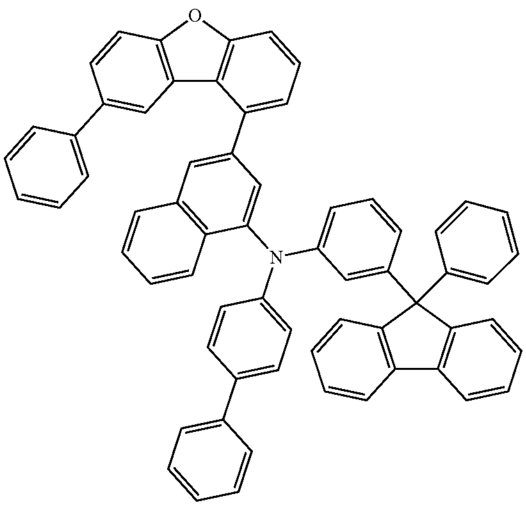
-continued
P1-21
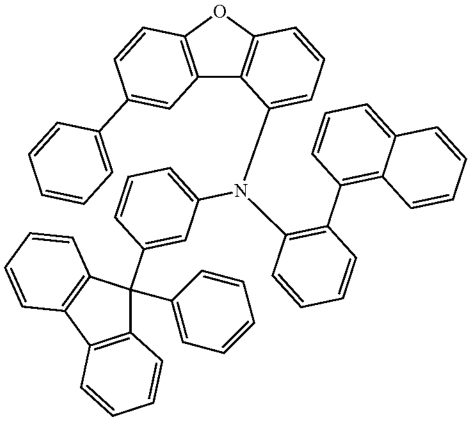
P1-22
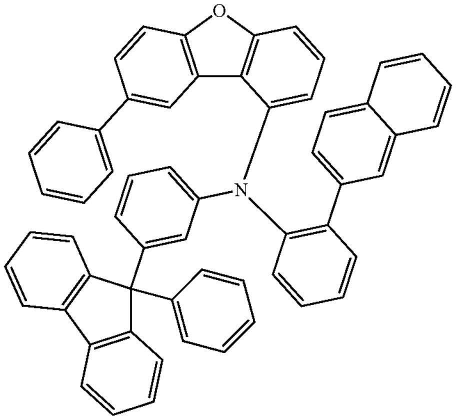
P1-23
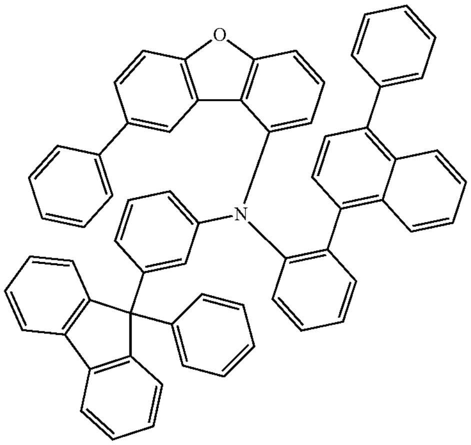

-continued
P1-24
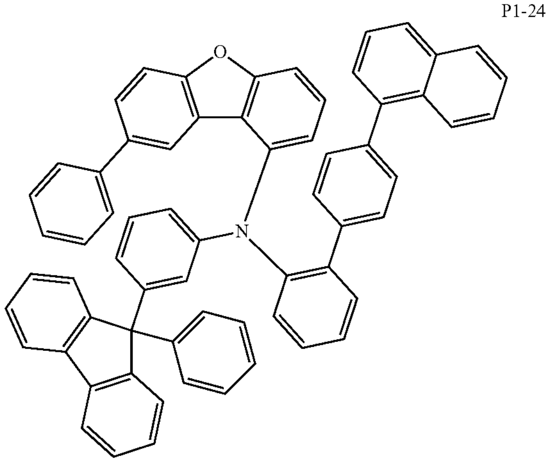
P1-25
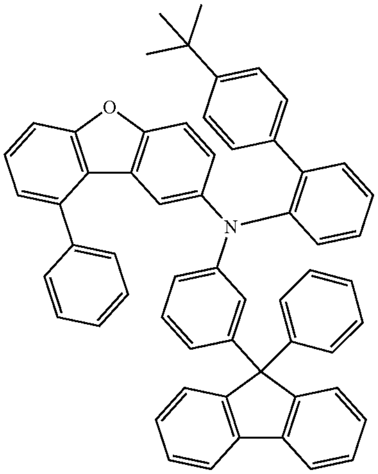
P1-26
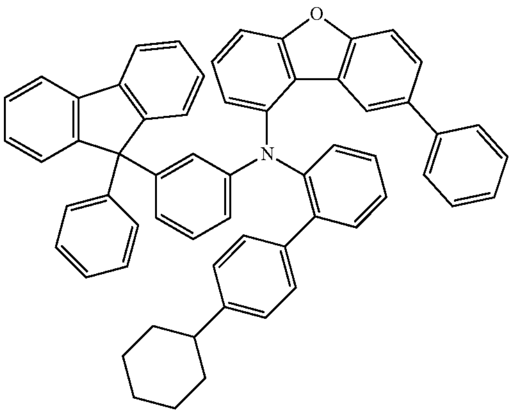
-continued
P1-27
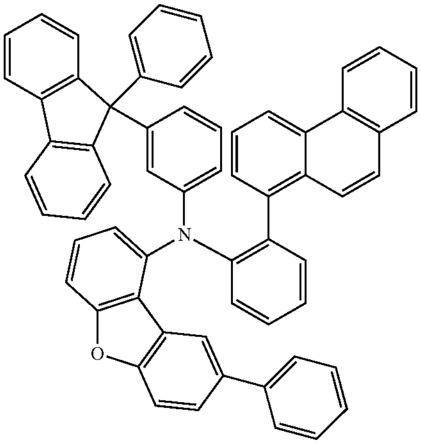
P1-28
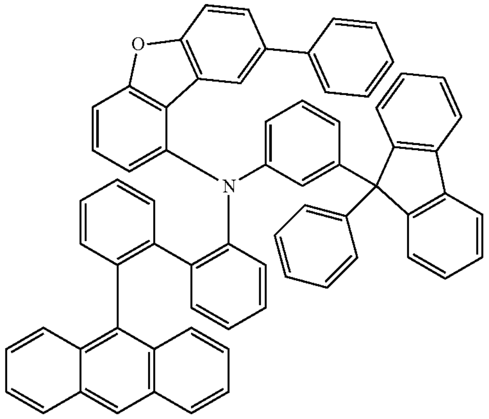
P1-29
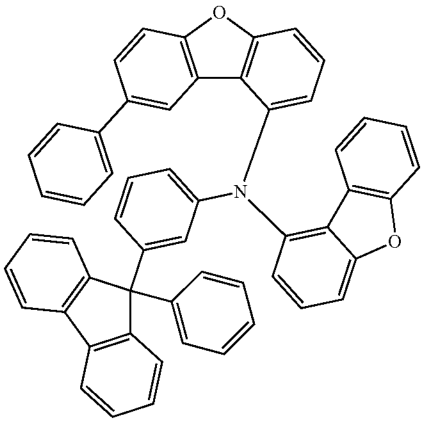

-continued
P1-30
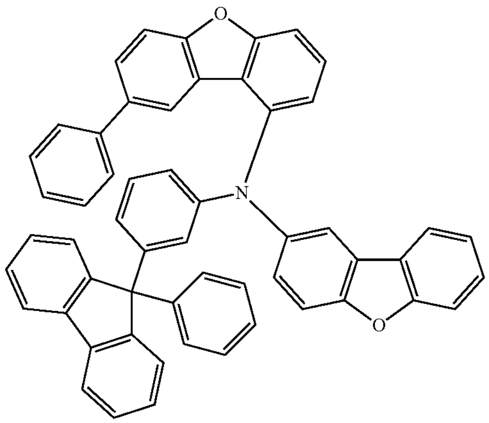
P1-31
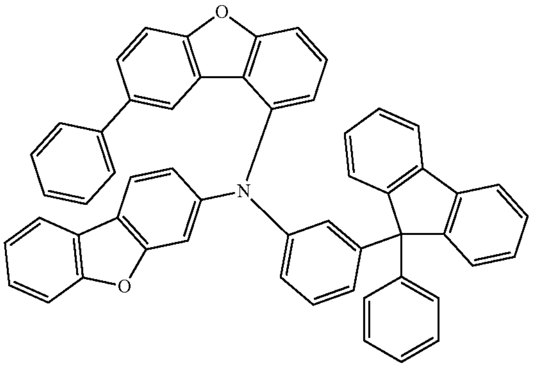
P1-32
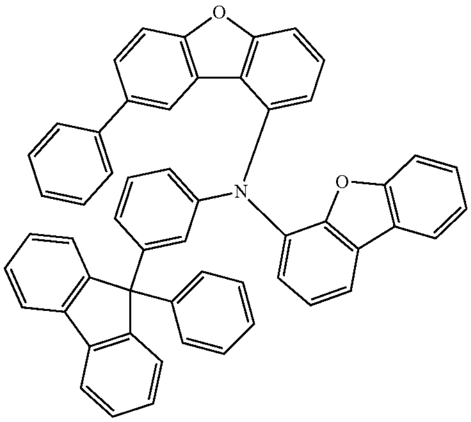
-continued
P1-33
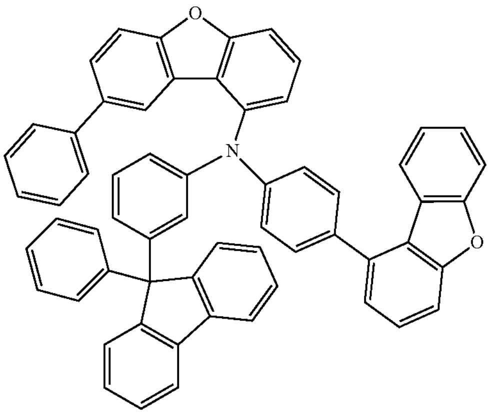
P1-34
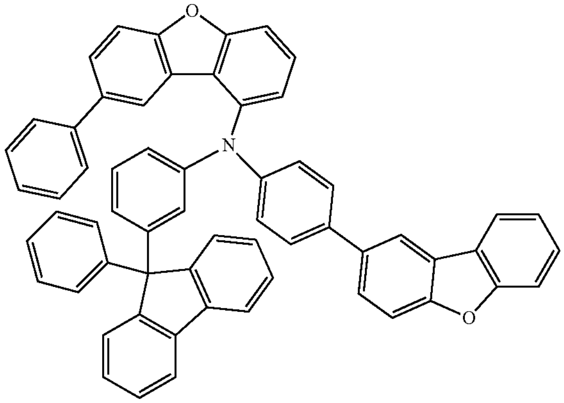
P1-35
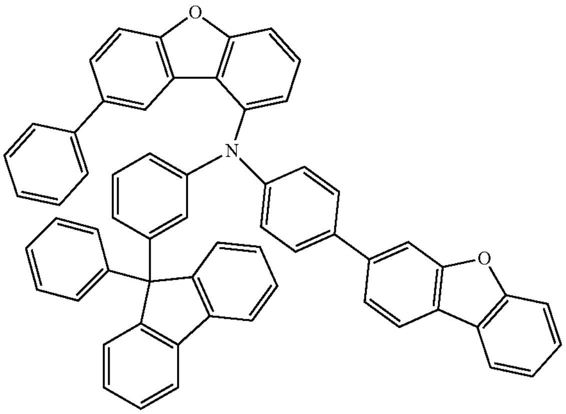

-continued
P1-36
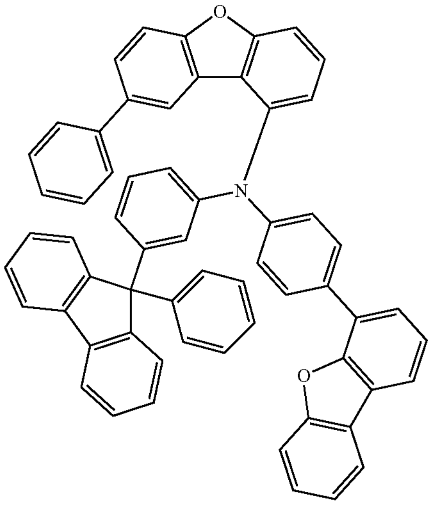
P1-37
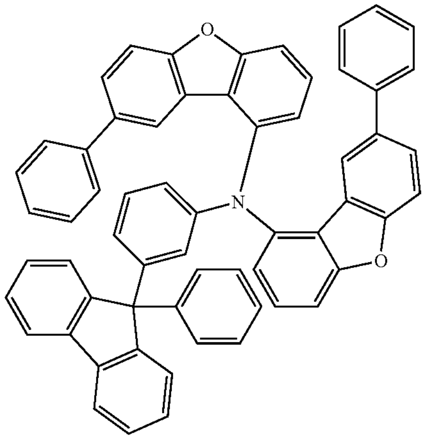
P1-38
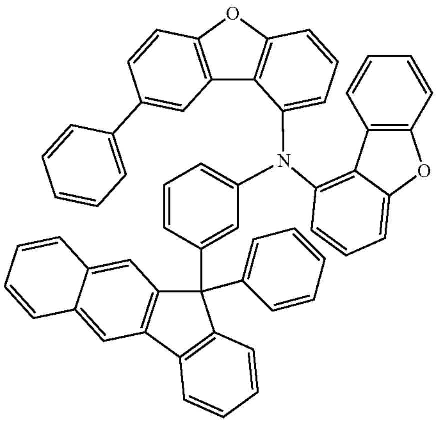
-continued
P1-39
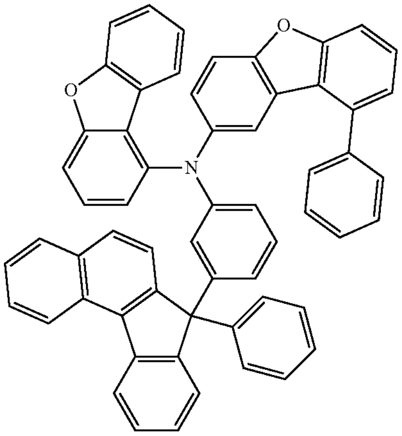
P1-40
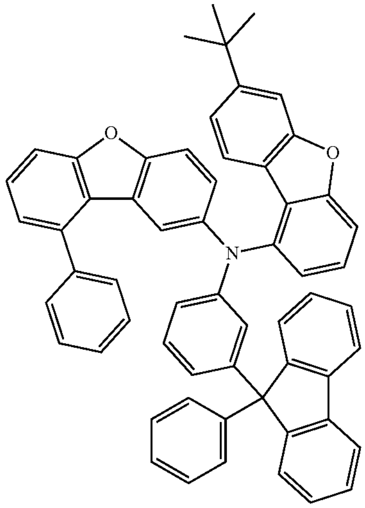
P1-41
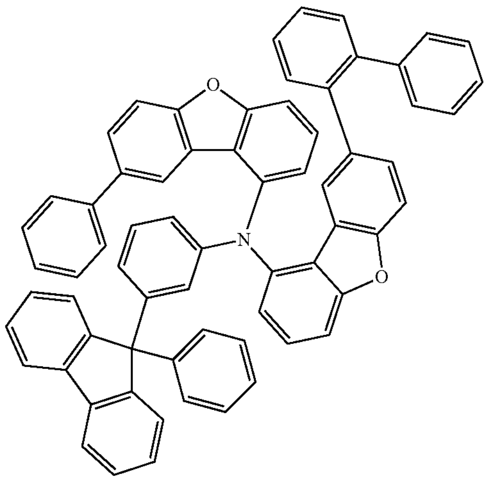

P1-42
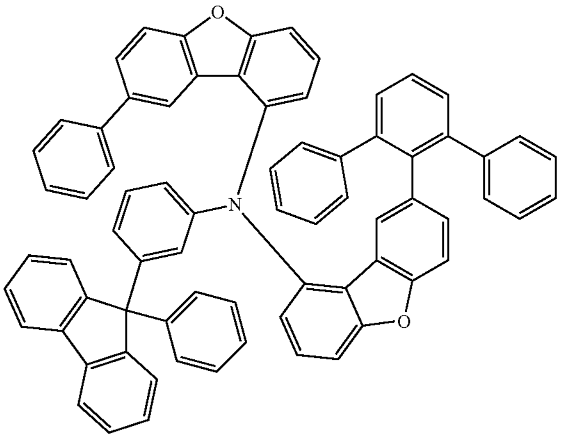
P1-43
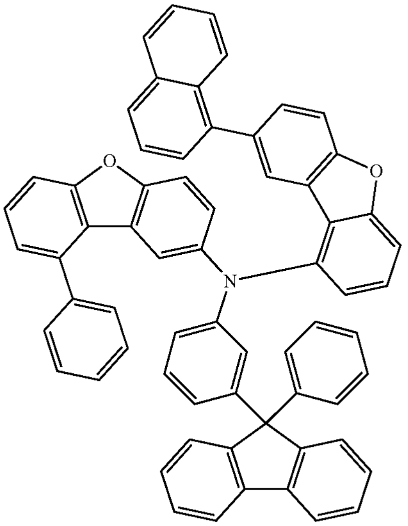
P1-44
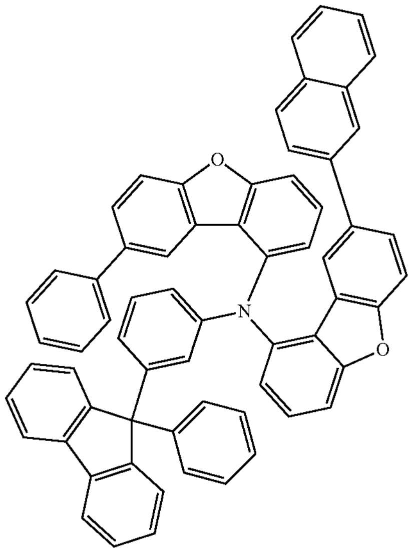
P1-45
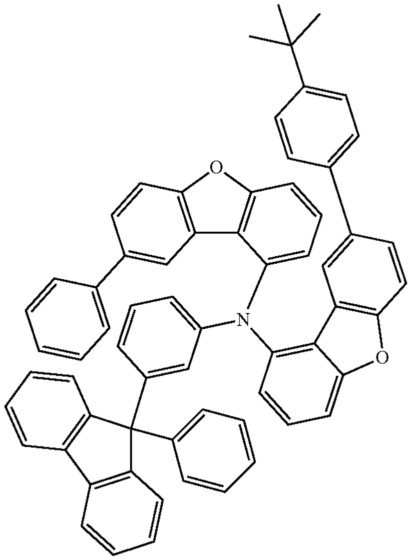
P1-46
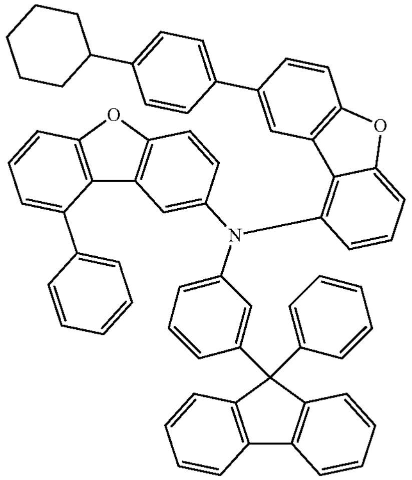
P1-47
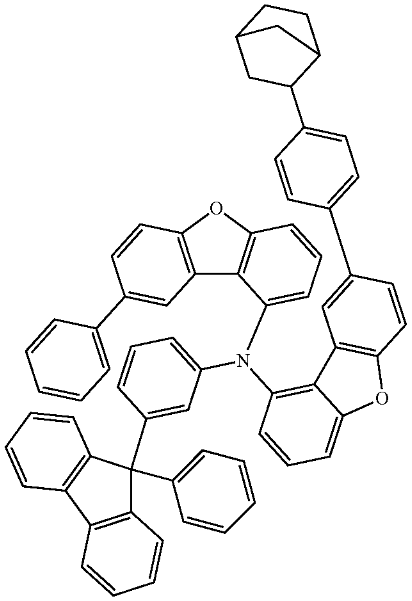

-continued
P1-48
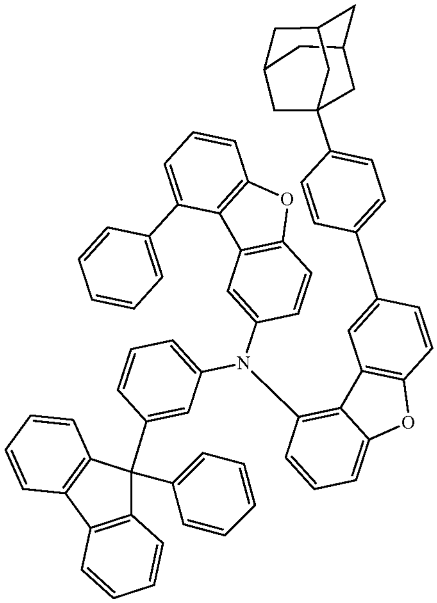
P1-49
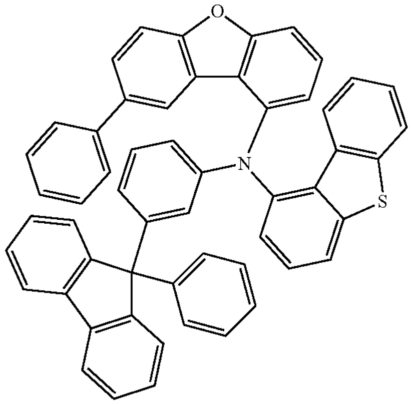
P1-50
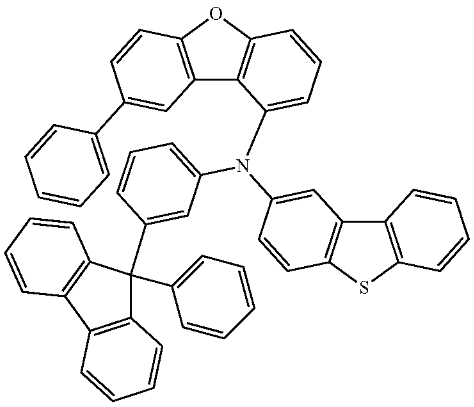
-continued
P1-51
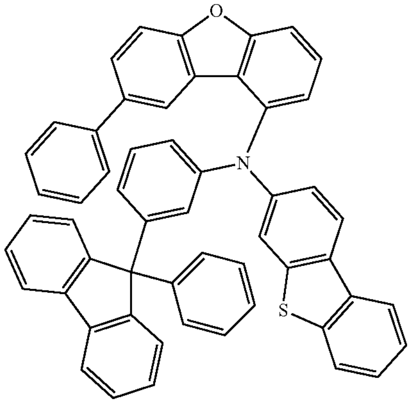
P1-52
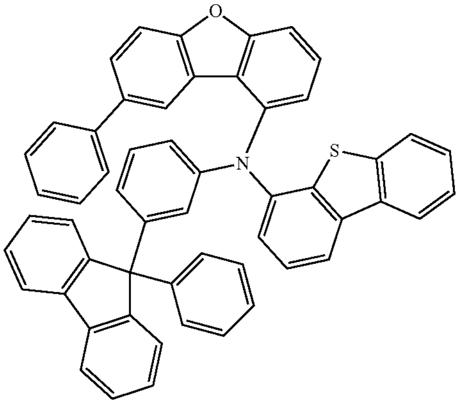
P1-53
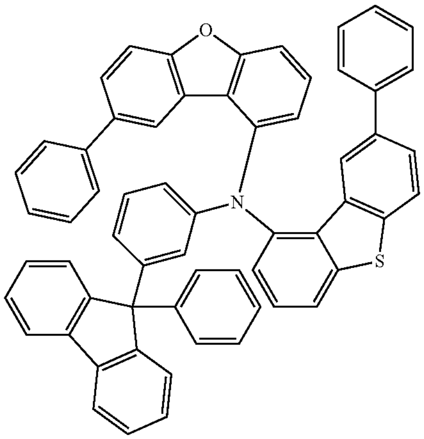

-continued
P1-54
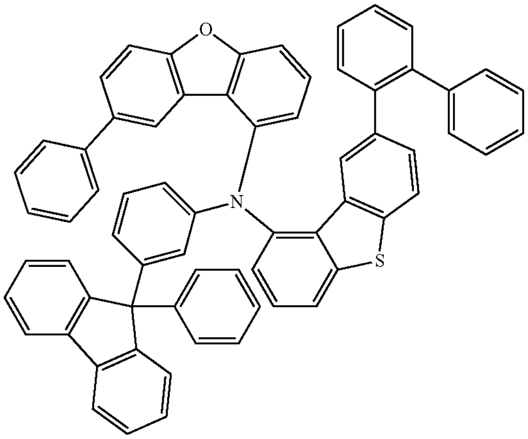
P1-55
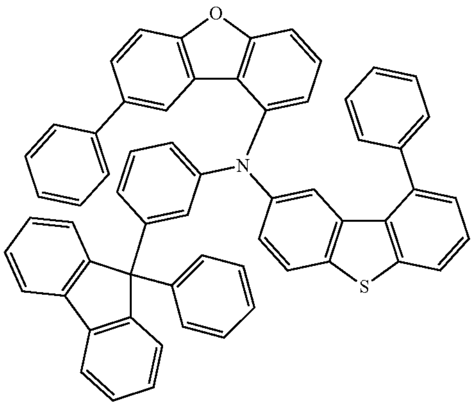
P1-56
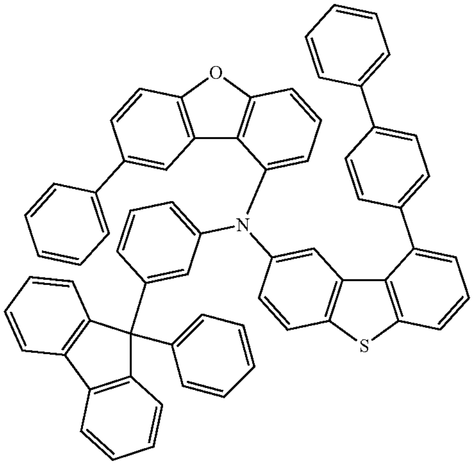
-continued
P1-57
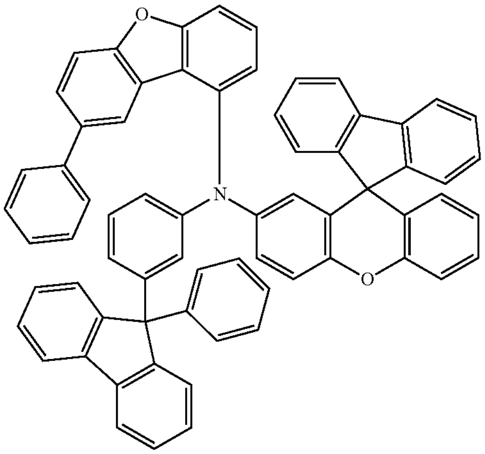
P1-58
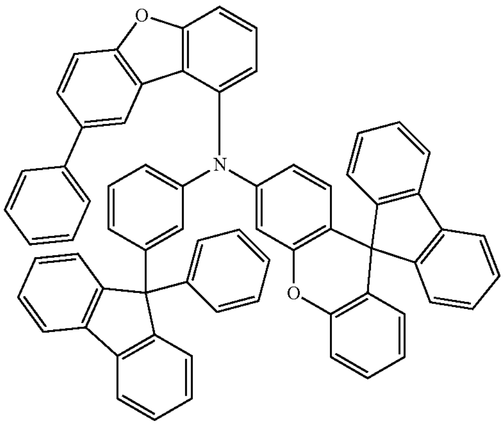
P1-59
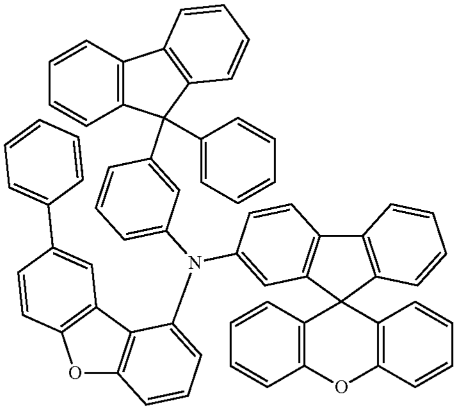

-continued
P1-60
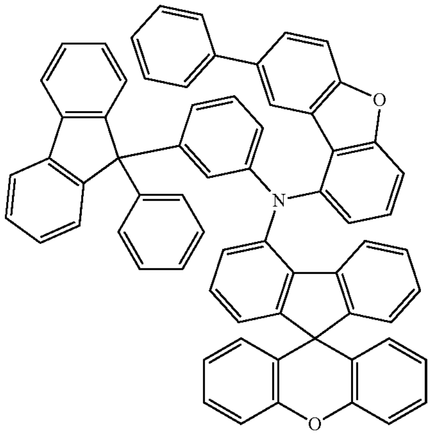
P1-61
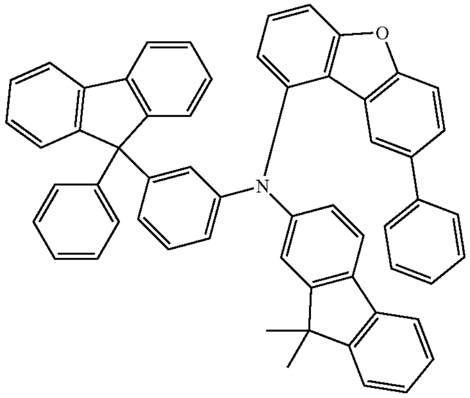
P1-62
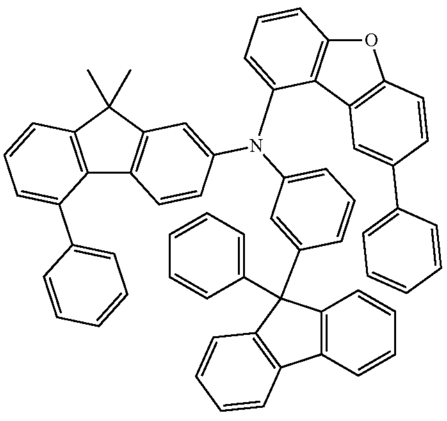
-continued
P1-63
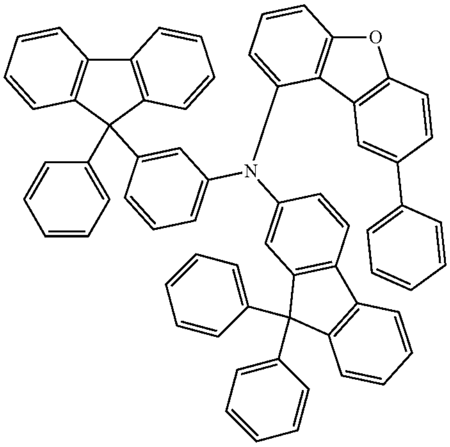
P1-64
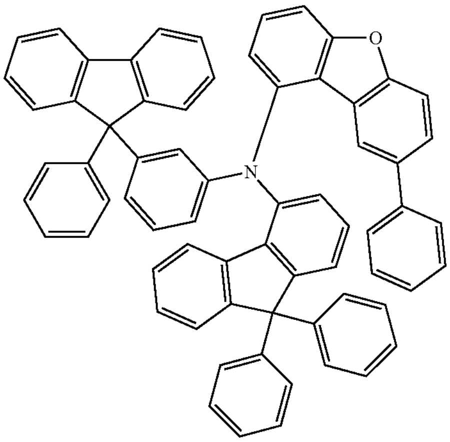
P1-65
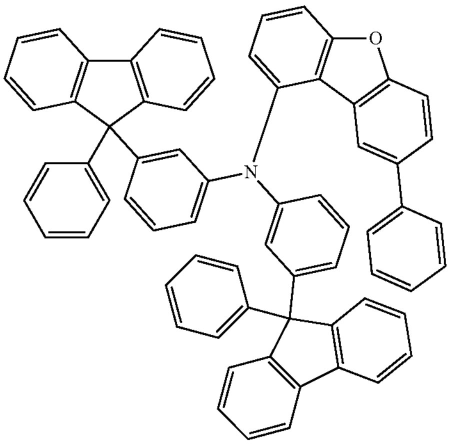

-continued
P1-66
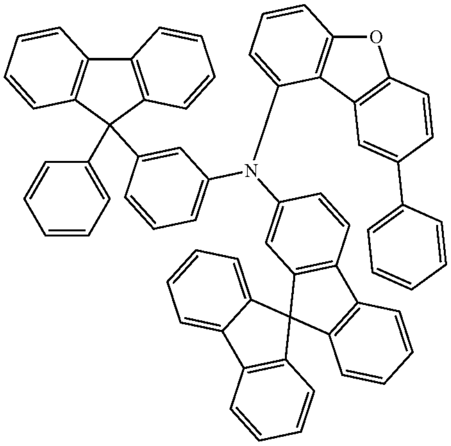
P1-67
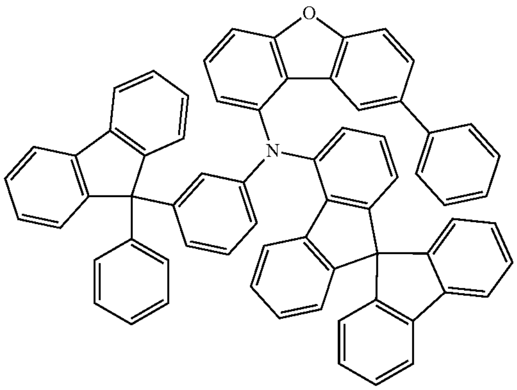
P1-68
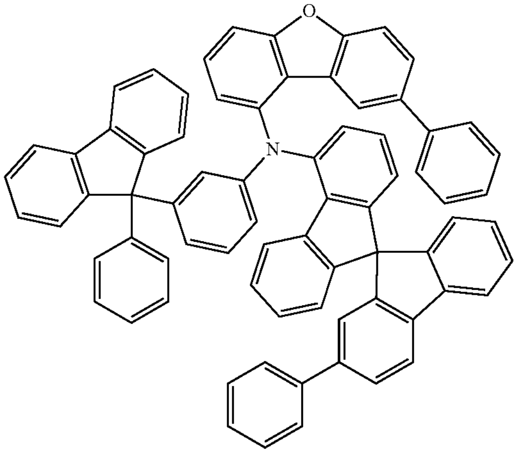
-continued
P1-69
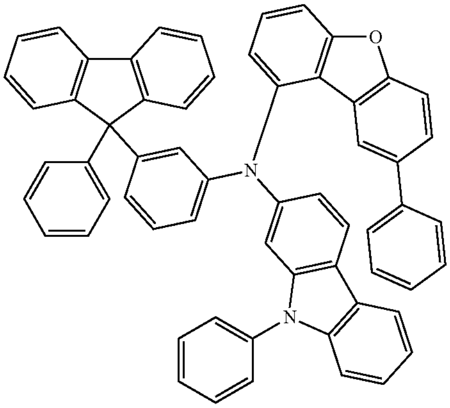
P1-70
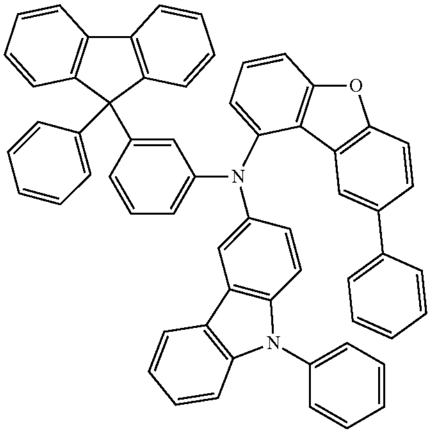
P1-71
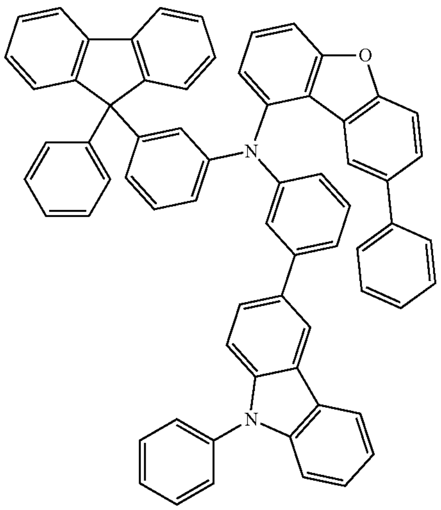

-continued
P1-72
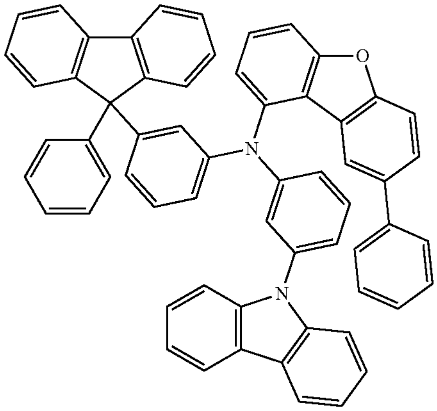
P1-73
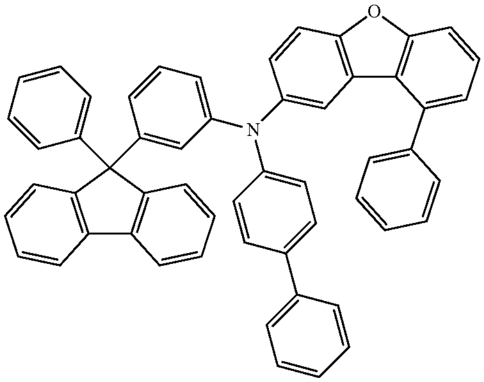
P1-74
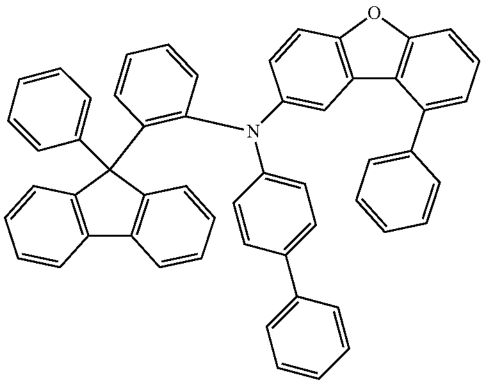
-continued
P1-75
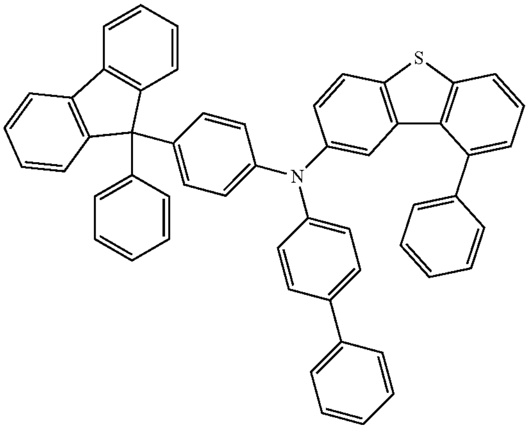
P1-76
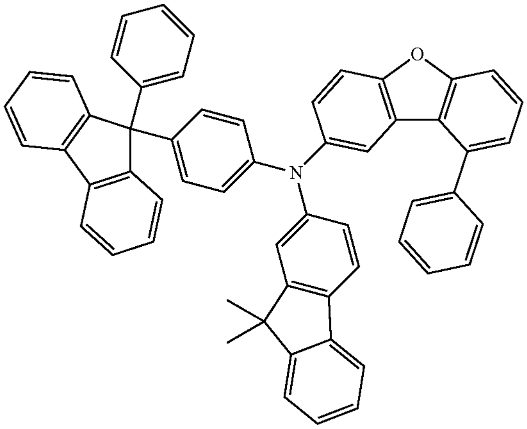
P1-77
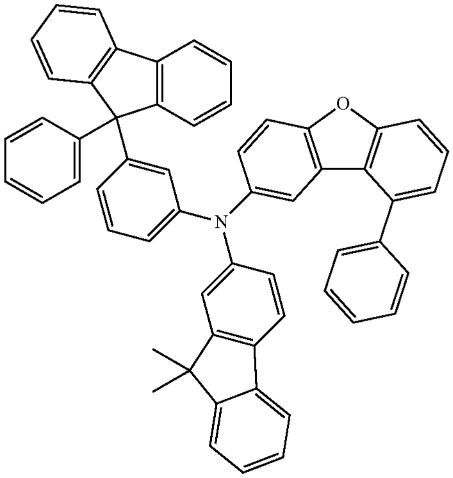

-continued
P1-78
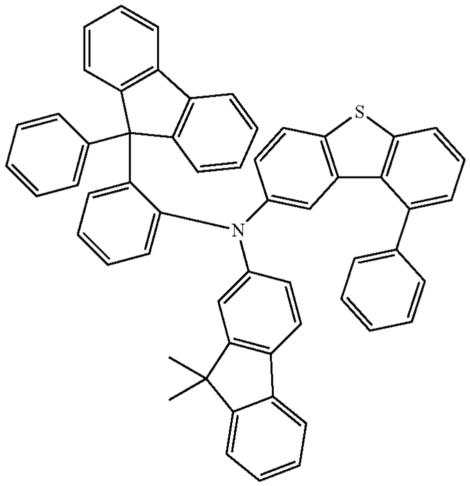
P1-79
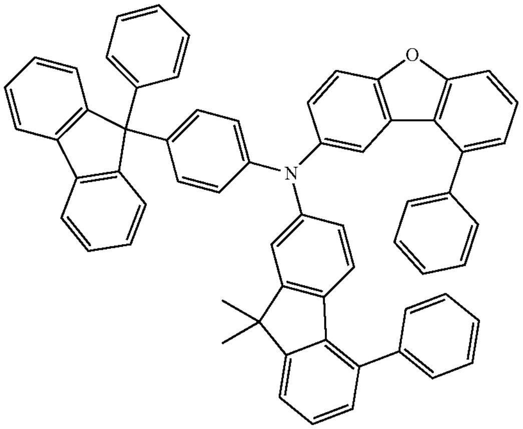
P1-80
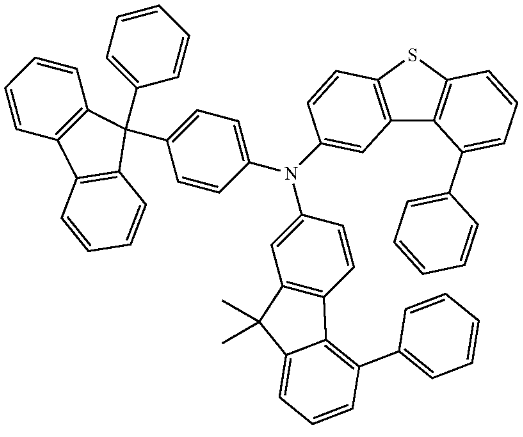
-continued
P1-81
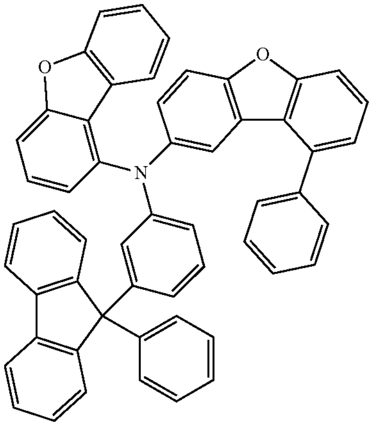
P1-82
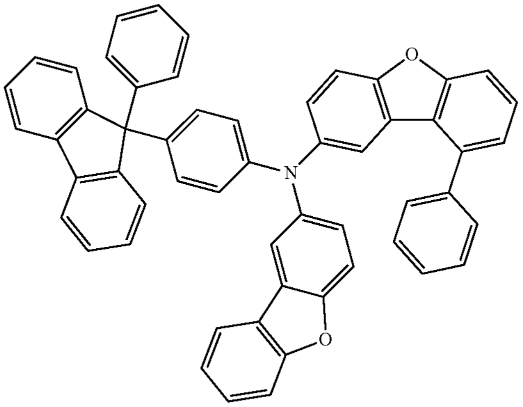
P1-83
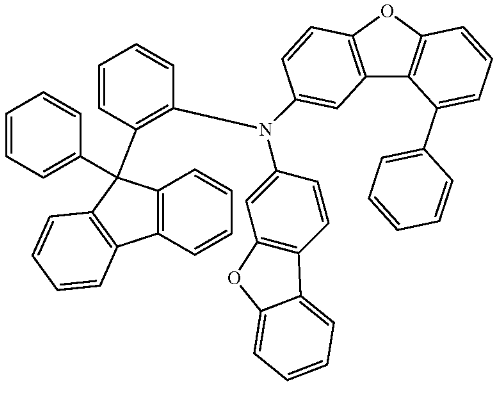

-continued
P1-84
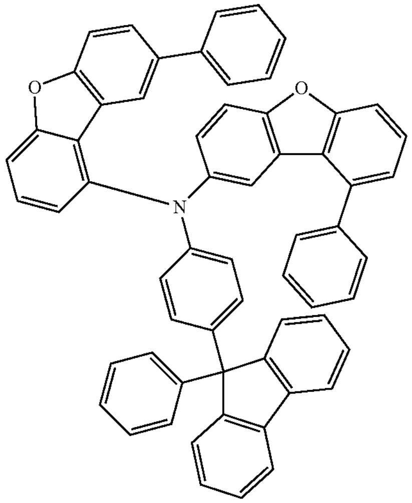
P1-85
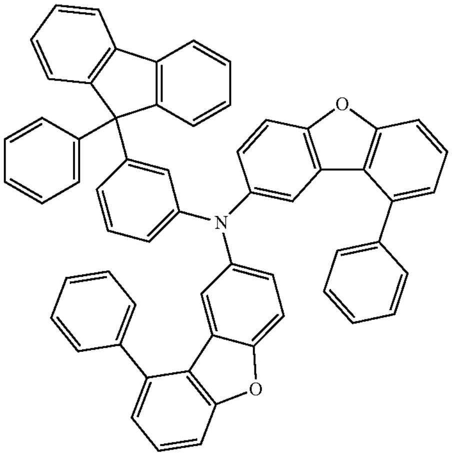
P1-86
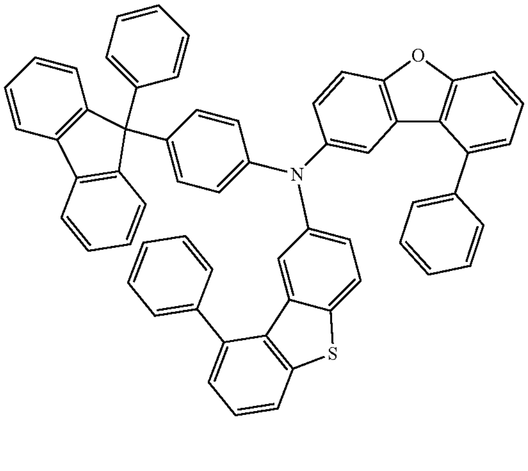
-continued
P1-87
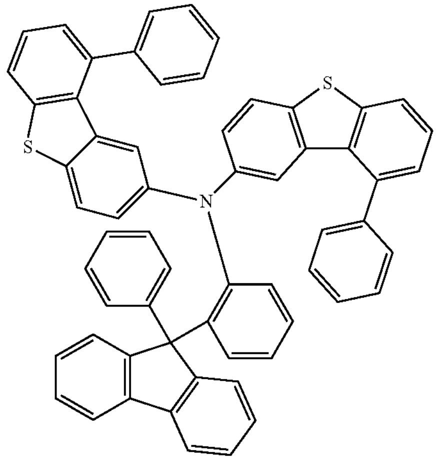
P1-88
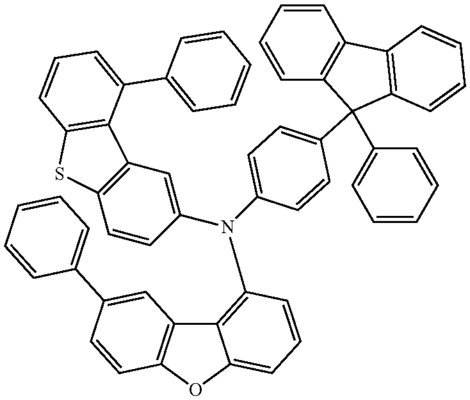
P1-89
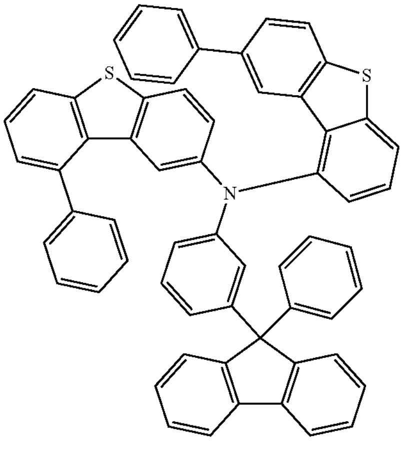

-continued
P1-90
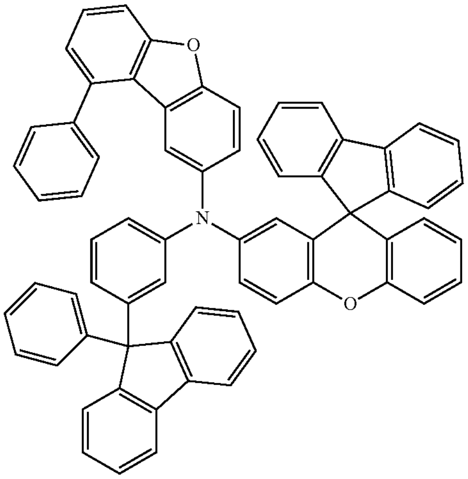
P1-91
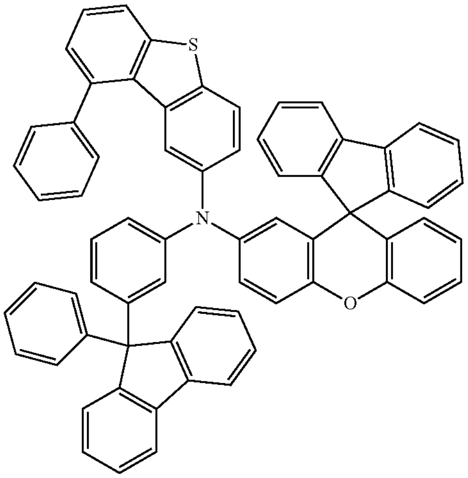
P1-92
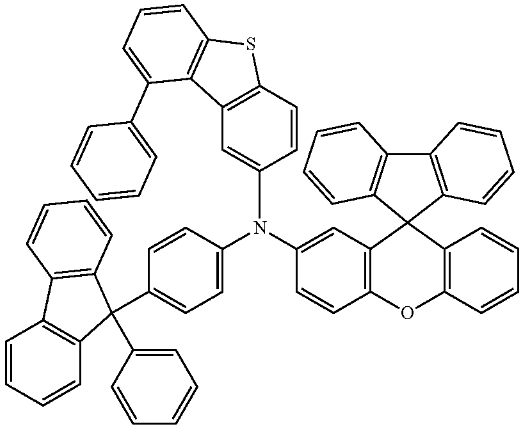
-continued
P1-93
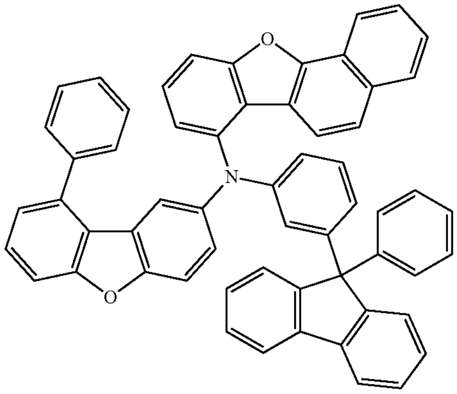
P1-94
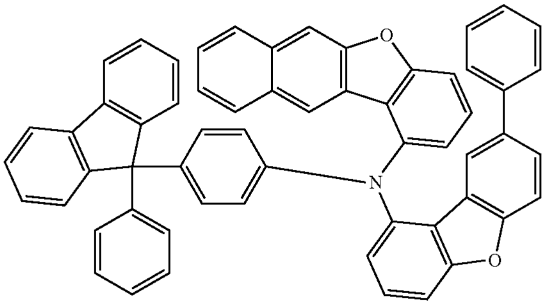
P1-95
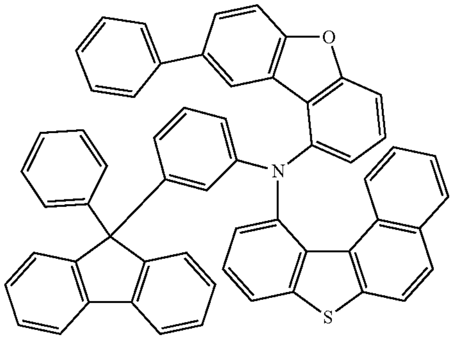
P1-96
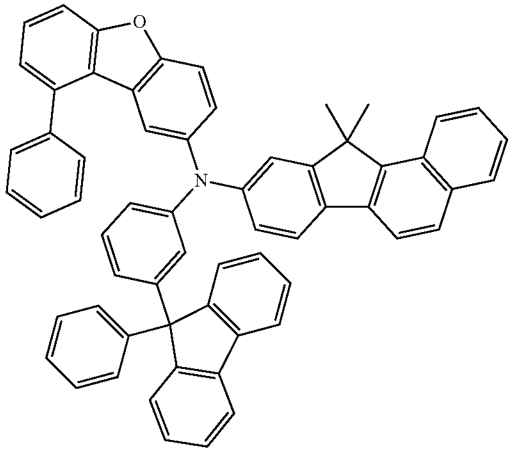

-continued
P1-97
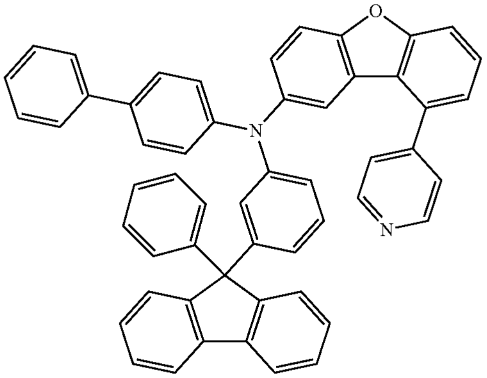
P1-98
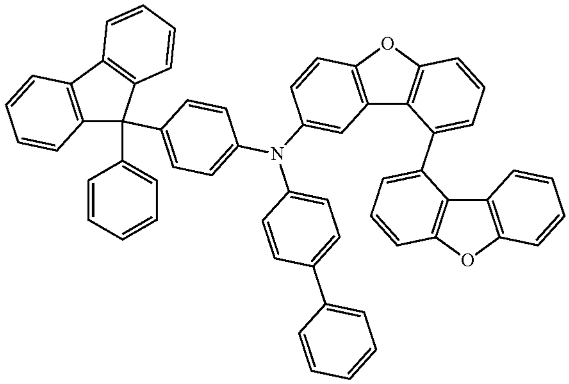
P1-99
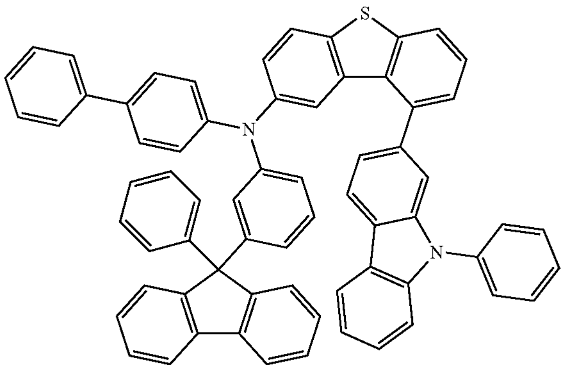
P1-100
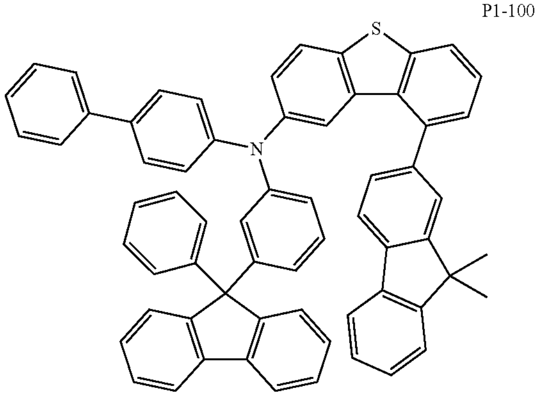
-continued
P1-101
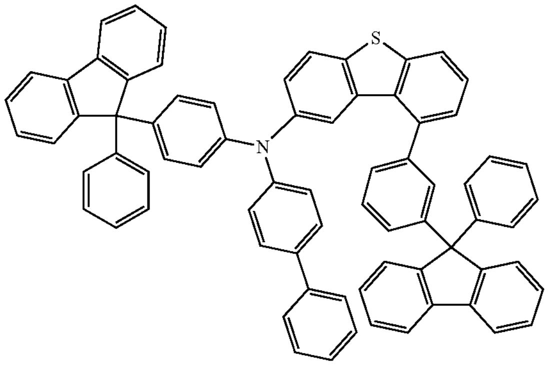
P1-102
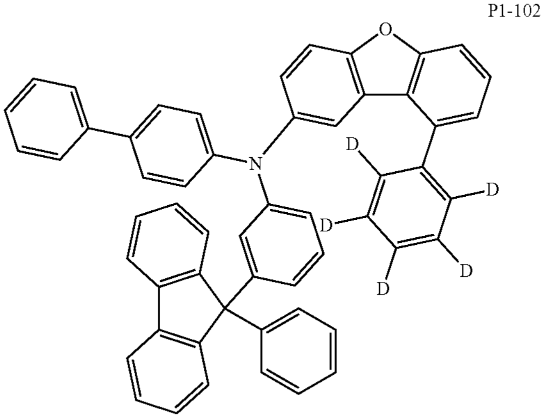
P1-103
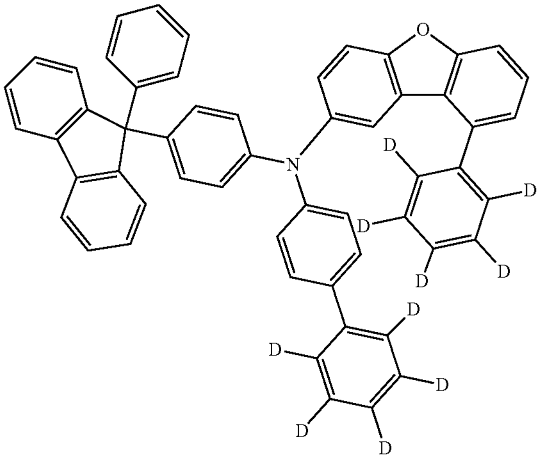

-continued
P1-104
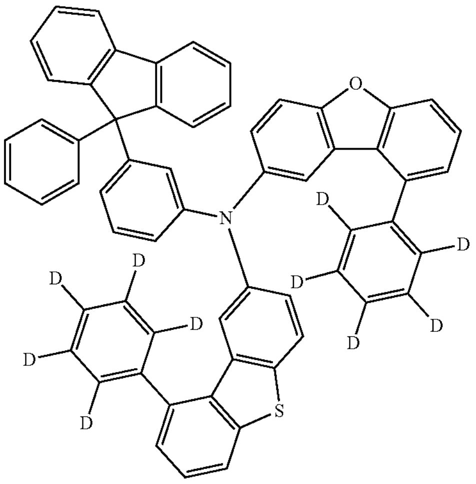
P1-105
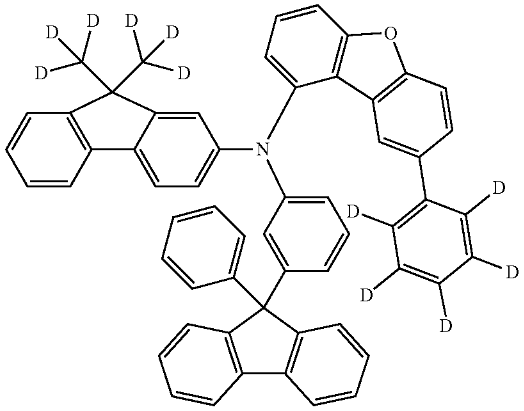
P1-106
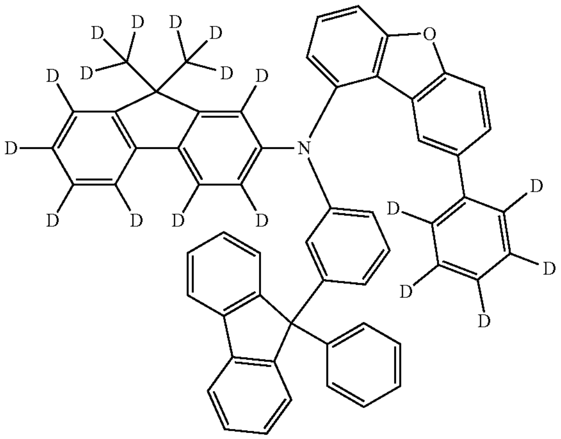
-continued
P1-107
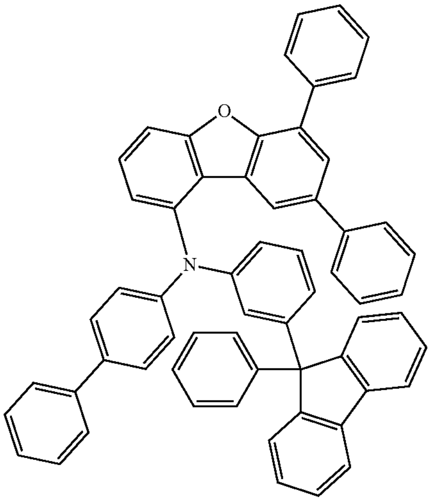
P1-108
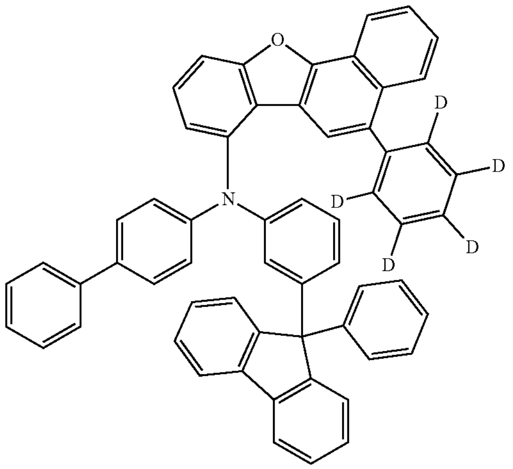
P2-1
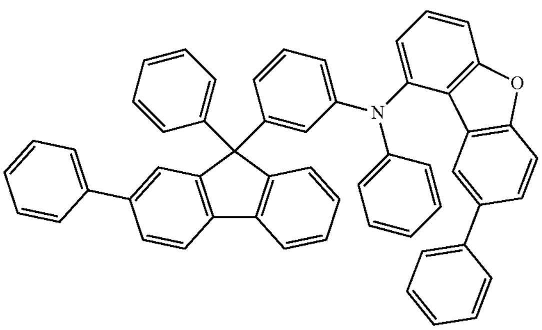

-continued
P2-2
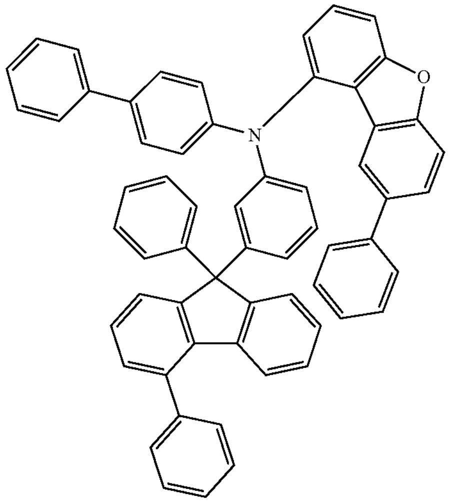
P2-3
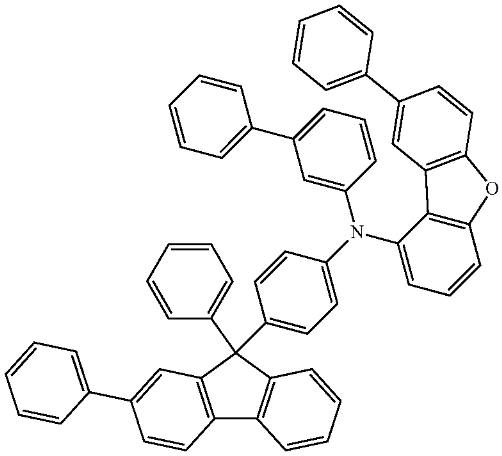
P2-4
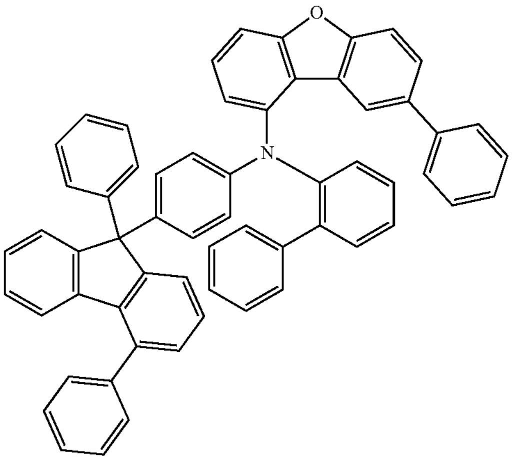
-continued
P2-5
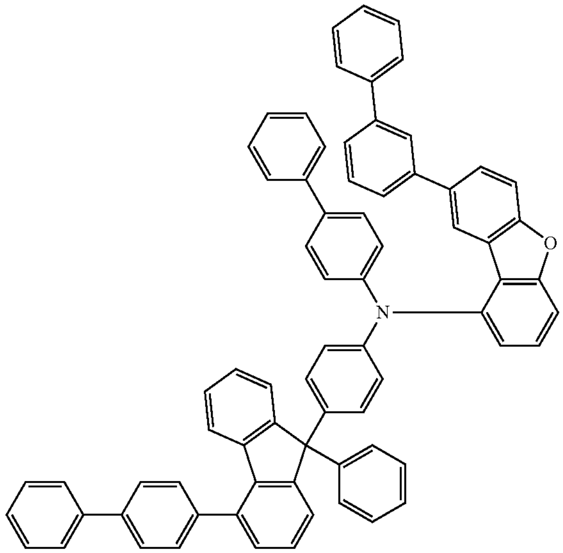
P2-6
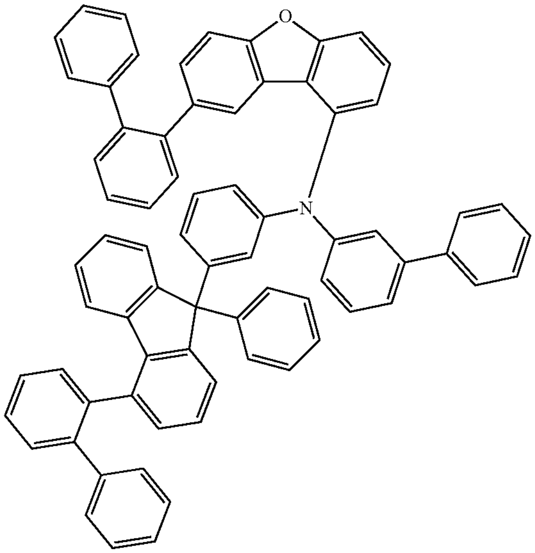

-continued
P2-7
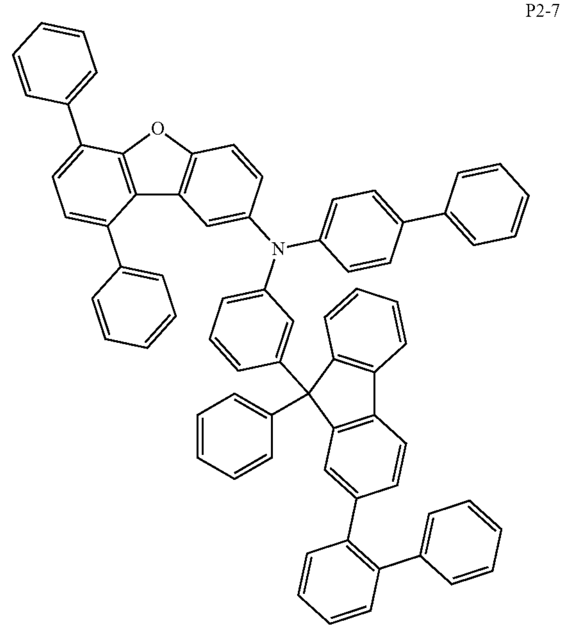
P2-8
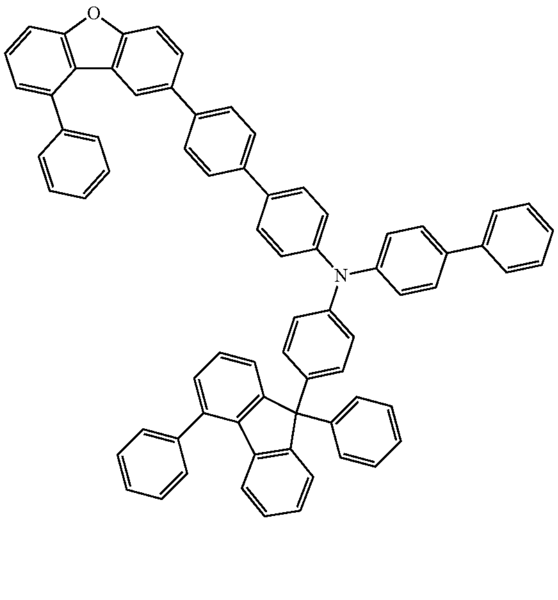
-continued
P2-9
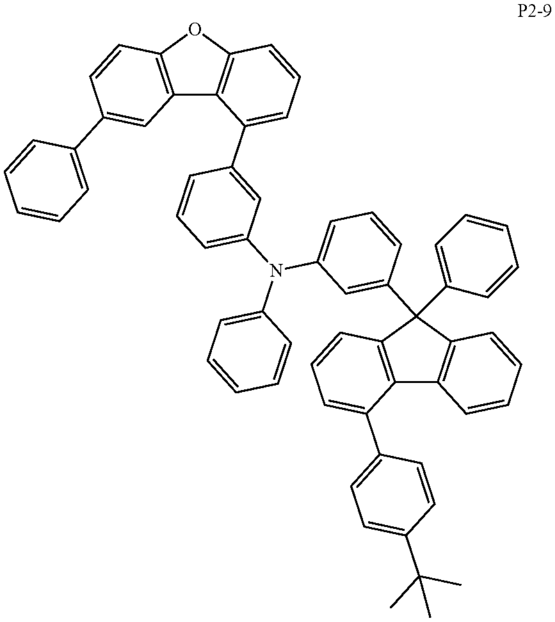
P2-10
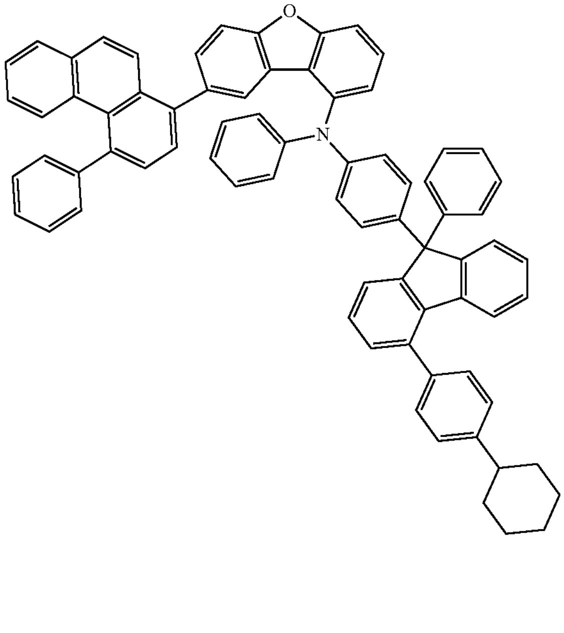

-continued
P2-11
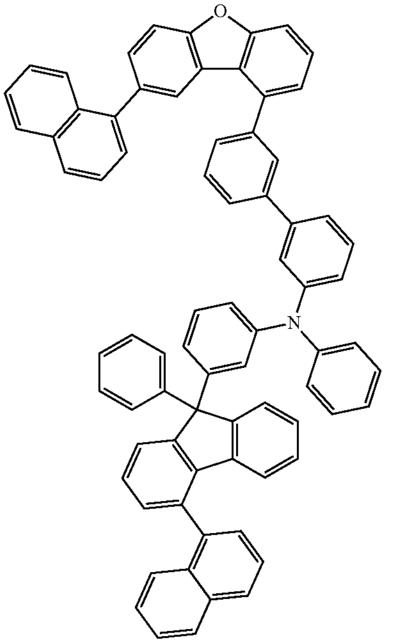
P2-12
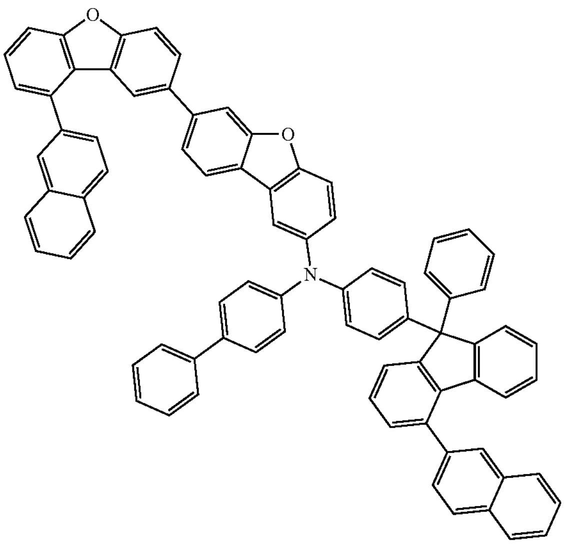
P2-13
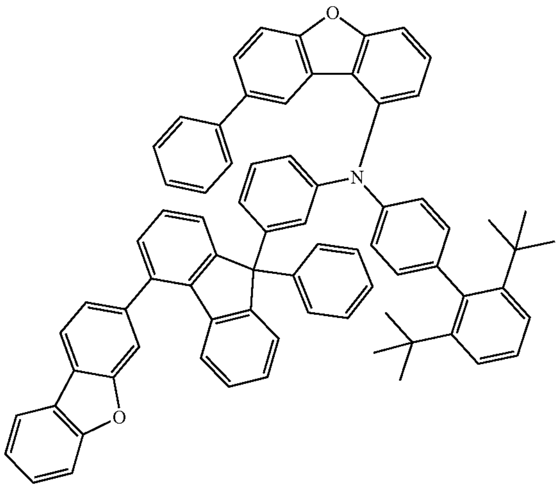
P2-14
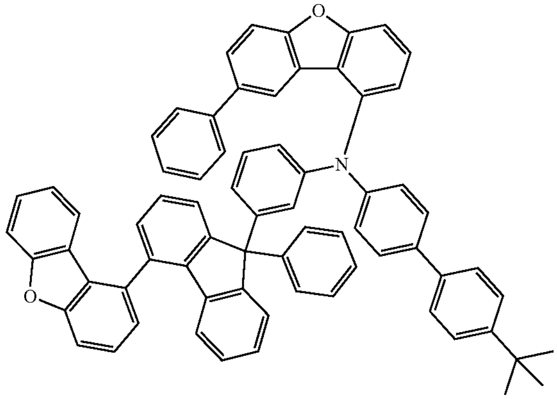
P2-15
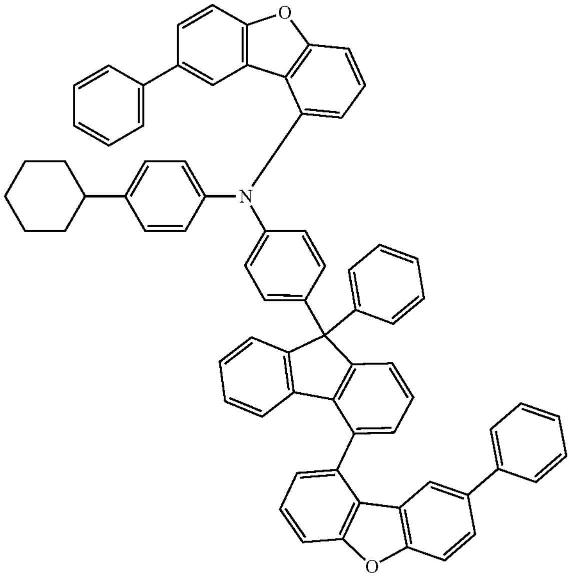

-continued
P2-16
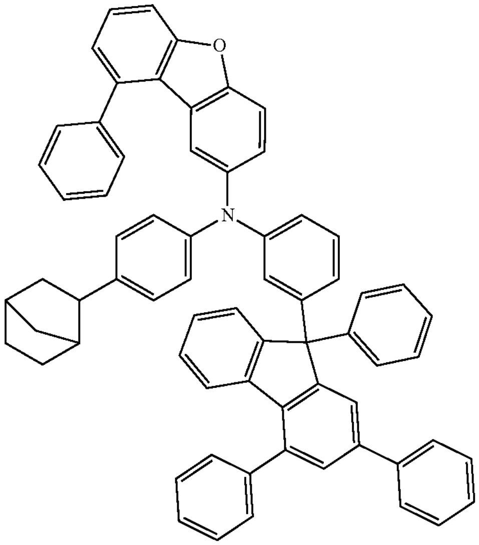
P2-17
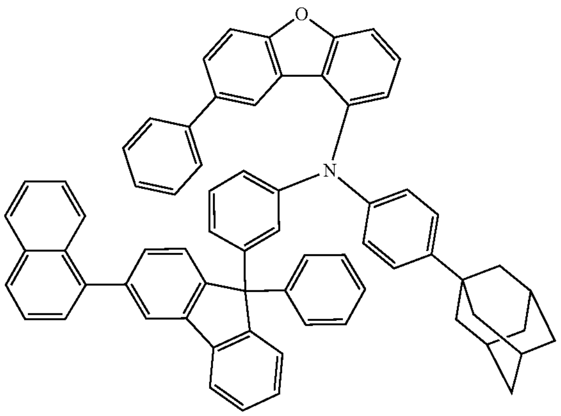
P2-18
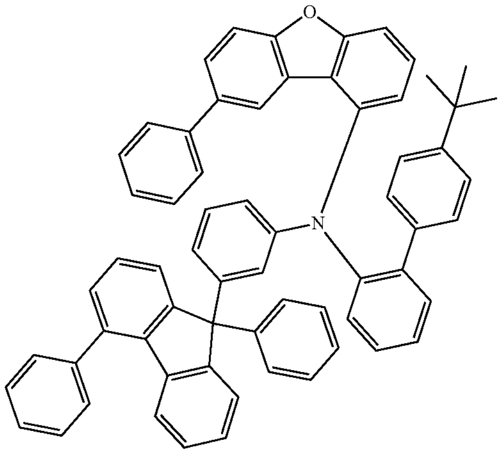
-continued
P2-19
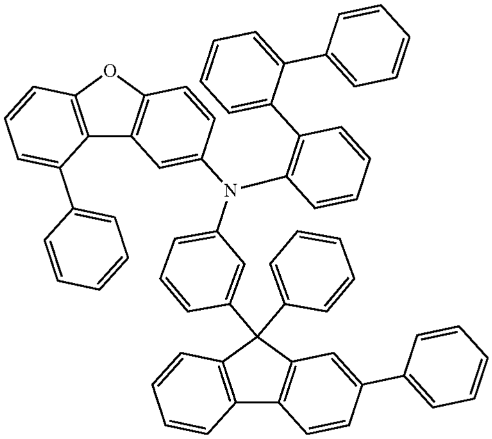
P2-20
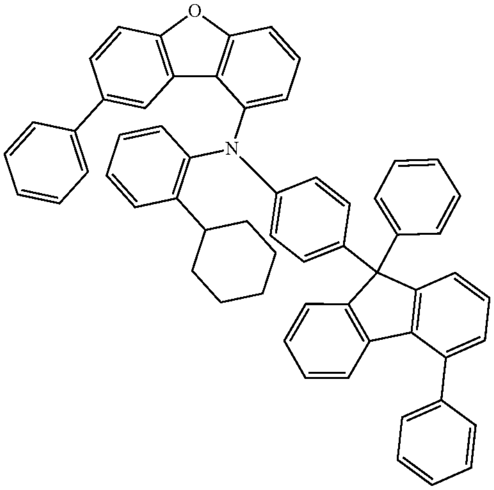
P2-21
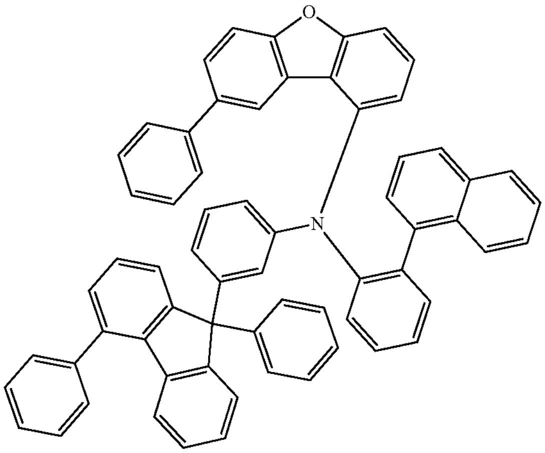

-continued
P2-22
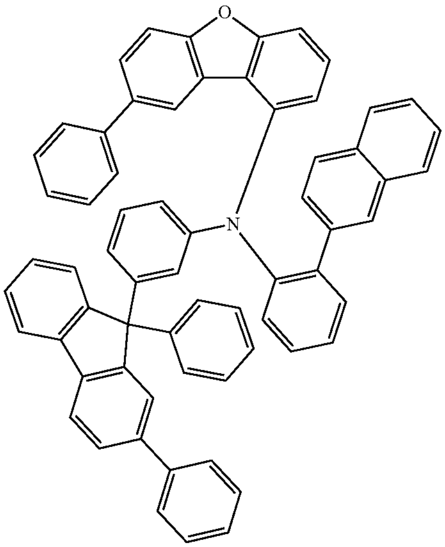
P2-23
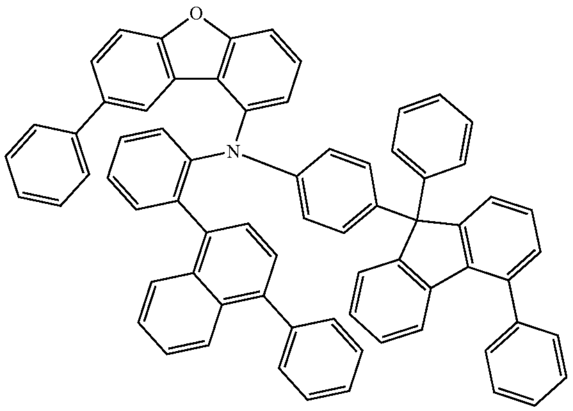
P2-24
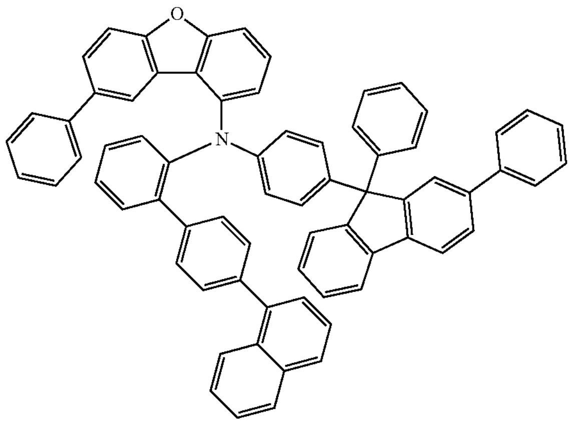
-continued
P2-25
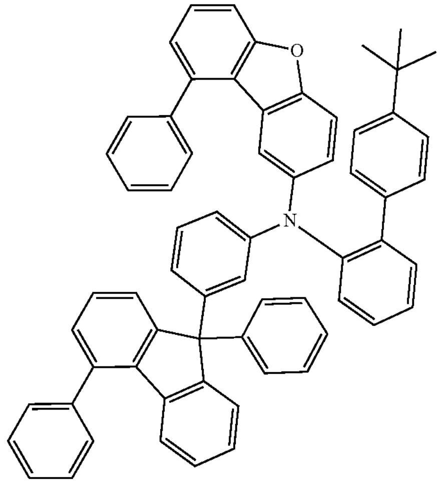
P2-26
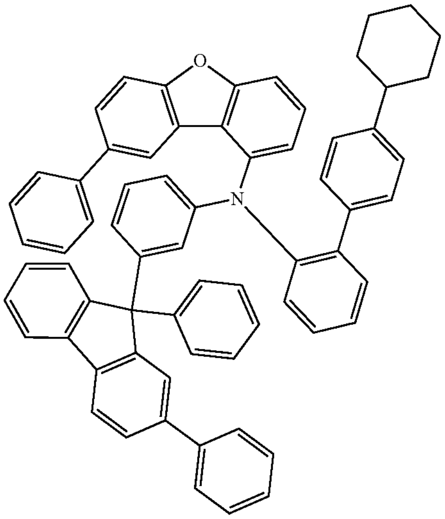
P2-27
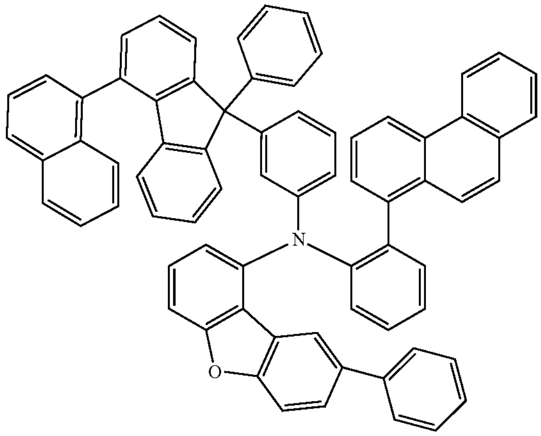

-continued
P2-28
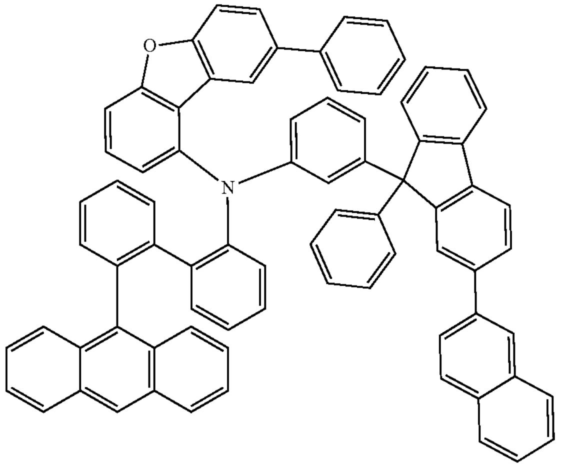
P2-29
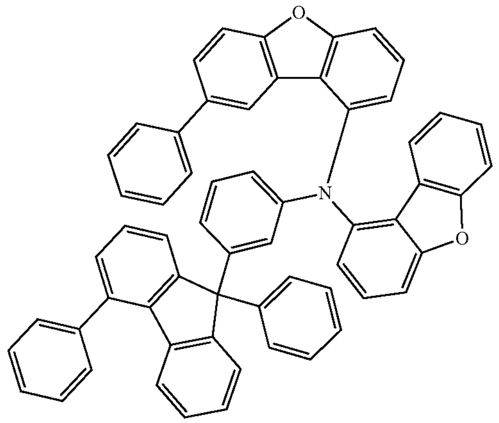
P2-30
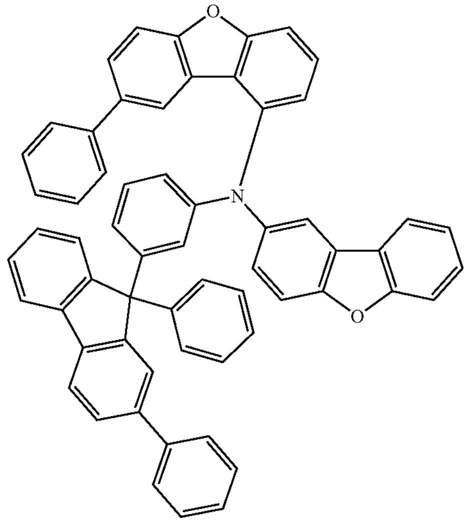
-continued
P2-31
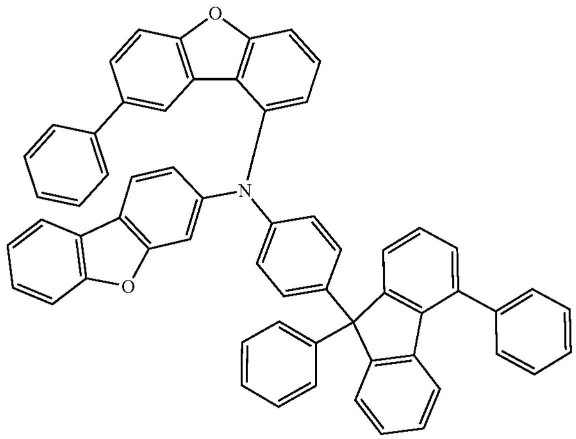
P2-32
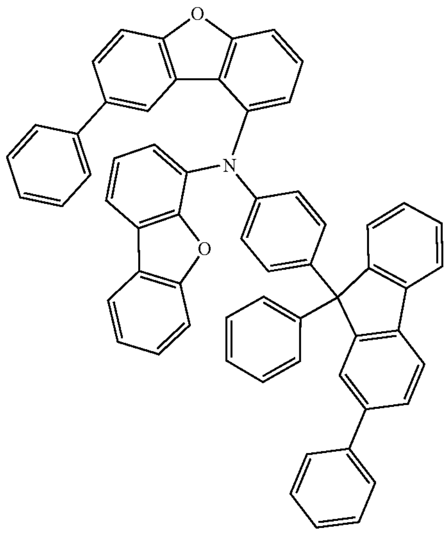
P2-33
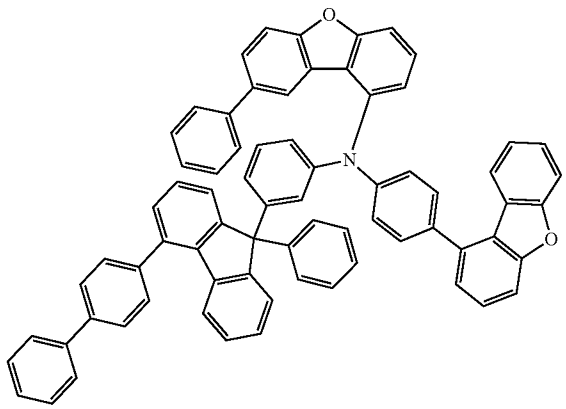

-continued
P2-34
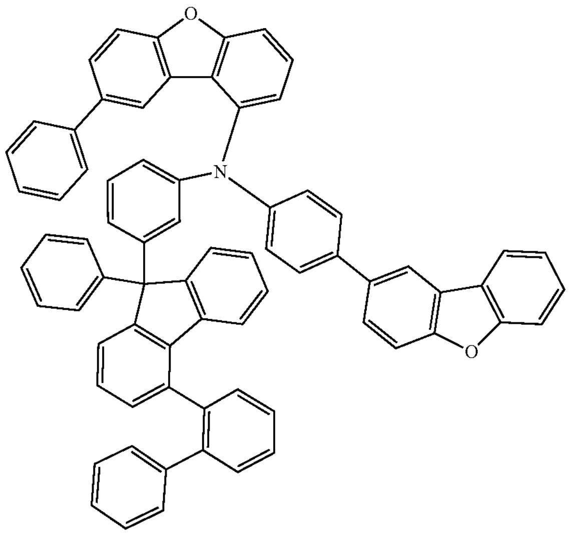
P2-35
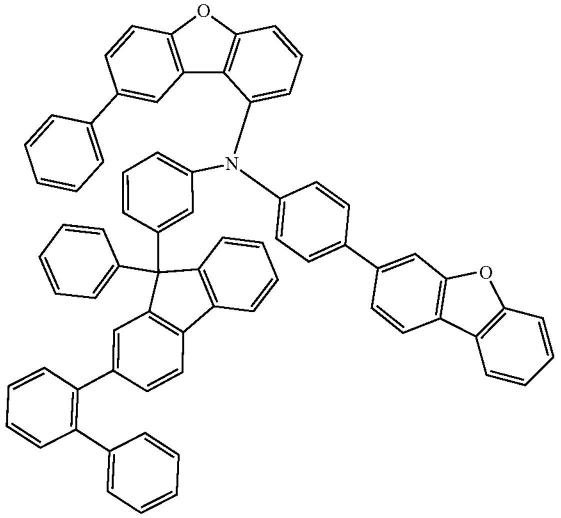
P2-36
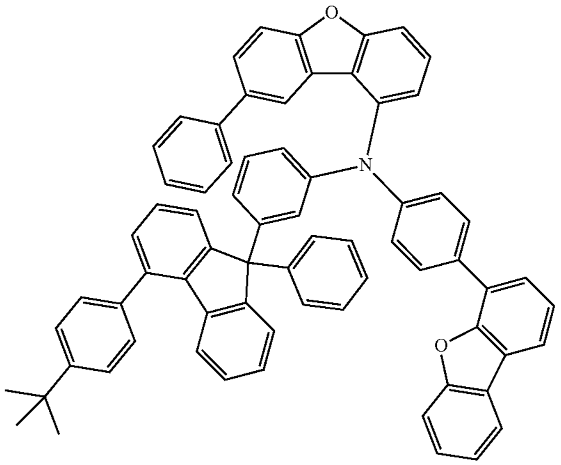
-continued
P2-37
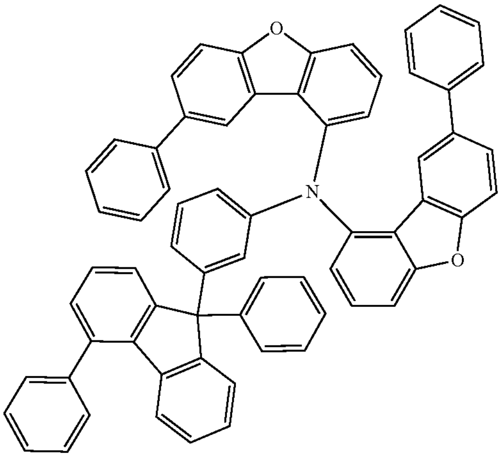
P2-38
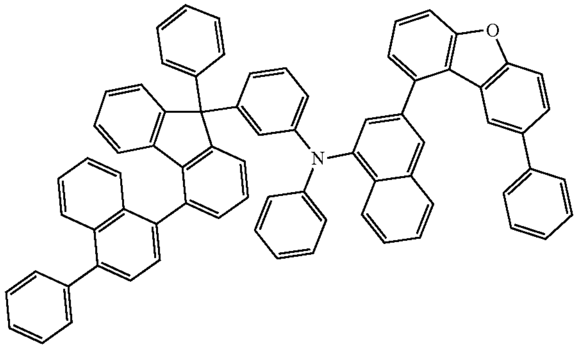
P2-39
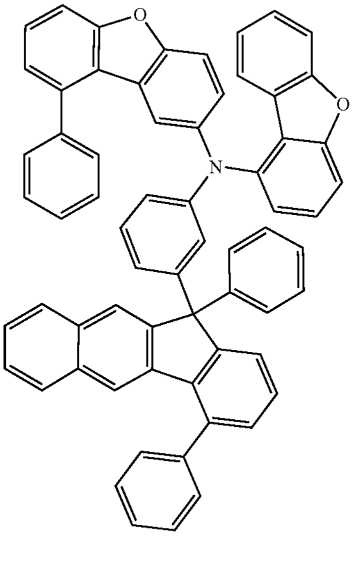

-continued
P2-40
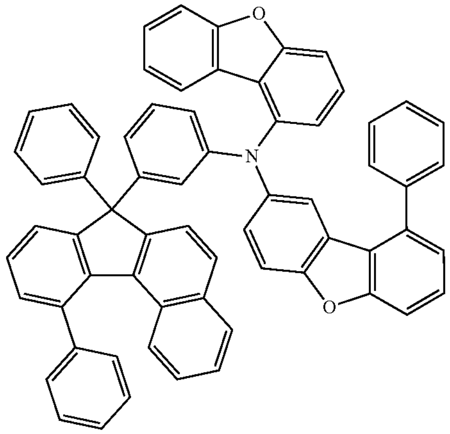
P2-41
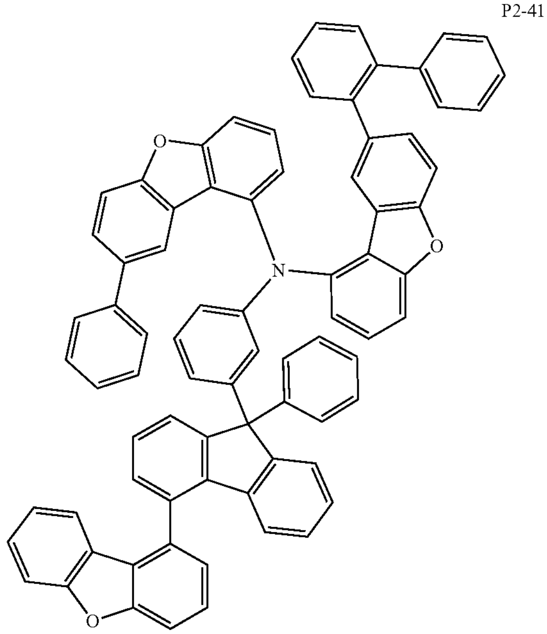
P2-42
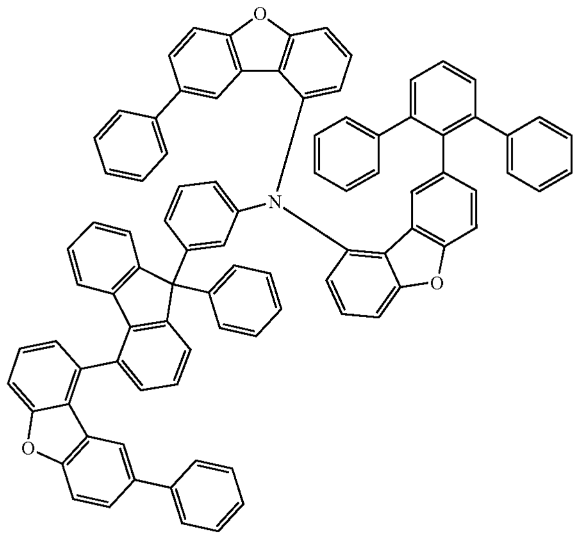
-continued
P2-43
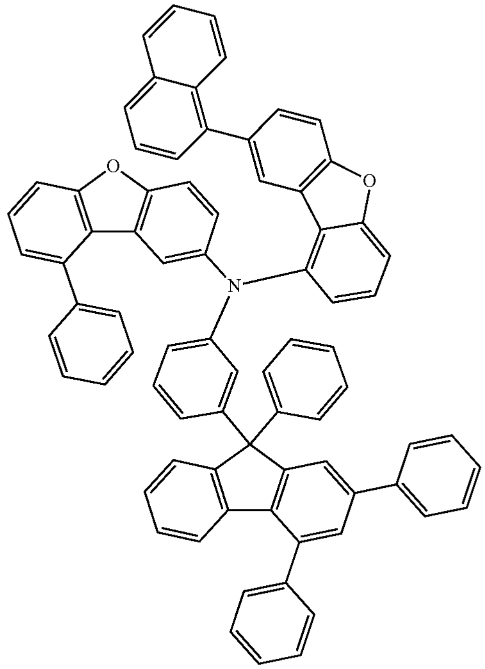
P2-44
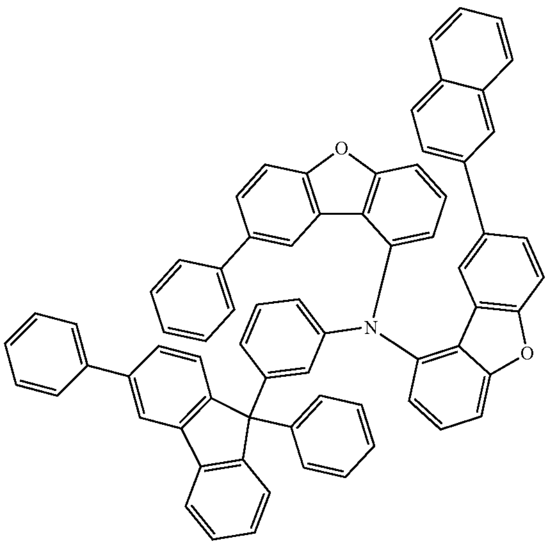

-continued
P2-45
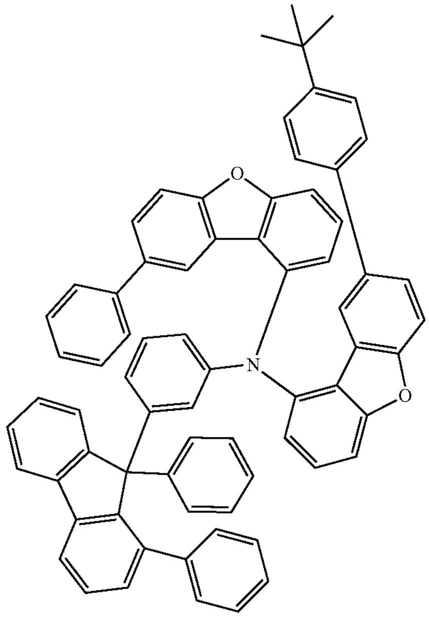
P2-46
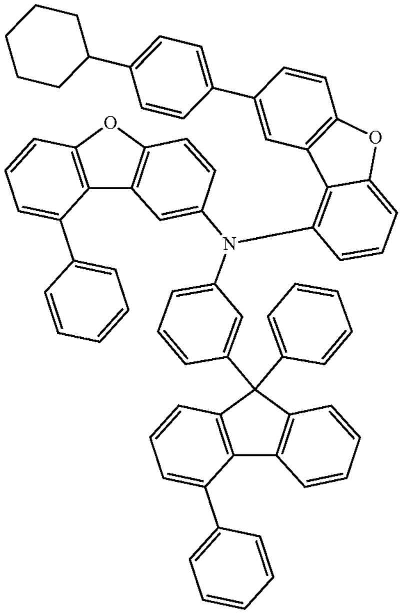
-continued
P2-47
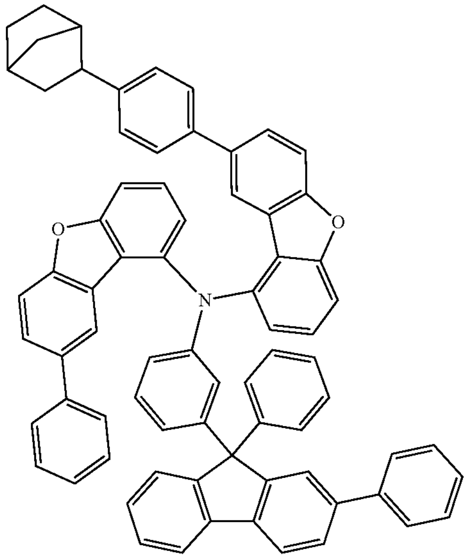
P2-48
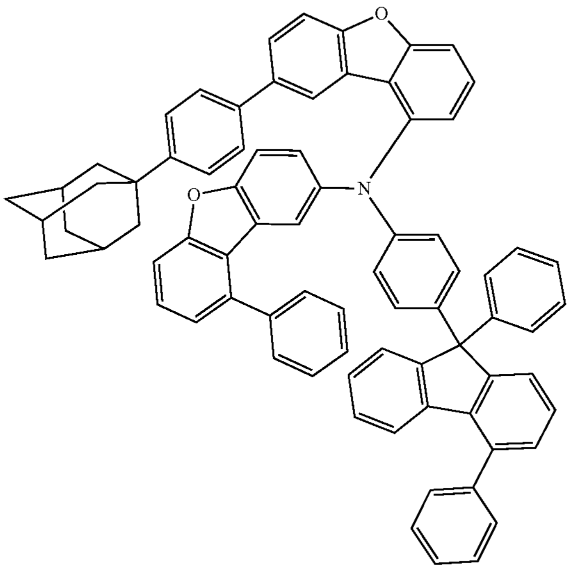
P2-49
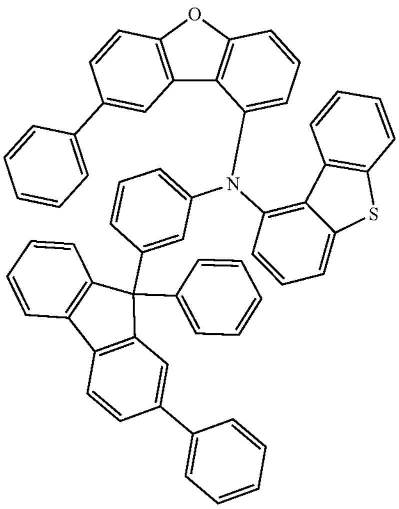

-continued
P2-50
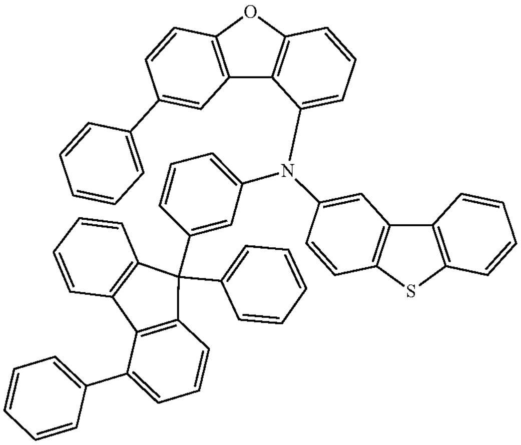
P2-51
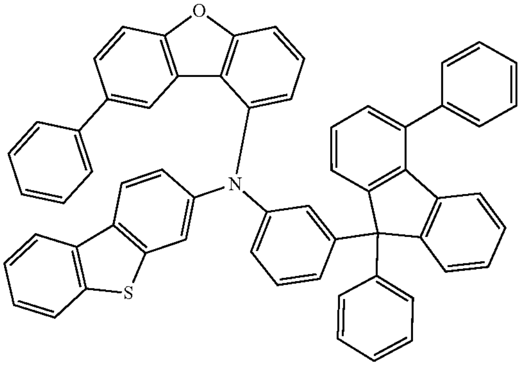
P2-52
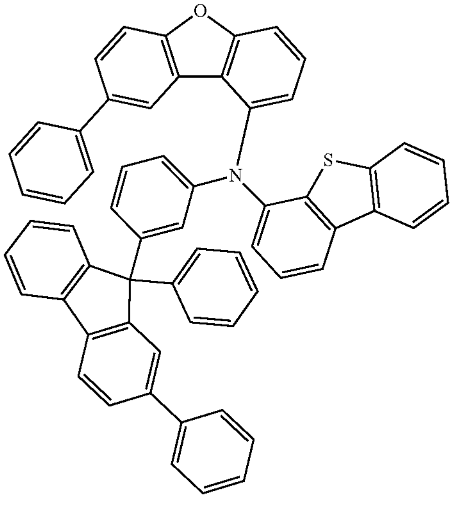
-continued
PS-53
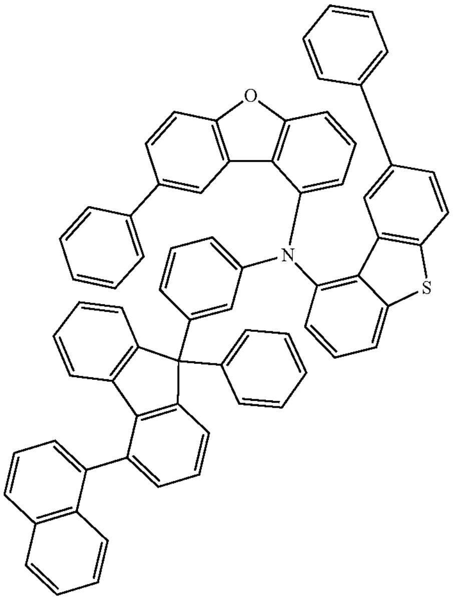
P2-54
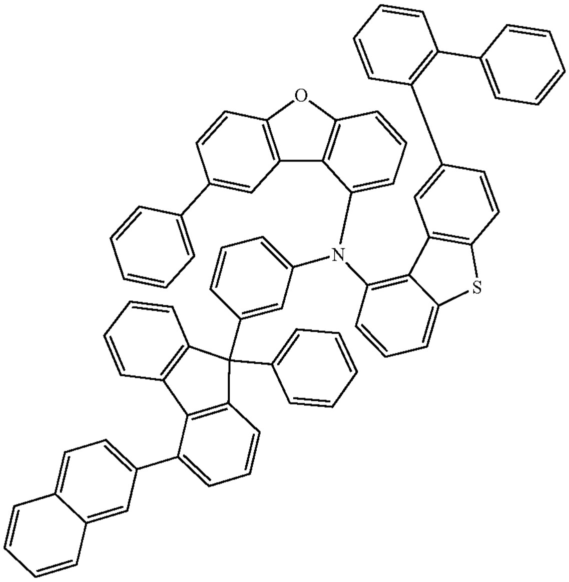
P2-55
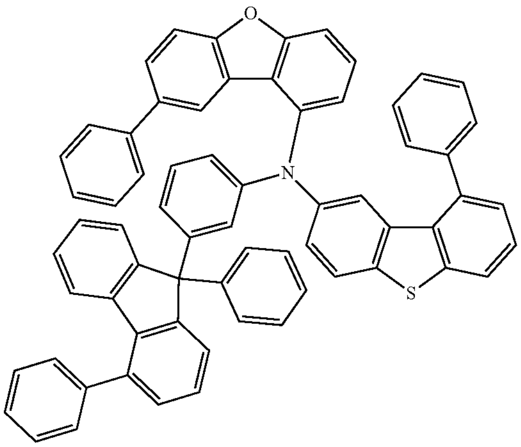

-continued
P2-56
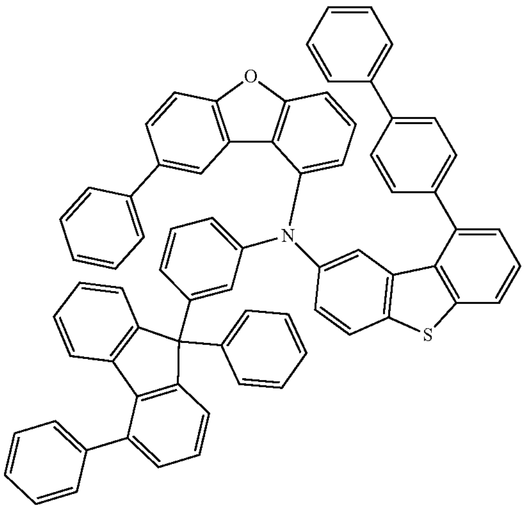
P2-57
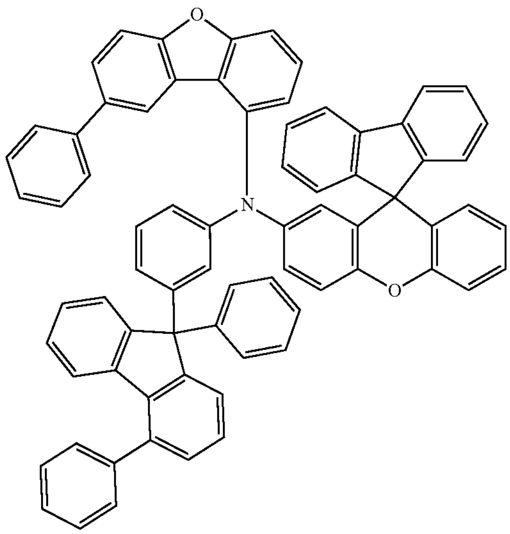
P2-58
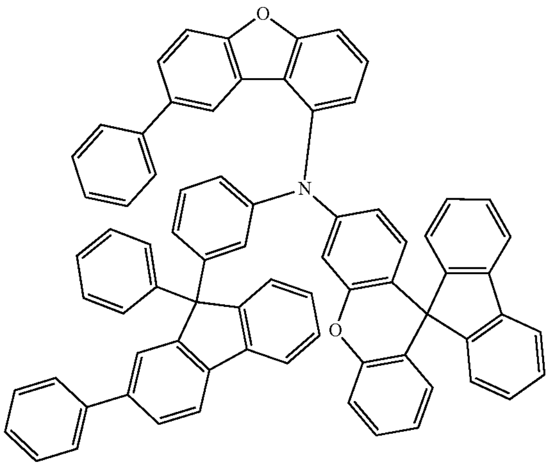
-continued
P2-59
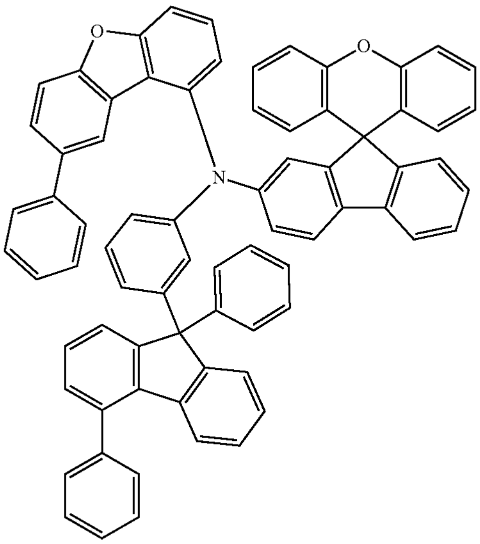
P2-60
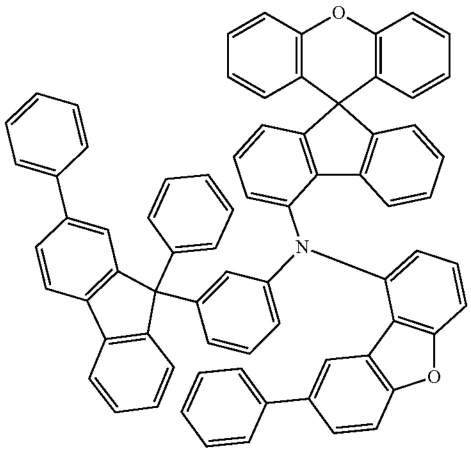
P2-61
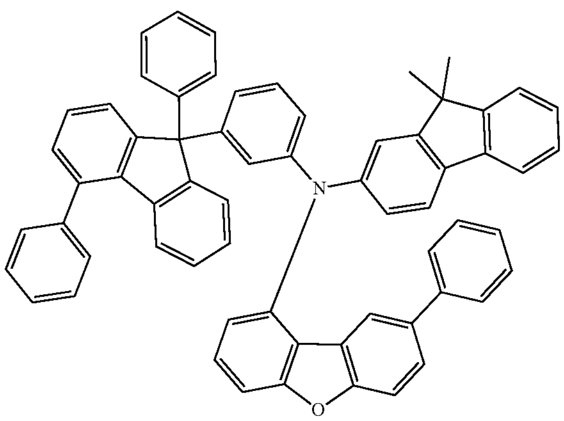

P2-62
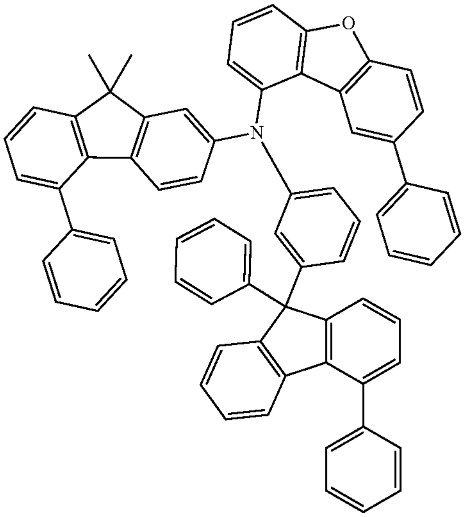
P2-63
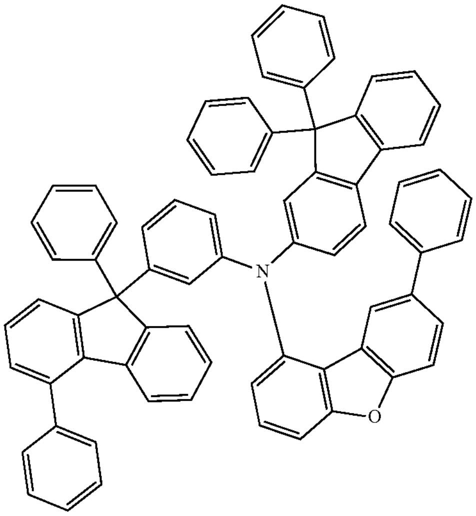
P2-64
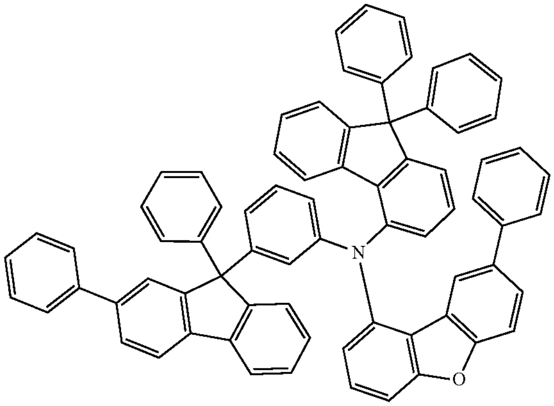
P2-65
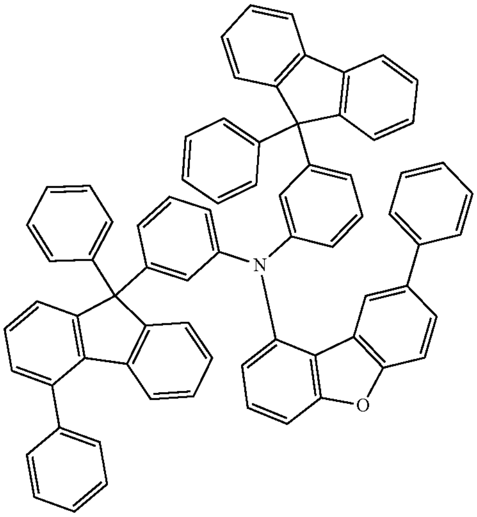
P2-66
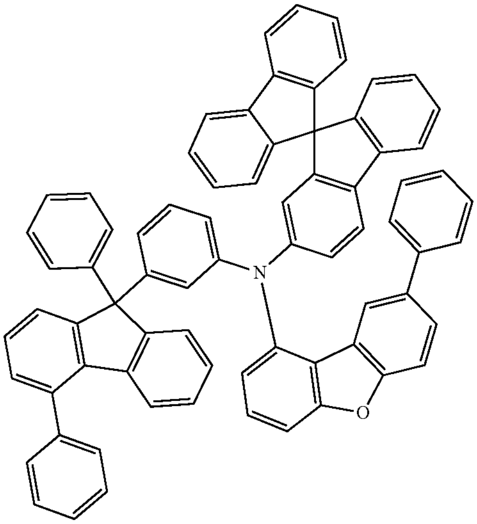
P2-67
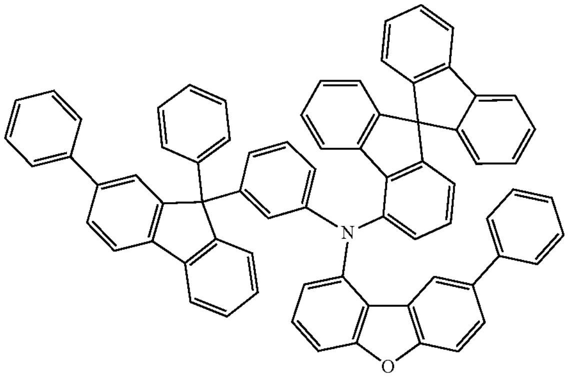

-continued
P2-68
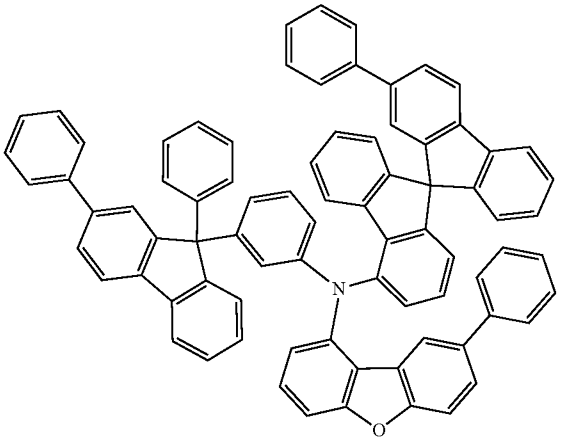
P2-69
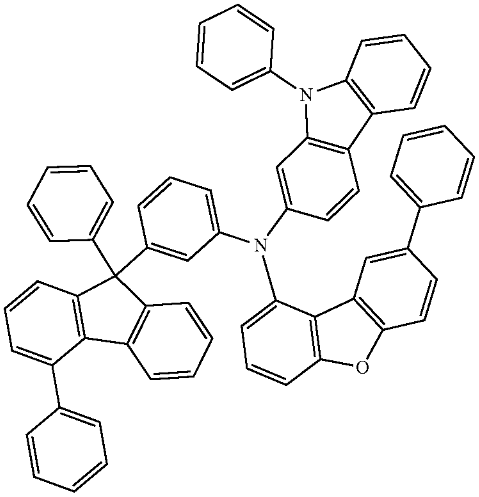
P2-70
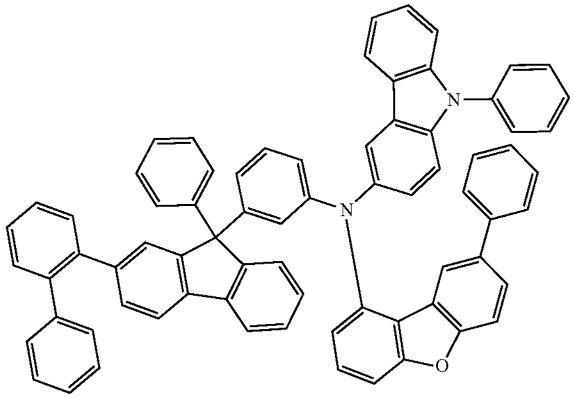
-continued
P2-71
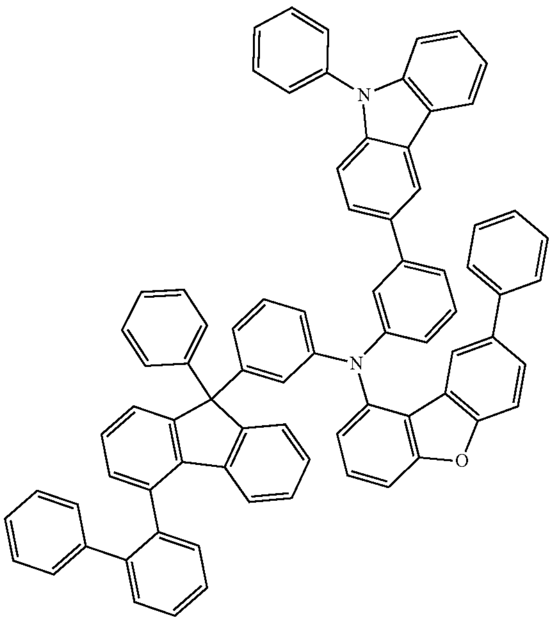
P2-72
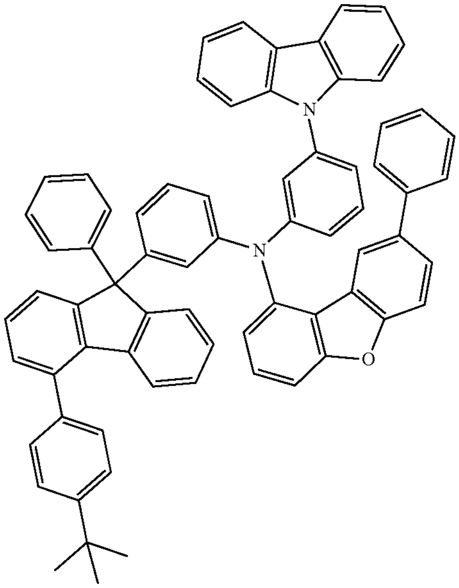
P2-73
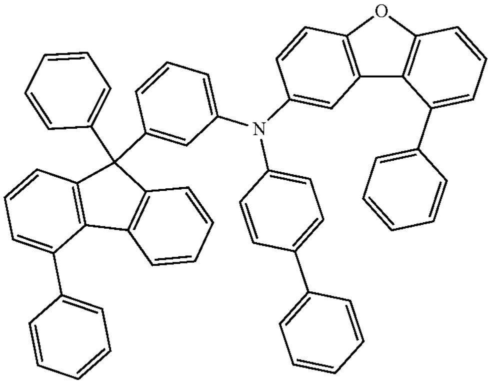

-continued
P2-74
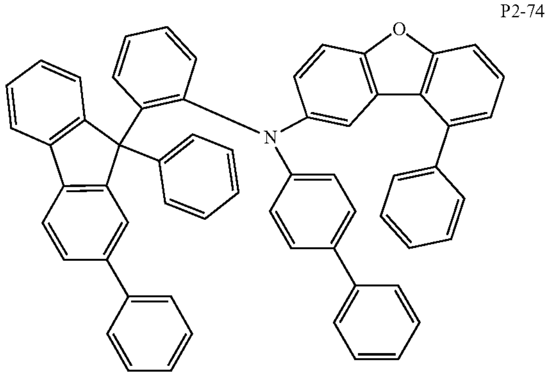
P2-75
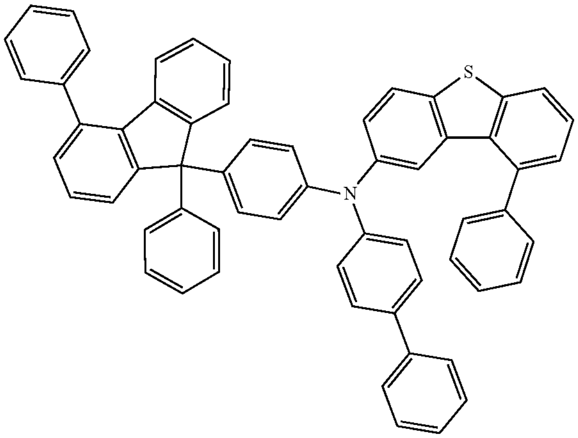
P2-76
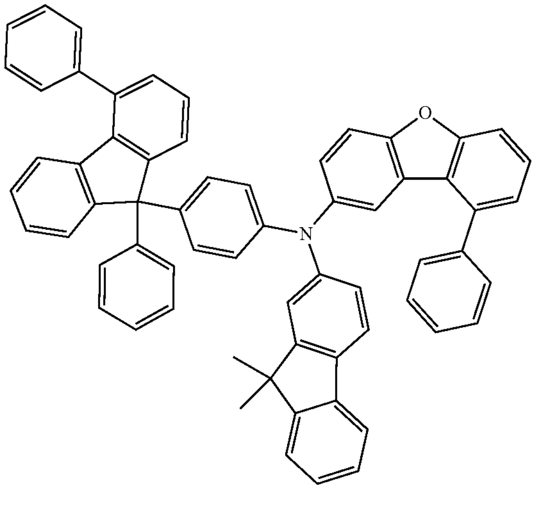
-continued
P2-77
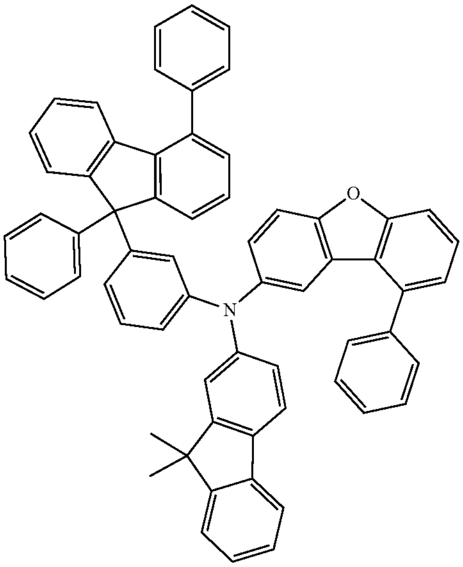
P2-78
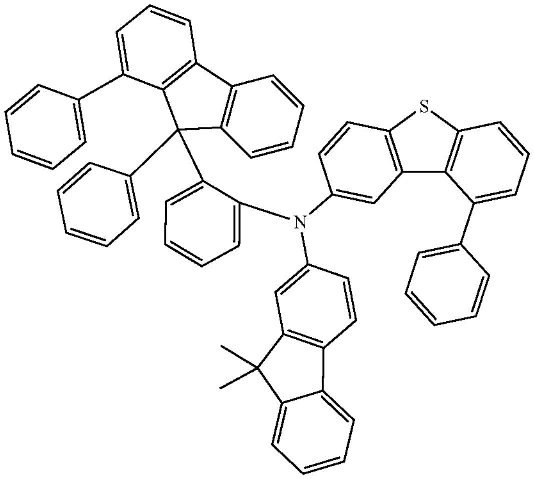
P2-79
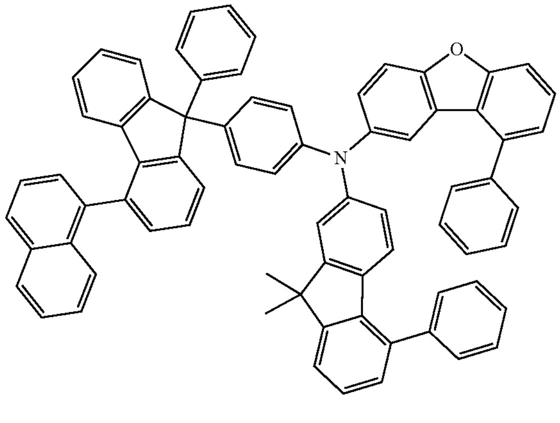

-continued
P2-80
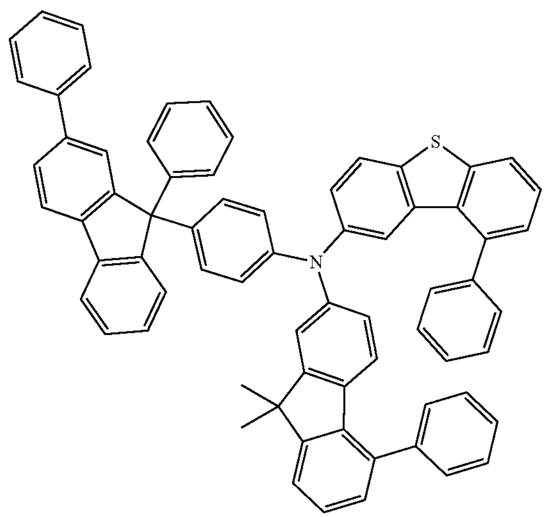
P2-81
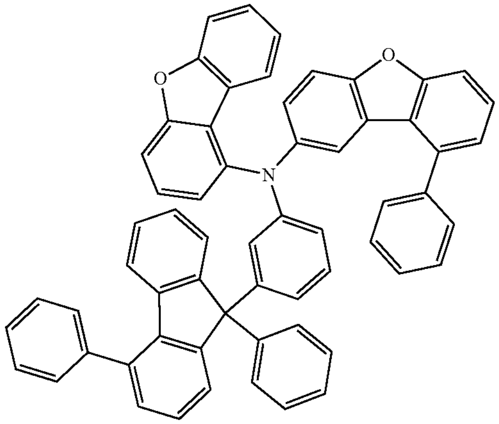
P2-82
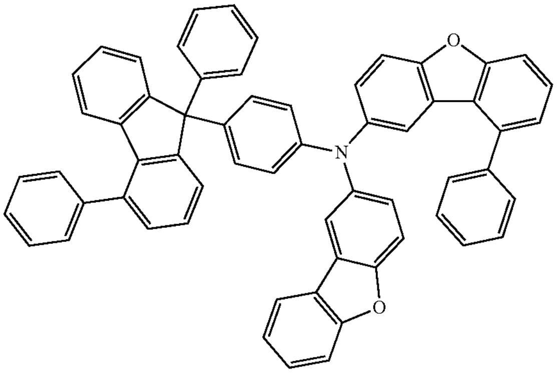
-continued
P2-83
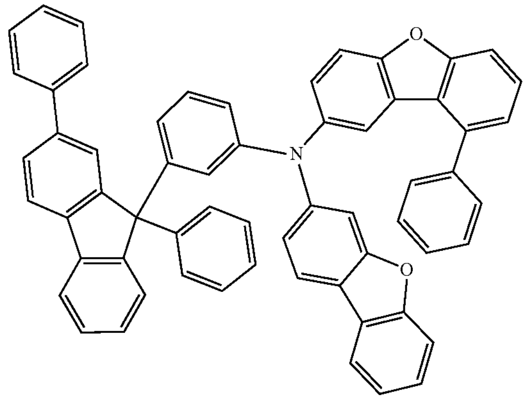
P2-84
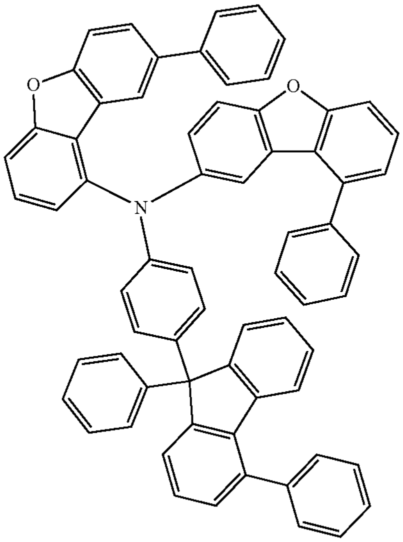
P2-85
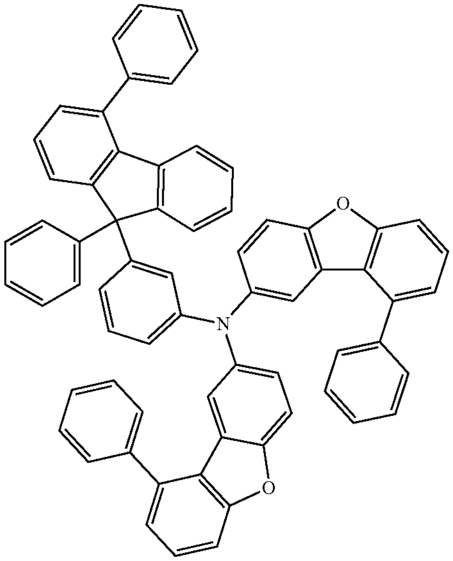

-continued
P2-86
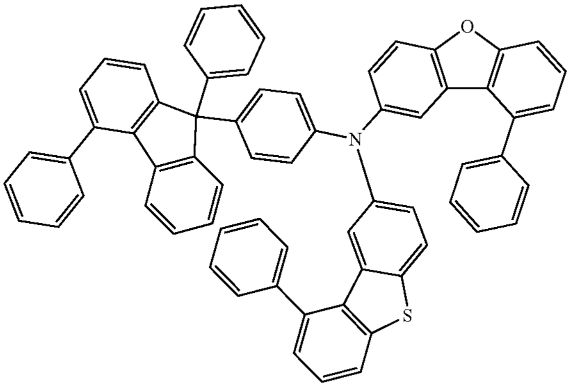
P2-87
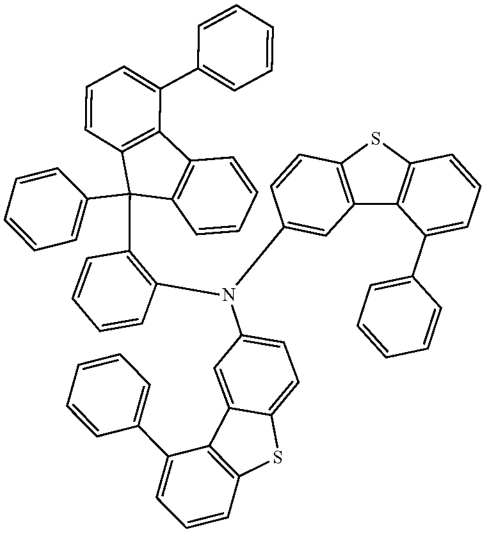
P2-88
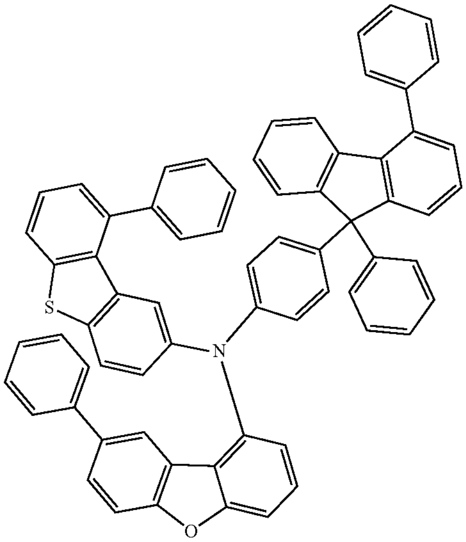
-continued
P2-89
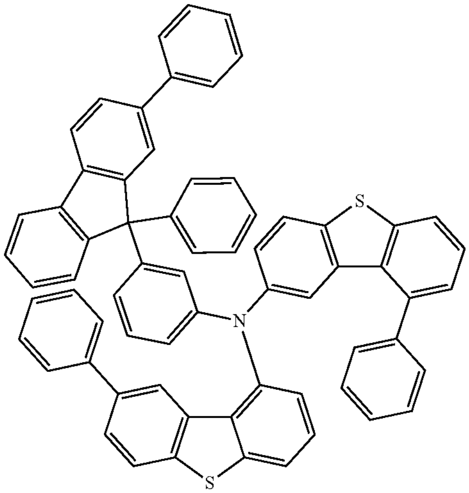
P2-90
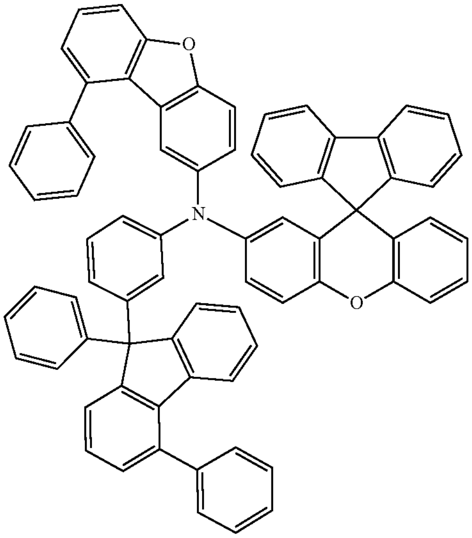
P2-91
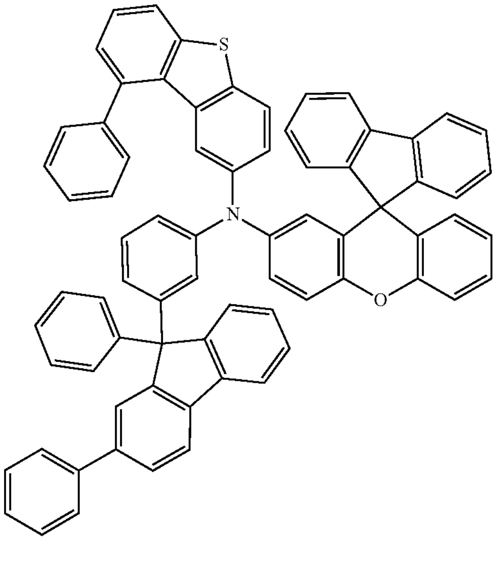

-continued
P2-92
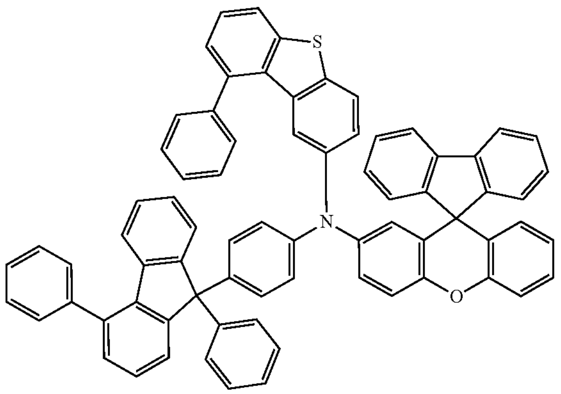
P2-93
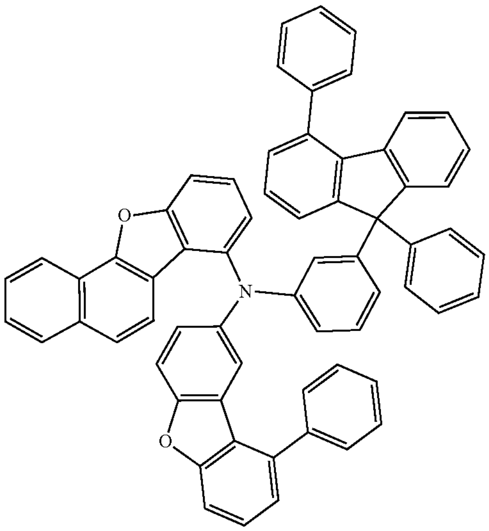
P2-94
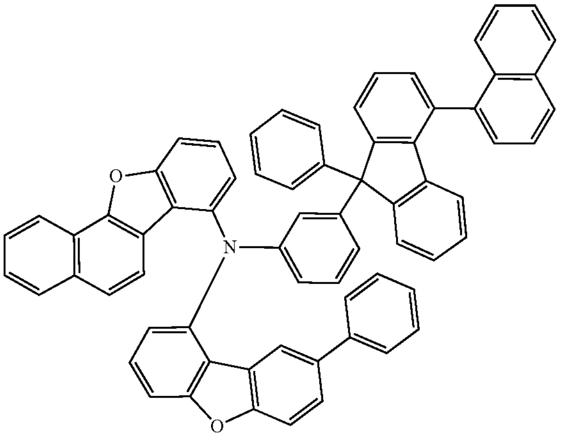
-continued
P2-95
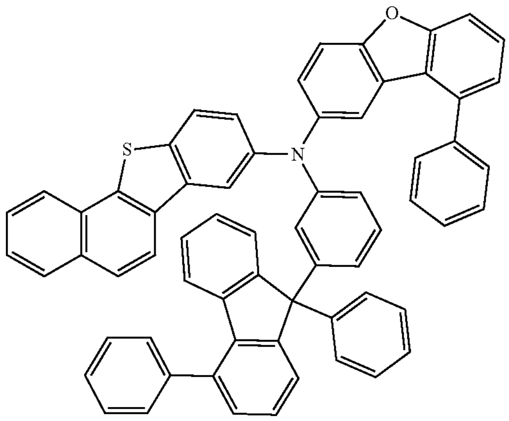
P2-96
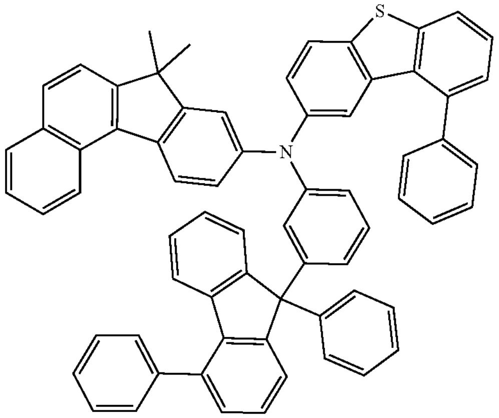
P2-97
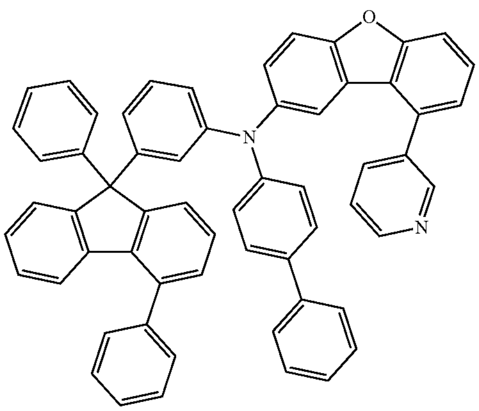

-continued
P2-98
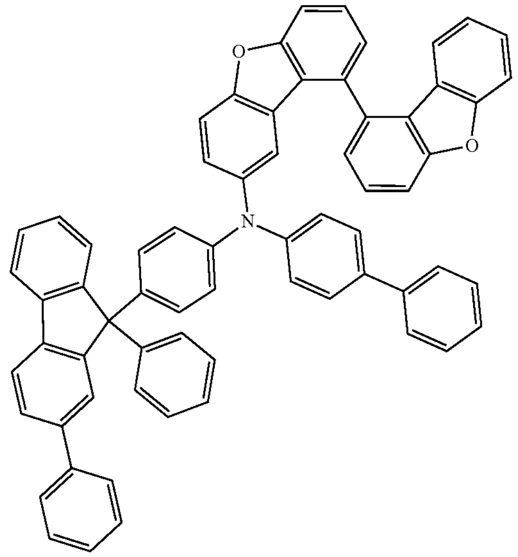
P2-99
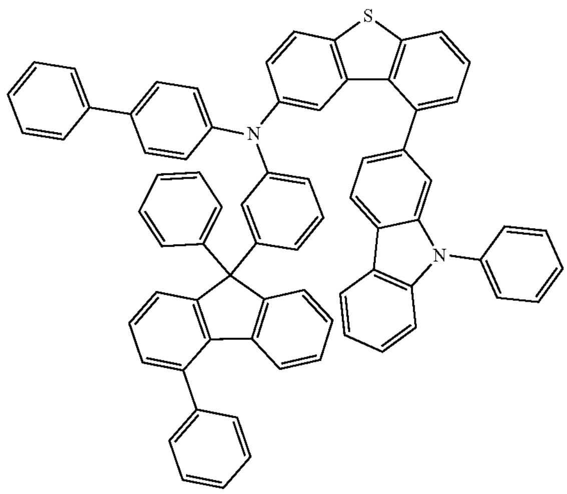
P2-100
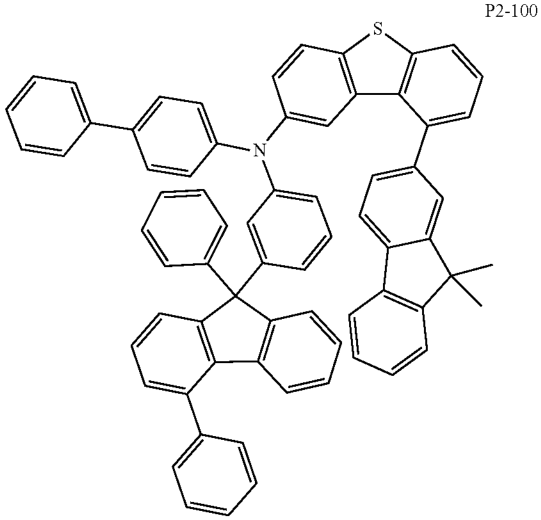
-continued
P2-101
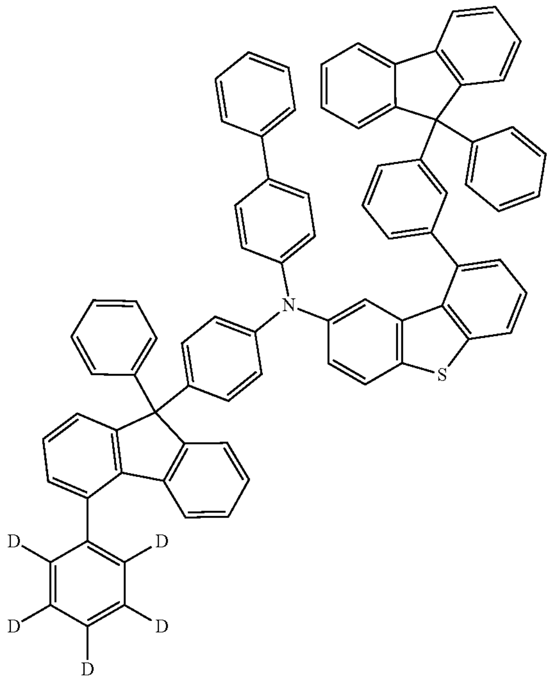
P2-102
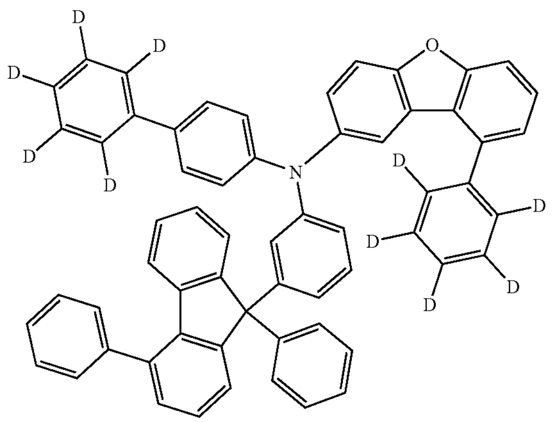

-continued
P2-103
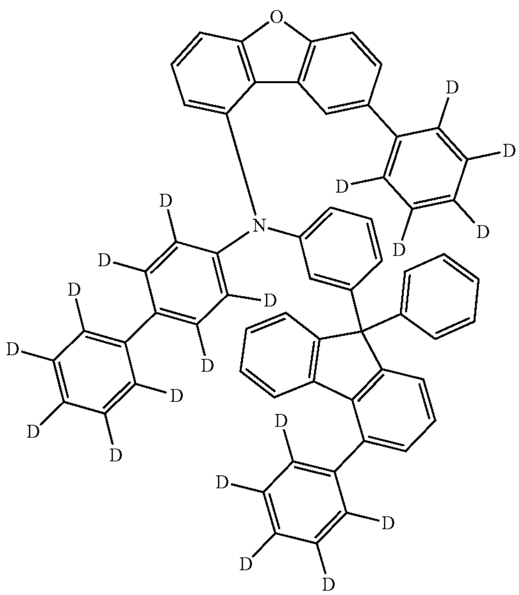
P2-104
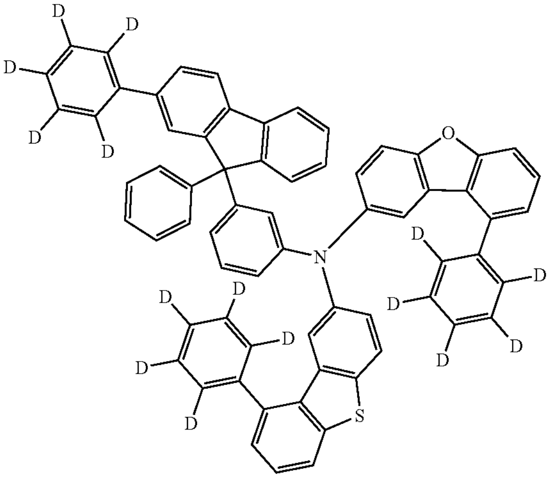
P2-105
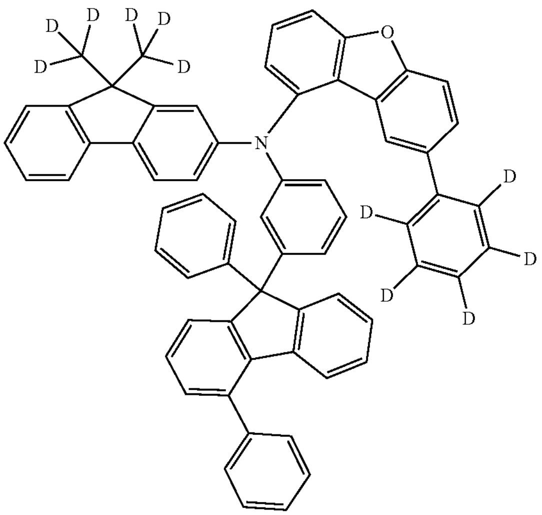
-continued
P2-106
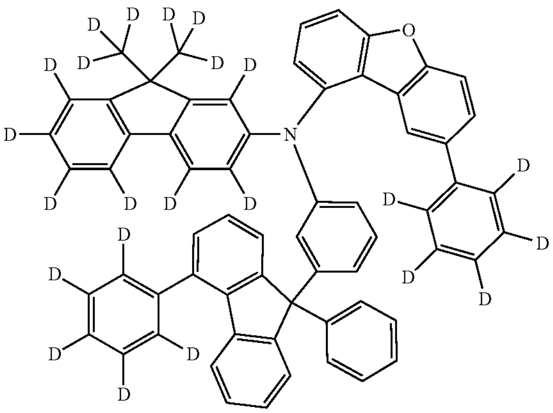
P2-107
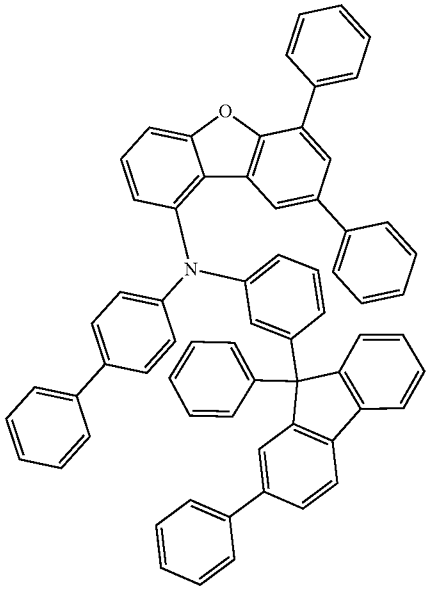
P2-108
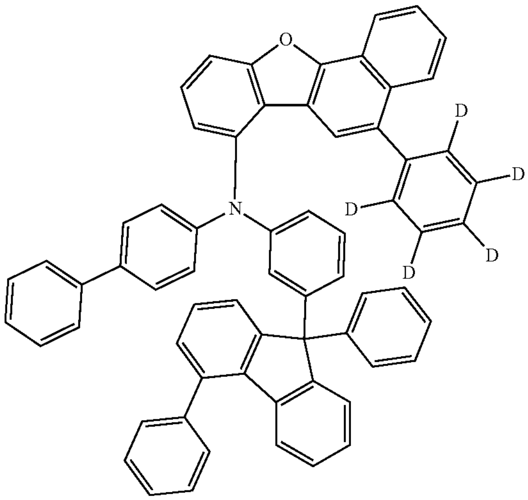

-continued
P3-1
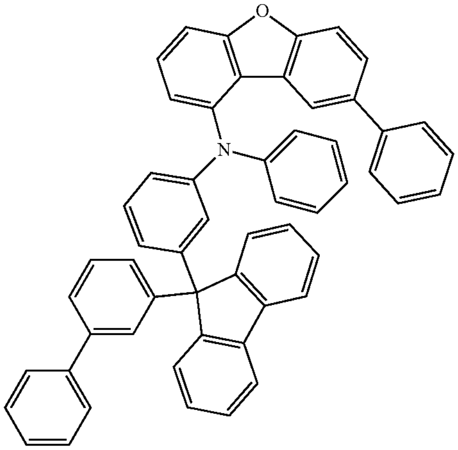
P3-2
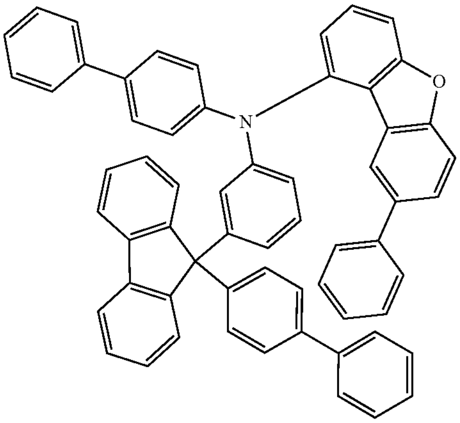
P3-3
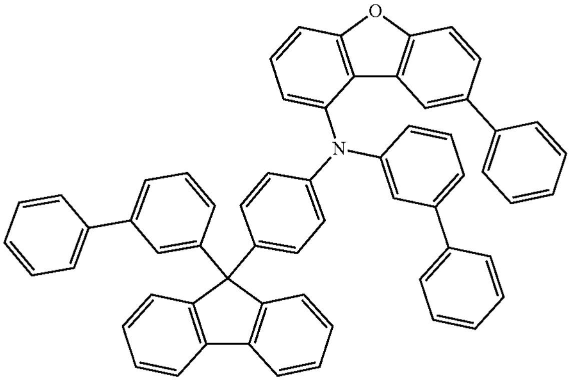
-continued
P3-4
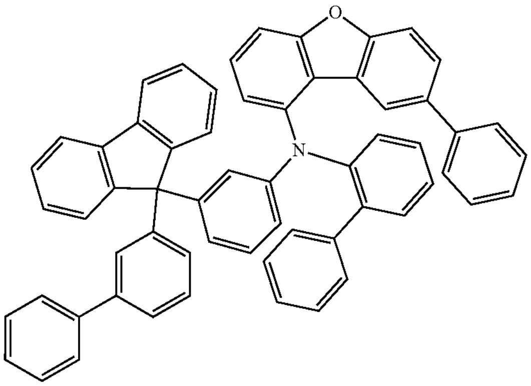
P3-5
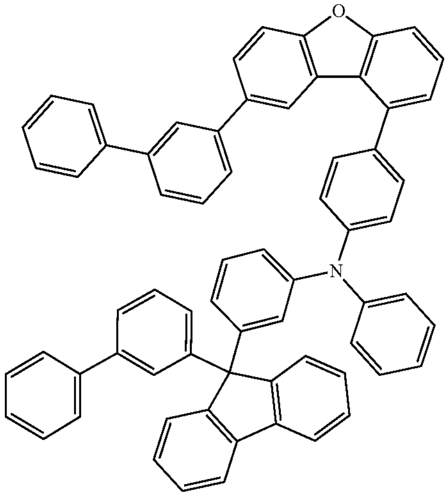
P3-6
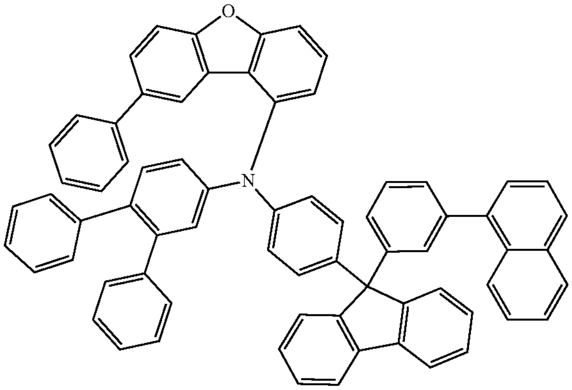

-continued
P3-7
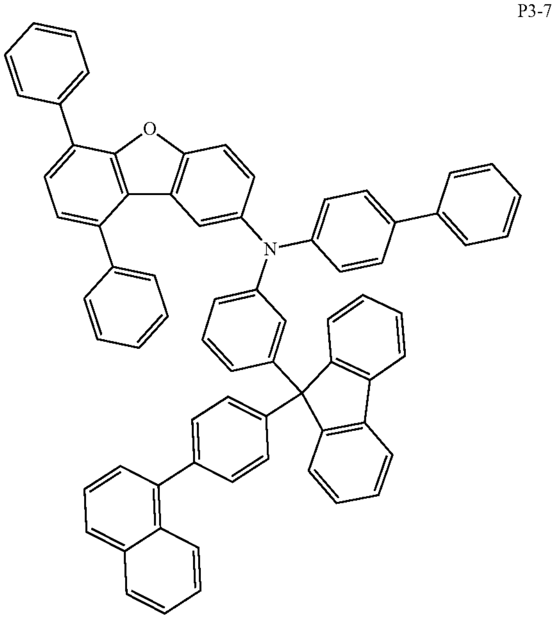
P3-8
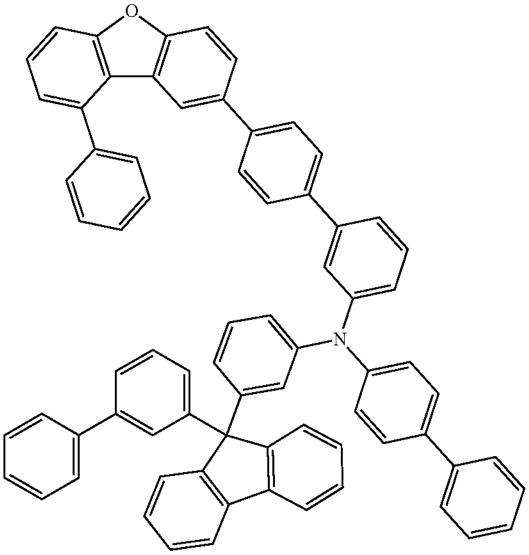
-continued
P3-9
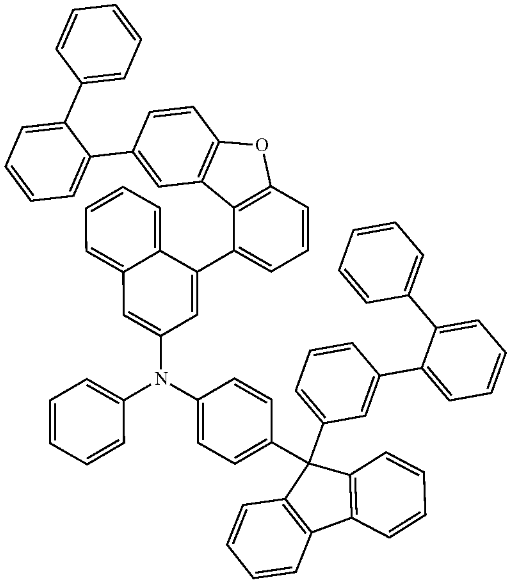
P3-10
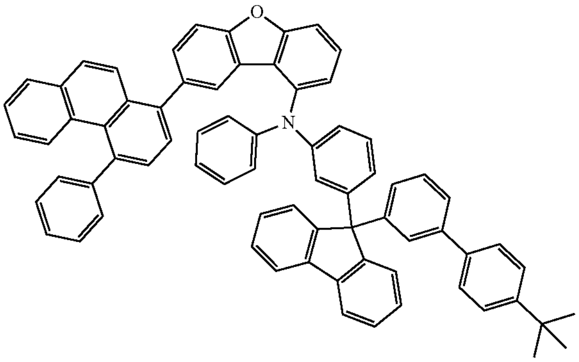
P3-11
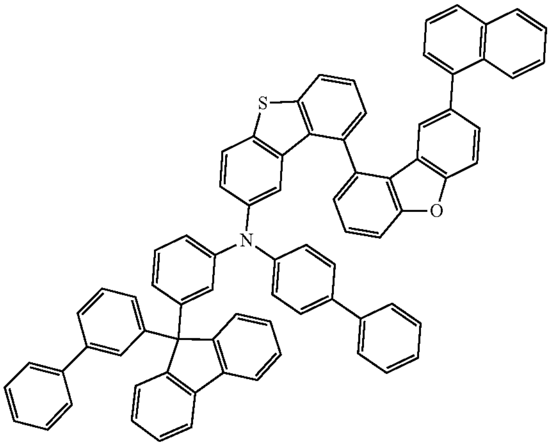

-continued
P3-12
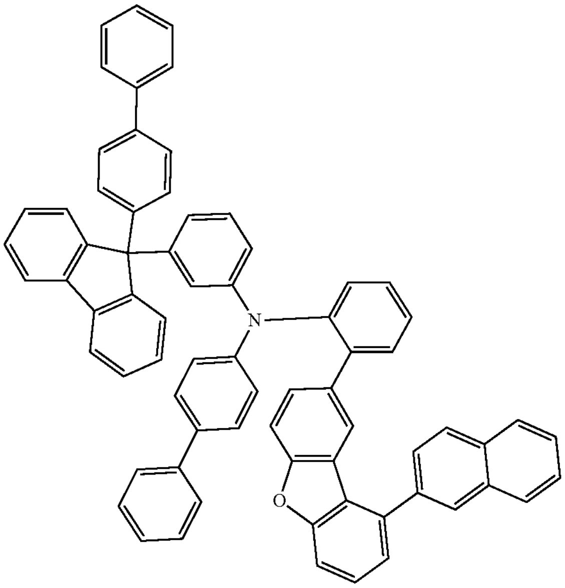
P3-13
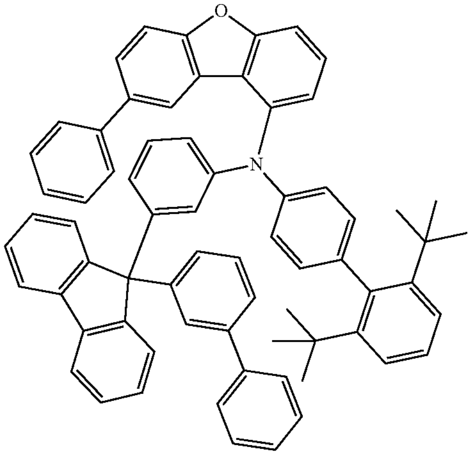
P3-14
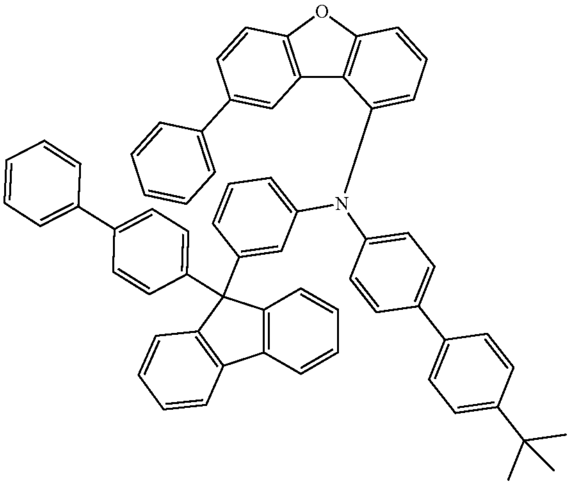
-continued
P3-15
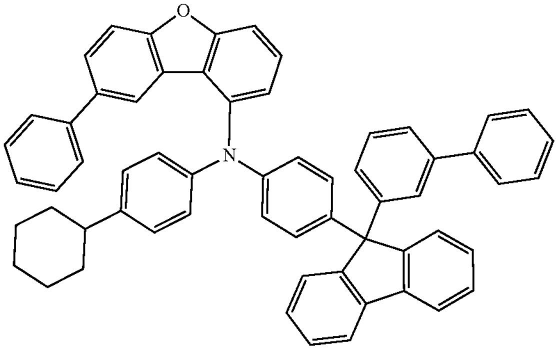
P3-16
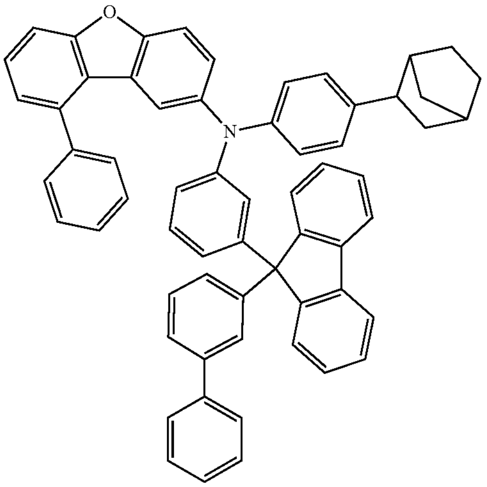
P3-17
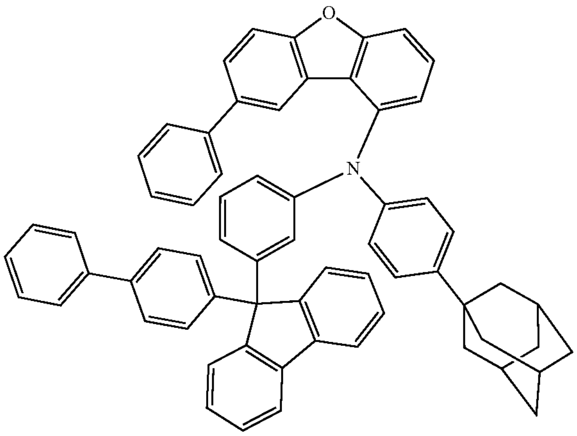

-continued
P3-18
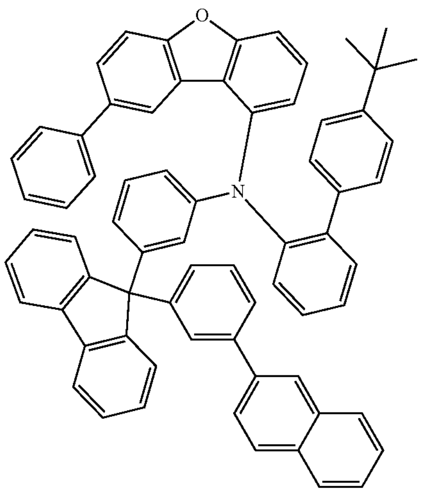
P3-19
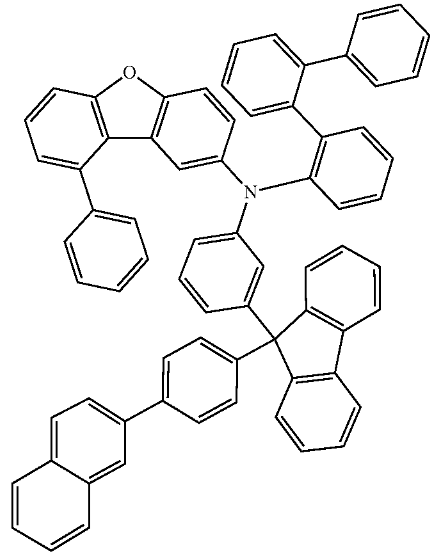
P3-20
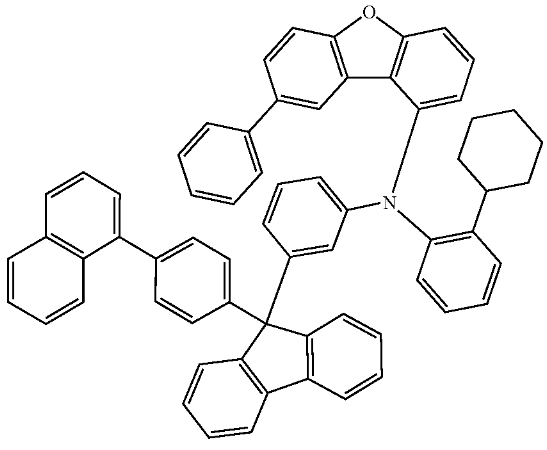
-continued
P3-21
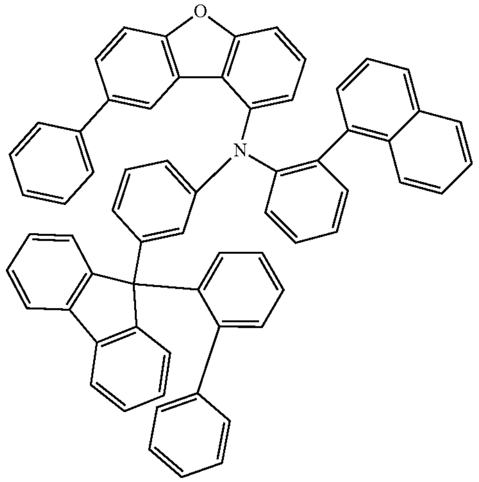
P3-22
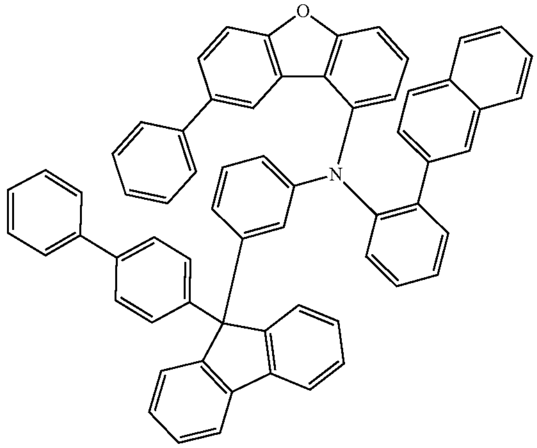
P3-23
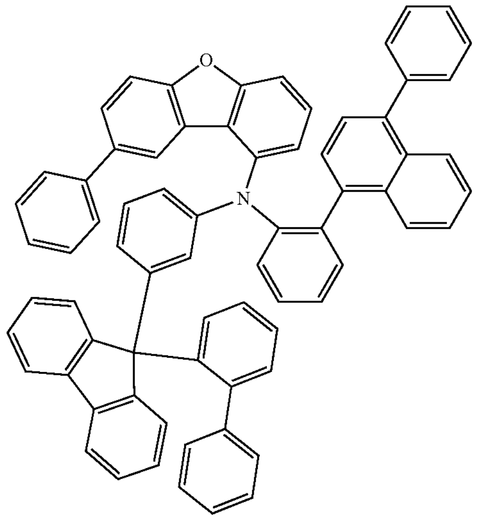

-continued
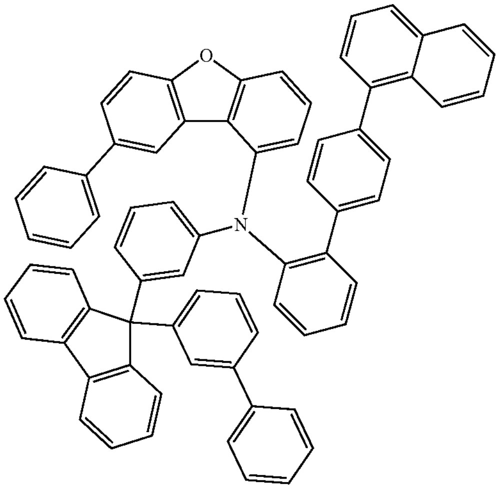
P3-24
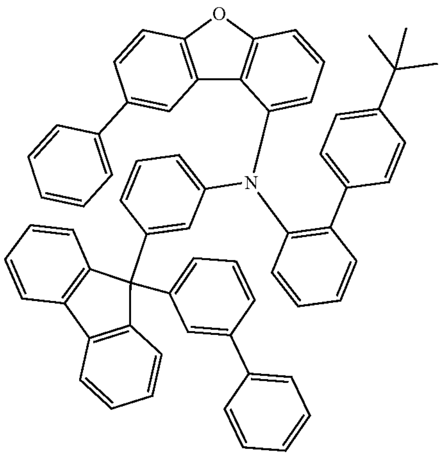
P3-25
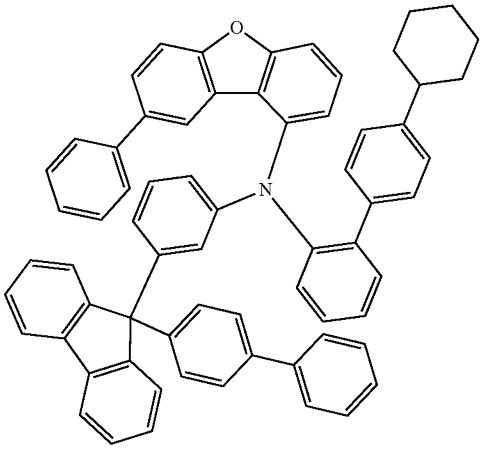
P3-26
-continued
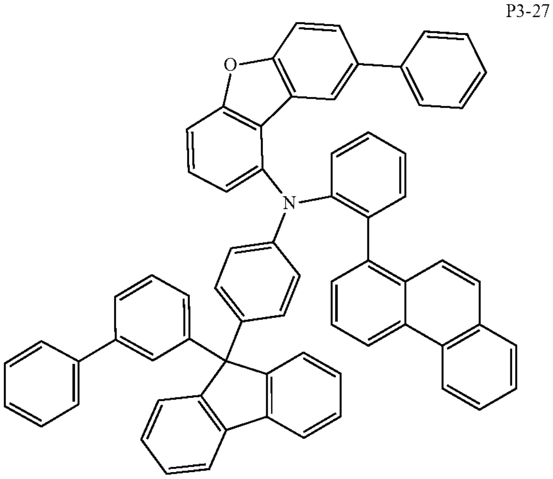
P3-27
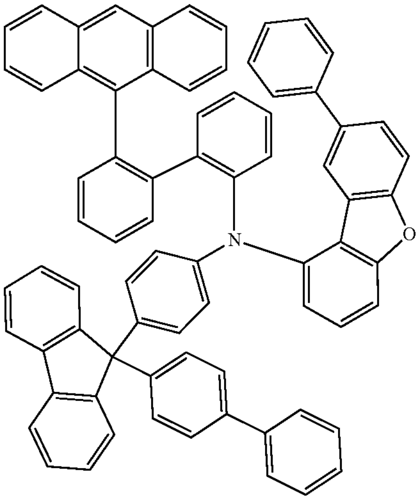
P3-28
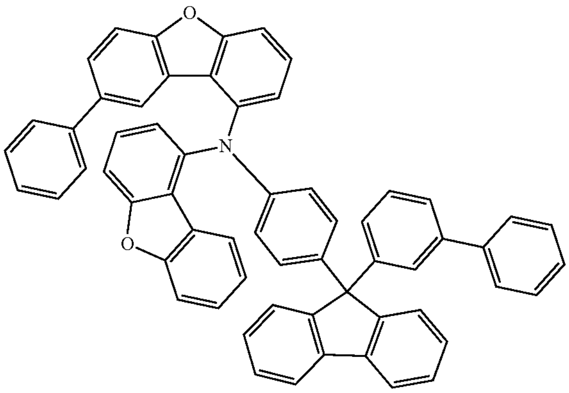
P3-29

-continued
P3-30
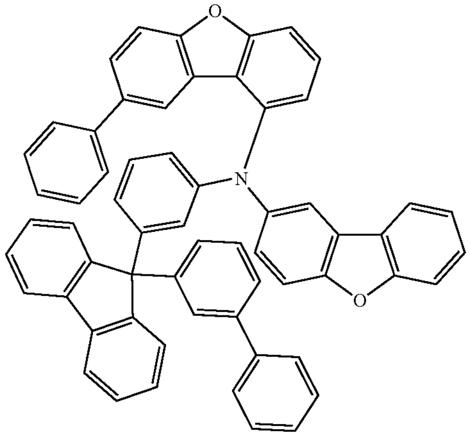
P3-31
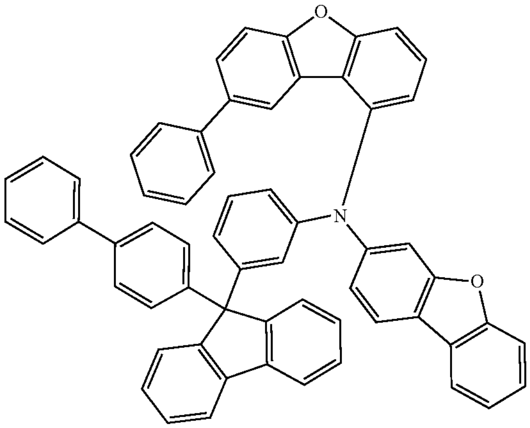
P3-32
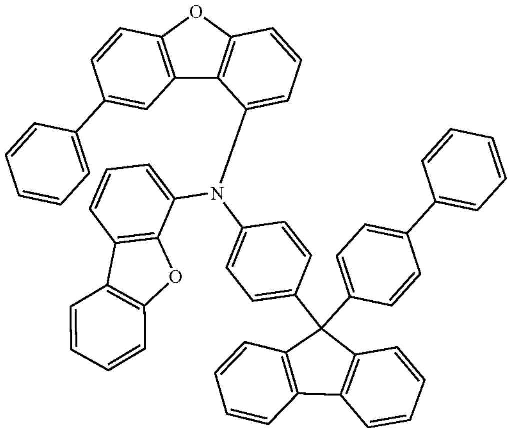
-continued
P3-33
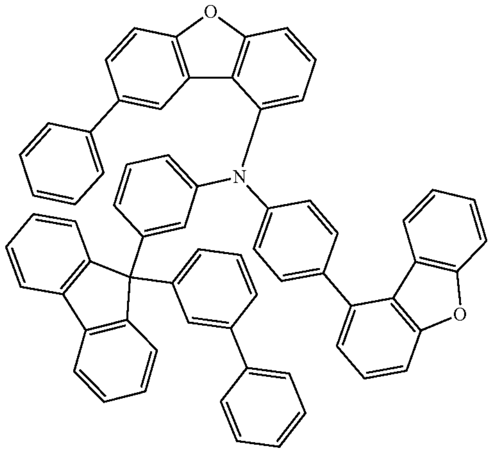
P3-34
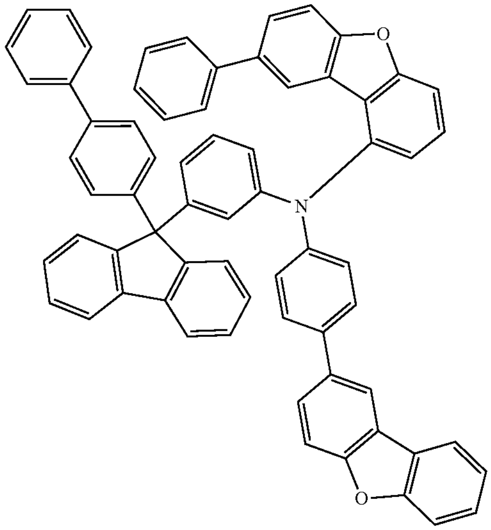
P3-35
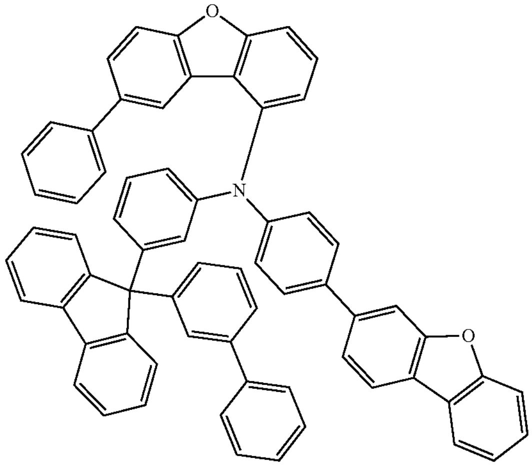

-continued
P3-36
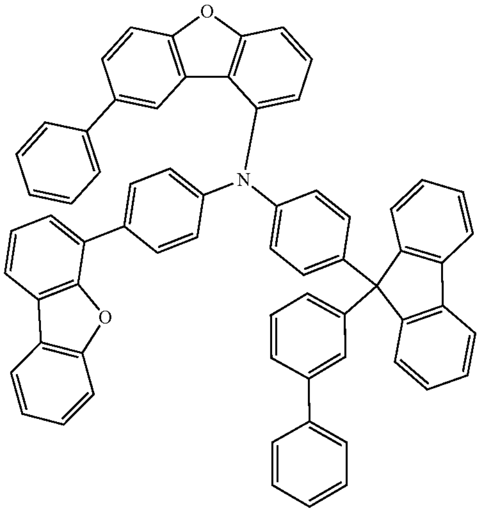
P3-37
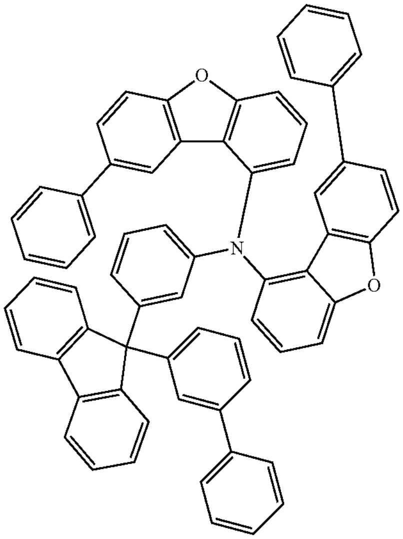
P3-38
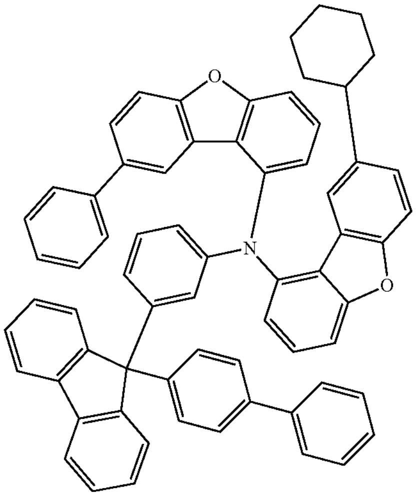
-continued
P3-39
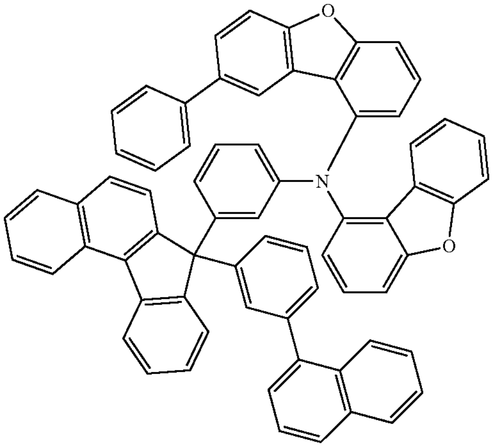
P3-40
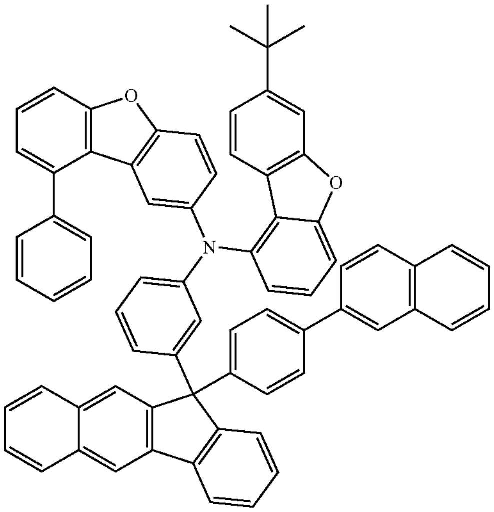
P3-41
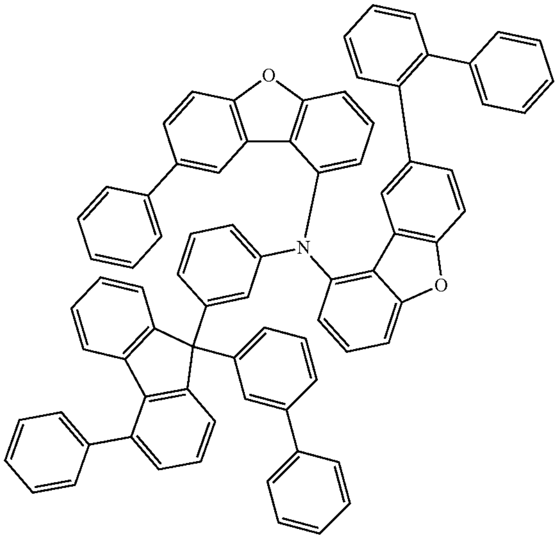

-continued
P3-42
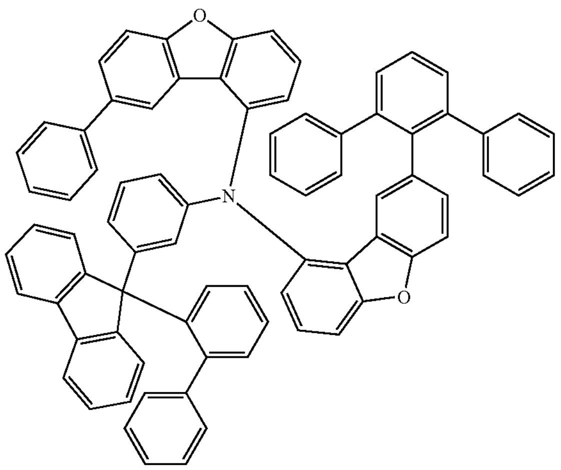
P3-43
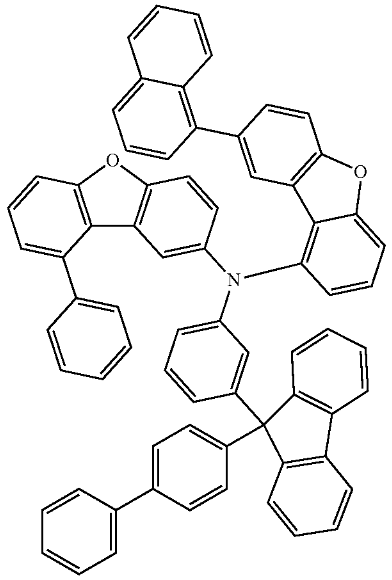
-continued
P3-44
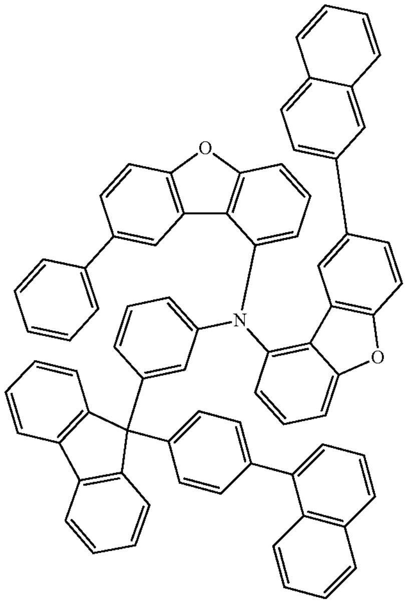
P3-45
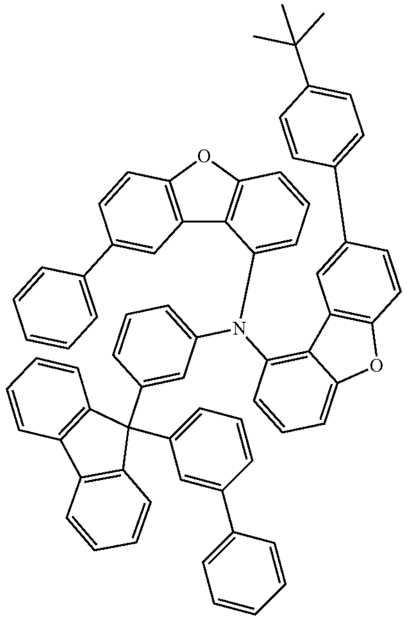

-continued
P3-46
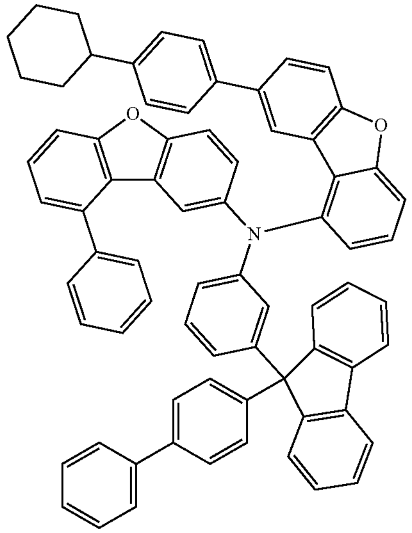
P3-47
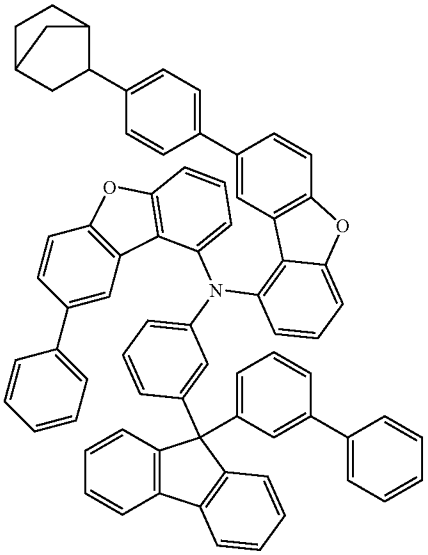
-continued
P3-48
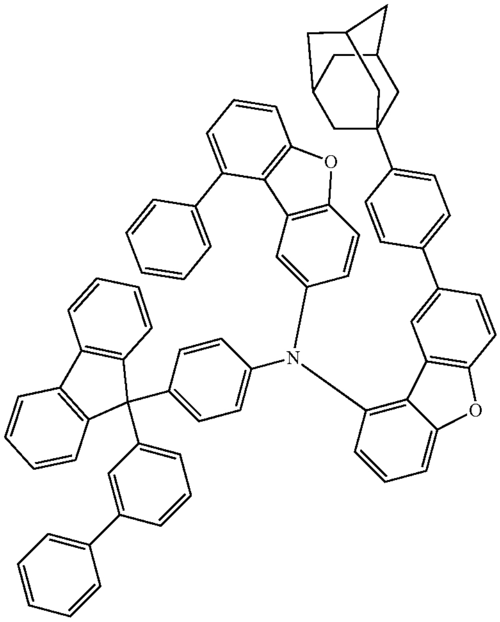
P3-49
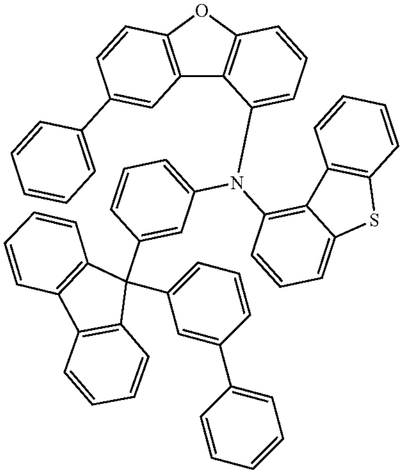
P3-50
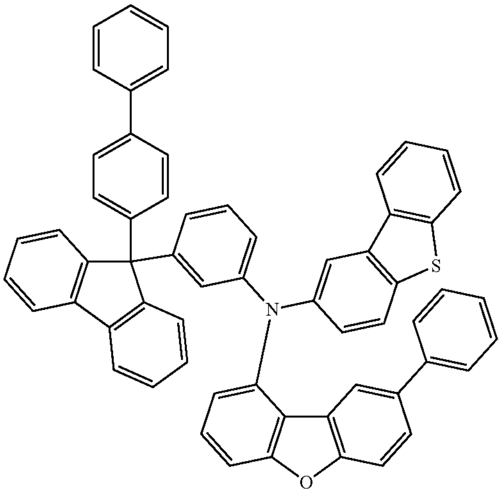

-continued
P3-51
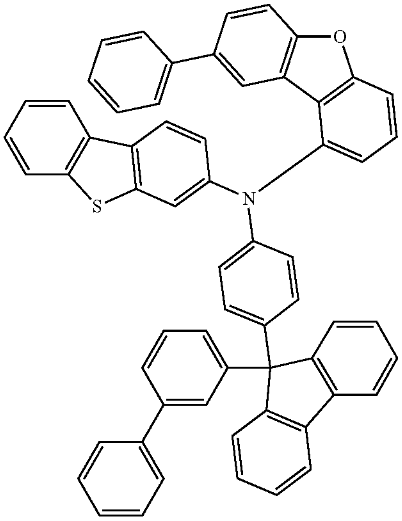
P3-52
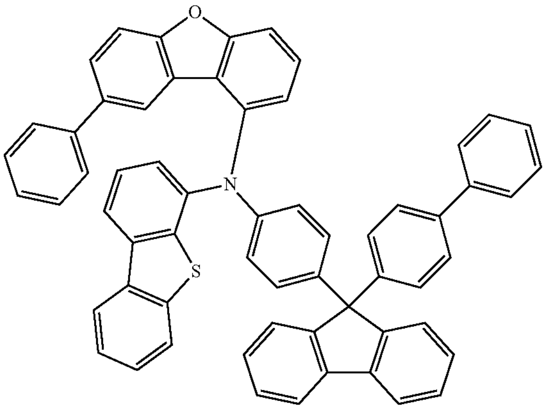
P3-53
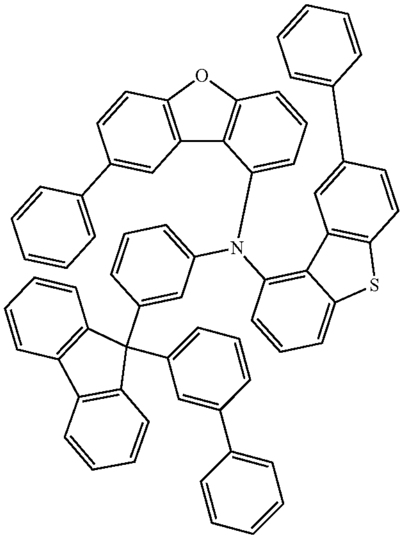
-continued
P3-54
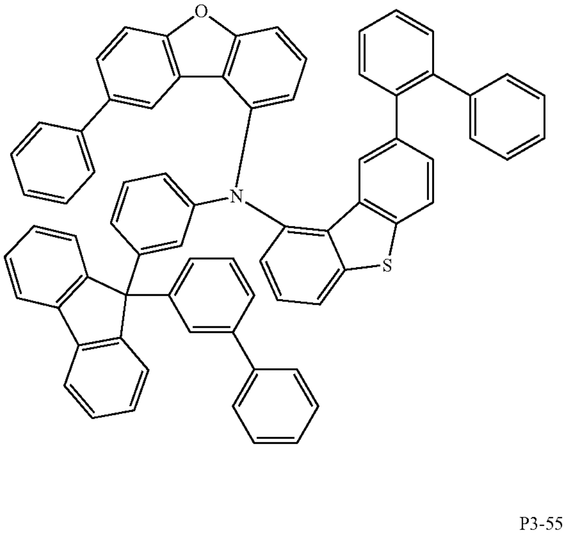
P3-55
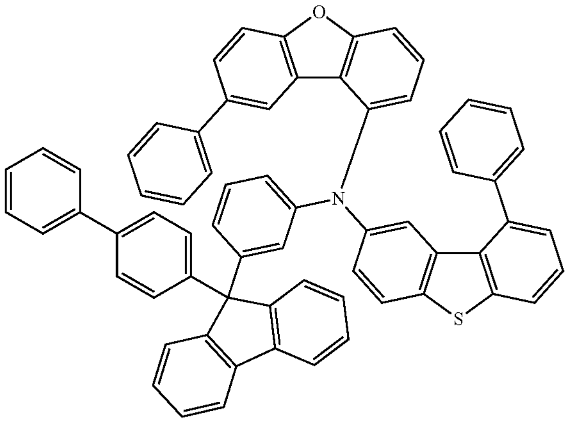
P3-56
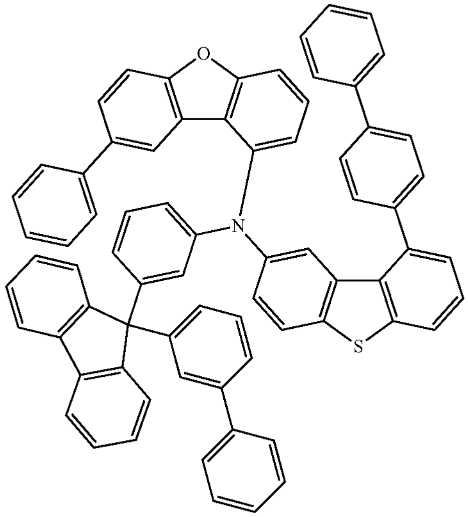

-continued
P3-57
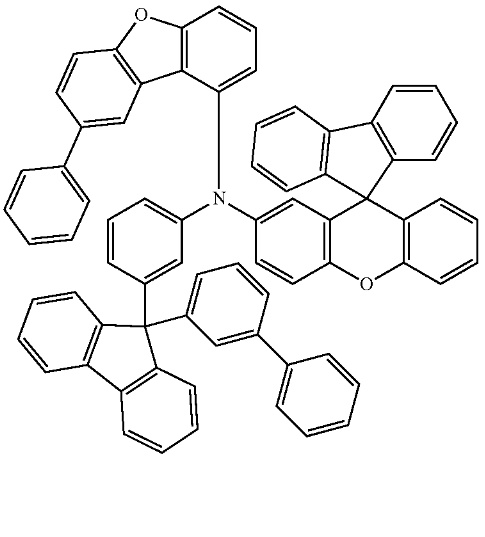
P3-58
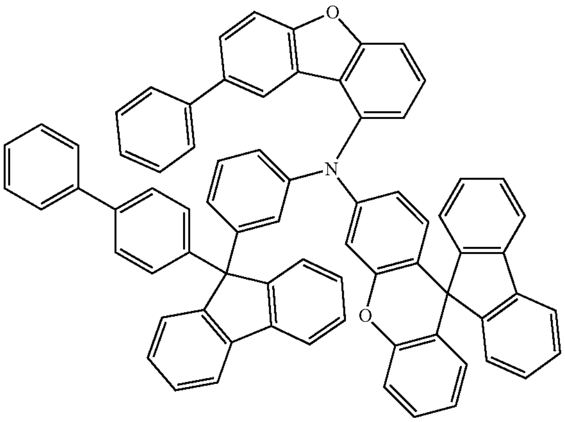
P3-59
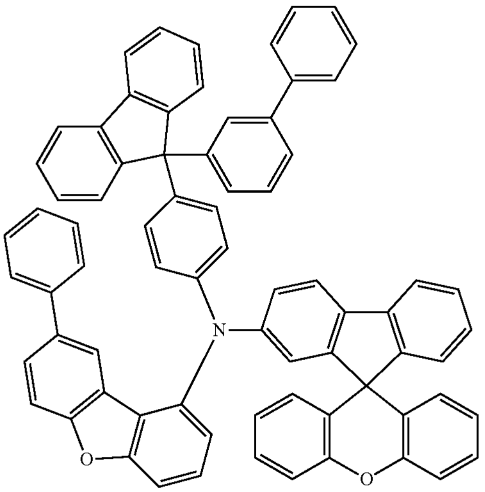
-continued
P3-60
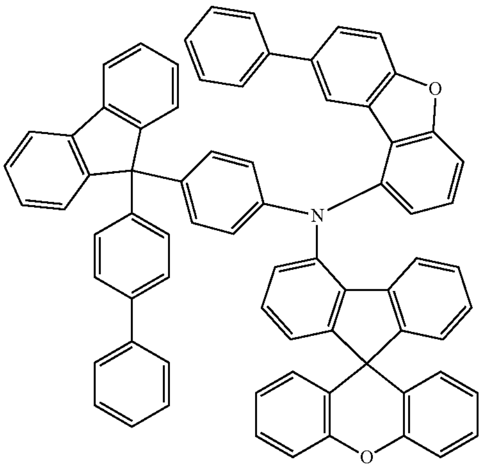
P3-61
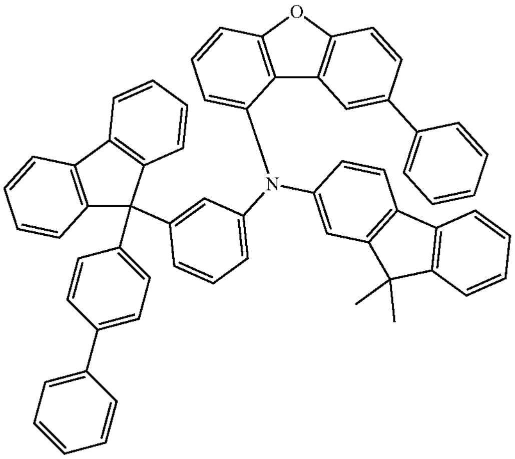
P3-62
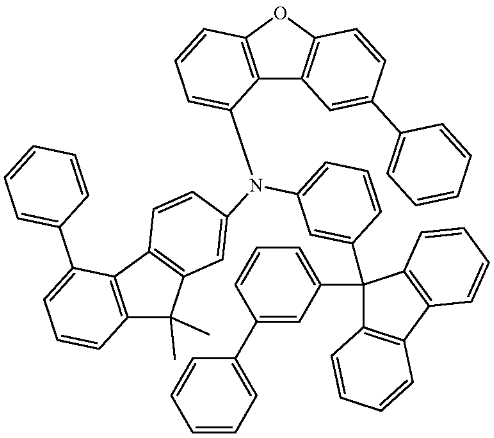

-continued
P3-63
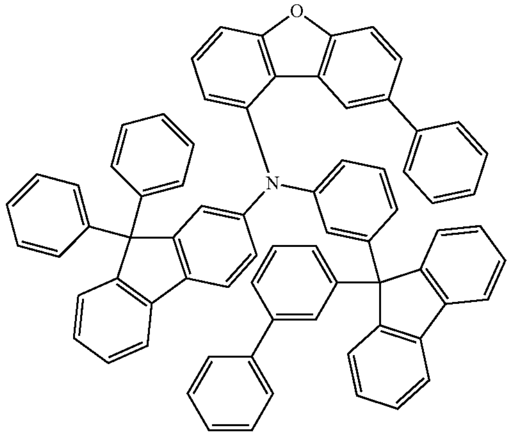
P3-64
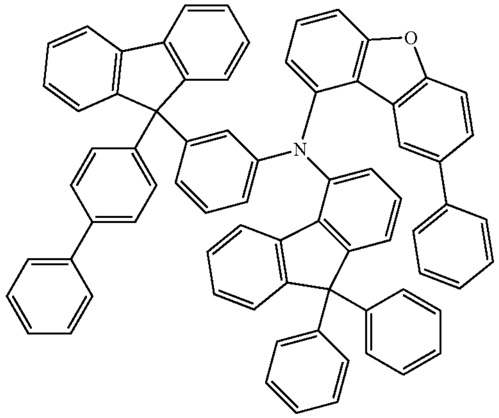
P3-65
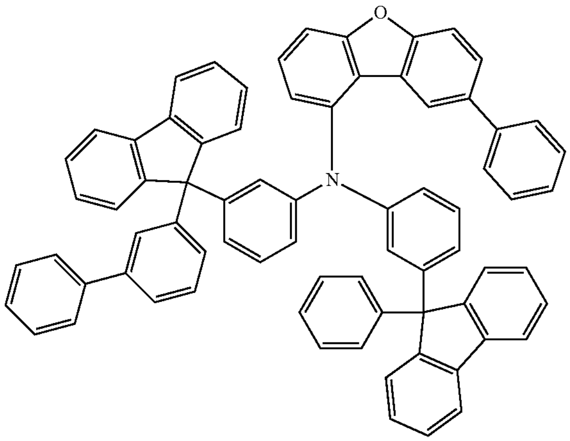
-continued
P3-66
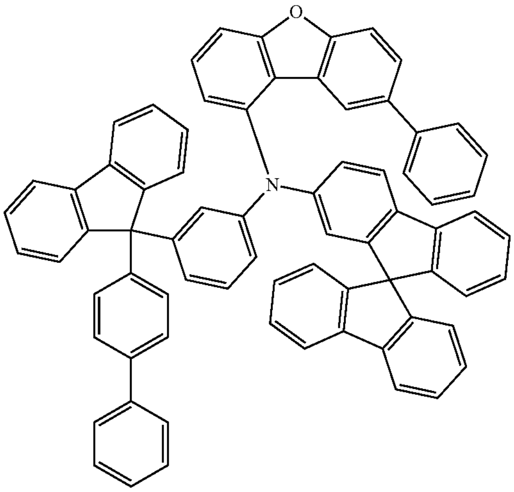
P3-67
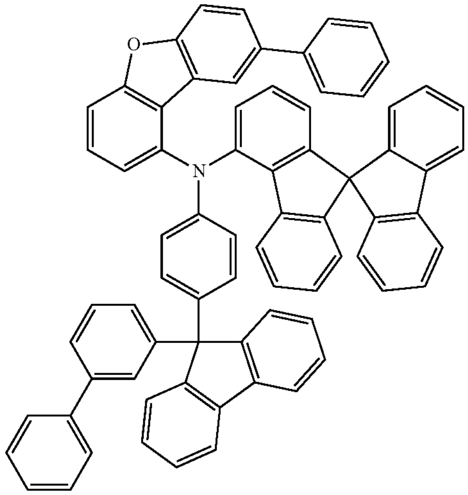
P3-68
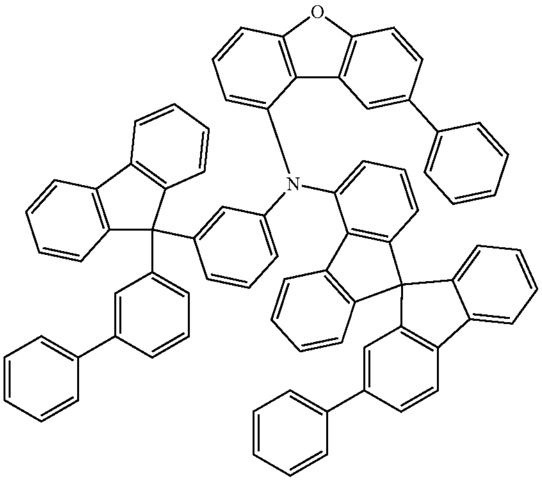

-continued
P3-69
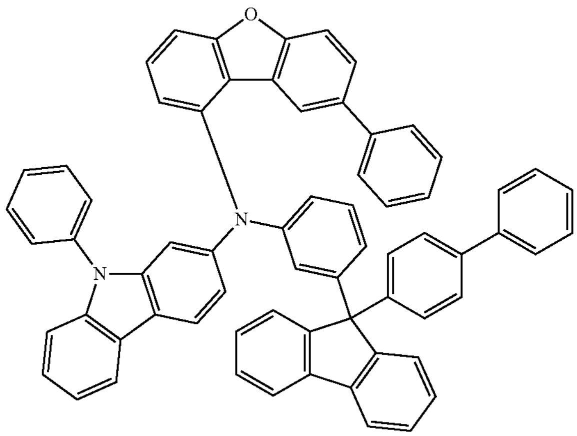
P3-70
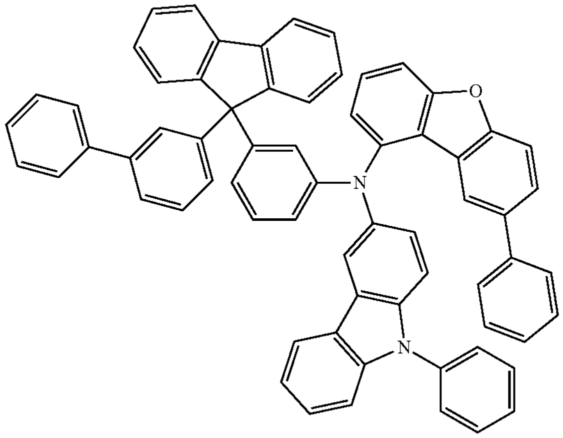
P3-71
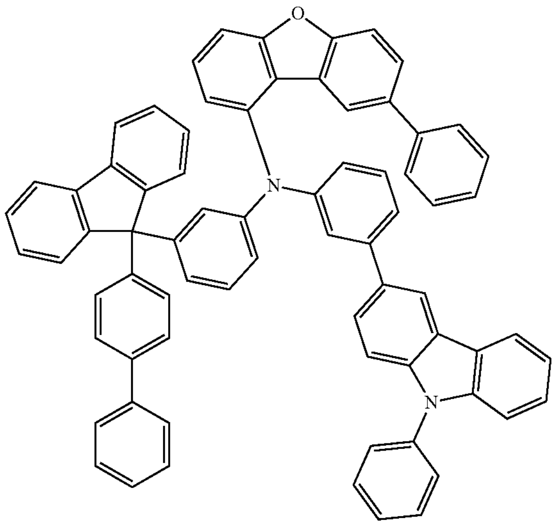
-continued
P3-72
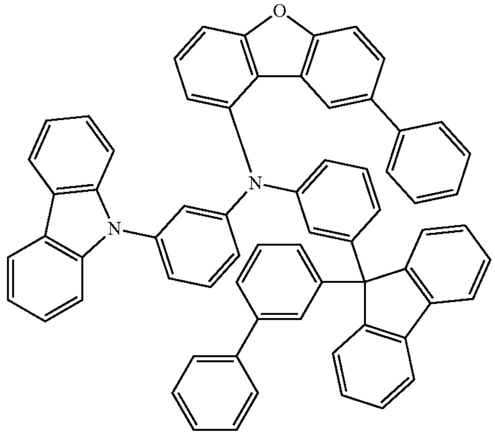
P3-73
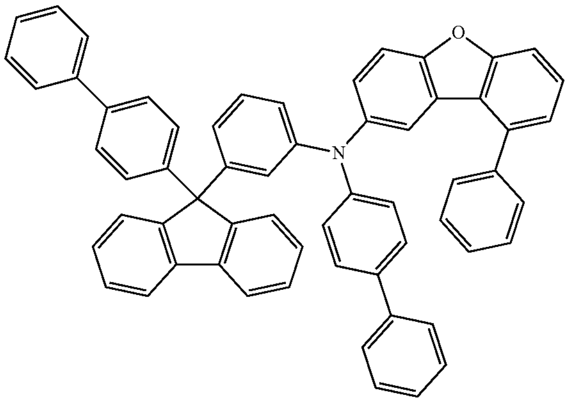
P3-74
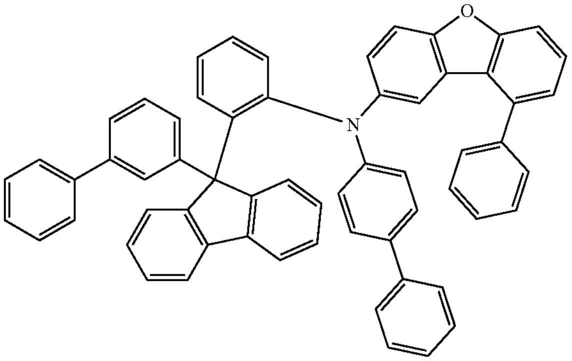

-continued
P3-75
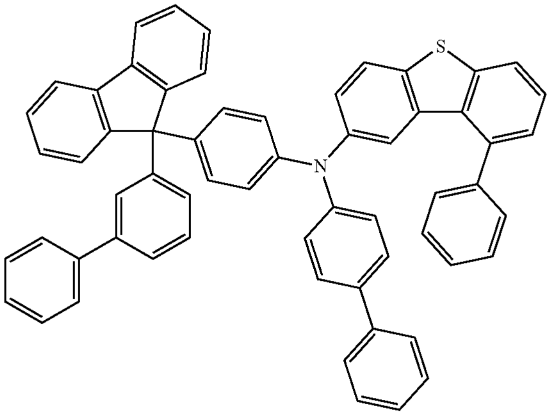
P3-76
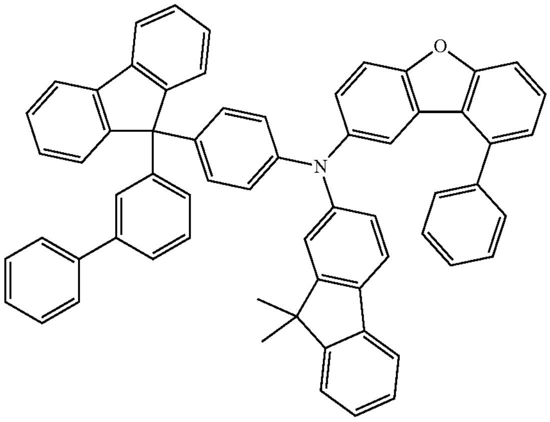
P3-77
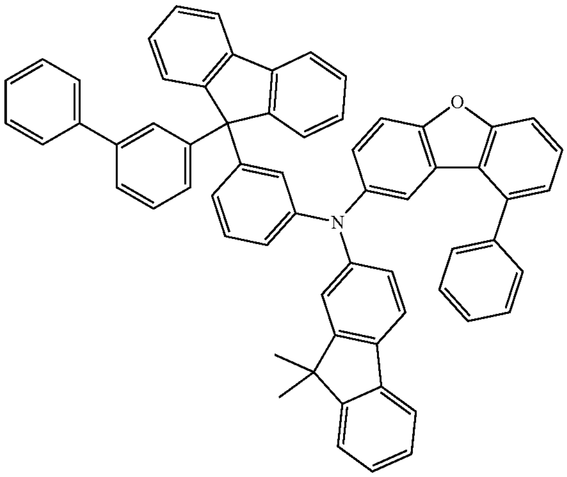
-continued
P3-78
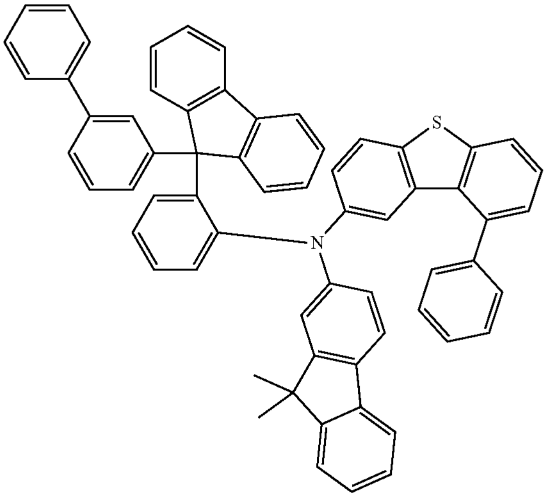
P3-79
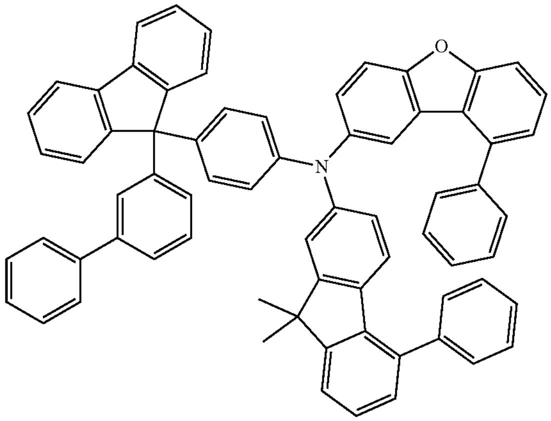
P3-80
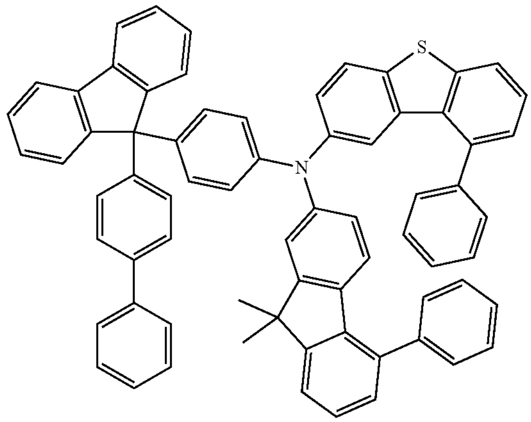

P3-81
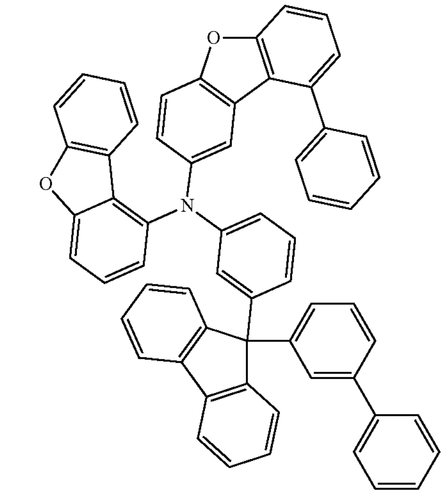
P3-82
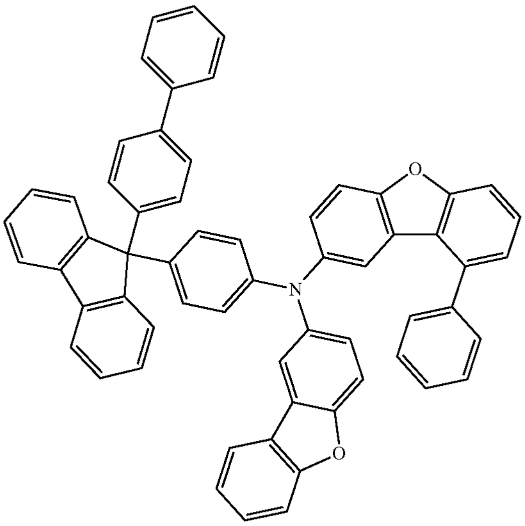
P3-83
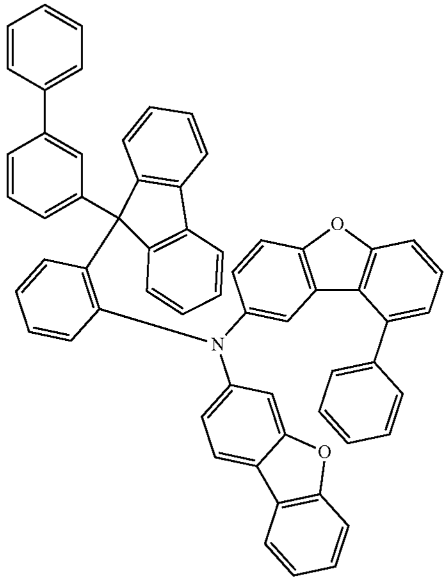
P3-84
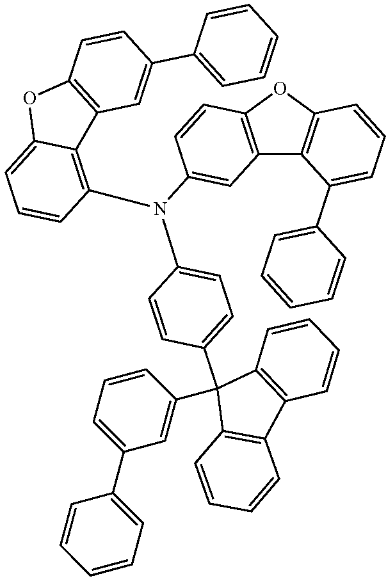
P3-85
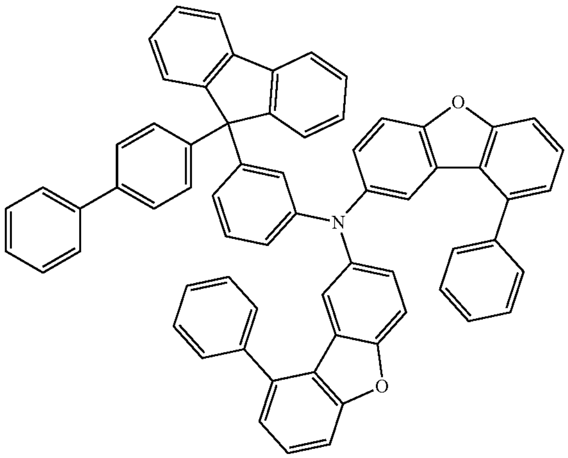
P3-86
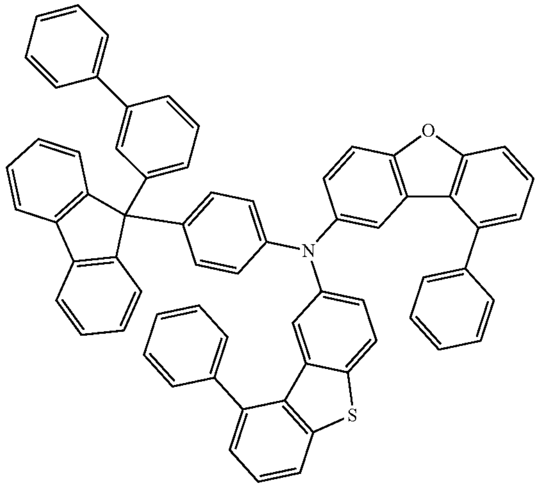

-continued
P3-87
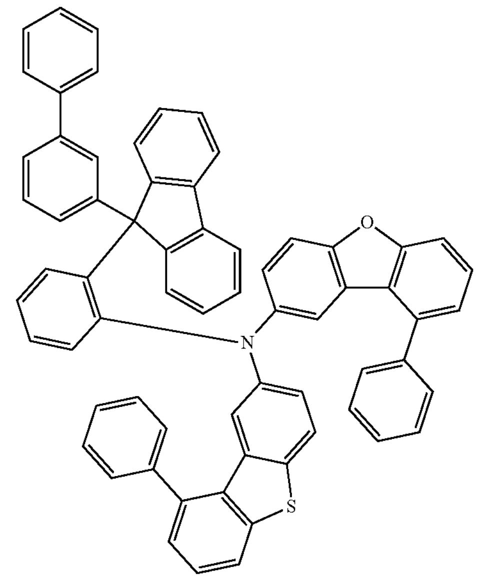
P3-88
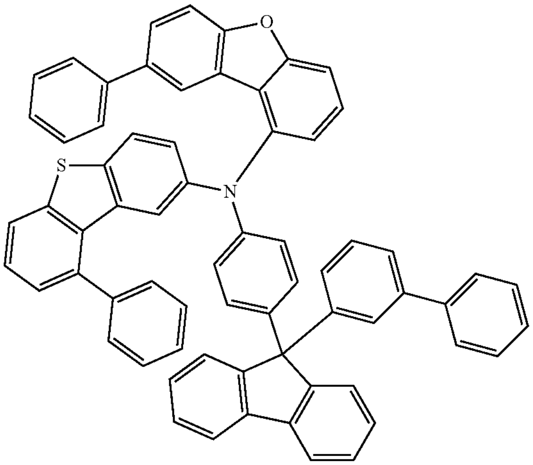
P3-89
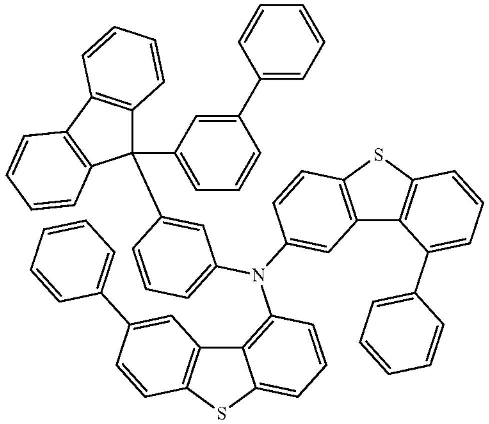
-continued
P3-90
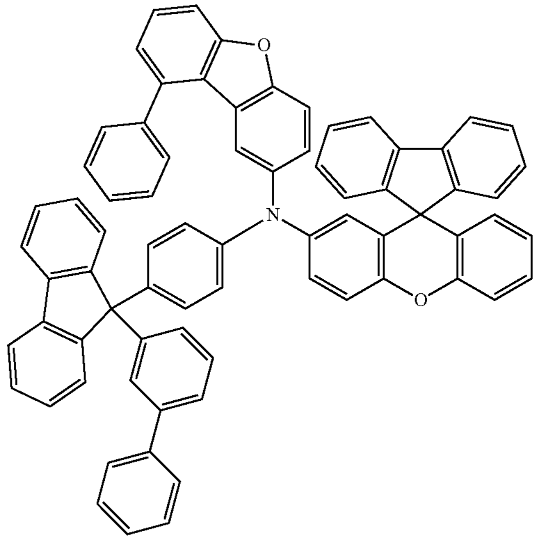
P3-91
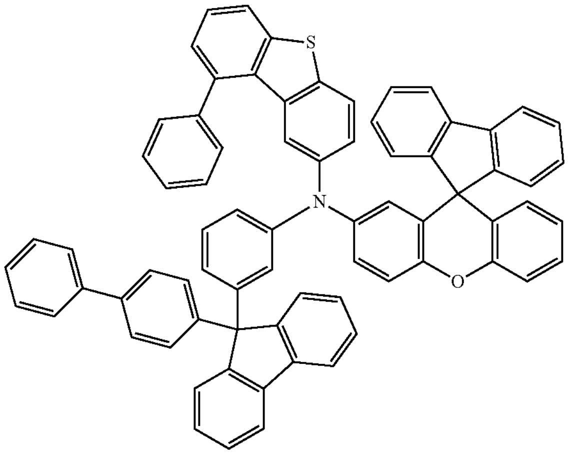
P3-92
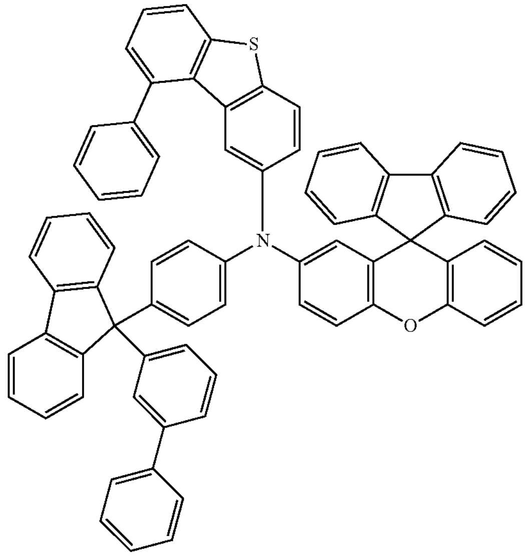

-continued
P3-93
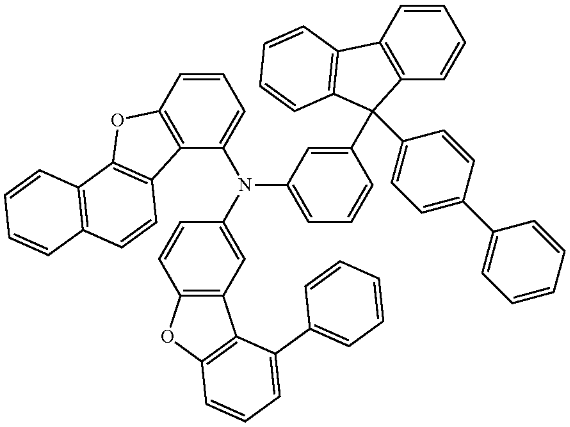
P3-94
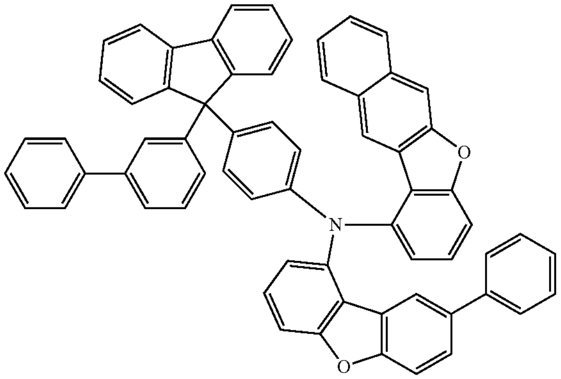
P3-95
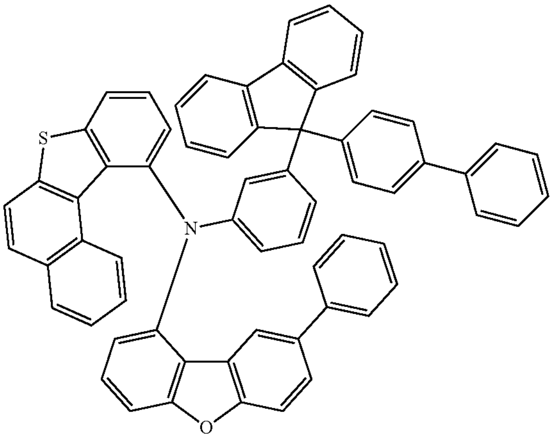
-continued
P3-96
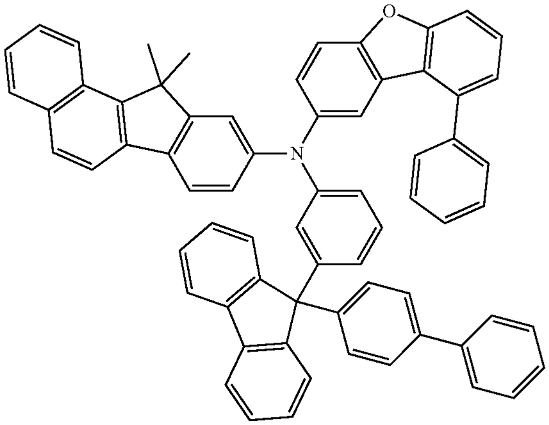
P3-97
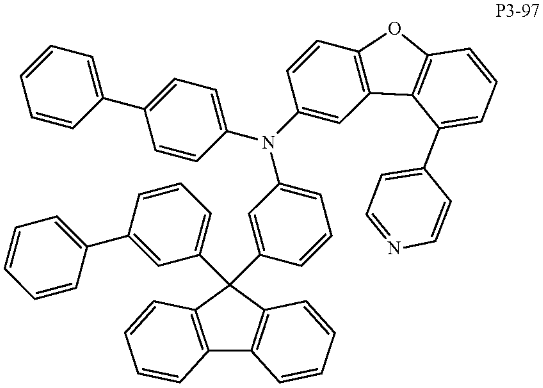
P3-98
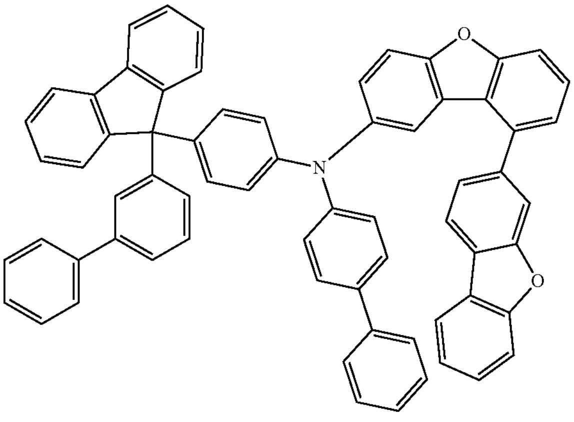

-continued
P3-99
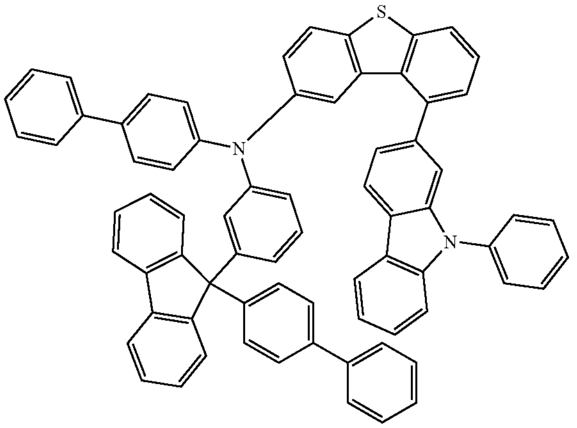
P3-100
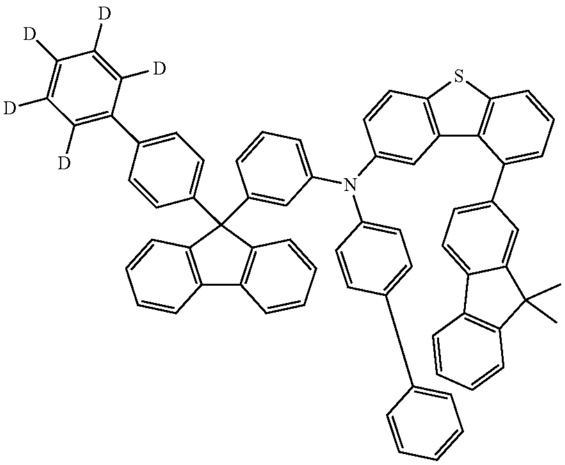
P3-101
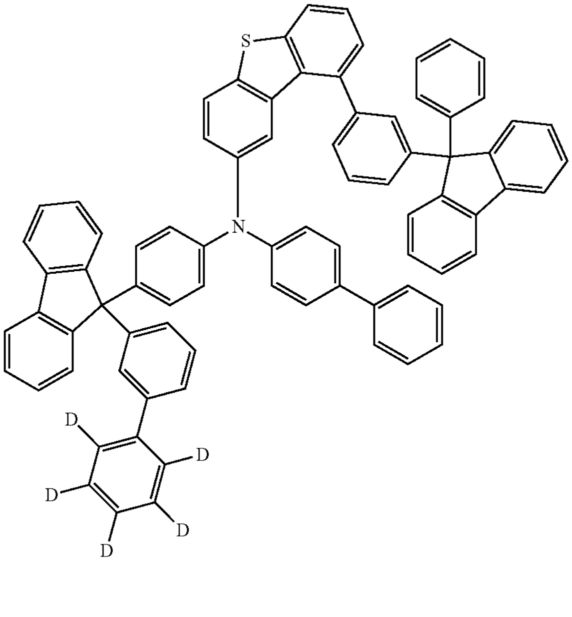
-continued
P3-102
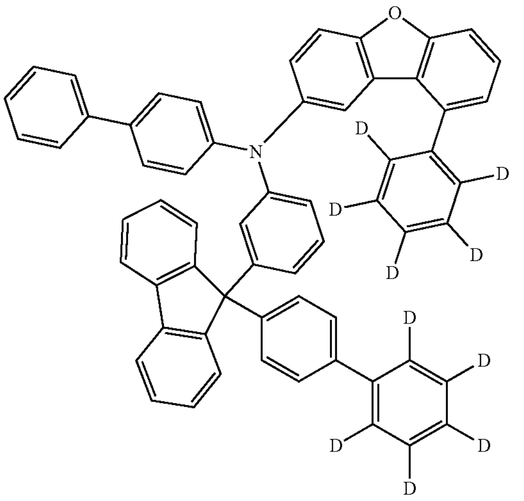
P3-103
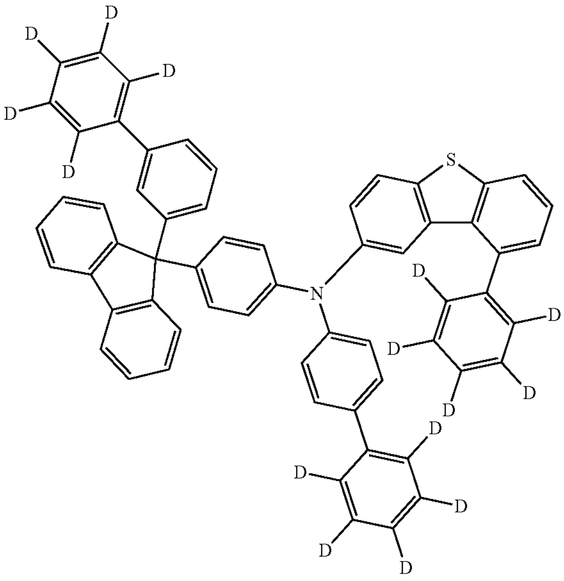
P3-104
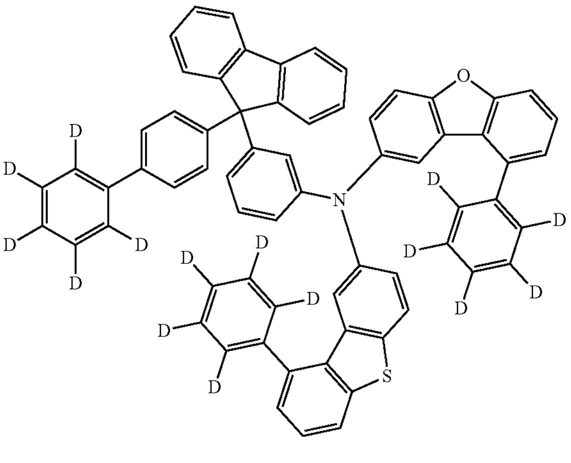

-continued

P3-105

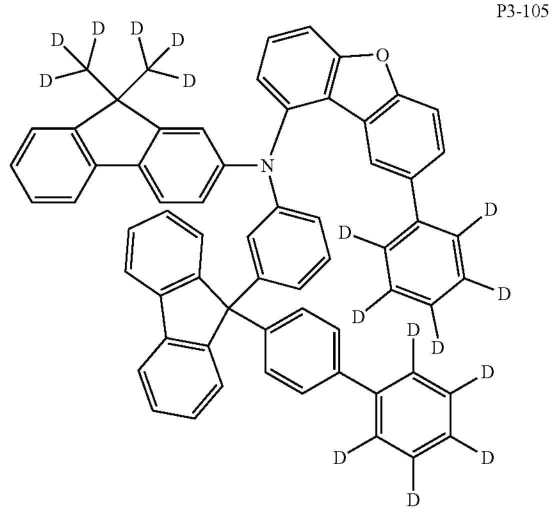

P3-106

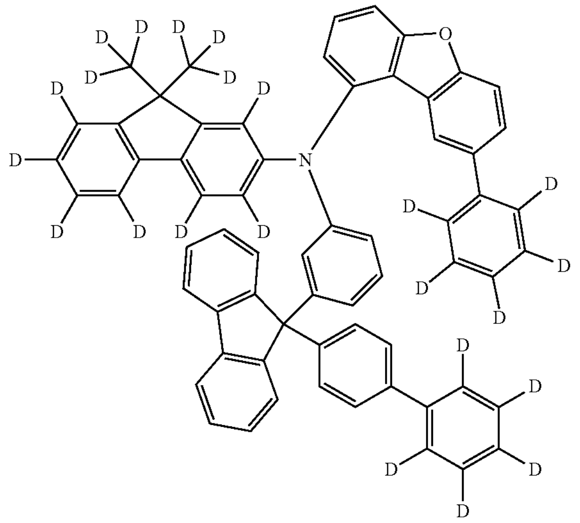

P3-107

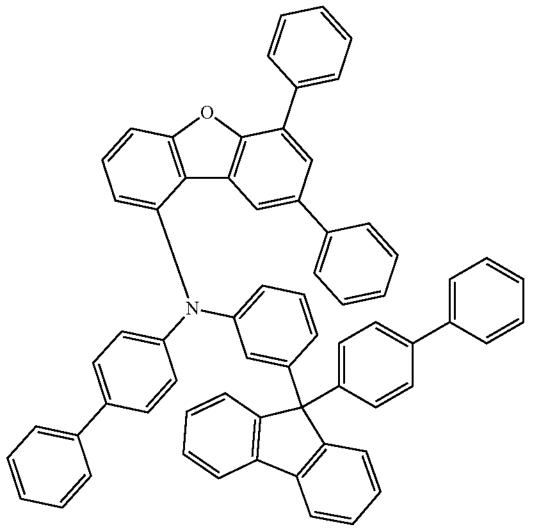

-continued

P3-108

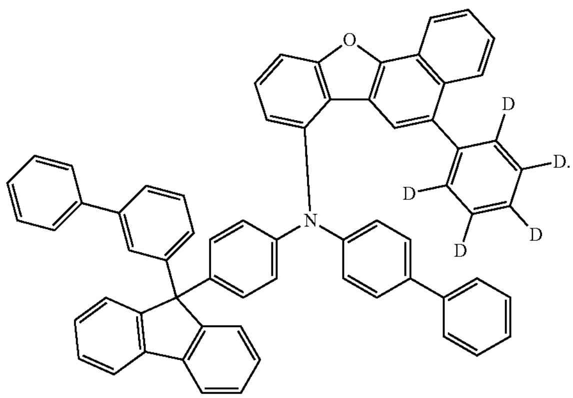

In another aspect of the present invention, the present invention provides an organic electric element comprising a first electrode, a second electrode, and an organic material layer between the first electrode and the second electrode, wherein the organic material layer includes compound represented by the Formula 1.

The organic material layer further includes a light-emitting layer and a light-emitting auxiliary layer between the light-emitting layer and the first electrode, and the light-emitting auxiliary layer includes the compound.

The organic material layer comprises two or more stacks, and the two or more stacks each comprise a hole transport layer, a light-emitting layer and an electron transport layer formed sequentially on the first electrode. Here, the organic material layer may comprise a charge generation layer formed between the two or more stacks.

The organic electric element may further include a layer for improving luminous efficiency. Here, the layer for improving luminous efficiency is formed on one side of two sides of a first electrode or a second electrode, the one side is not facing the organic material layer In another aspect of the present invention, the present invention provides an electronic device comprising a display device and a control unit for controlling the display device, wherein the display device comprises the compound represented by Formula 1.

Hereinafter, a synthesis example of the compound represented by Formula 1 and a preparation method of an organic electroluminescent element will be described in detail by way of examples. However, the present invention is not limited to the following examples.

Synthesis Example

The compound (final product) represented by Formula 1 according to the present invention can be synthesized by reacting Sub 1 and Sub 2 as in the following reaction scheme 1, but is not limited thereto.

<Reaction Scheme 1> (Hal is Br, I or Cl.)

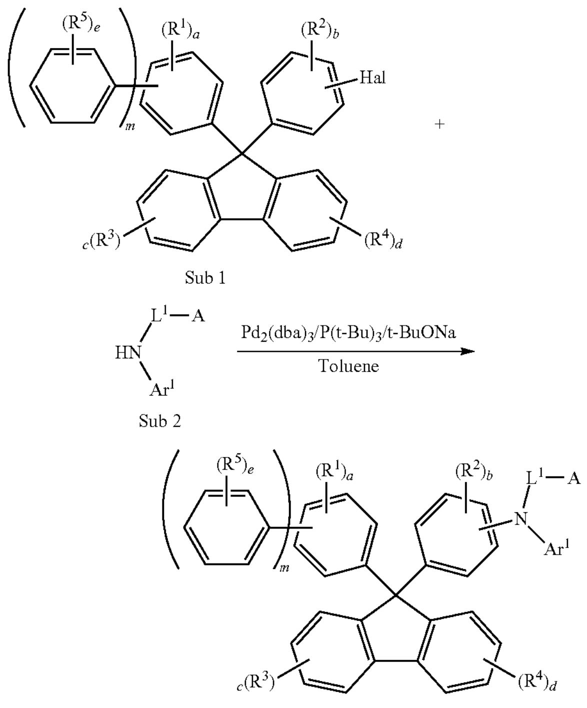

Sub 1

Sub 2

Final Product

Sub 2 is the following Sub2-A or Sub2-B.

Sub2-A

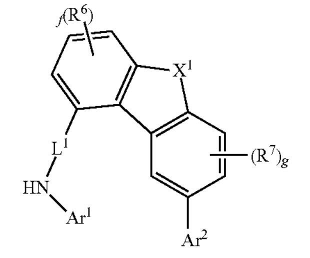

Sub2-B

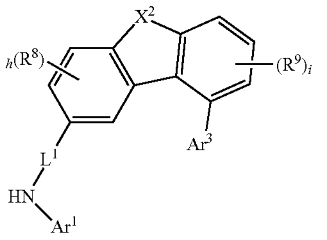

Synthesis Example of Sub 1

Sub 1 of the above reaction scheme 1 can be synthesized by the reaction path of the following reaction scheme 2-1 or reaction scheme 2-2, but is not limited thereto.

<Reaction Scheme 2-1> (Hal and $Hal^1$ are Br, Cl or I.)

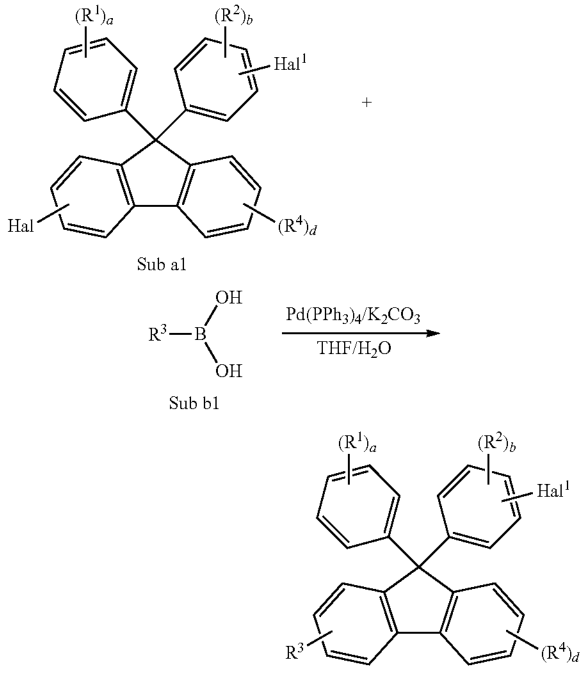

Sub a1

Sub b1

Sub A1

<Reaction Scheme 2-2>

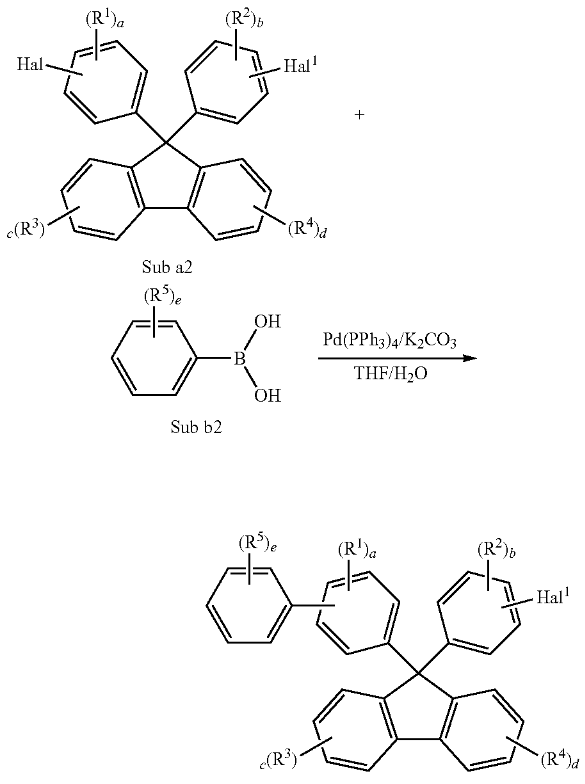

Sub a2

Sub b2

Sub A2

1. Synthesis Example of Sub1-3

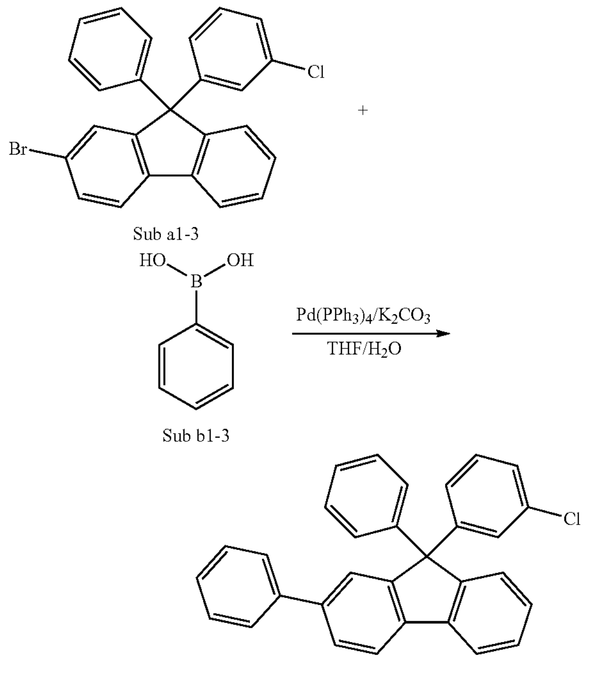

Sub a1-3

Sub b1-3

Sub1-3

Sub a1-3 (50 g, 115.80 mmol) and Sub b1-3 (15.5 g, 127.38 mmol) were placed in a round-bottom flask and dissolved in THF (290 mL) and water (100 mL). Then $Pd(PPh_3)_4$ (4.01 g, 3.47 mmol) and $K_2CO_3$ (32.00 g, 231.61 mmol) were added to the solution and the mixture was stirred at 60° C. When the reaction was completed, the reaction product was extracted with toluene and water, dried with $MgSO_4$, and concentrated. Then, the concentrate was separated using a silica column and recrystallized to obtain 43.8 g (yield: 88.2%) of the product.

2. Synthesis Example of Sub 1-5

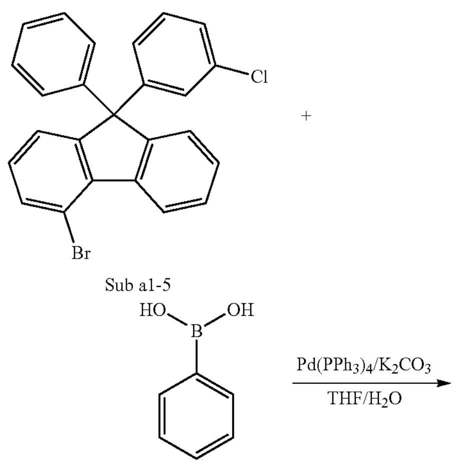

Sub a1-5

Sub b1-3

-continued

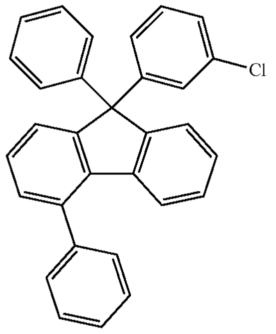

Sub1-5

The same method as the synthesis of Sub1-3 was carried out using Sub a1-5 instead of Sub a1-3, to obtain 42.4 g of the product (yield: 85.4%).

3. Synthesis Example of Sub1-18

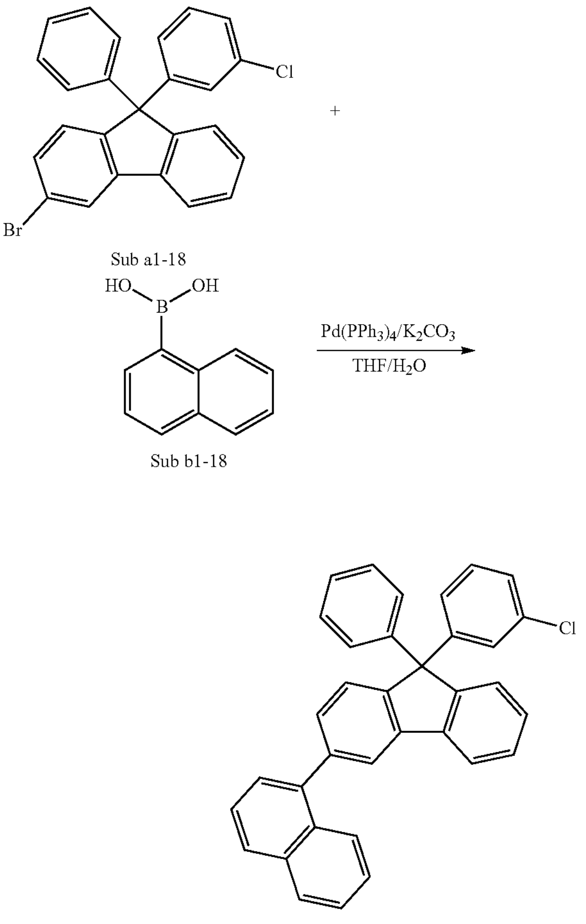

Sub a1-18

Sub b1-18

Sub1-18

The same method as the synthesis of Sub1-3 was carried out using Sub a1-18 instead of Sub a1-3 and Sub b1-18 (21.9 g, 127.38 mmol) instead of Sub b1-3, to obtain 48.7 g of the product (yield: 87.8%).

4. Synthesis Example of Sub1-20

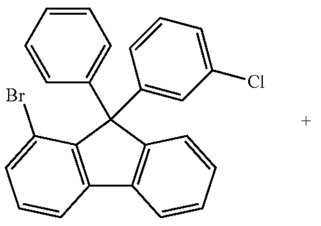

Sub a1-20

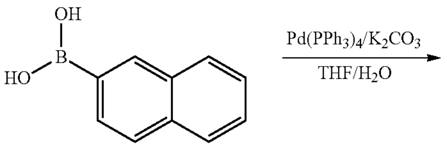

Sub b1-20

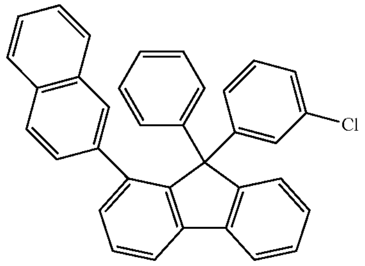

Sub1-20

The same method as the synthesis of Sub1-3 was carried out using Sub a1-20 instead of Sub a1-3 and Sub b1-20 (21.9 g, 127.38 mmol) instead of Sub b1-3, to obtain 49.2 g of the product (yield: 88.7%).

5. Synthesis Example of Sub1-24

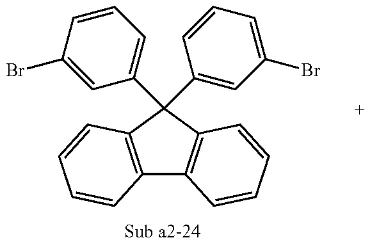

Sub a2-24

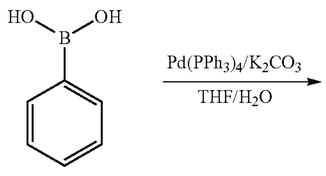

Sub b1-3

-continued

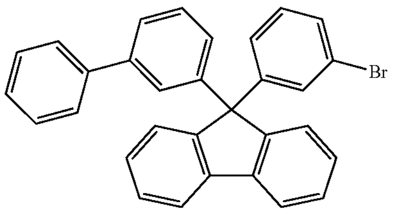

Sub1-24

Sub a2-24 (50 g, 104.99 mmol) and Sub b1-3 (14.1 g, 115.49 mmol) were placed in a round-bottom flask and dissolved in THF (270 mL) and water (90 mL), $Pd(PPh_3)_4$ (3.63 g, 3.15 mmol), $K_2CO_3$ (29.02 g, 209.99 mmol) were added thereto. Then the reaction was carried out in the same manner as the synthesis method of Sub 1-3 to obtain 12.9 g (yield: 25.9%) of product.

6. Synthesis Example of Sub 1-25

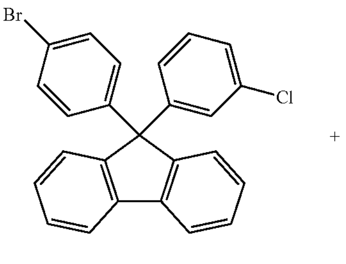

Sub a2-25

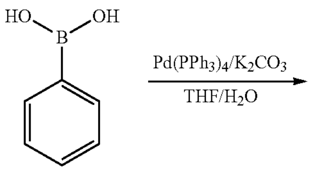

Sub b1-3

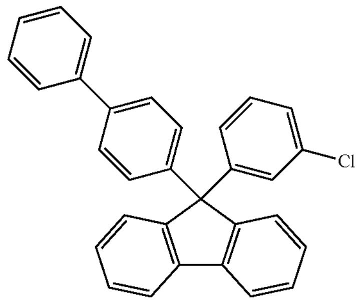

Sub1-25

The same synthesis method as Sub1-3 was carried out using Sub a2-25 instead of Sub a1-3, to obtain 42.1 g of the product (yield: 84.7%).

Compounds belonging to Sub 1 may be, but not limited to, the following compounds, and Table 1 shows FD-MS (Field Desorption-Mass Spectrometry) values of the following compounds.

Sub1-1
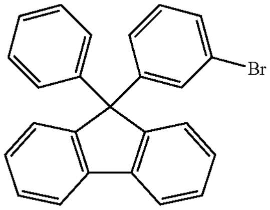
Sub1-2
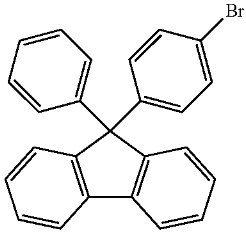
Sub1-3
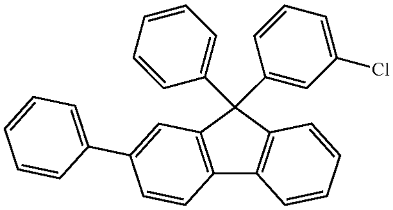
Sub1-4
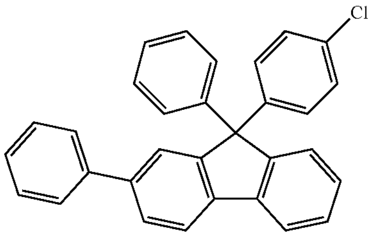
Sub1-5
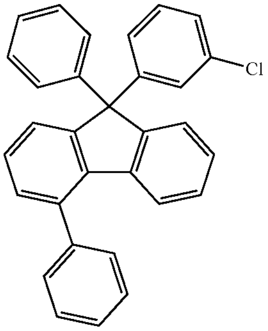
Sub1-6
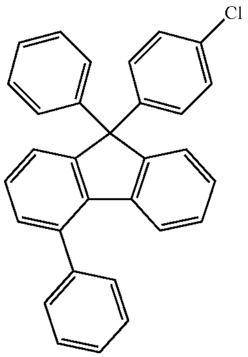
-continued
Sub1-7
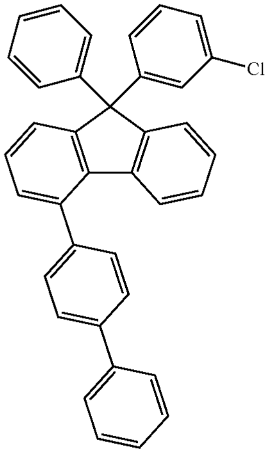
Sub1-8
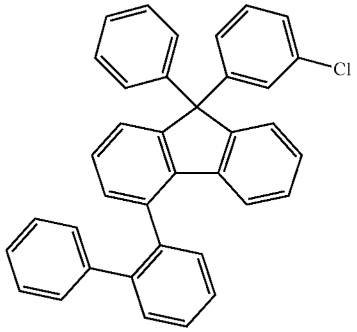
Sub1-9
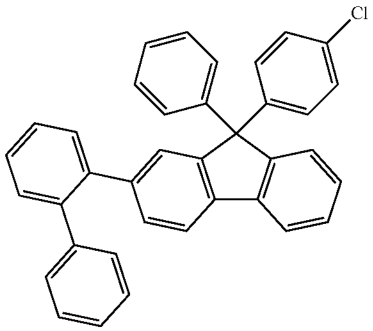
Sub1-10
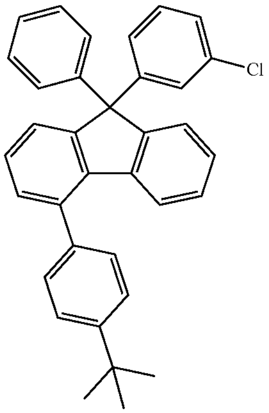

-continued
Sub1-11
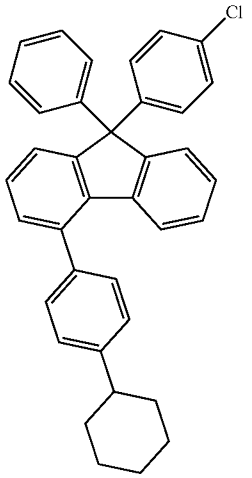
Sub1-12
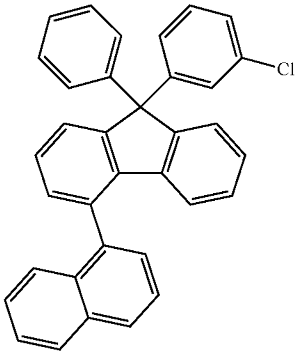
Sub1-13
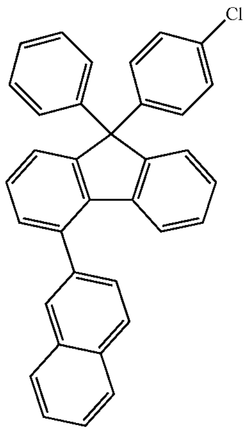
-continued
Sub1-14
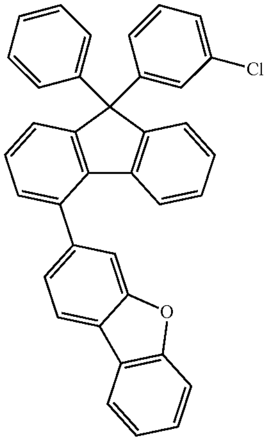
Sub1-15
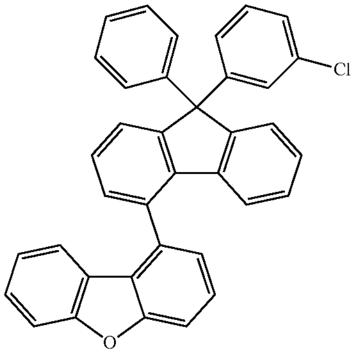
Sub1-16
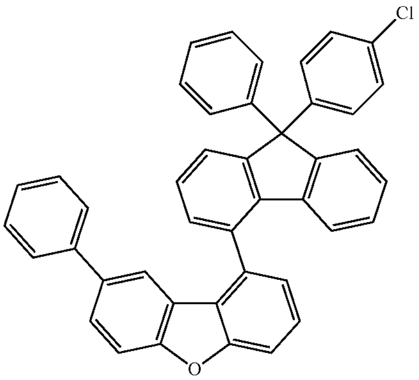
Sub1-17
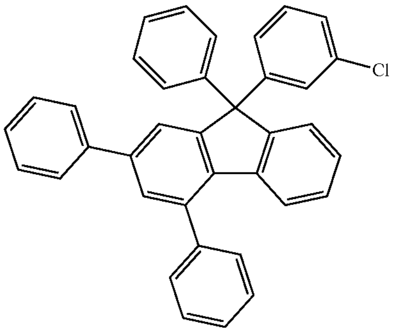

Sub1-18
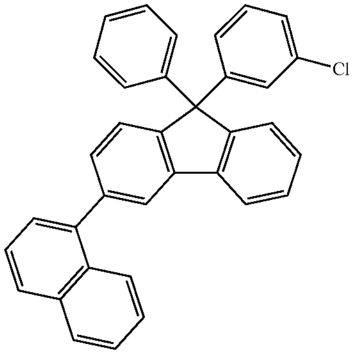
Sub1-19
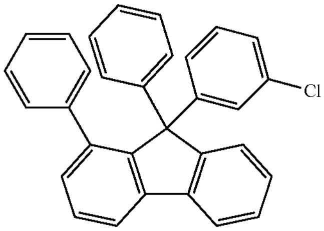
Sub1-20
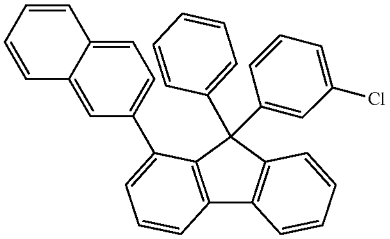
Sub1-21
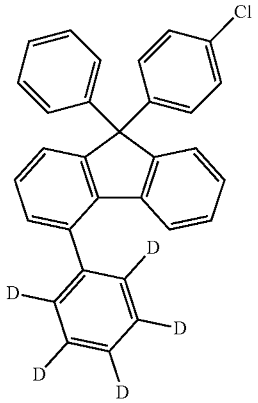
Sub1-22
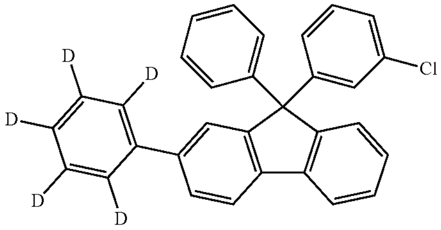
Sub1-23
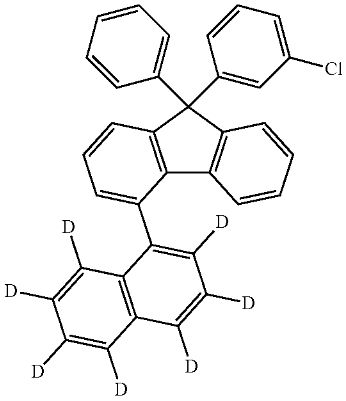
Sub1-24
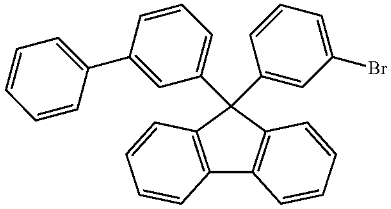
Sub1-25
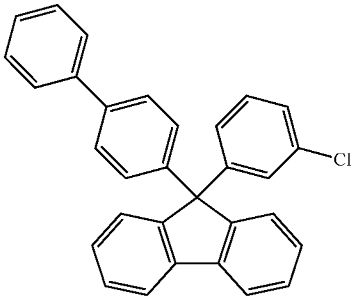
Sub1-26
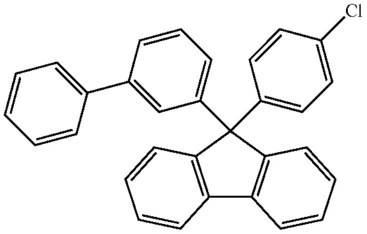
Sub1-27
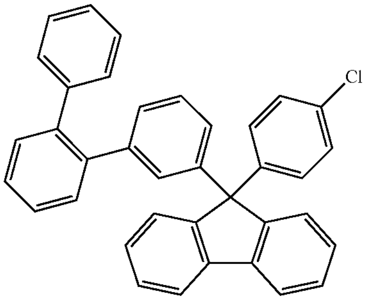

-continued
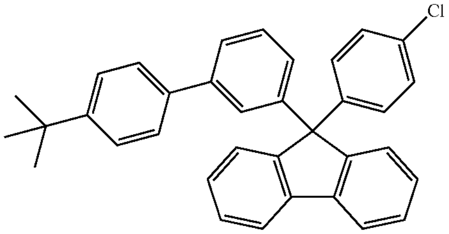
Sub1-28
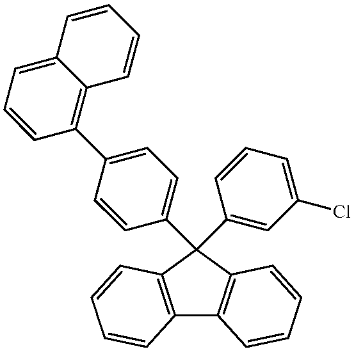
Sub1-29
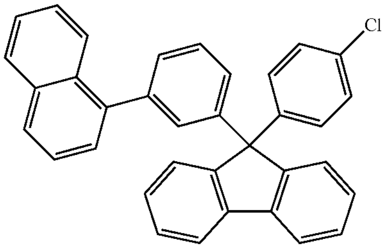
Sub1-30
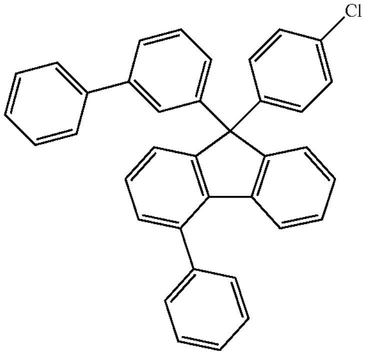
Sub1-31
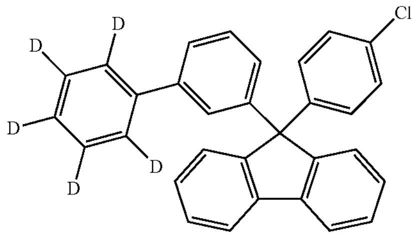
Sub1-32
-continued
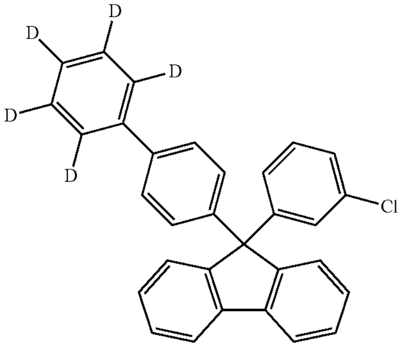
Sub1-33
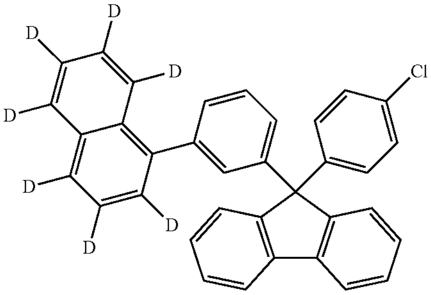
Sub1-34
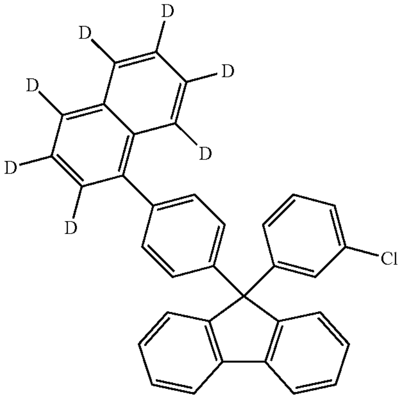
Sub1-35
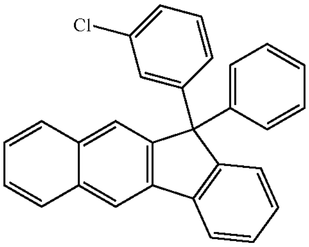
Sub1-36
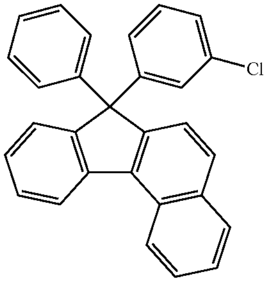
Sub1-37

-continued

Sub1-38

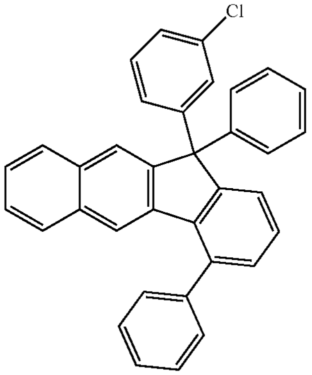

Sub1-39

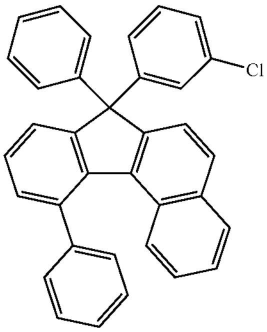

-continued

Sub1-40

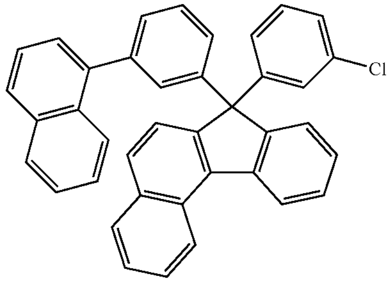

Sub1-41

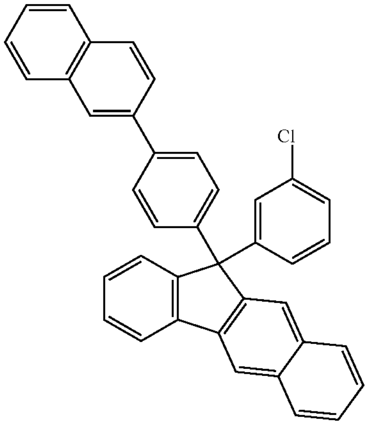

Sub1-42

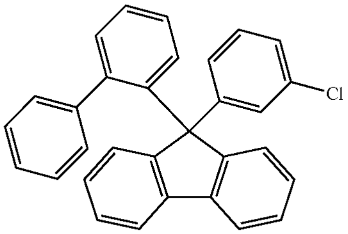

TABLE 1

| Compound | FD-MS | Compound | FD-MS |
|---|---|---|---|
| Sub 1-1 | m/z = 396.05 ($C_{26}H_{17}Br$ = 397.32) | Sub 1-2 | m/z = 396.05 ($C_{26}H_{17}Br$ = 397.32) |
| Sub 1-3 | m/z = 428.13 ($C_{31}H_{21}Cl$ = 428.96) | Sub 1-4 | m/z = 428.13 ($C_{31}H_{21}Cl$ = 428.96) |
| Sub 1-5 | m/z = 428.13 ($C_{31}H_{21}Cl$ = 428.96) | Sub 1-6 | m/z = 428.13 ($C_{31}H_{21}Cl$ = 428.96) |
| Sub 1-7 | m/z = 504.16 ($C_{37}H_{25}Cl$ = 505.06) | Sub 1-8 | m/z = 504.16 ($C_{37}H_{25}Cl$ = 505.06) |
| Sub 1-9 | m/z = 504.16 ($C_{37}H_{25}Cl$ = 505.06) | Sub 1-10 | m/z = 484.20 ($C_{35}H_{29}Cl$ = 485.07) |
| Sub 1-11 | m/z = 510.21 ($C_{37}H_{31}Cl$ = 511.11) | Sub 1-12 | m/z = 478.15 ($C_{35}H_{23}Cl$ = 479.02) |
| Sub 1-13 | m/z = 478.15 ($C_{35}H_{23}Cl$ = 479.02) | Sub 1-14 | m/z = 518.14 ($C_{37}H_{23}ClO$ = 519.04) |
| Sub 1-15 | m/z = 518.14 ($C_{37}H_{23}ClO$ = 519.04) | Sub 1-16 | m/z = 594.18 ($C_{43}H_{27}ClO$ = 595.14) |
| Sub 1-17 | m/z = 504.16 ($C_{37}H_{25}Cl$ = 505.06) | Sub 1-18 | m/z = 478.15 ($C_{35}H_{23}Cl$ = 479.02) |
| Sub 1-19 | m/z = 428.13 ($C_{31}H_{21}Cl$ = 428.96) | Sub 1-20 | m/z = 478.15 ($C_{35}H_{23}Cl$ = 479.02) |
| Sub 1-21 | m/z = 433.16 ($C_{31}H_{16}D_5Cl$ = 433.99) | Sub 1-22 | m/z = 433.16 ($C_{31}H_{16}D_5Cl$ = 433.99) |
| Sub 1-23 | m/z = 485.19 ($C_{35}H_{16}D_7Cl$ = 486.06) | Sub 1-24 | m/z = 472.08 ($C_{31}H_{21}Br$ = 473.41) |
| Sub 1-25 | m/z = 428.13 ($C_{31}H_{21}Cl$ = 428.96) | Sub 1-26 | m/z = 428.13 ($C_{31}H_{21}Cl$ = 428.96) |
| Sub 1-27 | m/z = 504.16 ($C_{37}H_{25}Cl$ = 505.06) | Sub 1-28 | m/z = 484.20 ($C_{35}H_{29}Cl$ = 485.07) |
| Sub 1-29 | m/z = 478.15 ($C_{35}H_{23}Cl$ = 479.02) | Sub 1-30 | m/z = 478.15 ($C_{35}H_{23}Cl$ = 479.02) |
| Sub 1-31 | m/z = 504.16 ($C_{37}H_{25}Cl$ = 505.06) | Sub 1-32 | m/z = 433.16 ($C_{31}H_{16}D_5Cl$ = 433.99) |
| Sub 1-33 | m/z = 433.16 ($C_{31}H_{16}D_5Cl$ = 433.99) | Sub 1-34 | m/z = 485.19 ($C_{35}H_{16}D_7Cl$ = 486.06) |
| Sub 1-35 | m/z = 485.19 ($C_{35}H_{16}D_7Cl$ = 486.06) | Sub 1-36 | m/z = 402.12 ($C_{29}H_{19}Cl$ = 402.92) |
| Sub 1-37 | m/z = 402.12 ($C_{29}H_{19}Cl$ = 402.92) | Sub 1-38 | m/z = 478.15 ($C_{35}H_{23}Cl$ = 479.02) |
| Sub 1-39 | m/z = 478.15 ($C_{35}H_{23}Cl$ = 479.02) | Sub 1-40 | m/z = 528.16 ($C_{39}H_{25}Cl$ = 529.08) |
| Sub 1-41 | m/z = 528.16 ($C_{39}H_{25}Cl$ = 529.08) | Sub 1-42 | m/z = 428.13 ($C_{31}H_{21}Cl$ = 428.96) |

Synthesis Example of Sub 2
Sub 2 of the above reaction scheme 1 can be synthesized by the reaction route of the following reaction scheme 3, but is not limited thereto.
<Reaction Scheme 3> ($Hal^2$ and $Hal^3$ are Br, Cl or I.)
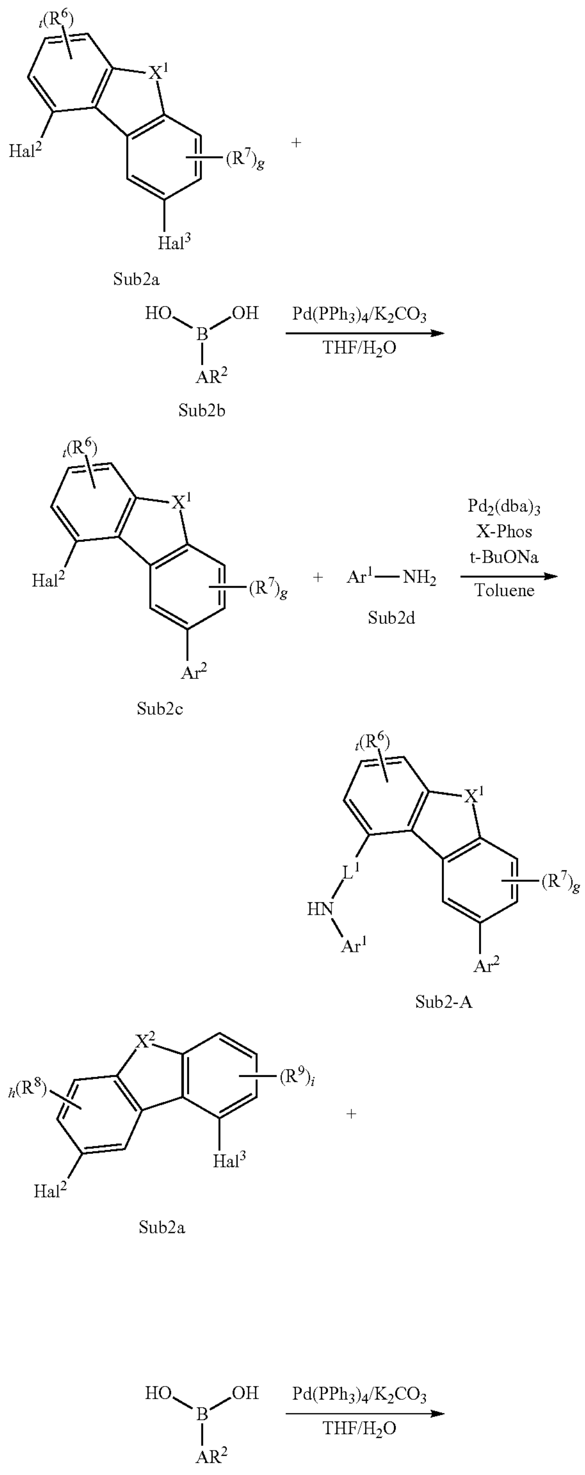
Sub2a
Sub2b
Sub2c
Sub2d
Sub2-A
Sub2a
Sub2b
-continued
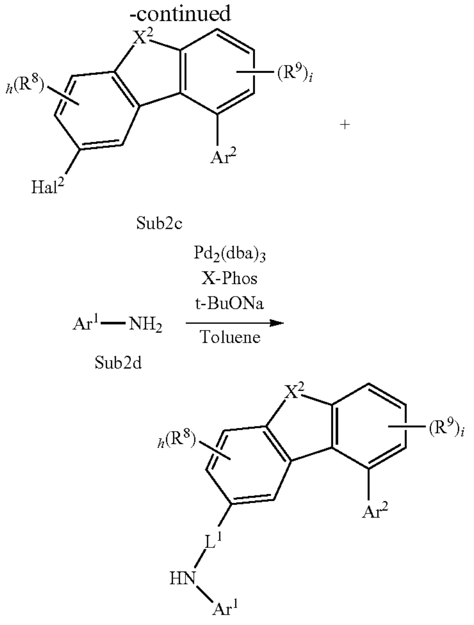
Sub2c
Sub2d
Sub2-B
1. Synthesis Example of Sub2-2
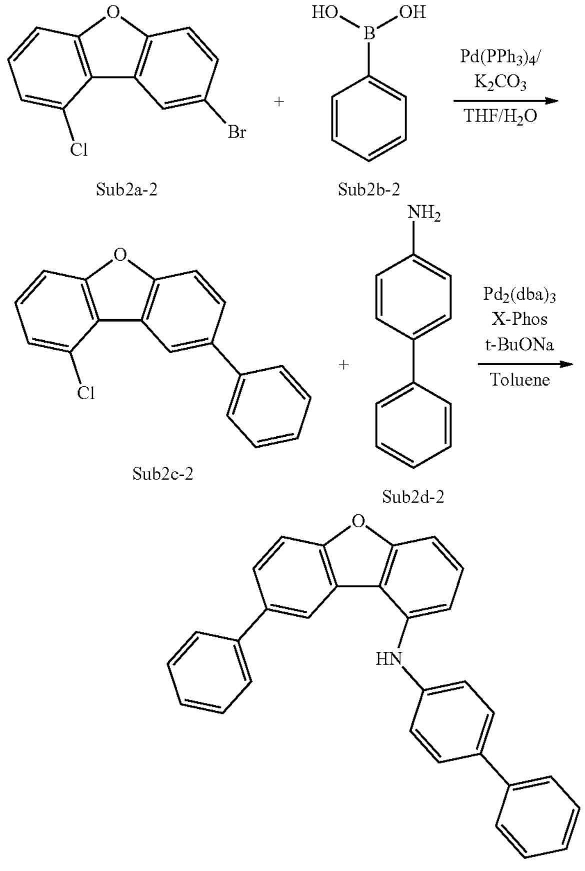
Sub2a-2
Sub2b-2
Sub2c-2
Sub2d-2
Sub2-2

(1) Synthesis Example of Sub2c-2

Sub2a-2 (50 g, 177.60 mmol) and Sub2b-2 (23.82 g, 195.36 mmol) were placed in a round-bottom flask and dissolved in THF (450 mL) and water (150 mL). Then, $Pd(PPh_3)_4$ (6.15 g, 5.32 mmol) and $K_2CO_3$ (49.08 g, 355.20 mmol) were added to the solution and the mixture was stirred at 70° C. When the reaction was completed, the reaction product was extracted with toluene and water, dried with $MgSO_4$, and concentrated. Then, the concentrate was separated using a silica column and recrystallized to obtain 42.4 g (yield: 85.6%) of the product.

(2) Synthesis Example of Sub2-2

Sub2c-2 (20 g, 71.75 mmol) and Sub2d-2 (12.14 g, 71.75 mmol) were placed in a round-bottom flask and dissolved in toluene (240 mL). Then, $Pd_2(dba)_3$ (1.97 g, 2.15 mmol), X-Phos (2.05 g, 4.30 mmol) and t-BuONa (13.79 g, 143.50 mmol) were added to the solution and the mixture was stirred at 60° C. When the reaction was completed, the reaction product was extracted with toluene and water, dried with $MgSO_4$, and concentrated. Then, the concentrate was separated using a silica column and recrystallized to obtain 23.5 g (yield: 79.6%) of the product.

2. Synthesis Example of Sub2-75

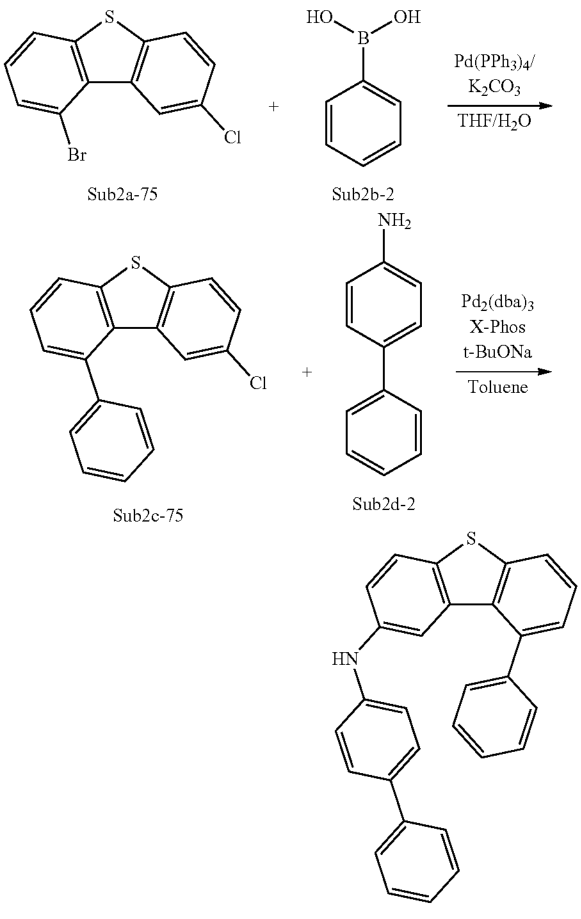

Sub2a-75 Sub2b-2 Sub2c-75 Sub2d-2 Sub2-75

(1) Synthesis Example of Sub2c-75

Sub2a-75 (50 g, 168.01 mmol) and Sub2b-2 (22.53 g, 184.81 mmol) were placed in a round-bottom flask and dissolved in THF (450 mL) and water (150 mL). Then, $Pd(PPh_3)_4$ (5.82 g, 5.04 mmol) and $K_2CO_3$ (46.43 g, 336.03 mmol) were added to the solution and the same method as the synthesis of Sub2c-2 was carried out to obtain 34.6 g (yield: 69.8%) of product.

(2) Synthesis Example of Sub2-75

Sub2c-75 (20 g, 67.84 mmol) and Sub2d-2 (11.48 g, 67.84 mmol) were placed in a round-bottom flask and dissolved in toluene (240 mL), and $Pd_2(dba)_3$ (1.86 g, 2.03 mmol), X-Phos (4.70 g, 4.07 mmol) and t-BuONa (13.04 g, 135.68 mmol) were added to the solution and the same method as the synthesis of Sub2-2 was carried out to obtain 23.4 (yield: 80.7%) of product.

3. Synthesis Example of Sub2-76

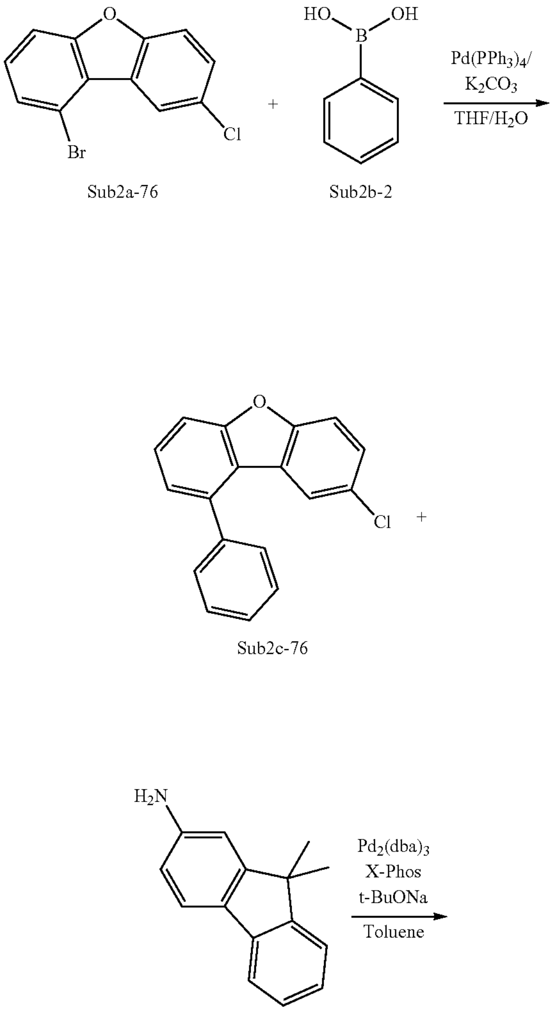

Sub2a-76 Sub2b-2 Sub2c-76 Sub2d-76

-continued

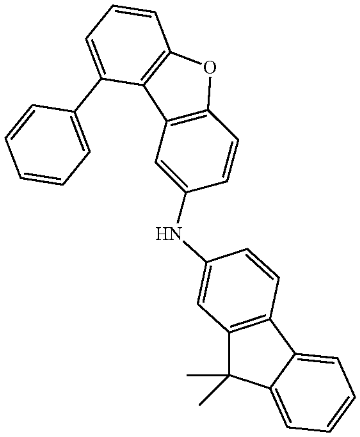

Sub2-76

(1) Synthesis Example of Sub2c-76

Sub2a-76 (50 g, 177.60 mmol) and Sub2b-2 (23.82 g, 195.36 mmol) were placed in a round-bottom flask and dissolved in in THF (450 mL) and water (150 mL). Then, $Pd(PPh_3)_4$ (6.15 g, 5.32 mmol) and $K_2CO_3$ (49.08 g, 355.20 mmol) were added to the solution and the same method as the synthesis of Sub2c-2 was carried out to obtain 40.8 g (yield: 82.4%) of product.

(2) Synthesis Example of Sub2-76

Sub2c-76 (20 g, 71.75 mmol) and Sub2d-76 (12.14 g, 71.75 mmol) were placed in a round-bottom flask and dissolved in toluene (240 mL), and $Pd_2(dba)_3$ (1.97 g, 2.15 mmol), X-Phos (2.05 g, 4.30 mmol) and t-BuONa (13.79 g, 143.50 mmol) were added to the solution and the same method as the synthesis of Sub2-2 was carried out to obtain 26.3 g (yield: 81.2%) of product.

4. Synthesis Example of Sub 2-82

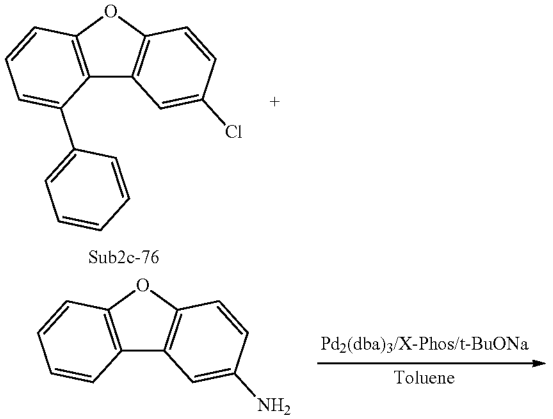

Sub2c-76

Sub2d-82

-continued

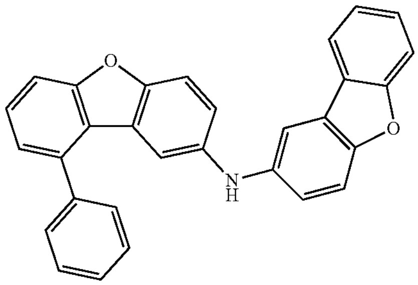

Sub2-82

Sub2c-76 (20 g, 71.75 mmol) and Sub2d-82 (13.14 g, 71.75 mmol) were placed in a round-bottom flask and dissolved in toluene (240 mL), and $Pd_2(dba)_3$ (1.97 g, 2.15 mmol), X-Phos (2.05 g, 4.30 mmol) and t-BuONa (13.79 g, 143.50 mmol) were added to the solution and the same method as the synthesis of Sub2-2 was carried out to obtain 25.8 g (yield: 84.5%) of product.

Compounds belonging to Sub 2 may be, but not limited to, the following compounds, and Table 2 shows FD-MS values of the following compounds.

Sub2-1

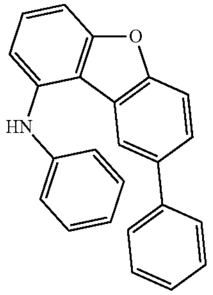

Sub2-2

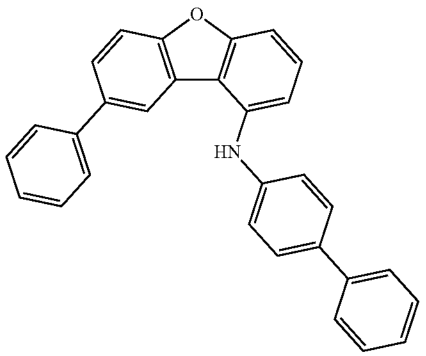

-continued
Sub2-3
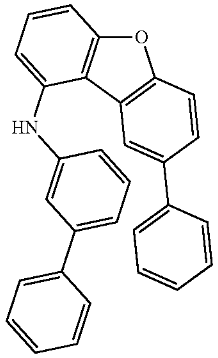
Sub2-4
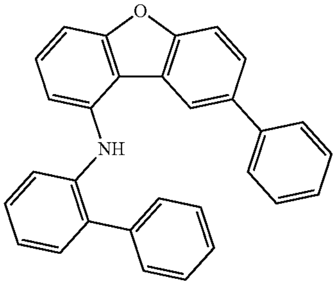
Sub2-5
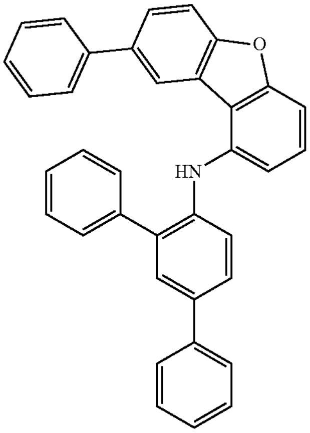
Sub2-6
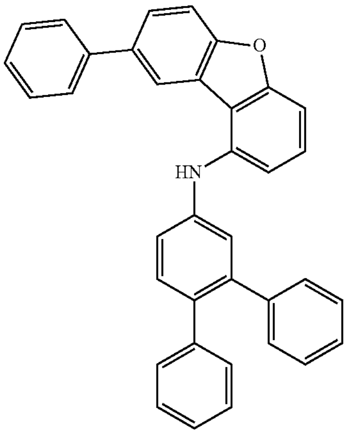
-continued
Sub2-7
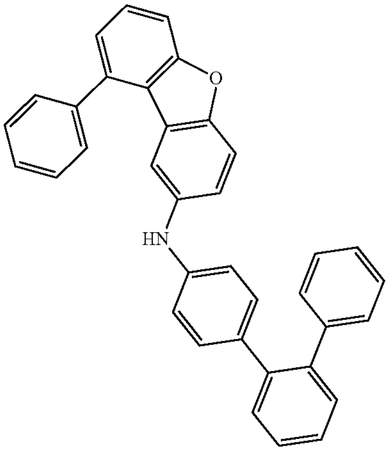
Sub2-8
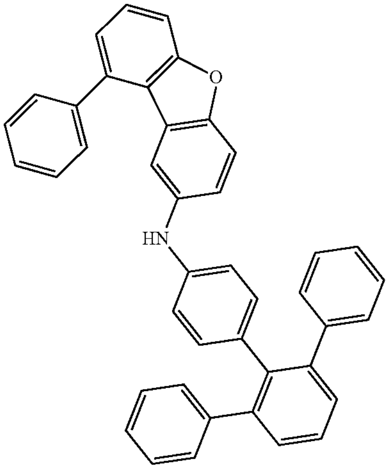
Sub2-9
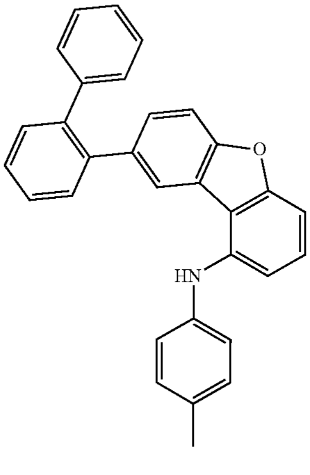

-continued
Sub2-10
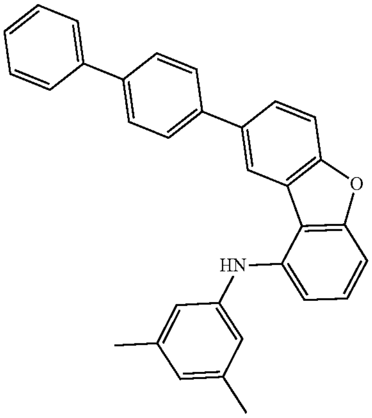
Sub2-11
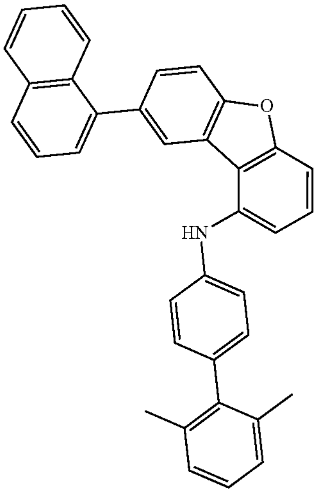
Sub2-12
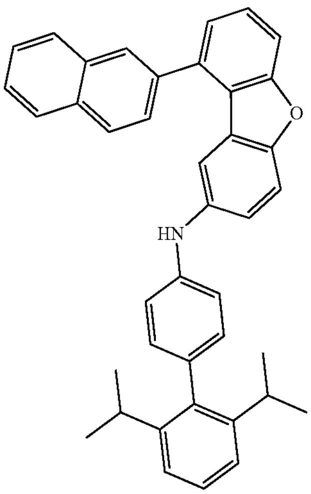
-continued
Sub2-13
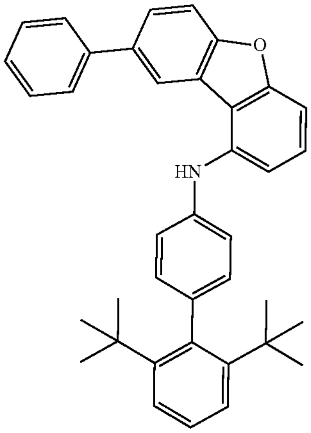
Sub2-14
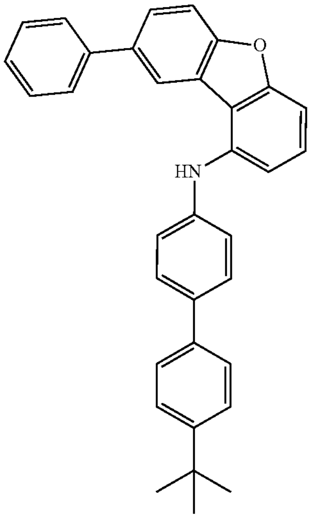
Sub2-15
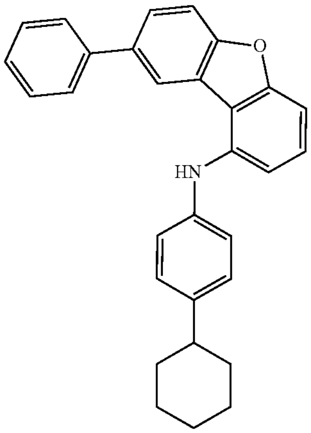

-continued
Sub2-16
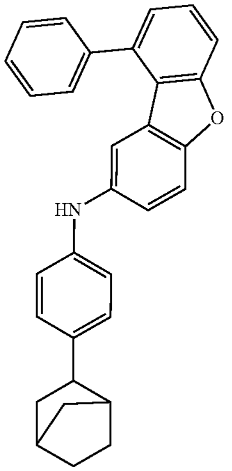
Sub2-17
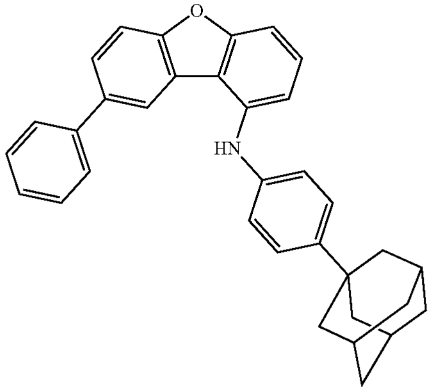
Sub2-18
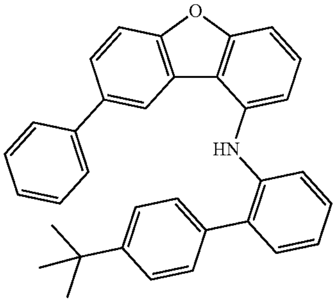
Sub2-19
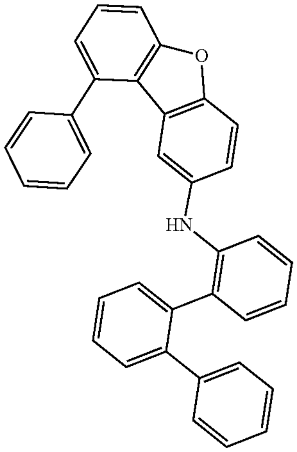
-continued
Sub2-20
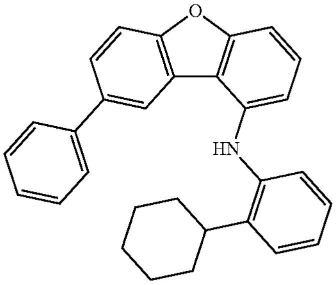
Sub2-21
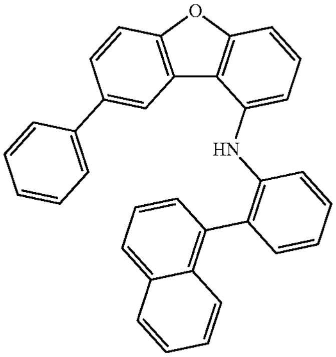
Sub2-22
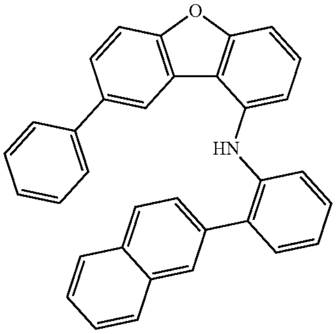
Sub2-23
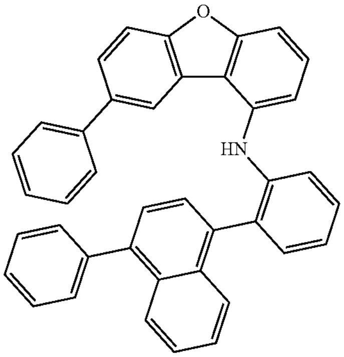

-continued
Sub2-24
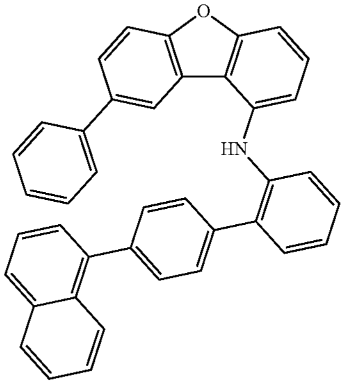
Sub2-25
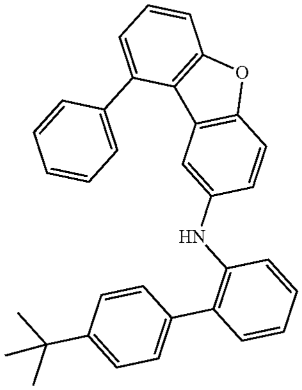
Sub2-26
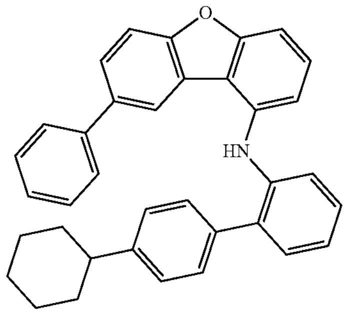
Sub2-27
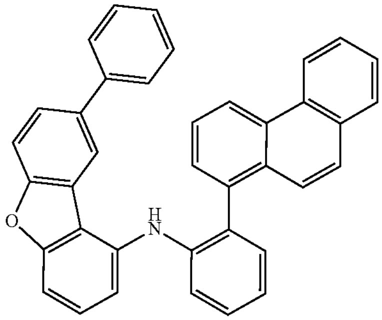
-continued
Sub2-28
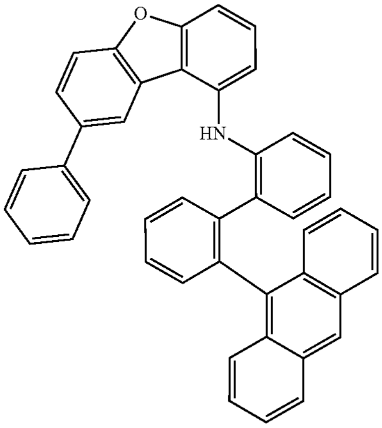
Sub2-29
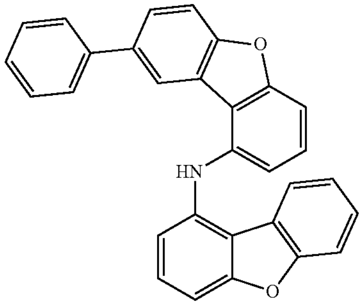
Sub2-30
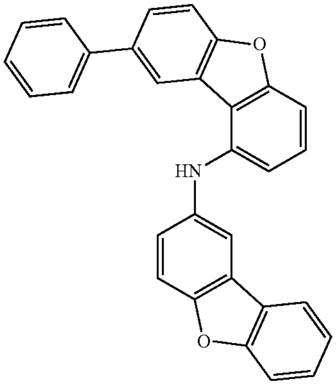
Sub2-31
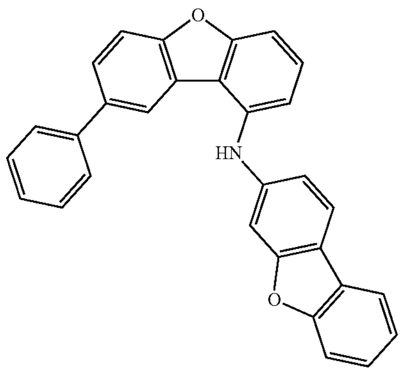

-continued
Sub2-32
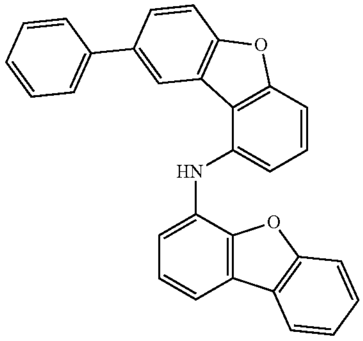
Sub2-33
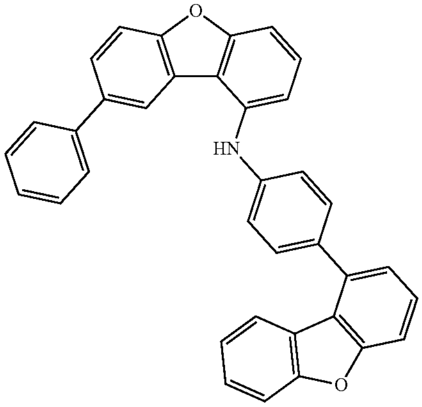
Sub2-34
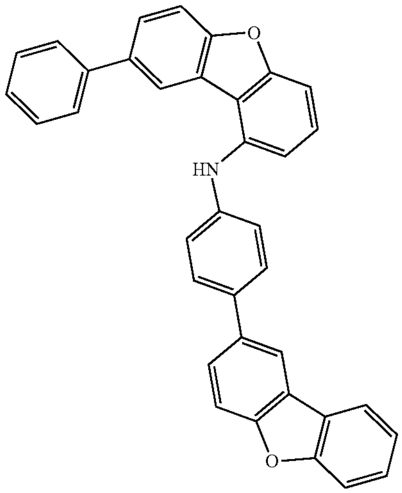
-continued
Sub2-35
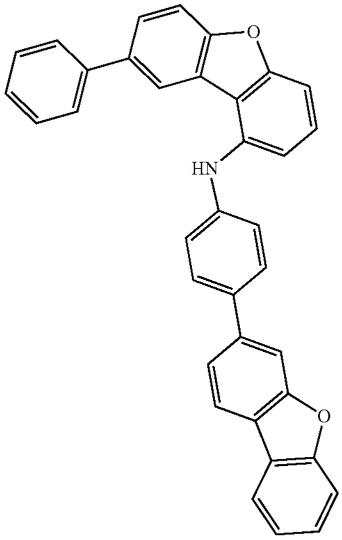
Sub2-36
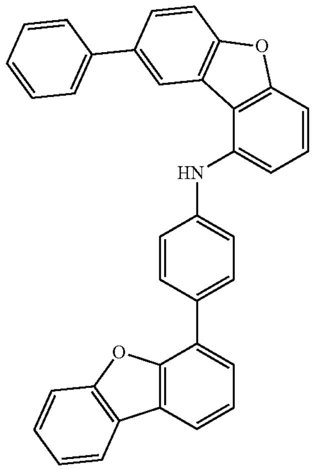
Sub2-37
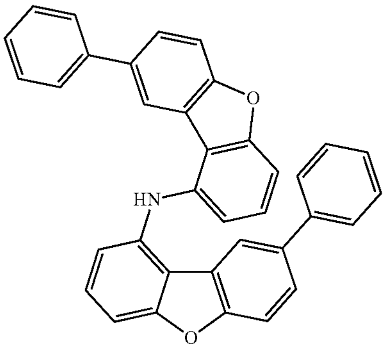

-continued
Sub2-38
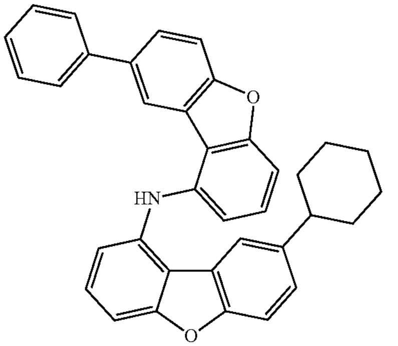
Sub2-39
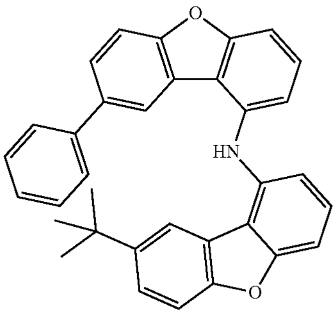
Sub2-40
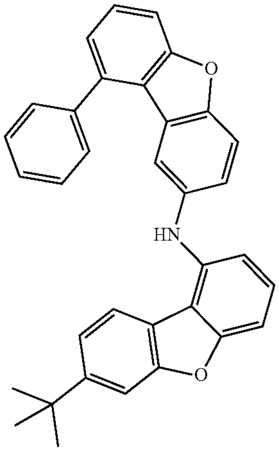
Sub2-41
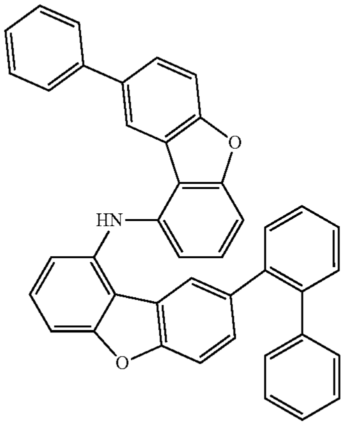
-continued
Sub2-42
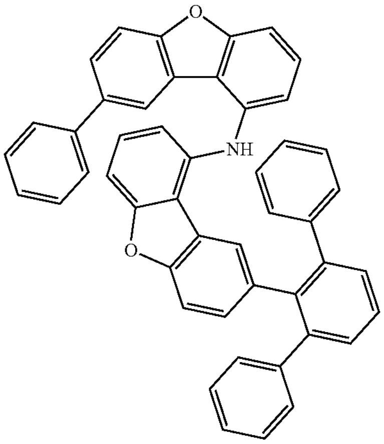
Sub2-43
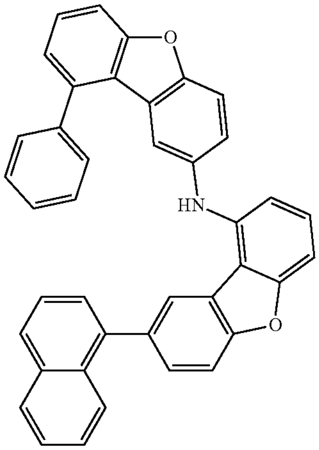
Sub2-44
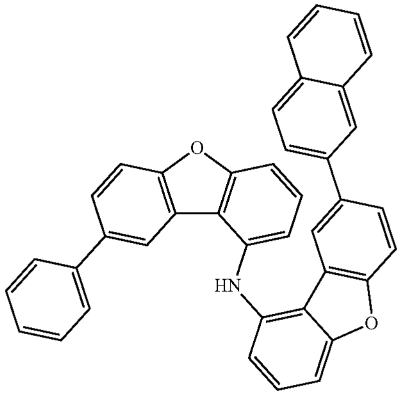

-continued
Sub2-45
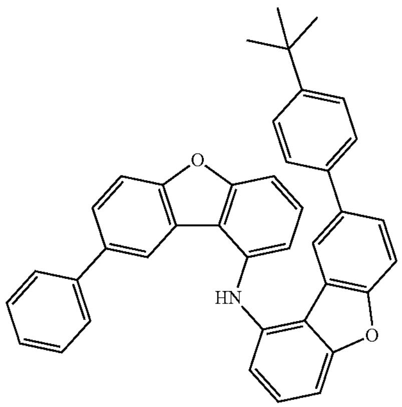
Sub2-46
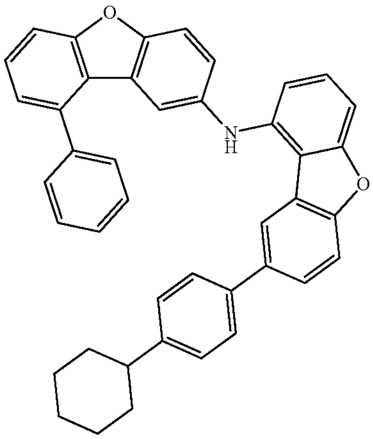
Sub2-47
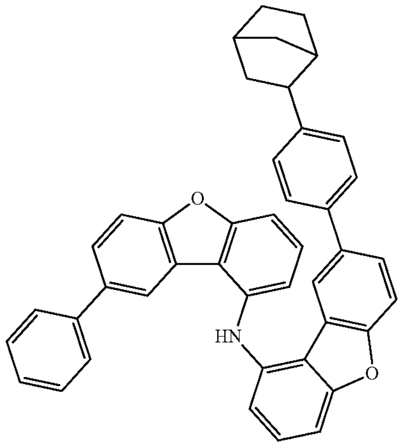
-continued
Sub2-48
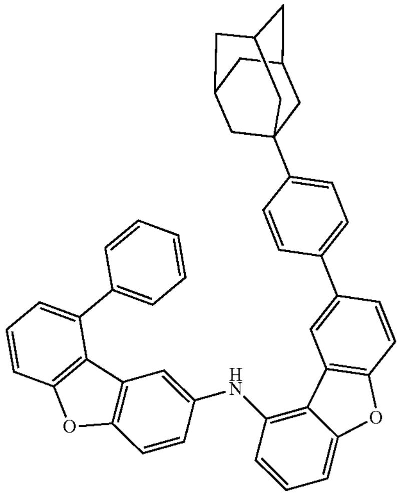
Sub2-49
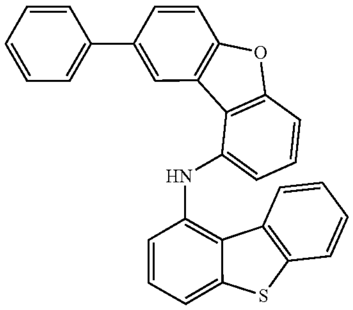
Sub2-50
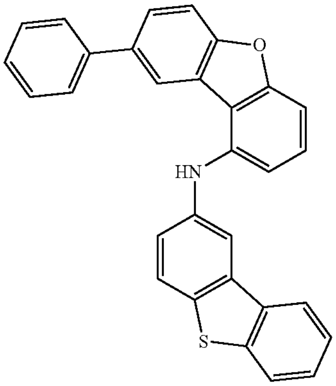
Sub2-51
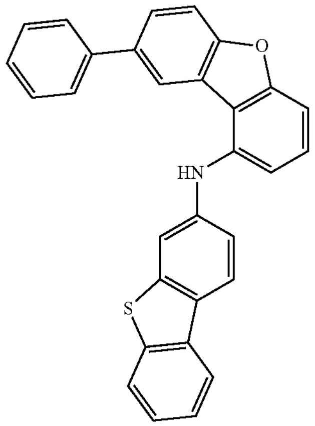

-continued
Sub2-52
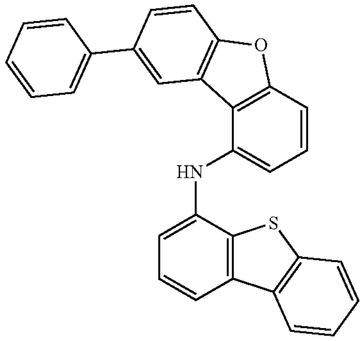
Sub2-53
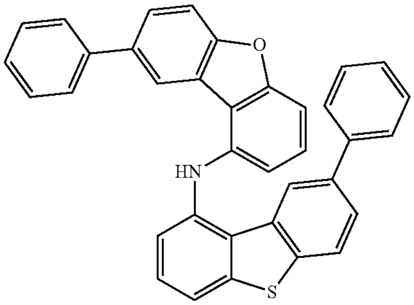
Sub2-54
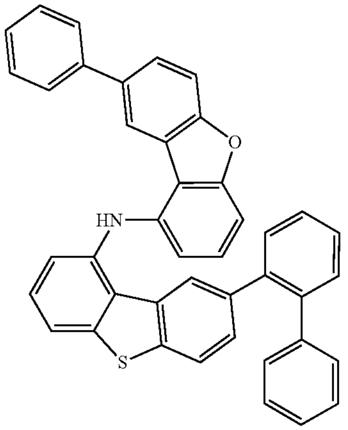
Sub2-55
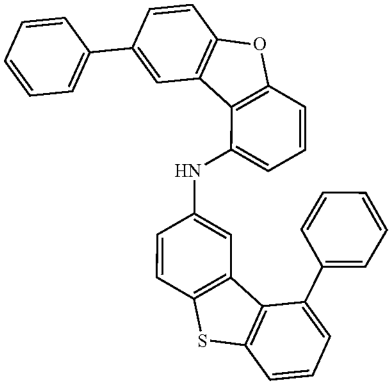
-continued
Sub2-56
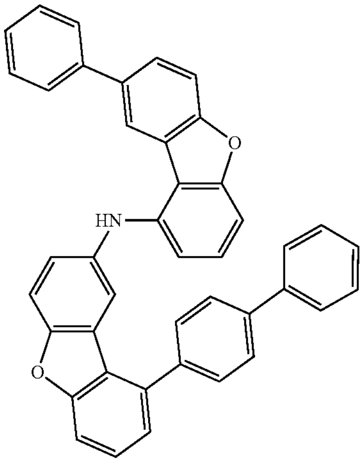
Sub2-57
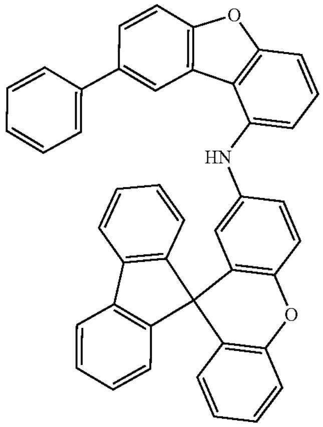
Sub2-58
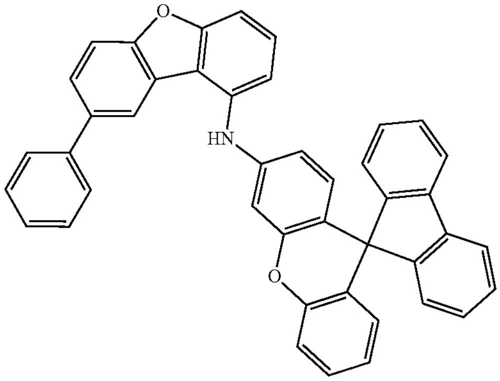

-continued
Sub2-59
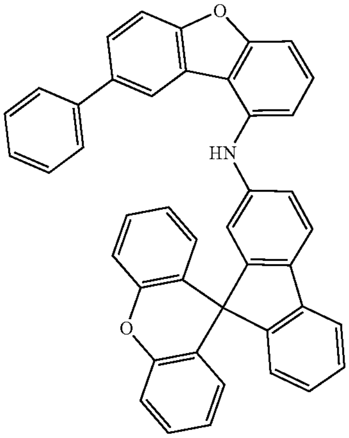
Sub2-60
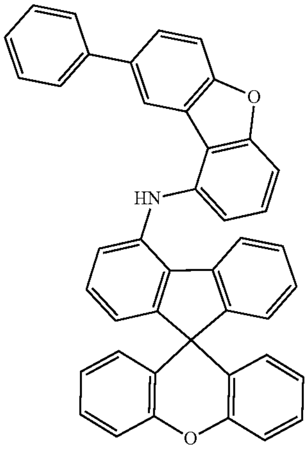
Sub2-61
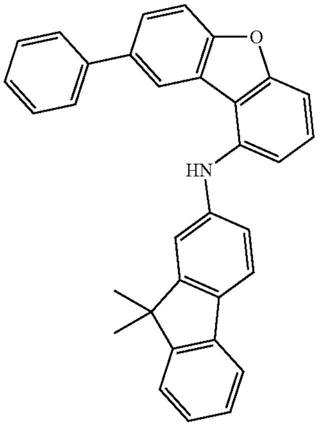
-continued
Sub2-62
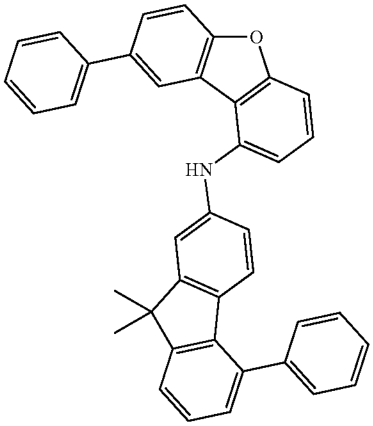
Sub2-63
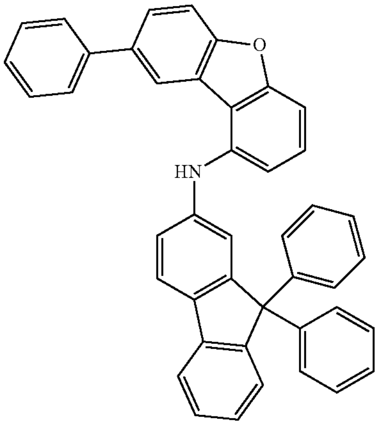
Sub2-64
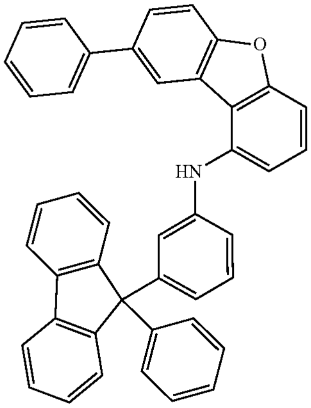

-continued
Sub2-65
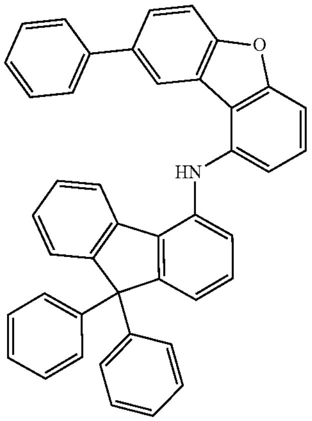
Sub2-66
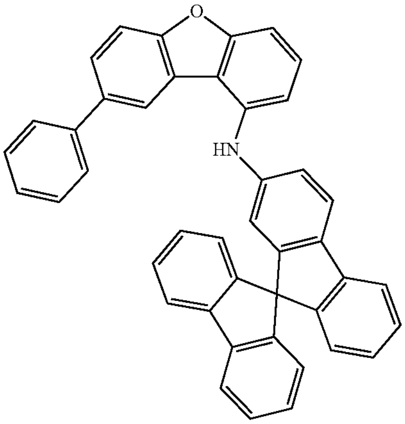
Sub2-67
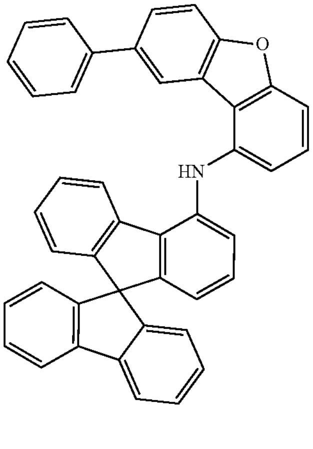
-continued
Sub2-68
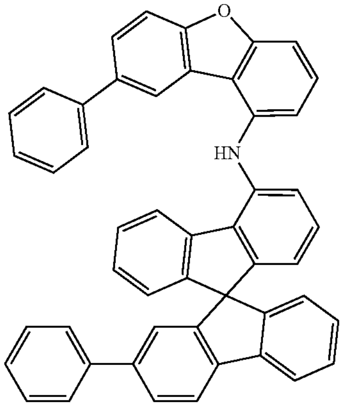
Sub2-69
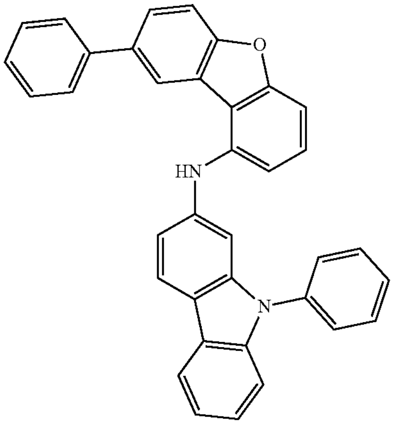
Sub2-70
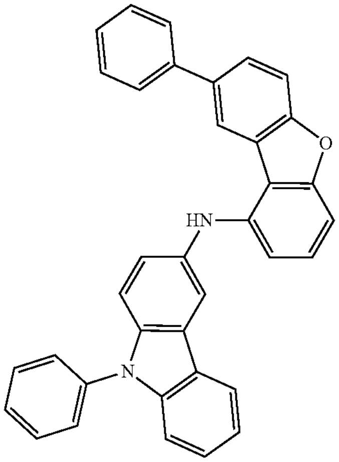

-continued
Sub2-71
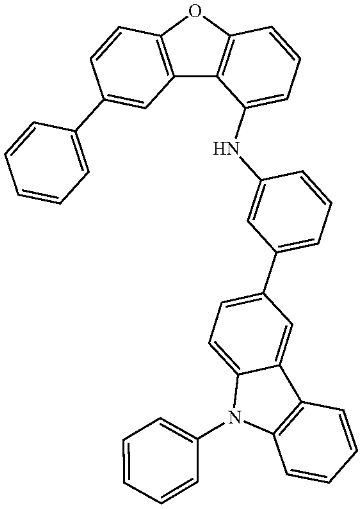
Sub2-72
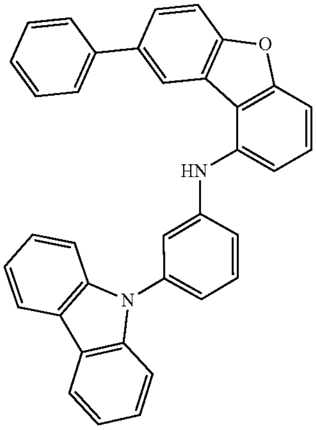
Sub2-73
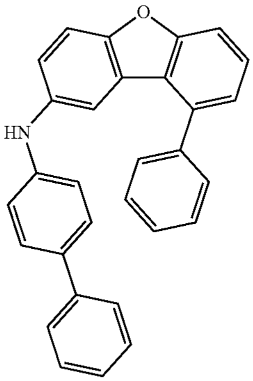
-continued
Sub2-74
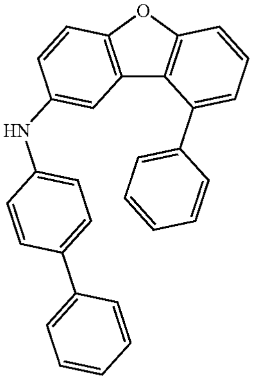
Sub2-75
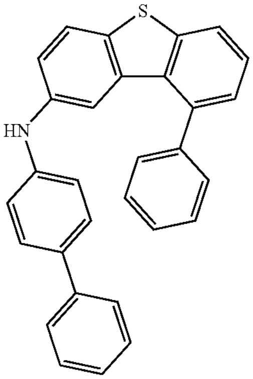
Sub2-76
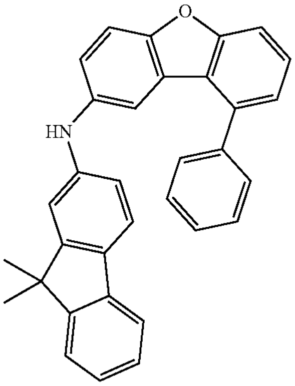
Sub2-77
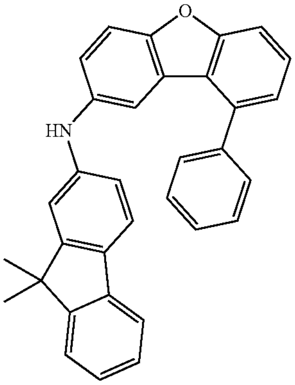

Sub2-78
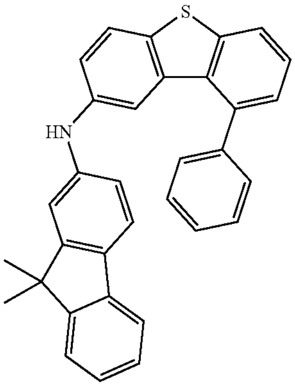
Sub2-79
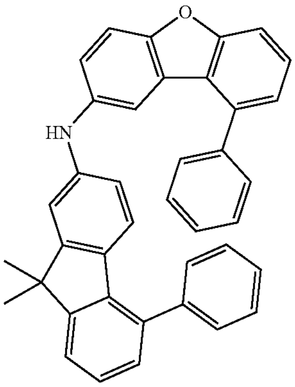
Sub2-80
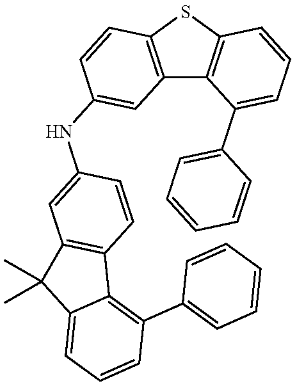
Sub2-81
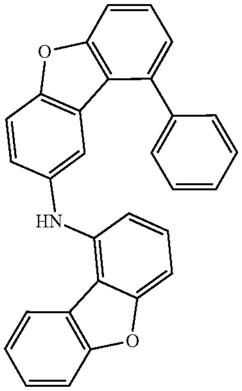
Sub2-82
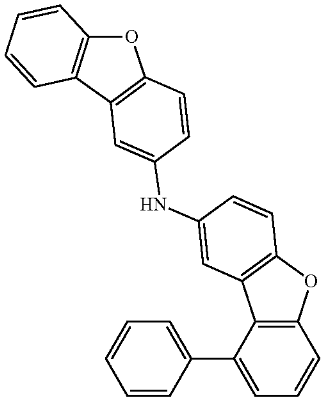
Sub2-83
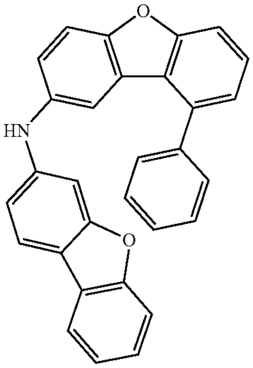
Sub2-84
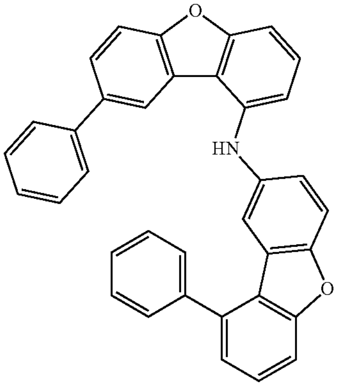
Sub2-85
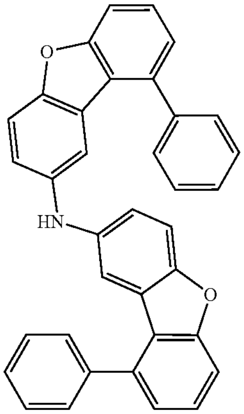

-continued
Sub2-86
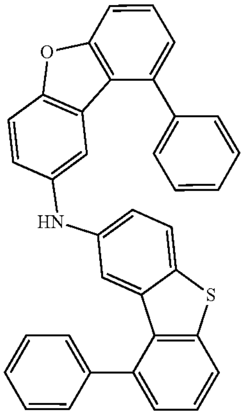
Sub2-87
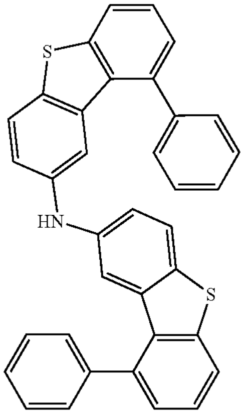
Sub2-88
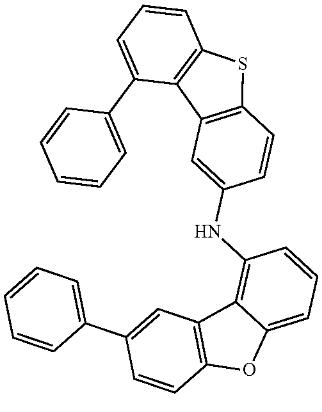
-continued
Sub2-89
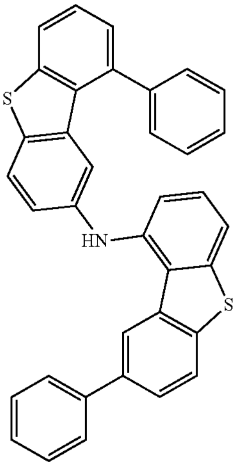
Sub2-90
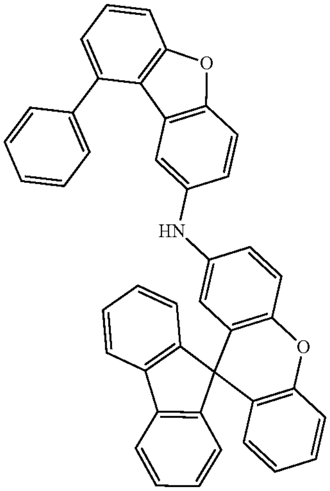
Sub2-91
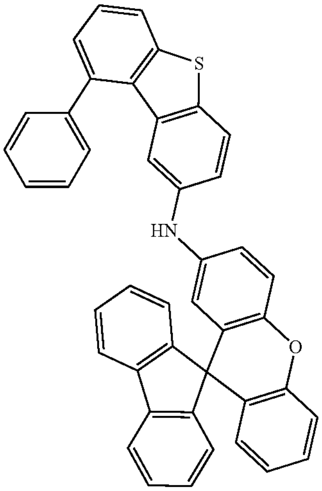

-continued
Sub2-92
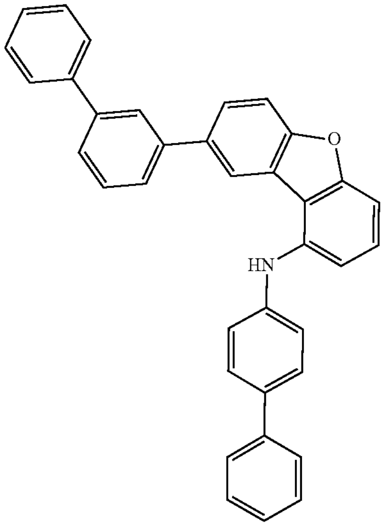
Sub2-93
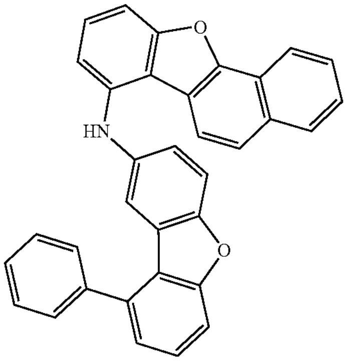
Sub2-94
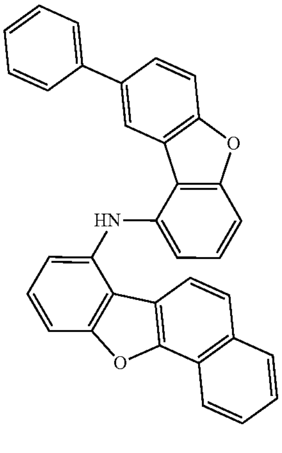
-continued
Sub2-95
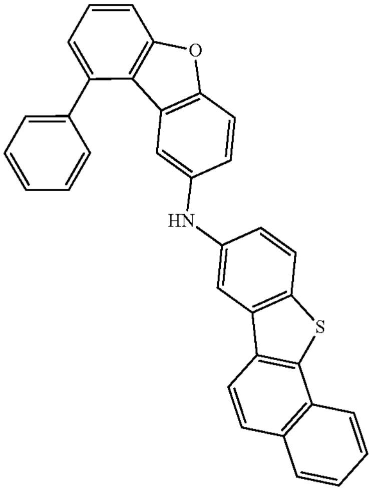
Sub2-96
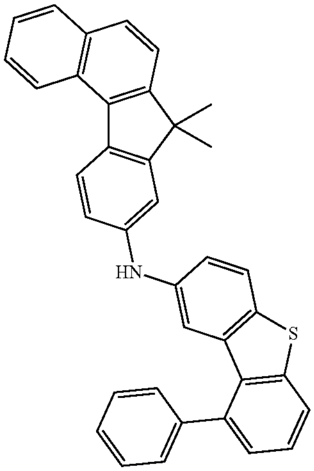
Sub2-97
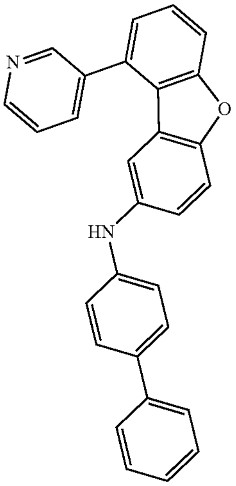

-continued
Sub2-98
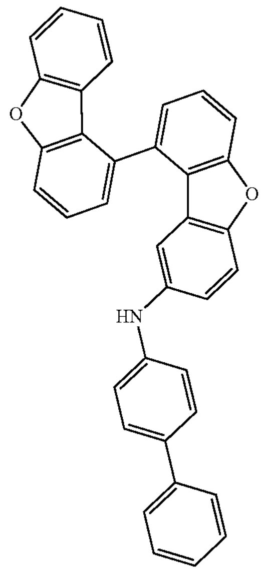
Sub2-99
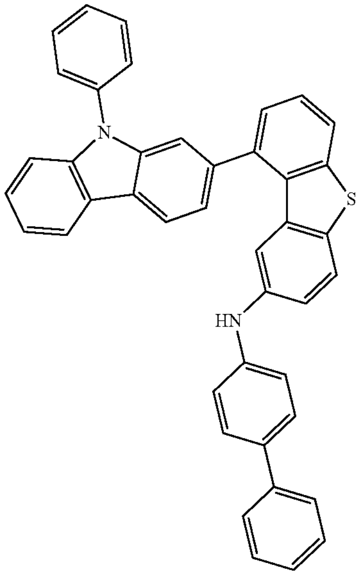
Sub2-100
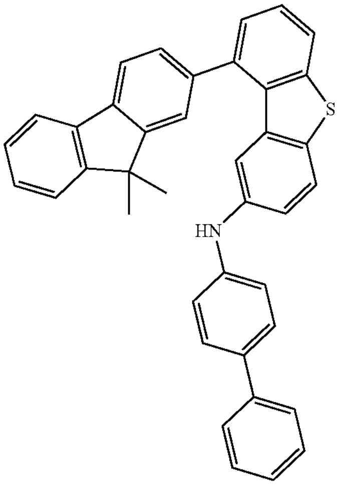
-continued
Sub2-101
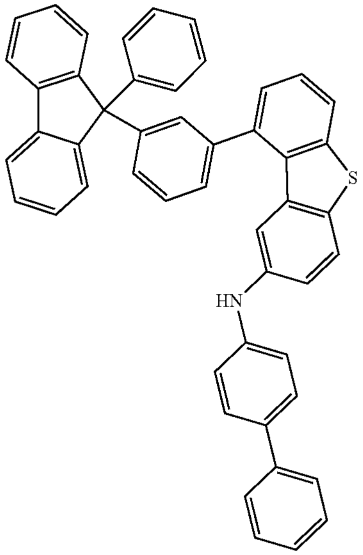
Sub2-102
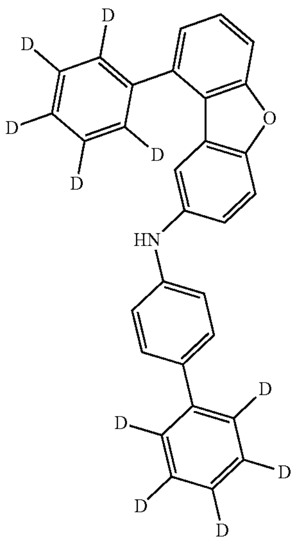
Sub2-103
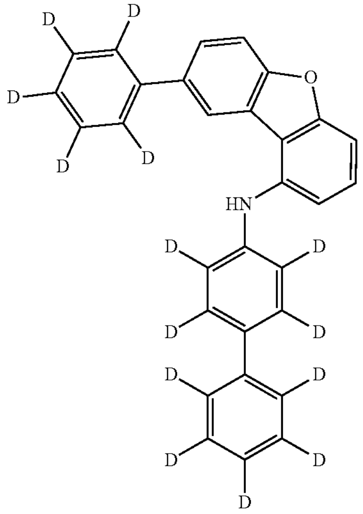

-continued
Sub2-104
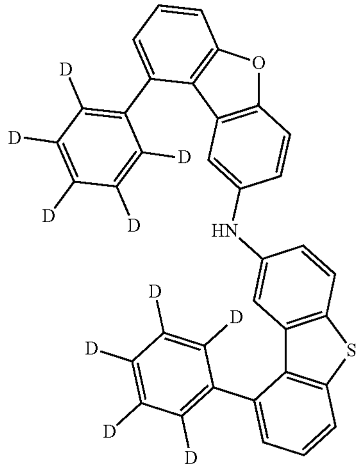
Sub2-105
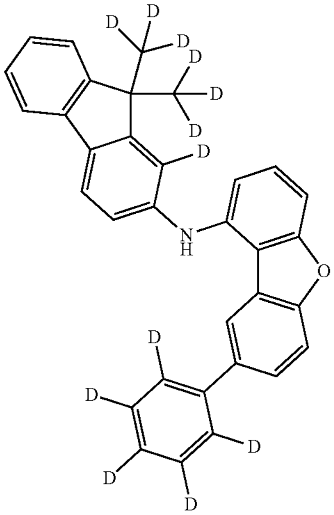
Sub2-106
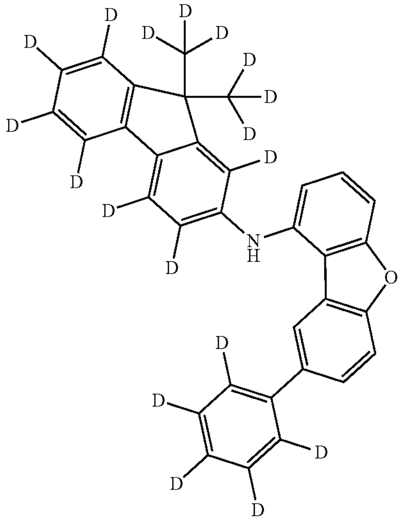
-continued
Sub2-107
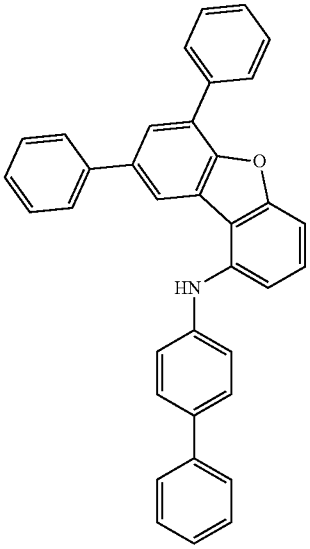
Sub2-108
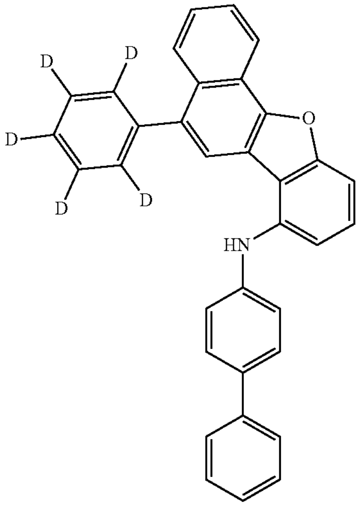
Sub2-109
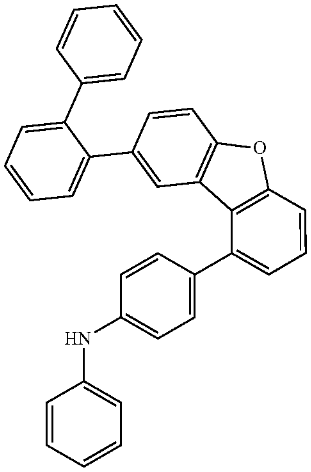

-continued
Sub2-110
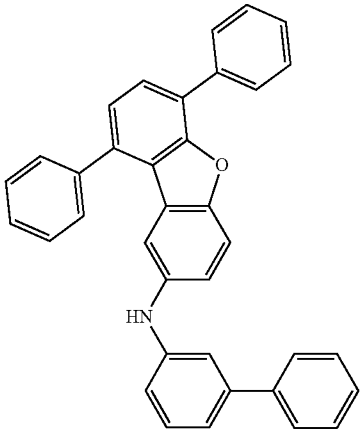
Sub2-111
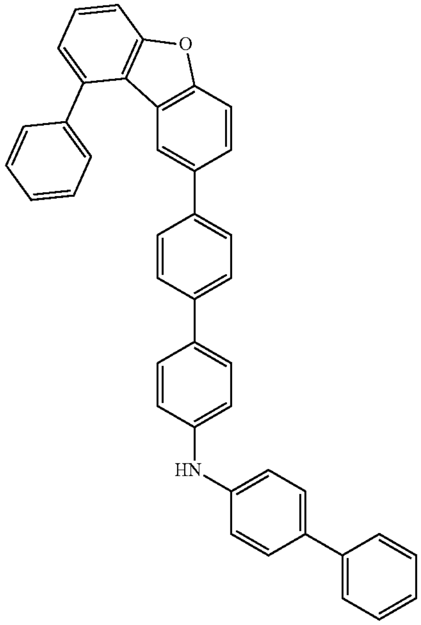
Sub2-112
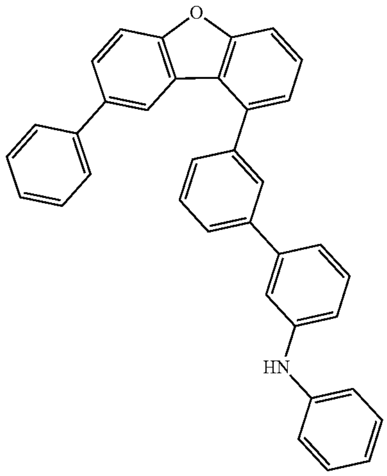
-continued
Sub2-113
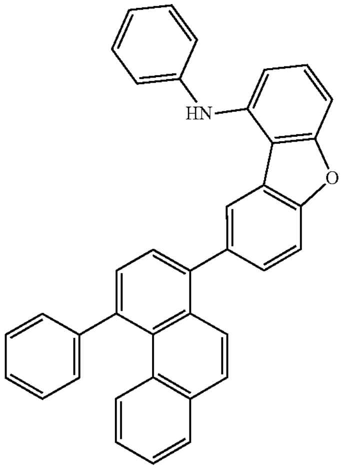
Sub2-114
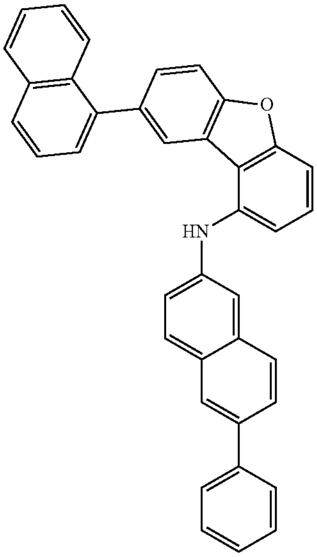
Sub2-115
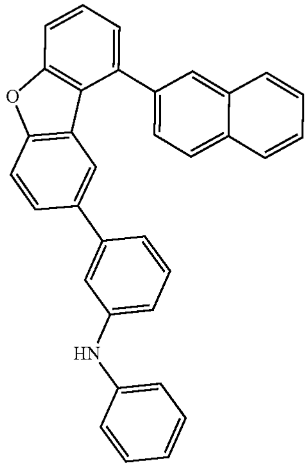

-continued

Sub2-116

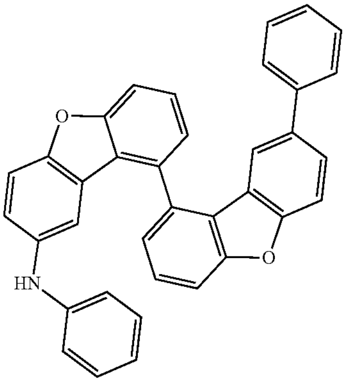

Sub2-117

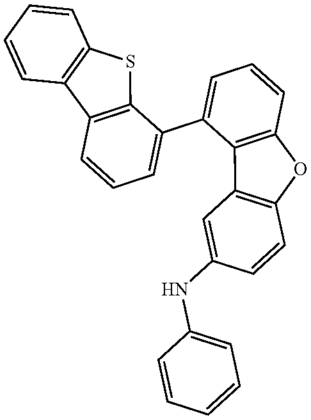

-continued

Sub2-118

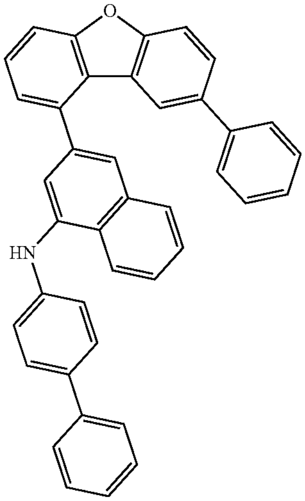

TABLE 2

| Compound | FD-MS | Compound | FD-MS |
|---|---|---|---|
| Sub2-1 | m/z = 335.13 ($C_{24}H_{17}NO$ = 335.41) | Sub2-2 | m/z = 411.16 ($C_{30}H_{21}NO$ = 411.50) |
| Sub2-3 | m/z = 411.16 ($C_{30}H_{21}NO$ = 411.50) | Sub2-4 | m/z = 411.16 ($C_{30}H_{21}NO$ = 411.50) |
| Sub2-5 | m/z = 487.19 ($C_{36}H_{25}NO$ = 487.60) | Sub2-6 | m/z = 487.19 ($C_{36}H_{25}NO$ = 487.60) |
| Sub2-7 | m/z = 487.19 ($C_{36}H_{25}NO$ = 487.60) | Sub2-8 | m/z = 563.22 ($C_{42}H_{29}NO$ = 563.70) |
| Sub2-9 | m/z = 425.18 ($C_{31}H_{23}NO$ = 425.53) | Sub2-10 | m/z = 439.19 ($C_{32}H_{25}NO$ = 439.56) |
| Sub2-11 | m/z = 489.21 ($C_{36}H_{27}NO$ = 489.62) | Sub2-12 | m/z = 545.27 ($C_{40}H_{35}NO$ = 545.73) |
| Sub2-13 | m/z = 523.29 ($C_{38}H_{37}NO$ = 523.72) | Sub2-14 | m/z = 467.22 ($C_{34}H_{29}NO$ = 467.61) |
| Sub2-15 | m/z = 417.21 ($C_{30}H_{27}NO$ = 417.55) | Sub2-16 | m/z = 429.21 ($C_{31}H_{27}NO$ = 429.56) |
| Sub2-17 | m/z = 469.24 ($C_{34}H_{31}NO$ = 469.63) | Sub2-18 | m/z = 467.22 ($C_{34}H_{29}NO$ = 467.61) |
| Sub2-19 | m/z = 487.19 ($C_{36}H_{25}NO$ = 487.60) | Sub2-20 | m/z = 417.21 ($C_{30}H_{27}NO$ = 417.55) |
| Sub2-21 | m/z = 461.18 ($C_{34}H_{23}NO$ = 461.56) | Sub2-22 | m/z = 461.18 ($C_{34}H_{23}NO$ = 461.56) |
| Sub2-23 | m/z = 537.21 ($C_{40}H_{27}NO$ = 537.66) | Sub2-24 | m/z = 537.21 ($C_{40}H_{27}NO$ = 537.66) |
| Sub2-25 | m/z = 467.22 ($C_{34}H_{29}NO$ = 467.61) | Sub2-26 | m/z = 493.24 ($C_{36}H_{31}NO$ = 493.65) |
| Sub2-27 | m/z = 511.19 ($C_{38}H_{25}NO$ = 511.62) | Sub2-28 | m/z = 587.22 ($C_{44}H_{29}NO$ = 587.72) |
| Sub2-29 | m/z = 425.14 ($C_{30}H_{19}NO_2$ = 425.49) | Sub2-30 | m/z = 425.14 ($C_{30}H_{19}NO_2$ = 425.49) |
| Sub2-31 | m/z = 425.14 ($C_{30}H_{19}NO_2$ = 425.49) | Sub2-32 | m/z = 425.14 ($C_{30}H_{19}NO_2$ = 425.49) |
| Sub2-33 | m/z = 501.17 ($C_{36}H_{23}NO_2$ = 501.59) | Sub2-34 | m/z = 501.17 ($C_{36}H_{23}NO_2$ = 501.59) |
| Sub2-35 | m/z = 501.17 ($C_{36}H_{23}NO_2$ = 501.59) | Sub2-36 | m/z = 501.17 ($C_{36}H_{23}NO_2$ = 501.59) |
| Sub2-37 | m/z = 501.17 ($C_{36}H_{23}NO_2$ = 501.59) | Sub2-38 | m/z = 507.22 ($C_{36}H_{29}NO_2$ = 507.63) |
| Sub2-39 | m/z = 481.20 ($C_{34}H_{27}NO_2$ = 481.60) | Sub2-40 | m/z = 481.20 ($C_{34}H_{27}NO_2$ = 481.60) |
| Sub2-41 | m/z = 577.20 ($C_{42}H_{27}NO_2$ = 577.68) | Sub2-42 | m/z = 653.24 ($C_{48}H_{31}NO_2$ = 653.78) |
| Sub2-43 | m/z = 551.19 ($C_{40}H_{25}NO_2$ = 551.65) | Sub2-44 | m/z = 551.19 ($C_{40}H_{25}NO_2$ = 551.65) |
| Sub2-45 | m/z = 557.24 ($C_{40}H_{31}NO_2$ = 557.69) | Sub2-46 | m/z = 583.25 ($C_{42}H_{33}NO_2$ = 583.73) |
| Sub2-47 | m/z = 595.25 ($C_{43}H_{33}NO_2$ = 595.74) | Sub2-48 | m/z = 635.28 ($C_{46}H_{37}NO_2$ = 635.81) |
| Sub2-49 | m/z = 441.12 ($C_{30}H_{19}NOS$ = 441.55) | Sub2-50 | m/z = 441.12 ($C_{30}H_{19}NOS$ = 441.55) |
| Sub2-51 | m/z = 441.12 ($C_{30}H_{19}NOS$ = 441.55) | Sub2-52 | m/z = 441.12 ($C_{30}H_{19}NOS$ = 441.55) |
| Sub2-53 | m/z = 517.15 ($C_{36}H_{23}NOS$ = 517.65) | Sub2-54 | m/z = 593.18 ($C_{42}H_{27}NOS$ = 593.74) |
| Sub2-55 | m/z = 517.15 ($C_{36}H_{23}NOS$ = 517.65) | Sub2-56 | m/z = 593.18 ($C_{42}H_{27}NOS$ = 593.74) |
| Sub2-57 | m/z = 589.20 ($C_{43}H_{27}NO_2$ = 589.69) | Sub2-58 | m/z = 589.20 ($C_{43}H_{27}NO_2$ = 589.69) |
| Sub2-59 | m/z = 589.20 ($C_{43}H_{27}NO_2$ = 589.69) | Sub2-60 | m/z = 589.20 ($C_{43}H_{27}NO_2$ = 589.69) |
| Sub2-61 | m/z = 451.19 ($C_{33}H_{25}NO$ = 451.57) | Sub2-62 | m/z = 527.22 ($C_{39}H_{29}NO$ = 527.67) |
| Sub2-63 | m/z = 575.22 ($C_{43}H_{29}NO$ = 575.71) | Sub2-64 | m/z = 575.22 ($C_{43}H_{29}NO$ = 575.71) |
| Sub2-65 | m/z = 575.22 ($C_{43}H_{29}NO$ = 575.71) | Sub2-66 | m/z = 573.21 ($C_{43}H_{27}NO$ = 573.70) |
| Sub2-67 | m/z = 573.21 ($C_{43}H_{27}NO$ = 573.70) | Sub2-68 | m/z = 649.27 ($C_{49}H_{31}NO$ = 649.79) |
| Sub2-69 | m/z = 500.19 ($C_{36}H_{24}N_2O$ = 500.60) | Sub2-70 | m/z = 500.19 ($C_{36}H_{24}N_2O$ = 500.60) |

TABLE 2-continued

| Compound | FD-MS | Compound | FD-MS |
|---|---|---|---|
| Sub2-71 | m/z = 576.22 ($C_{42}H_{26}N_2O$ = 576.70) | Sub2-72 | m/z = 500.19 ($C_{36}H_{24}N_2O$ = 500.60) |
| Sub2-73 | m/z = 411.16 ($C_{30}H_{21}NO$ = 411.50) | Sub2-74 | m/z = 411.16 ($C_{30}H_{21}NO$ = 411.50) |
| Sub2-75 | m/z = 427.14 ($C_{30}H_{21}NS$ = 427.57) | Sub2-76 | m/z = 451.19 ($C_{33}H_{25}NO$ = 451.57) |
| Sub2-77 | m/z = 451.19 ($C_{33}H_{25}NO$ = 451.57) | Sub2-78 | m/z = 467.17 ($C_{33}H_{25}NS$ = 467.63) |
| Sub2-79 | m/z = 527.22 ($C_{39}H_{29}NO$ = 527.67) | Sub2-80 | m/z = 543.20 ($C_{39}H_{29}NS$ = 543.73) |
| Sub2-81 | m/z = 425.14 ($C_{30}H_{19}NO_2$ = 425.49) | Sub2-82 | m/z = 425.14 ($C_{30}H_{19}NO_2$ = 425.49) |
| Sub2-83 | m/z = 425.14 ($C_{30}H_{19}NO_2$ = 425.49) | Sub2-84 | m/z = 501.17 ($C_{36}H_{23}NO_2$ = 501.59) |
| Sub2-85 | m/z = 501.17 ($C_{36}H_{23}NO_2$ = 501.59) | Sub2-86 | m/z = 517.15 ($C_{36}H_{23}NOS$ = 517.65) |
| Sub2-87 | m/z = 533.13 ($C_{36}H_{23}NS_2$ = 533.71) | Sub2-88 | m/z = 517.15 ($C_{36}H_{23}NOS$ = 517.65) |
| Sub2-89 | m/z = 533.13 ($C_{36}H_{23}NS_2$ = 533.71) | Sub2-90 | m/z = 589.20 ($C_{43}H_{27}NO_2$ = 589.69) |
| Sub2-91 | m/z = 605.18 ($C_{43}H_{27}NOS$ = 605.76) | Sub2-92 | m/z = 487.19 ($C_{36}H_{25}NO$ = 487.60) |
| Sub2-93 | m/z = 475.16 ($C_{34}H_{21}NO_2$ = 475.55) | Sub2-94 | m/z = 475.16 ($C_{34}H_{21}NO_2$ = 475.55) |
| Sub2-95 | m/z = 491.13 ($C_{34}H_{21}NOS$ = 491.61) | Sub2-96 | m/z = 517.19 ($C_{37}H_{23}NS$ = 517.69) |
| Sub2-97 | m/z = 412.16 ($C_{29}H_{20}N_2O$ = 412.49) | Sub2-98 | m/z = 501.17 ($C_{36}H_{23}NO_2$ = 501.59) |
| Sub2-99 | m/z = 592.20 ($C_{42}H_{28}N_2S$ = 592.76) | Sub2-100 | m/z = 543.20 ($C_{39}H_{29}NS$ = 543.73) |
| Sub2-101 | m/z = 667.23 ($C_{49}H_{33}NS$ = 667.87) | Sub2-102 | m/z = 421.23 ($C_{30}H_{11}D_{10}NO$ = 421.57) |
| Sub2-103 | m/z = 425.25 ($C_{30}H_7D_{14}NO$ = 425.59) | Sub2-104 | m/z = 527.21 ($C_{36}H_{13}D_{10}NOS$ = 527.71) |
| Sub2-105 | m/z = 462.26 ($C_{33}H_{14}D_{11}NO$ = 462.64) | Sub2-106 | m/z = 469.31 ($C_{33}H_7D_{18}NO$ = 469.68) |
| Sub2-107 | m/z = 487.19 ($C_{36}H_{25}NO$ = 487.60) | Sub2-108 | m/z = 466.21 ($C_{34}H_{18}D_5NO$ = 466.59) |
| Sub2-109 | m/z = 487.19 ($C_{36}H_{25}NO$ = 487.60) | Sub2-110 | m/z = 487.19 ($C_{36}H_{25}NO$ = 487.60) |
| Sub2-111 | m/z = 563.22 ($C_{42}H_{29}NO$ = 563.70) | Sub2-112 | m/z = 487.19 ($C_{36}H_{25}NO$ = 487.60) |
| Sub2-113 | m/z = 511.19 ($C_{38}H_{25}NO$ = 511.62) | Sub2-114 | m/z = 511.19 ($C_{38}H_{25}NO$ = 511.62) |
| Sub2-115 | m/z = 461.18 ($C_{34}H_{23}NO$ = 461.56) | Sub2-116 | m/z = 501.17 ($C_{36}H_{23}NO_2$ = 501.59) |
| Sub2-117 | m/z = 441.12 ($C_{30}H_{19}NOS$ = 441.55) | Sub2-118 | m/z = 537.21 ($C_{40}H_{27}NO$ = 537.66) |

Synthesis Example of Final Product

1. Synthesis Example of P1-2

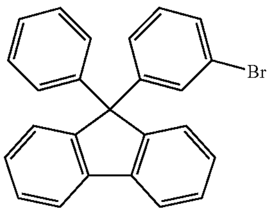

Sub1-1

+

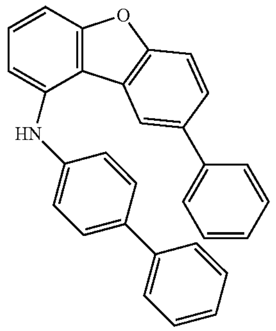

Sub2-2

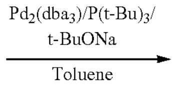

-continued

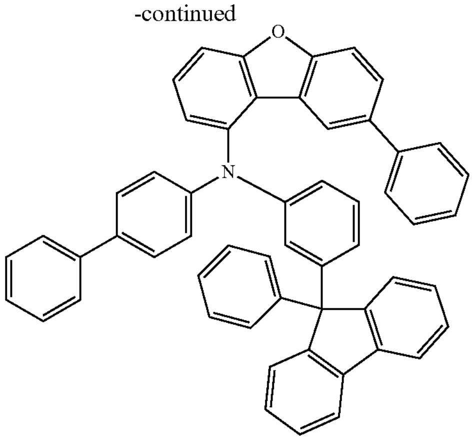

P1-2

Sub1-1 (CAS RN: 1257251-75-4, 15.00 g, 37.75 mmol) and Sub2-2 (15.53 g, 37.75 mmol) were placed in a round-bottom flask and dissolved in toluene (125 mL). Then, $Pd_2(dba)_3$ (1.03 g, 1.13 mmol), P (t-Bu) 3 (0.45 g, 2.26 mmol) and t-BuONa (7.25 g, 75.50 mmol) were added to the solution and the mixture was stirred at 120° C. When the reaction was completed, the reaction product was extracted with toluene and water, dried with $MgSO_4$, and concentrated. Then, the concentrate was then separated using a silica column and recrystallized to obtain 23.7 g (yield: 86.3%) of the product.

2. Synthesis Example of P1-75

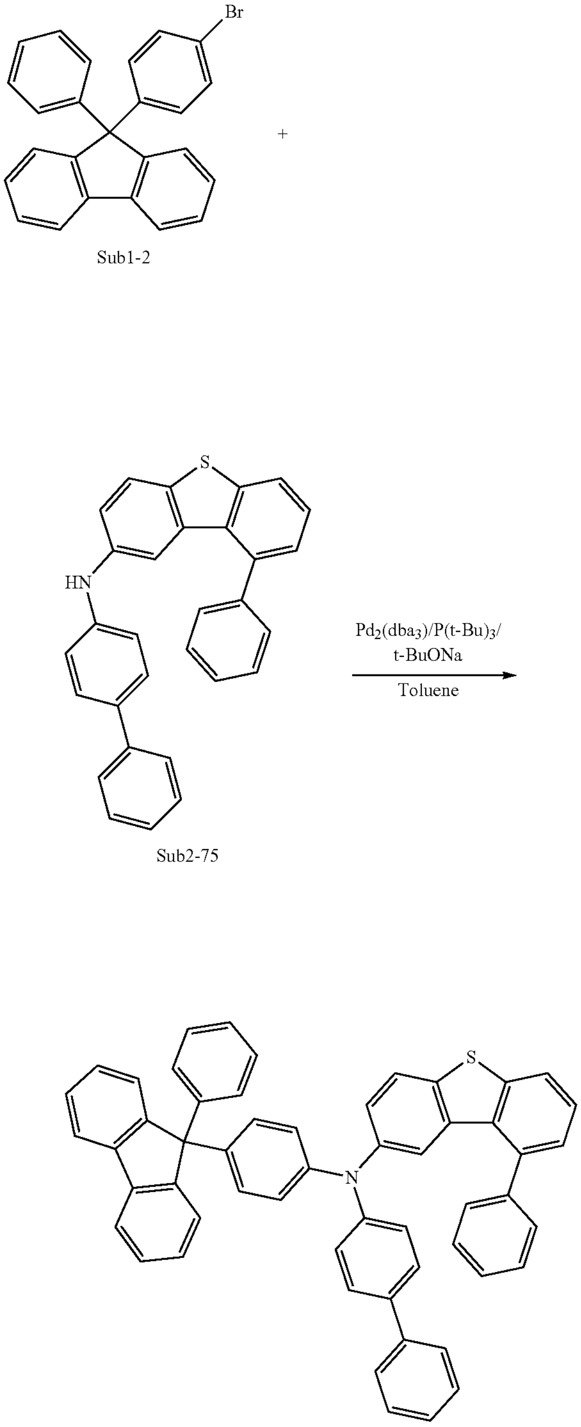

Sub1-2 + Sub2-75 → P1-75

Sub1-2 (15.00 g, 37.75 mmol) and Sub2-75 (16.14 g, 37.75 mmol) were placed in a round-bottom flask and dissolved in toluene (125 mL). Then, $Pd_2(dba)_3$ (1.03 g, 1.13 mmol), P (t-Bu) 3 (0.45 g, 2.26 mmol) and t-BuONa (7.25 g, 75.50 mmol) were added to the solution and the same method as the synthesis of P1-2 was carried out to obtain 22.5 g (yield: 80.1%) of product.

3. Synthesis Example of P1-76

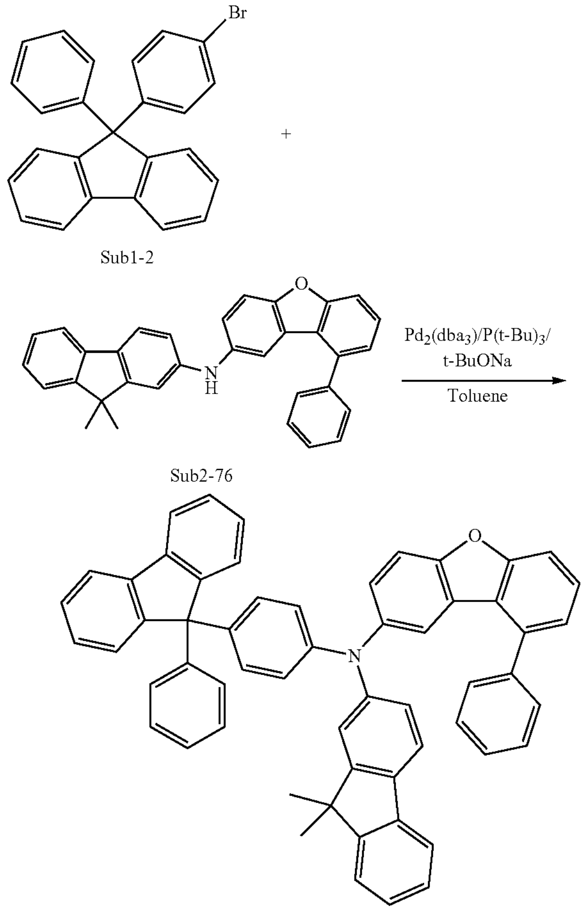

Sub1-2 + Sub2-76 → P1-76

Sub1-2 (15.00 g, 37.75 mmol) and Sub2-76 (17.04 g, 37.75 mmol) were placed in a round-bottom flask and dissolved in toluene (125 mL). Then, $Pd_2(dba)_3$ (1.03 g, 1.13 mmol), P (t-Bu) 3 (0.45 g, 2.26 mmol) and t-BuONa (7.25 g, 75.50 mmol) were added to the solution and the same method as the synthesis of P1-2 was carried out to obtain 22.7 g (yield: 78.3%) of product.

4. Synthesis Example of P2-50

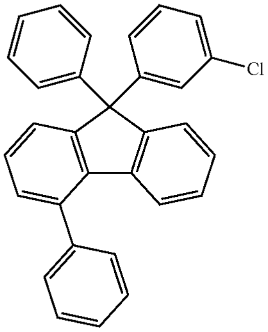

+

Sub1-5

-continued

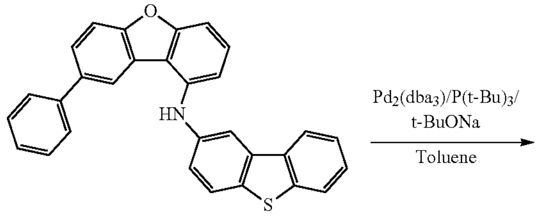

Sub2-50

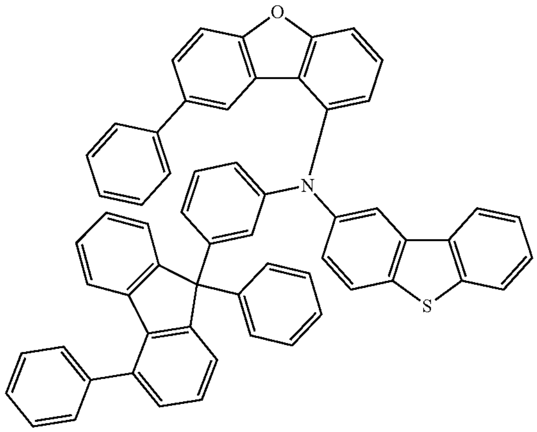

P2-50

Sub1-5 (15.00 g, 34.96 mmol) and Sub2-50 (15.44 g, 34.96 mmol) were placed in a round-bottom flask and dissolved in toluene (125 mL). Then, $Pd_2(dba)_3$ (0.96 g, 1.04 mmol), $P(t\text{-}Bu)_3$ (0.42 g, 2.09 mmol) and t-BuONa (6.72 g, 69.93 mmol) were added to the solution and the same method as the synthesis of P1-2 was carried out to obtain 24.1 g (yield: 82.6%).

5. Synthesis Example of P2-91

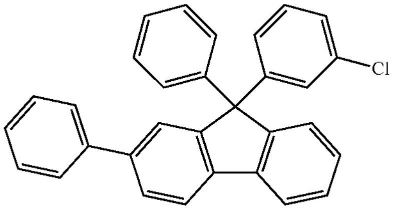

\+

Sub1-3

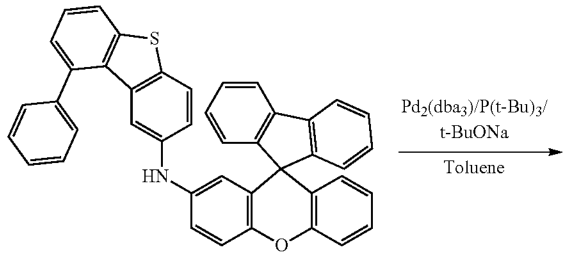

Sub2-91

-continued

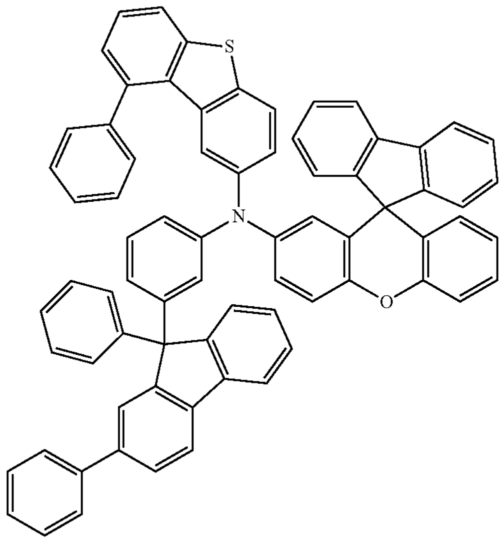

P2-91

Sub1-3 (15.00 g, 34.96 mmol) and Sub2-91 (21.18 g, 34.96 mmol) were placed in a round-bottom flask and dissolved in toluene (125 mL). Then, $Pd_2(dba)_3$ (0.96 g, 1.04 mmol), P (t-Bu) 3 (0.42 g, 2.09 mmol) and t-BuONa (6.72 g, 69.93 mmol) were added to the solution and the same method as the synthesis of P1-2 was carried out to obtain 29.3 g (yield: 83.9%) of product.

6. Synthesis Example of P2-105

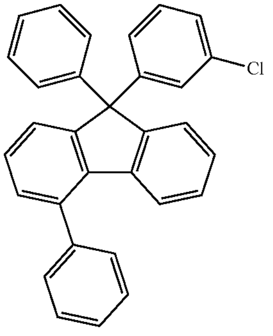

\+

Sub1-5

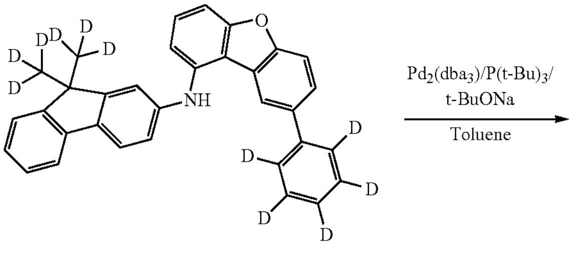

Sub2-105

-continued

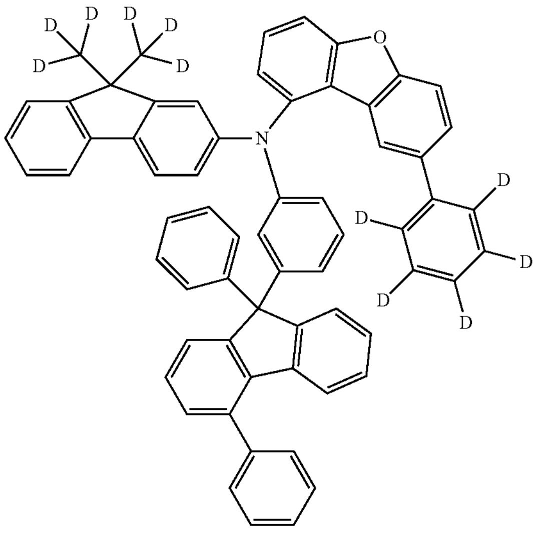

P2-105

Sub1-5 (15.00 g, 34.96 mmol) and Sub2-105 (16.17 g, 34.96 mmol) were placed in a round-bottom flask and dissolved in toluene (125 mL). Then, $Pd_2(dba)_3$ (0.96 g, 1.04 mmol), P (t-Bu) 3 (0.42 g, 2.09 mmol) and t-BuONa (6.72 g, 69.93 mmol) were added to the solution and the same method as the synthesis of P1-2 was carried out to obtain 22.2 g (yield: 74.2%) of product.

7. Synthesis Example of P3-6

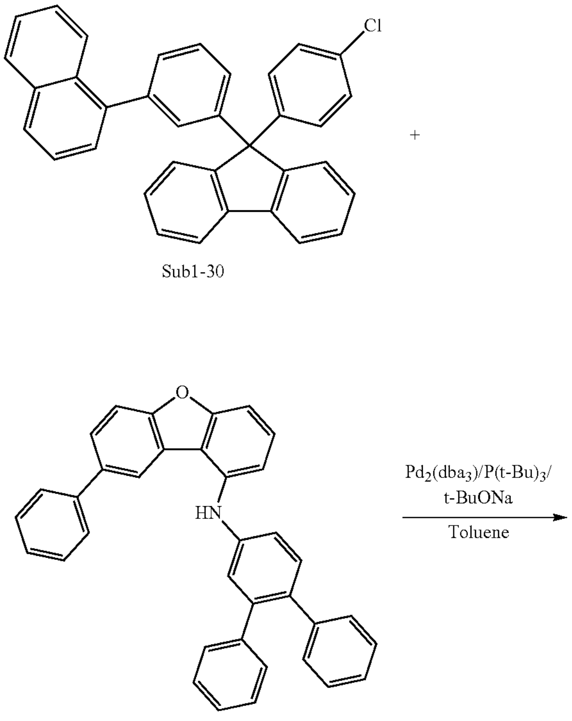

Sub1-30

Sub2-6

-continued

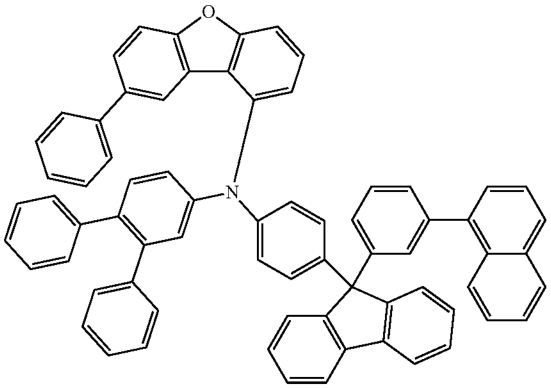

P3-6

Sub1-30 (15.00 g, 31.31 mmol) and Sub2-6 (15.26 g, 31.31 mmol) were placed in a round-bottom flask and dissolved in toluene (110 mL). Then, $Pd_2(dba)_3$ (0.86 g, 0.94 mmol), P (t-Bu) 3 (0.38 g, 1.88 mmol) and t-BuONa (6.02 g, 62.70 mmol) were added to the solution and the same method as the synthesis of P1-2 was carried out to obtain 23.7 g (yield: 81.36%) of product.

8. Synthesis Example of P3-16

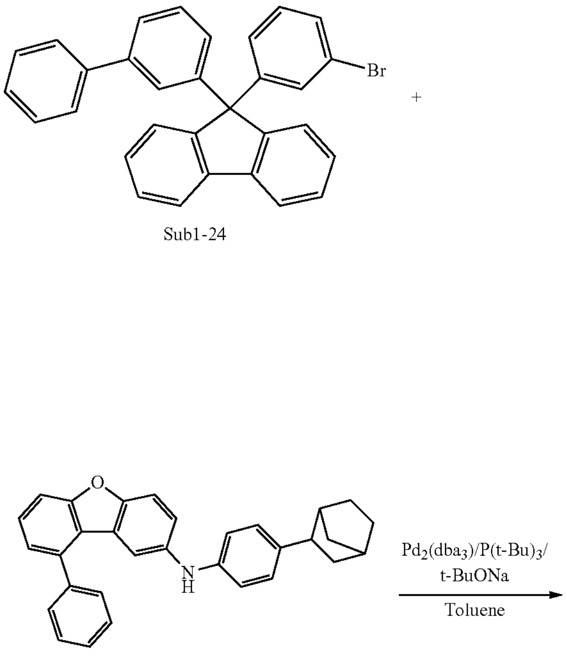

Sub1-24

Sub2-16

-continued

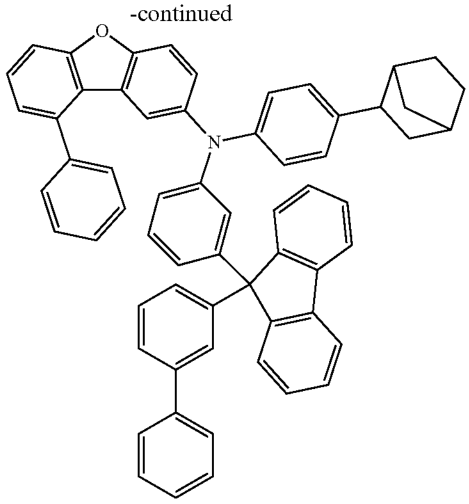

P3-16

Sub1-24 (15.00 g, 31.68 mmol) and Sub2-16 (13.61 g, 31.68 mmol) were placed in a round-bottom flask and dissolved in toluene (110 mL). Then, $Pd_2(dba)_3$ (0.87 g, 0.95 mmol), P (t-Bu) 3 (0.38 g, 1.90 mmol) and t-BuONa (6.09 g, 63.37 mmol) were added to the solution and the same method as the synthesis of P1-2 was carried out to obtain 20.1 g (yield: 77.1%) of product.

9. Synthesis Example of P3-100

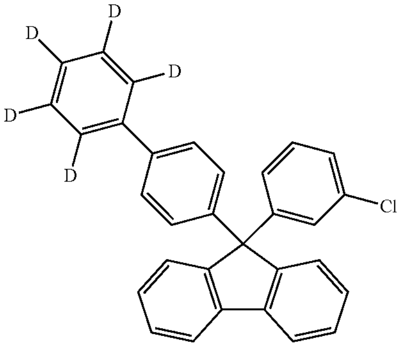

Sub1-33

+

-continued

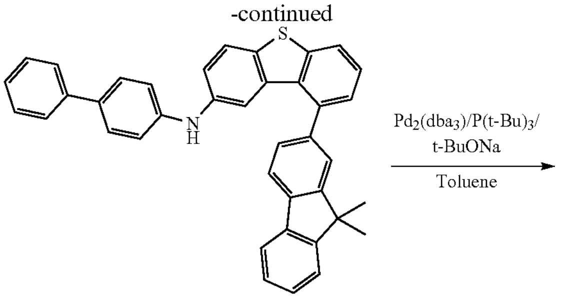

Sub2-100

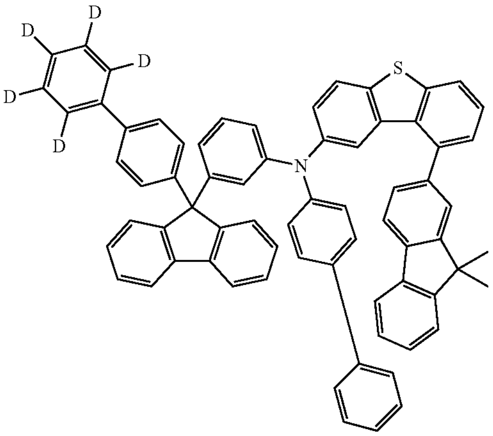

P3-100

Sub1-33 (15.00 g, 31.35 mmol) and Sub2-100 (17.04 g, 31.35 mmol) were placed in a round-bottom flask and dissolved in toluene (110 mL). Then, $Pd_2(dba)_3$ (0.86 g, 0.94 mmol), P (t-Bu) 3 (0.38 g, 1.88 mmol) and t-BuONa (6.02 g, 62.70 mmol) were added to the solution and the same method as the synthesis of P1-2 was carried out to obtain 22.8 g (yield: 77.2%) of product.

The FD-MS values of the compounds of the present invention manufactured according to the above synthetic examples are as shown in Table 3 below.

TABLE 3

| Compound | FD-MS | Compound | FD-MS |
|---|---|---|---|
| P1-1 | m/z = 651.26 ($C_{49}H_{33}NO$ = 651.81) | P1-2 | m/z = 727.29 ($C_{55}H_{37}NO$ = 727.91) |
| P1-3 | m/z = 727.29 ($C_{55}H_{37}NO$ = 727.91) | P1-4 | m/z = 727.29 ($C_{55}H_{37}NO$ = 727.91) |
| P1-5 | m/z = 803.32 ($C_{61}H_{41}NO$ = 804.01) | P1-6 | m/z = 803.32 ($C_{61}H_{41}NO$ = 804.01) |
| P1-7 | m/z = 803.32 ($C_{61}H_{41}NO$ = 804.01) | P1-8 | m/z = 879.35 ($C_{57}H_{45}NO$ = 880.10) |
| P1-9 | m/z = 741.30 ($C_{56}H_{39}NO$ = 741.93) | P1-10 | m/z = 755.32 ($C_{57}H_{41}NO$ = 755.96) |
| P1-11 | m/z = 805.33 ($C_{61}H_{43}NO$ = 806.02) | P1-12 | m/z = 861.40 ($C_{65}H_{51}NO$ = 862.13) |
| P1-13 | m/z = 839.41 ($C_{63}H_{53}NO$ = 840.12) | P1-14 | m/z = 783.35 ($C_{59}H_{45}NO$ = 784.02) |
| P1-15 | m/z = 733.33 ($C_{53}H_{43}NO$ = 733.96) | P1-16 | m/z = 745.33 ($C_{56}H_{43}NO$ = 745.97) |
| P1-17 | m/z = 785.37 ($C_{59}H_{47}NO$ = 786.03) | P1-18 | m/z = 817.30 ($C_{61}H_{39}NO_2$ = 817.99) |
| P1-19 | m/z = 757.24 ($C_{55}H_{35}NOS$ = 757.95) | P1-20 | m/z = 853.33 ($C_{65}H_{43}NO$ = 854.07) |
| P1-21 | m/z = 777.30 ($C_{59}H_{39}NO$ = 777.97) | P1-22 | m/z = 777.30 ($C_{59}H_{39}NO$ = 777.97) |
| P1-23 | m/z = 853.33 ($C_{65}H_{43}NO$ = 854.07) | P1-24 | m/z = 853.33 ($C_{65}H_{43}NO$ = 854.07) |
| P1-25 | m/z = 783.35 ($C_{59}H_{45}NO$ = 784.02) | P1-26 | m/z = 809.37 ($C_{61}H_{47}NO$ = 810.05) |
| P1-27 | m/z = 827.32 ($C_{63}H_{41}NO$ = 828.03) | P1-28 | m/z = 903.35 ($C_{69}H_{45}NO$ = 904.13) |
| P1-29 | m/z = 741.27 ($C_{55}H_{35}NO_2$ = 741.89) | P1-30 | m/z = 741.27 ($C_{55}H_{35}NO_2$ = 741.89) |
| P1-31 | m/z = 741.27 ($C_{55}H_{35}NO_2$ = 741.89) | P1-32 | m/z = 741.27 ($C_{55}H_{35}NO_2$ = 741.89) |

TABLE 3-continued

| Compound | FD-MS | Compound | FD-MS |
|---|---|---|---|
| P1-33 | m/z = 817.30 ($C_{51}H_{39}NO_2$ = 817.99) | P1-34 | m/z = 817.30 ($C_{61}H_{39}NO_2$ = 817.99) |
| P1-35 | m/z = 817.30 ($C_{51}H_{39}NO_2$ = 817.99) | P1-36 | m/z = 817.30 ($C_{61}H_{39}NO_2$ = 817.99) |
| P1-37 | m/z = 817.30 ($C_{51}H_{39}NO_2$ = 817.99) | P1-38 | m/z = 791.28 ($C_{59}H_{37}NO_2$ = 791.95) |
| P1-39 | m/z = 791.28 ($C_{59}H_{37}NO_2$ = 791.95) | P1-40 | m/z = 797.33 ($C_{59}H_{43}NO_2$ = 798.00) |
| P1-41 | m/z = 893.33 ($C_{67}H_{43}NO_2$ = 894.09) | P1-42 | m/z = 969.36 ($C_{73}H_{47}NO_2$ = 970.18) |
| P1-43 | m/z = 867.31 ($C_{65}H_{41}NO_2$ = 868.05) | P1-44 | m/z = 867.31 ($C_{67}H_{49}NO_2$ = 868.05) |
| P1-45 | m/z = 873.36 ($C_{65}H_{47}NO_2$ = 874.10) | P1-46 | m/z = 899.38 ($C_{67}H_{49}NO_2$ = 900.13) |
| P1-47 | m/z = 911.38 ($C_{68}H_{49}NO_2$ = 912.15) | P1-48 | m/z = 951.41 ($C_{71}H_{53}NO_2$ = 952.21) |
| P1-49 | m/z = 757.24 ($C_{55}H_{35}NOS$ = 757.95) | P1-50 | m/z = 757.24 ($C_{55}H_{35}NOS$ = 757.95) |
| P1-51 | m/z = 757.24 ($C_{55}H_{35}NOS$ = 757.95) | P1-52 | m/z = 757.24 ($C_{65}H_{35}NOS$ = 757.95) |
| P1-53 | m/z = 833.28 ($C_{61}H_{39}NOS$ = 834.05) | P1-54 | m/z = 909.31 ($C_{67}H_{43}NOS$ = 910.15) |
| P1-55 | m/z = 833.28 ($C_{61}H_{39}NOS$ = 834.05) | P1-56 | m/z = 909.31 ($C_{67}H_{43}NOS$ = 910.15) |
| P1-57 | m/z = 905.33 ($C_{68}H_{43}NO_2$ = 906.10) | P1-58 | m/z = 905.33 ($C_{68}H_{43}NO_2$ = 906.10) |
| P1-59 | m/z = 905.33 ($C_{68}H_{43}NO_2$ = 906.10) | P1-60 | m/z = 905.33 ($C_{68}H_{43}NO_2$ = 906.10) |
| P1-61 | m/z = 797.32 ($C_{58}H_{41}NO$ = 767.97) | P1-62 | m/z = 843.35 ($C_{64}H_{43}NO$ = 844.07) |
| P1-63 | m/z = 891.35 ($C_{58}H_{45}NO$ = 892.11) | P1-64 | m/z = 891.35 ($C_{68}H_{45}NO$ = 892.11) |
| P1-65 | m/z = 891.35 ($C_{68}H_{45}NO$ = 892.11) | P1-66 | m/z = 889.33 ($C_{68}H_{43}NO$ = 890.10) |
| P1-67 | m/z = 889.33 ($C_{68}H_{43}NO$ = 890.10) | P1-68 | m/z = 965.37 ($C_{74}H_{47}NO$ = 966.20) |
| P1-69 | m/z = 816.31 ($C_{61}H_{40}N_2O$ = 817.00) | P1-70 | m/z = 816.31 ($C_{61}H_{40}N_2O$ = 817.00) |
| P1-71 | m/z = 892.35 ($C_{67}H_{44}N_2O$ = 893.10) | P1-72 | m/z = 816.31 ($C_{61}H_{40}N_2O$ = 817.00) |
| P1-73 | m/z = 727.29 ($C_{55}H_{37}NO$ = 727.91) | P1-74 | m/z = 727.29 ($C_{55}H_{37}NO$ = 727.91) |
| P1-75 | m/z = 743.26 ($C_{55}H_{37}NS$ = 743.97) | P1-76 | m/z = 767.32 ($C_{68}H_{44}NO$ = 767.97) |
| P1-77 | m/z = 767.32 ($C_{58}H_{41}NO$ = 767.97) | P1-78 | m/z = 783.30 ($C_{68}H_{41}NS$ = 784.03) |
| P1-79 | m/z = 843.35 ($C_{64}H_{45}NO$ = 844.07) | P1-80 | m/z = 859.33 ($C_{64}H_{45}NS$ = 860.13) |
| P1-81 | m/z = 741.27 ($C_{55}H_{35}NO_2$ = 741.89) | P1-82 | m/z = 741.27 ($C_{55}H_{35}NO_2$ = 741.89) |
| P1-83 | m/z = 741.27 ($C_{55}H_{35}NO_2$ = 741.89) | P1-84 | m/z = 741.27 ($C_{55}H_{35}NO_2$ = 741.89) |
| P1-85 | m/z = 817.30 ($C_{61}H_{39}NO_2$ = 817.99) | P1-86 | m/z = 833.28 ($C_{61}H_{39}NOS$ = 834.05) |
| P1-87 | m/z = 849.25 ($C_{61}H_{39}NS_2$ = 850.11) | P1-88 | m/z = 833.28 ($C_{61}H_{39}NOS$ = 834.05) |
| P1-89 | m/z = 849.25 ($C_{61}H_{39}NS_2$ = 850.11) | P1-90 | m/z = 905.33 ($C_{68}H_{43}NO_2$ = 906.10) |
| P1-91 | m/z = 921.31 ($C_{68}H_{43}NOS$ = 922.16) | P1-92 | m/z = 921.31 ($C_{68}H_{43}NOS$ = 922.16) |
| P1-93 | m/z = 791.28 ($C_{59}H_{37}NO_2$ = 791.95) | P1-94 | m/z = 791.28 ($C_{59}H_{37}NO_2$ = 791.95) |
| P1-95 | m/z = 807.26 ($C_{59}H_{37}NOS$ = 808.01) | P1-96 | m/z = 817.33 ($C_{62}H_{43}NO$ = 818.03) |
| P1-97 | m/z = 728.28 ($C_{54}H_{36}N_2O$ = 728.90) | P1-98 | m/z = 817.30 ($C_{61}H_{39}NO_2$ = 817.99) |
| P1-99 | m/z = 908.32 ($C_{67}H_{44}N_2S$ = 909.16) | P1-100 | m/z = 859.33 ($C_{64}H_{45}NS$ = 860.13) |
| P1-101 | m/z = 983.36 ($C_{74}H_{49}NS$ = 984.27) | P1-102 | m/z = 732.32 ($C_{58}H_{32}D_5NO$ = 732.94) |
| P1-103 | m/z = 753.33 ($C_{56}H_{27}D_{10}NS$ = 754.03) | P1-104 | m/z = 843.34 ($C_{61}H_{29}D_{10}NOS$ = 844.11) |
| P1-105 | m/z = 778.39 ($C_{58}H_{30}D_{11}NO$ = 779.04) | P1-106 | m/z = 785.43 ($C_{58}H_{23}D_{18}NO$ = 786.08) |
| P1-107 | m/z = 803.32 ($C_{61}H_{41}NO$ = 804.01) | P1-108 | m/z = 782.33 ($C_{59}H_{34}D_5NO$ = 783.00) |
| P2-1 | m/z = 727.29 ($C_{55}H_{37}NO$ = 727.91) | P2-2 | m/z = 803.32 ($C_{61}H_{41}NO$ = 804.01) |
| P2-3 | m/z = 803.32 ($C_{61}H_{41}NO$ = 804.01) | P2-4 | m/z = 803.32 ($C_{61}H_{41}NO$ = 804.01) |
| P2-5 | m/z = 955.38 ($C_{73}H_{49}NO$ = 956.20) | P2-6 | m/z = 955.38 ($C_{73}H_{49}NO$ = 956.20) |
| P2-7 | m/z = 955.38 ($C_{73}H_{49}NO$ = 956.20) | P2-8 | m/z = 955.38 ($C_{73}H_{49}NO$ = 956.20) |
| P2-9 | m/z = 859.38 ($C_{65}H_{49}NO$ = 860.11) | P2-10 | m/z = 985.43 ($C_{75}H_{59}NO$ = 986.27) |
| P2-11 | m/z = 979.38 ($C_{75}H_{49}NO$ = 980.22) | P2-12 | m/z = 1069.39 ($C_{81}H_{51}NO_2$ = 1070.30) |
| P2-13 | m/z = 1005.45 ($C_{75}H_{59}NO_2$ = 1006.30) | P2-14 | m/z = 949.39 ($C_{71}H_{11}NO_2$ = 950.19) |
| P2-15 | m/z = 975.41 ($C_{73}H_{53}NO_2$ = 976.23) | P2-16 | m/z = 897.40 ($C_{68}H_{51}NO$ = 898.16) |
| P2-17 | m/z = 911.41 ($C_{69}H_{53}NO$ = 912.19) | P2-18 | m/z = 859.38 ($C_{65}H_{49}NO$ = 860.11) |
| P2-19 | m/z = 929.37 ($C_{71}H_{47}NO$ = 930.16) | P2-20 | m/z = 809.37 ($C_{61}H_{47}NO$ = 810.05) |
| P2-21 | m/z = 853.33 ($C_{65}H_{43}NO$ = 854.07) | P2-22 | m/z = 853.33 ($C_{65}H_{43}NO$ = 854.07) |
| P2-23 | m/z = 929.37 ($C_{71}H_{41}NO$ = 930.16) | P2-24 | m/z = 929.37 ($C_{71}H_{41}NO$ = 930.16) |
| P2-25 | m/z = 859.38 ($C_{65}H_{49}NO$ = 860.11) | P2-26 | m/z = 885.40 ($C_{67}H_{61}NO$ = 886.15) |
| P2-27 | m/z = 953.37 ($C_{73}H_{47}NO$ = 954.19) | P2-28 | m/z = 1029.40 ($C_{79}H_{51}NO$ = 1030.28) |
| P2-29 | m/z = 817.30 ($C_{61}H_{39}NO_2$ = 817.99) | P2-30 | m/z = 817.30 ($C_{61}H_{39}NO$ = 817.99) |
| P2-31 | m/z = 817.30 ($C_{61}H_{39}NO_2$ = 817.99) | P2-32 | m/z = 817.30 ($C_{61}H_{39}NO_2$ = 817.99) |
| P2-33 | m/z = 969.36 ($C_{73}H_{47}NO_2$ = 970.18) | P2-34 | m/z = 969.36 ($C_{73}H_{47}NO_2$ = 970.18) |
| P2-35 | m/z = 969.36 ($C_{73}H_{47}NO_2$ = 970.18) | P2-36 | m/z = 949.39 ($C_{71}H_{51}NO_2$ = 950.19) |
| P2-37 | m/z = 893.33 ($C_{67}H_{43}NO_2$ = 894.09) | P2-38 | m/z = 979.38 ($C_{75}H_{49}NO$ = 980.22) |
| P2-39 | m/z = 867.31 ($C_{63}H_{41}NO_2$ = 868.05) | P2-40 | m/z = 867.31 ($C_{65}H_{41}NO_2$ = 868.05) |
| P2-41 | m/z = 1059.37 ($C_{79}H_{49}NO_3$ = 1060.27) | P2-42 | m/z = 1211.43 ($C_{91}H_{57}NO_3$ = 1212.46) |
| P2-43 | m/z = 1019.38 ($C_{77}H_{49}NO_2$ = 1020.24) | P2-44 | m/z = 943.35 ($C_{71}H_{45}NO_2$ = 944.15) |
| P2-45 | m/z = 949.39 ($C_{77}H_{51}NO_2$ = 950.19) | P2-46 | m/z = 975.41 ($C_{73}H_{63}NO_2$ = 976.23) |
| P2-47 | m/z = 987.41 ($C_{74}H_{53}NO_2$ = 988.24) | P2-48 | m/z = 1027.44 ($C_{77}H_{57}NO_2$ = 1028.31) |
| P2-49 | m/z = 833.28 ($C_{61}H_{39}NOS$ = 834.05) | P2-50 | m/z = 833.28 ($C_{61}H_{39}NOS$ = 834.05) |
| P2-51 | m/z = 833.28 ($C_{61}H_{39}NOS$ = 834.05) | P2-52 | m/z = 833.28 ($C_{61}H_{39}NOS$ = 834.05) |
| P2-53 | m/z = 959.32 ($C_{71}H_{45}NOS$ = 960.21) | P2-54 | m/z = 1035.35 ($C_{77}H_{49}NOS$ = 1036.31) |
| P2-55 | m/z = 909.31 ($C_{67}H_{43}NOS$ = 910.15) | P2-56 | m/z = 985.34 ($C_{73}H_{47}NOS$ = 986.25) |
| P2-57 | m/z = 981.36 ($C_{74}H_{47}NO_2$ = 982.20) | P2-58 | m/z = 981.36 ($C_{74}H_{47}NO_2$ = 982.20) |
| P2-59 | m/z = 981.36 ($C_{74}H_{47}NO_2$ = 982.20) | P2-60 | m/z = 981.36 ($C_{74}H_{47}NO_2$ = 982.20) |
| P2-61 | m/z = 843.35 ($C_{64}H_{45}NO$ = 844.07) | P2-62 | m/z = 919.38 ($C_{70}H_{49}NO$ = 920.17) |
| P2-63 | m/z = 967.38 ($C_{74}H_{49}NO$ = 968.21) | P2-64 | m/z = 967.38 ($C_{74}H_{49}NO$ = 968.21) |
| P2-65 | m/z = 967.38 ($C_{74}H_{49}NO$ = 968.21) | P2-66 | m/z = 965.37 ($C_{74}H_{47}NO$ = 966.20) |
| P2-67 | m/z = 965.37 ($C_{74}H_{47}NO$ = 966.20) | P2-68 | m/z = 1041.40 ($C_{80}H_{51}NO$ = 1042.29) |
| P2-69 | m/z = 892.35 ($C_{67}H_{44}N_2O$ = 893.10) | P2-70 | m/z = 968.38 ($C_{73}H_{48}N_2O$ = 969.20) |
| P2-71 | m/z = 1044.41 ($C_{79}H_{52}N_2O$ = 1045.30) | P2-72 | m/z = 948.41 ($C_{71}H_{52}N_2O$ = 949.21) |
| P2-73 | m/z = 803.32 ($C_{51}H_{41}NO$ = 804.01) | P2-74 | m/z = 803.32 ($C_{61}H_{41}NO$ = 804.01) |
| P2-75 | m/z = 819.30 ($C_{61}H_{41}NS$ = 820.07) | P2-76 | m/z = 843.35 ($C_{64}H_{45}NO$ = 844.07) |
| P2-77 | m/z = 843.35 ($C_{54}H_{45}NO$ = 844.07) | P2-78 | m/z = 859.33 ($C_{64}H_{45}NS$ = 860.13) |
| P2-79 | m/z = 969.40 ($C_{74}H_{51}NO$ = 970.23) | P2-80 | m/z = 935.36 ($C_{70}H_{49}NS$ = 936.23) |

TABLE 3-continued

| Compound | FD-MS | Compound | FD-MS |
|---|---|---|---|
| P2-81 | m/z = 817.30 ($C_{61}H_{39}NO_2$ = 817.99) | P2-82 | m/z = 817.30 ($C_{61}H_{39}NO_2$ = 817.99) |
| P2-83 | m/z = 817.30 ($C_{61}H_{39}NO_2$ = 817.99) | P2-84 | m/z = 893.33 ($C_{67}H_{43}NO_2$ = 894.09) |
| P2-85 | m/z = 893.33 ($C_{67}H_{43}NO_2$ = 894.09) | P2-86 | m/z = 909.31 ($Ce_7H_{43}NOS$ = 910.15) |
| P2-87 | m/z = 925.28 ($C_{67}H_{43}NS_2$ = 926.21) | P2-88 | m/z = 909.31 ($C_{67}H_{43}NOS$ = 910.15) |
| P2-89 | m/z = 925.28 ($C_{67}H_{43}NS_2$ = 926.21) | P2-90 | m/z = 981.36 ($C_{74}H_{47}NO_2$ = 982.20) |
| P2-91 | m/z = 997.34 ($C_{74}H_{47}NOS$ = 998.26) | P2-92 | m/z = 997.34 ($C_{74}H_{47}NOS$ = 998.26) |
| P2-93 | m/z = 867.31 ($C_{65}H_{41}NO_2$ = 868.05) | P2-94 | m/z = 917.33 ($C_{69}H_{43}NO_2$ = 918.11) |
| P2-95 | m/z = 883.29 ($C_{65}H_{41}NOS$ = 884.11) | P2-96 | m/z = 909.34 ($C_{68}H_{47}NS$ = 910.19) |
| P2-97 | m/z = 804.31 ($C_{60}H_{40}N_2O$ = 804.99) | P2-98 | m/z = 893.33 ($C_{67}H_{43}NO_2$ = 894.09) |
| P2-99 | m/z = 984.35 ($C_{73}H_{48}N_2S$ = 985.26) | P2-100 | m/z = 935.36 ($C_{70}H_{49}NS$ = 936.23) |
| P2-101 | m/z = 1064.42 ($C_{80}H_{48}D_5NS$ = 1065.40) | P2-102 | m/z = 813.38 ($C_{61}H_{31}D_{10}NO$ = 814.07) |
| P2-103 | m/z = 822.44 ($C_{61}H_{22}D_{19}NO$ = 823.12 | P2-104 | m/z = 924.40 ($C_{67}H_{28}D_{15}NOS$ = 925.24) |
| P2-105 | m/z = 854.42 ($C_{64}H_{34}D_{11}NO$ = 855.14) | P2-106 | m/z = 866.49 ($C_{64}H_{22}D_{23}NO$ = 867.21) |
| P2-107 | m/z = 879.35 ($C_{67}H_{45}NO$ = 880.10) | P2-108 | m/z = 858.37 ($C_{65}H_{38}D_3NO$ = 859.10) |
| P3-1 | m/z = 727.29 ($C_{55}H_{37}NO$ = 727.91) | P3-2 | m/z = 803.32 ($C_{61}H_{41}NO$ = 804.01) |
| P3-3 | m/z = 803.32 ($C_{61}H_{41}NO$ = 804.01) | P3-4 | m/z = 803.32 ($C_{61}H_{41}NO$ = 804.01) |
| P3-5 | m/z = 879.35 ($C_{67}H_{45}NO$ = 880.10) | P3-6 | m/z = 929.37 ($C_{71}H_{47}NO$ = 930.16) |
| P3-7 | m/z = 929.37 ($C_{71}H_{47}NO$ = 930.16) | P3-8 | m/z = 955.38 ($C_{73}H_{49}NO$ = 956.20) |
| P3-9 | m/z = 1005.40 ($C_{77}H_{51}NO$ = 1006.26) | P3-10 | m/z = 959.41 ($C_{73}H_{53}NO$ = 960.23) |
| P3-11 | m/z = 1035.35 ($C_{77}H_{49}NOS$ = 1036.31) | P3-12 | m/z = 929.37 ($C_{71}H_{47}NO$ = 930.16) |
| P3-13 | m/z = 915.44 ($C_{69}H_{57}NO$ = 916.22) | P3-14 | m/z = 859.38 ($C_{65}H_{49}NO$ = 860.11) |
| P3-15 | m/z = 809.37 ($C_{61}H_{47}NO$ = 810.05) | P3-16 | m/z = 821.37 ($C_{62}H_{47}NO$ = 822.06) |
| P3-17 | m/z = 861.40 ($C_{55}H_{51}NO$ = 862.13) | P3-18 | m/z = 909.40 ($C_{69}H_{51}NO$ = 910.17) |
| P3-19 | m/z = 929.37 ($C_{71}H_{47}NO$ = 930.16) | P3-20 | m/z = 859.38 ($C_{65}H_{49}NO$ = 860.11) |
| P3-21 | m/z = 853.33 ($C_{68}H_{43}NO$ = 854.07) | P3-22 | m/z = 853.33 ($C_{65}H_{43}NO$ = 854.07) |
| P3-23 | m/z = 929.37 ($C_{71}H_{47}NO$ = 930.16) | P3-24 | m/z = 929.37 ($C_{71}H_{47}NO$ = 930.16) |
| P3-25 | m/z = 859.38 ($C_{68}H_{49}NO$ = 860.11) | P3-26 | m/z = 885.40 ($C_{67}H_{51}NO$ = 886.15) |
| P3-27 | m/z = 903.35 ($C_{68}H_{43}NO$ = 904.13) | P3-28 | m/z = 979.38 ($C_{75}H_{49}NO$ = 980.22) |
| P3-29 | m/z = 817.30 ($C_{61}H_{39}NO_2$ = 817.99) | P3-30 | m/z = 817.30 ($C_{61}H_{39}NO_2$ = 817.99) |
| P3-31 | m/z = 817.30 ($C_{61}H_{39}NO_2$ = 817.99) | P3-32 | m/z = 817.30 ($C_{61}H_{39}NO_2$ = 817.99) |
| P3-33 | m/z = 893.33 ($C_{67}H_{43}NO_2$ = 894.09) | P3-34 | m/z = 893.33 ($C_{67}H_{43}NO_2$ = 894.09) |
| P3-35 | m/z = 893.33 ($C_{57}H_{43}NO_2$ = 894.09) | P3-36 | m/z = 893.33 ($C_{67}H_{43}NO_2$ = 894.09) |
| P3-37 | m/z = 893.33 ($C_{67}H_{43}NO_2$ = 894.09) | P3-38 | m/z = 899.38 ($C_{67}H_{49}NO_2$ = 900.13) |
| P3-39 | m/z = 917.33 ($C_{69}H_{43}NO_2$ = 918.11) | P3-40 | m/z = 973.39 ($C_{73}H_{51}NO_2$ = 974.22) |
| P3-41 | m/z = 1045.39 ($C_{79}H_{51}NO_2$ = 1046.28) | P3-42 | m/z = 1045.39 ($C_{79}H_{51}NO_2$ = 1046.28) |
| P3-43 | m/z = 943.35 ($C_{71}H_{45}NO_2$ = 944.15) | P3-44 | m/z = 993.36 ($C_{75}H_{47}NO_2$ = 994.21) |
| P3-45 | m/z = 949.39 ($C_{71}H_{51}NO_2$ = 950.19) | P3-46 | m/z = 975.41 ($C_{73}H_{53}NO_2$ = 976.23) |
| P3-47 | m/z = 987.41 ($C_{74}H_{53}NO_2$ = 988.24) | P3-48 | m/z = 1027.44 ($C_{77}H_{57}NO_2$ = 1028.31) |
| P3-49 | m/z = 833.28 ($C_{61}H_{39}NOS$ = 834.05) | P3-50 | m/z = 833.28 ($C_{61}H_{39}NOS$ = 834.05) |
| P3-51 | m/z = 833.28 ($C_{61}H_{39}NOS$ = 834.05) | P3-52 | m/z = 833.28 ($C_{61}H_{39}NOS$ = 834.05) |
| P3-53 | m/z = 909.31 ($C_{67}H_{43}NOS$ = 910.15) | P3-54 | m/z = 985.34 ($C_{73}H_{47}NOS$ = 986.25) |
| P3-55 | m/z = 909.31 ($C_{67}H_{43}NOS$ = 910.15) | P3-56 | m/z = 985.34 ($C_{73}H_{47}NOS$ = 986.25) |
| P3-57 | m/z = 981.36 ($C_{74}H_{47}NO_2$ = 982.20) | P3-58 | m/z = 981.36 ($C_{74}H_{47}NO_2$ = 982.20) |
| P3-59 | m/z = 981.36 ($C_{74}H_{47}NO_2$ = 982.20) | P3-60 | m/z = 981.36 ($C_{74}H_{47}NO_2$ = 982.20) |
| P3-61 | m/z = 843.35 ($C_{64}H_{45}NO$ = 844.07) | P3-62 | m/z = 919.38 ($C_{70}H_{49}NO$ = 920.17) |
| P3-63 | m/z = 967.38 ($C_{74}H_{49}NO$ = 968.21) | P3-64 | m/z = 967.38 ($G_{74}H_{49}NO$ = 968.21) |
| P3-65 | m/z = 967.38 ($C_{74}H_{49}NO$ = 968.21) | P3-66 | m/z = 965.37 ($C_{74}H_{47}NO$ = 966.20) |
| P3-67 | m/z = 965.37 ($C_{74}H_{47}NO$ = 966.20) | P3-68 | m/z = 1041.40 ($C_{90}H_{51}NO$ = 1042.29) |
| P3-69 | m/z = 892.35 ($C_{67}H_{44}N_2O$ = 893.10) | P3-70 | m/z = 892.35 ($C_{67}H_{44}N_2O$ = 893.10) |
| P3-71 | m/z = 968.38 ($C_{73}H_{48}N_2O$ = 969.20) | P3-72 | m/z = 892.35 ($C_{67}H_{44}N_2O$ = 893.10) |
| P3-73 | m/z = 803.32 ($C_{61}H_{41}NO$ = 804.01) | P3-74 | m/z = 803.32 ($C_{61}H_{41}NO$ = 804.01) |
| P3-75 | m/z = 819.30 ($C_{61}H_{41}NS$ = 820.07) | P3-76 | m/z = 843.35 ($C_{64}H_{45}NO$ = 844.07) |
| P3-77 | m/z = 843.35 ($C_{64}H_{45}NO$ = 844.07) | P3-78 | m/z = 859.33 ($C_{64}H_{45}NS$ = 860.13) |
| P3-79 | m/z = 919.38 ($C_{70}H_{49}NO$ = 920.17) | P3-80 | m/z = 935.36 ($C_{70}H_{49}NS$ = 936.23) |
| P3-81 | m/z = 817.30 ($C_{61}H_{39}NO_2$ = 817.99) | P3-82 | m/z = 817.30 ($C_{61}H_{39}NO_2$ = 817.99) |
| P3-83 | m/z = 817.30 ($C_{61}H_{39}NO_2$ = 817.99) | P3-84 | m/z = 893.33 ($C_{67}H_{43}NO_2$ = 894.09) |
| P3-85 | m/z = 893.33 ($C_{67}H_{43}NO_2$ = 894.09) | P3-86 | m/z = 909.31 ($C_{67}H_{43}NOS$ = 910.15) |
| P3-87 | m/z = 925.28 ($C_{67}H_{43}NS_2$ = 926.21) | P3-88 | m/z = 909.31 ($C_{67}H_{43}NOS$ = 910.15) |
| P3-89 | m/z = 925.28 ($C_{67}H_{43}NS_2$ = 926.21) | P3-90 | m/z = 981.36 ($C_{74}H_{47}NO_2$ = 982.20) |
| P3-91 | m/z = 997.34 ($C_{74}H_{47}NOS$ = 998.26) | P3-92 | m/z = 997.34 ($C_{74}H_{47}NOS$ = 998.26) |
| P3-93 | m/z = 867.31 ($C_{65}H_{41}NO_2$ = 868.05) | P3-94 | m/z = 867.31 ($C_{65}H_{41}NO_2$ = 868.05) |
| P3-95 | m/z = 883.29 ($C_{65}H_{41}NOS$ = 884.11) | P3-96 | m/z = 893.33 ($C_{67}H_{43}NO_2$ = 894.09) |
| P3-97 | m/z = 804.31 ($C_{60}H_{40}N_2O$ = 804.99) | P3-98 | m/z = 893.33 ($C_{67}H_{43}NO_2$ = 894.09) |
| P3-99 | m/z = 984.35 ($C_{73}H_{48}N_2S$ = 985.26) | P3-100 | m/z = 940.39 ($C_{70}H_{44}D_5NS$ = 941.26) |
| P3-101 | m/z = 1064.42 ($C_{80}H_{48}D_5NS$ = 1065.40) | P3-102 | m/z = 813.38 ($C_{61}H_{31}D_{10}NO$ = 814.07) |
| P3-103 | m/z = 834.39 ($C_{61}H_{25}D_{15}NS$ = 835.16) | P3-104 | m/z = 924.40 ($C_{67}H_{28}D_{15}NOS$ = 925.24) |
| P3-105 | m/z = 859.45 ($C_{64}H_{29}D_{16}NO$ = 860.17) | P3-106 | m/z = 866.49 ($C_{64}H_{22}D_{23}NO$ = 867.21) |
| P3-107 | m/z = 879.35 ($C_{87}H_{45}NO$ = 880.10) | P3-108 | m/z = 858.37 ($C_{65}H_{38}D_5NO$ = 859.10) |

Fabrication and Evaluation of Organic Electric Element

[Test Example 1] Green Organic Electroluminescent Element (Light-Emitting Auxiliary Layer)

After vacuum-depositing 4,4',4"-tris[2-naphthyl(phenyl)amino] triphenylamine (hereinafter abbreviated as "2-TNATA") on an ITO layer (anode) formed on a glass substrate to form a hole injection layer of 60 nm thickness, a hole transport layer of 60 nm thickness was formed by vacuum-depositing N,N'-bis(1-naphthalenyl)-N,N'-bis-phenyl-(1,1'-biphenyl)-4,4'-diamine (hereinafter abbreviated as "NPB") on the hole injection layer.

Subsequently, a light-emitting auxiliary layer of 20 nm thickness was formed by vacuum-depositing the compound P1-2 of the present invention on the hole transport layer and 4,4'-N,N'-dicarbazole-biphenyl (hereinafter abbreviated as "CBP") as a host material and tris(2-phenylpyridine)-iridium (hereinafter abbreviated as "$Ir(ppy)_3$") as a dopant material in a weight ratio of 95:5 were deposited on the light-emitting auxiliary layer to form a light-emitting layer of 30 nm thickness.

Next, (1,1'-bisphenyl-4-olato)bis(2-methyl-8-quinolinolato)aluminum (hereinafter abbreviated as "BAlq") was vacuum-deposited to form a hole blocking layer of 10 nm thickness on the light-emitting layer, and tris-(8-hydroxyquinoline)aluminum (hereinafter abbreviated as "$Alq_3$") was vacuum-deposited to form a an electron transport layer of 40 nm thickness on the hole blocking layer. Thereafter, LiF was deposited to form an electron injection layer of 0.2 nm thickness on the electron transport layer, and then Al was deposited to form a cathode of 150 nm thickness on the electron injection layer.

[Test Example 2] to [Test Example 15]

The organic electroluminescent elements were fabricated in the same manner as described in Example 1 except that the compounds of the present invention described in the following Table 4, instead of compound P1-2, were used as material of a light-emitting auxiliary layer.

[Comparative Example 1] to [Comparative Example 3]

The organic electroluminescent elements were fabricated in the same manner as described in Example 1 except that Comparative Compounds 1 to 3, instead of compound P1-2, were used as material of a light-emitting auxiliary layer.

<Comp. Compd 1>

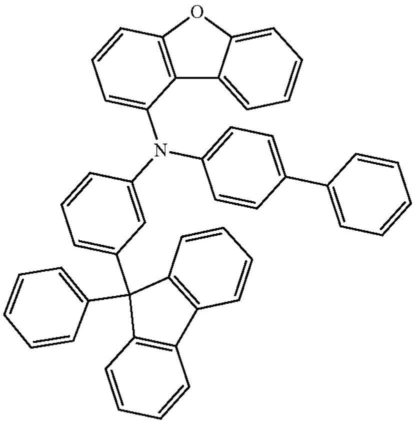

-continued

<Comp. Compd 2>

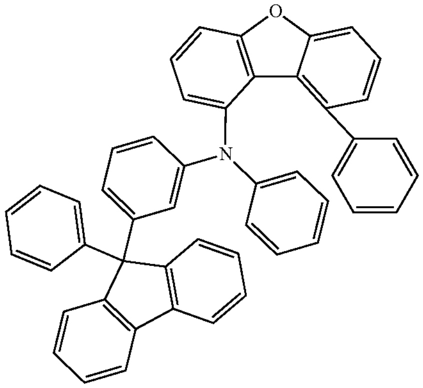

<Comp. Compd 3>

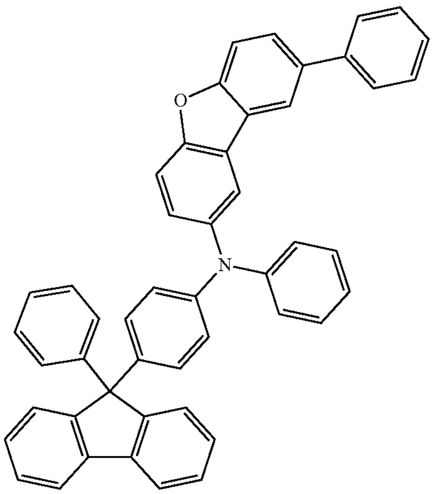

A forward bias DC voltage was applied to the organic electroluminescent elements manufactured in Test Examples 1 to 15 and Comparative Examples 1 to 3, and electroluminescence (EL) characteristics were measured with Photo Research's PR-650 and lifetime (T95) was measured with a lifetime measuring device manufactured by Mc Science company at 5000 cd/$m^2$ standard luminance. The measurement results are shown in Table 4 below.

TABLE 4

| | Compound | Voltage (V) | Current Density (mA/cm$^2$) | Brightness (cd/m$^2$) | Efficiency (cd/A) | Lifetime T(95) |
|---|---|---|---|---|---|---|
| comp. Ex (1) | Comp. compd 1 | 6.3 | 23.1 | 5000.0 | 21.6 | 82.5 |
| comp. Ex (2) | Comp. compd 2 | 5.9 | 16.6 | 5000.0 | 30.1 | 92.6 |
| comp. Ex (3) | Comp. compd 3 | 6.0 | 17.7 | 5000.0 | 28.3 | 100.7 |
| Test Ex. (1) | P1-2 | 4.9 | 11.7 | 5000.0 | 42.7 | 123.0 |
| Test Ex. (2) | P1-6 | 4.9 | 11.5 | 5000.0 | 43.4 | 123.2 |
| Test Ex. (3) | P1-12 | 4.8 | 11.4 | 5000.0 | 43.9 | 122.9 |
| Test Ex. (4) | P1-16 | 4.9 | 12.0 | 5000.0 | 41.8 | 123.4 |
| Test Ex. (5) | P1-30 | 5.0 | 11.9 | 5000.0 | 42.1 | 125.0 |
| Test Ex. (6) | P1-33 | 4.9 | 11.5 | 5000.0 | 43.4 | 124.8 |
| Test Ex. (7) | P1-40 | 4.8 | 11.7 | 5000.0 | 42.8 | 122.9 |
| Test Ex. (8) | P1-53 | 4.9 | 11.5 | 5000.0 | 43.4 | 124.3 |
| Test Ex. (9) | P1-57 | 5.0 | 11.6 | 5000.0 | 42.3 | 123.6 |
| Test Ex. (10) | P1-73 | 4.9 | 12.5 | 5000.0 | 40.1 | 121.2 |
| Test Ex. (11) | P1-75 | 5.1 | 12.2 | 5000.0 | 40.9 | 121.9 |
| Test Ex. (12) | P1-86 | 5.0 | 12.1 | 5000.0 | 41.3 | 122.3 |
| Test Ex. (13) | P1-87 | 5.1 | 12.3 | 5000.0 | 40.5 | 121.7 |
| Test Ex. (14) | P1-93 | 4.8 | 11.6 | 5000.0 | 43.2 | 124.1 |
| Test Ex. (15) | P1-105 | 4.9 | 11.6 | 5000.0 | 43.2 | 125.7 |

From the above Table 4, it can be seen that not only can the driving voltage of an organic electroluminescent element be lowered, but also the efficiency and lifespan are significantly improved when an organic electroluminescent element is manufactured using the material for an organic electroluminescent element of the present invention as a light-emitting auxiliary layer material, compared to when Comparative Compound 1 to Comparative Compound 3 are used.

Comparative Compound 1 to Comparative Compound 3 and the compound of the present invention have the same structure in which an amine group is bonded to the phenyl of 9,9-diphenyl-9H-fluorene, but there is a difference in the substituent bonded to the benzene moiety of dibenzofuran which is substituted on the amine group.

Comparative Compound 1 is similar to the compound in which A in Formula 1 of the present invention is Formula A-1, but the compound of the present invention is different in that $Ar^2$, not hydrogen, is necessarily substituted at a specific position of the benzene moiety of dibenzofuran in Formula A-1, whereas Comparative Compounds 1 and 2 have a difference in that the substituent corresponding to $Ar^2$ is hydrogen.

In addition, Comparative Compound 3 is similar to the compound in which A in Formula 1 of the present invention is Formula A-2, but the compound of the present invention is different in that $Ar^3$, not hydrogen, is necessarily substituted at a specific position of the benzene moiety of dibenzofuran in Formula A-2, whereas Comparative Compound 3 has a difference in that the substituent corresponding to $Ar^3$ is hydrogen.

The compound of the present invention has an amine group and $Ar^2$ or $Ar^3$ substituted at an asymmetric position with respect to dibenzofuran. That is, an amine group is substituted at position 1 of dibenzofuran and $Ar^2$ is substituted at position 8, or an amine group is substituted at position 2 and $Ar^3$ is substituted at position 9.

On the other hand, it can be seen that Comparative Compounds 2 and 3 have amine groups and phenyl groups substituted at positions symmetrical with respect to dibenzofuran. That is, Comparative Compound 2 has an amine group substituted at position 1 of dibenzofuran and a phenyl group substituted at position 9, and Comparative Compound 3 has an amine group substituted at position 2 of dibenzofuran and a phenyl group substituted at position 8.

Due to these differences, when the compound of the present invention is used as a light-emitting auxiliary layer material, the driving voltage, efficiency, and lifespan are all significantly improved compared to the comparative compounds.

This can be explained by the LUMO values of Comparative Compound 2, Comparative Compound 3, and the compounds of the present invention. Referring to Table 5 below, it can be seen that the LUMO values of the compounds of the present invention, in which the amine group and phenyl are asymmetrically substituted, is higher than that of Comparative Compounds 2 and 3, in which the amine group and phenyl are symmetrically substituted with respect to dibenzofuran.

TABLE 5

| | Comp. compd 2 | Comp. compd 3 | P1-1 | P1-73 |
|---|---|---|---|---|
| LUMO (eV) | −1.089 | −1.066 | −1.028 | −1.004 |

Therefore, since the compound of the present invention has a higher LUMO value, it has an improved blocking ability for electrons passing from the light-emitting layer to the light-emitting auxiliary layer than the comparative compound 2 or comparative compound 3, so that light emission can be prevented from occurring at the interface between the light-emitting layer and an adjacent layer rather than the light-emitting layer, and deterioration of the interface can be prevented. As a result, when the compound of the present invention is used as a light-emitting auxiliary layer material, the lifespan, efficiency, and color purity of the element appear to be improved.

These results suggest that even if the core structure is similar, the properties of the compound, such as hole characteristics, luminous efficiency characteristics, energy levels (LUMO, HOMO levels, T1 levels), hole injection and mobility characteristics, and electron blocking characteristics, may differ depending on the type of substituent and the bonding position of the substituent, which may lead to completely different element results.

[Test Example 16] to [Test Example 28] Green Organic Electroluminescent Element (Light-Emitting Auxiliary Layer)

The organic electroluminescent elements were fabricated in the same manner as described in Example 1 except that the compounds of the present invention described in the following Table 5, instead of compound P1-2, were used as material of a light-emitting auxiliary layer.

Comparative Example 4

The organic electroluminescent elements were fabricated in the same manner as described in Example 1 except that one of Comparative Compound 4, instead of compound P1-2, was used as material of a light-emitting auxiliary layer.

<Comparative Compound 4>

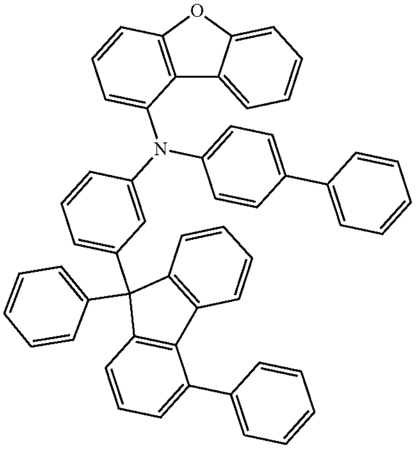

A forward bias DC voltage was applied to the electroluminescent elements manufactured in Test Examples 16 to 30 and Comparative Examples 1 and 4, and electroluminescence (EL) characteristics were measured with Photo Research's PR-650 and lifetime (T95) was measured with a lifetime measuring device manufactured by Mc Science company at 5000 cd/m$^2$ standard luminance. The measurement results are shown in Table 6 below.

TABLE 6

| | Compound | Voltage (V) | Current Density (mA/cm$^2$) | Brightness (cd/m$^2$) | Efficiency (cd/A) | Lifetime T(95) |
|---|---|---|---|---|---|---|
| comp. Ex (1) | Comp. compd 1 | 6.3 | 23.1 | 5000.0 | 21.6 | 82.5 |
| comp. Ex (4) | Comp. compd 4 | 6.2 | 20.2 | 5000.0 | 24.7 | 103.1 |
| Test Ex. (16) | P2-1 | 5.2 | 12.4 | 5000.0 | 40.4 | 131.6 |
| Test Ex. (17) | P2-5 | 5.3 | 12.8 | 5000.0 | 39.2 | 132.0 |
| Test Ex. (18) | P2-8 | 5.2 | 12.4 | 5000.0 | 40.2 | 131.2 |
| Test Ex. (19) | P2-14 | 5.2 | 12.3 | 5000.0 | 40.6 | 130.3 |
| Test Ex. (20) | P2-32 | 5.1 | 12.0 | 5000.0 | 41.7 | 132.4 |
| Test Ex. (21) | P2-35 | 5.1 | 12.1 | 5000.0 | 41.3 | 131.8 |
| Test Ex. (22) | P2-39 | 5.2 | 11.9 | 5000.0 | 41.8 | 133.1 |
| Test Ex. (23) | P2-58 | 5.2 | 12.2 | 5000.0 | 41.0 | 132.1 |
| Test Ex. (24) | P2-61 | 5.1 | 12.3 | 5000.0 | 40.7 | 132.4 |
| Test Ex. (25) | P2-78 | 5.4 | 12.9 | 5000.0 | 38.7 | 129.0 |
| Test Ex. (26) | P2-88 | 5.4 | 12.7 | 5000.0 | 39.5 | 129.8 |
| Test Ex. (27) | P2-98 | 5.3 | 12.4 | 5000.0 | 40.2 | 130.3 |
| Test Ex. (28) | P2-102 | 5.2 | 12.1 | 5000.0 | 41.4 | 133.5 |

From the above Table 6, it can be seen that when a green organic electroluminescent element is manufactured using the material for an organic electroluminescent element of the present invention as a light-emitting auxiliary layer material, not only can the driving voltage of the organic electroluminescent element be lowered, but also the light-emitting efficiency and lifespan can be significantly improved, compared to when Comparative Compound 1 or Comparative Compound 4 is used.

Comparative compounds 1 and 4 have very similar structures, but they differ in that Comparative Compound 1 has a hydrogen bonded at the 4-position of 9,9-diphenyl-9H-fluorene, whereas Comparative Compound 4 has a phenyl substituted at the 4-position.

Comparing Comparative Examples 1 and 4, it can be seen that in the case of Comparative Example 4, the characteristics of the element, especially the lifespan, are significantly improved. Therefore, it can be seen that even if a compound has a similar structure, when a compound in which a substituent other than hydrogen is substituted on the benzene moiety of 9,9-diphenyl-9H-fluorene, like Comparative Compound 4, is used as a light-emitting auxiliary layer material, it is advantageous in improving the lifespan of the element.

The compounds of the present invention used in the examples of Table 6 above is the same as Comparative Compound 4 in that a substituent other than hydrogen is substituted on the benzene moiety of 9,9-diphenyl-9H-fluorene. However, Comparative Compound 4 differs from the compound of the present invention in that an amine group is substituted at position 1 on dibenzofuran, but hydrogen is bonded at position 8.

That is, the compounds of the present invention used in the above examples has substituents that are asymmetrically substituted on both benzene rings of dibenzofuran, such as an amine group substituted at position 1 and $Ar^2$ substituted at position 8, or an amine group substituted at position 2 and $Ar^3$ substituted at position 9 of dibenzofuran, whereas the comparative compound 4 has an amine group substituted only on one benzene ring of dibenzofuran and the other benzene ring is not substituted with a substituent other than hydrogen.

It can be confirmed from Table 6 above that there is a large difference in hole mobility depending on the presence or absence of these substituents and the bonding position, and that this difference can ultimately affect the element characteristics.

In addition, it appears that by using the compound of the present invention as a material for the light-emitting auxiliary layer, the HOMO or LUMO energy level of the compound of the present invention has an appropriate value between each energy level of the hole transport layer and the light-emitting layer, so that holes and electrons achieve charge balance and light emission occurs within the light-emitting layer rather than at the interface of the hole transport layer, and thus efficiency and lifespan of the element are maximized.

[Test Example 29] to [Test Example 41] Green Organic Electroluminescent Element (Light-Emitting Auxiliary Layer)

The organic electroluminescent elements were fabricated in the same manner as described in Example 1 except that the compounds of the present invention described in the following Table 6, instead of compound P1-2, were used as material of a light-emitting auxiliary layer.

Comparative Example 5

The organic electroluminescent elements were fabricated in the same manner as described in Example 1 except that one of Comparative Compound 5, instead of compound P1-2, was used as material of a light-emitting auxiliary layer.

<Comparative Compound 5>

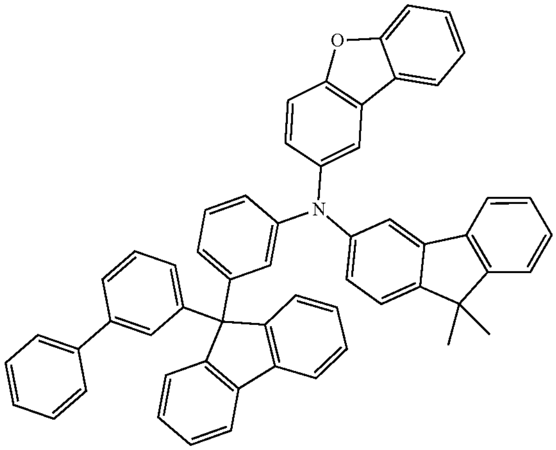

A forward bias DC voltage was applied to the electroluminescent elements manufactured in Test Examples 29 to 41 and Comparative Examples 1 and 5, and electroluminescence (EL) characteristics were measured with Photo Research's PR-650 and lifetime (T95) was measured with a lifetime measuring device manufactured by Mc Science company at 5000 $cd/m^2$ standard luminance. The measurement results are shown in Table 7 below.

TABLE 7

| | Compound | Voltage (V) | Current Density ($mA/cm^2$) | Brightness ($cd/m^2$) | Efficiency (cd/A) | Lifetime T(95) |
|---|---|---|---|---|---|---|
| comp. Ex (1) | Comp. compd 1 | 6.3 | 23.1 | 5000.0 | 21.6 | 82.5 |
| comp. Ex (5) | Comp. compd 5 | 6.1 | 16.1 | 5000.0 | 31.0 | 88.7 |
| Test Ex. (29) | P3-1 | 5.2 | 10.9 | 5000.0 | 45.7 | 126.0 |
| Test Ex. (30) | P3-7 | 5.1 | 10.8 | 5000.0 | 46.1 | 126.4 |
| Test Ex. (31) | P3-12 | 5.2 | 10.8 | 5000.0 | 46.5 | 126.1 |
| Test Ex. (32) | P3-21 | 5.1 | 10.9 | 5000.0 | 46.0 | 126.3 |
| Test Ex. (33) | P3-32 | 5.1 | 10.3 | 5000.0 | 48.5 | 127.5 |
| Test Ex. (34) | P3-48 | 5.0 | 10.6 | 5000.0 | 47.2 | 127.6 |
| Test Ex. (35) | P3-53 | 5.0 | 10.4 | 5000.0 | 48.2 | 128.1 |
| Test Ex. (36) | P3-56 | 5.1 | 10.5 | 5000.0 | 47.8 | 127.0 |
| Test Ex. (37) | P3-80 | 5.2 | 11.1 | 5000.0 | 45.1 | 124.9 |
| Test Ex. (38) | P3-82 | 5.2 | 11.2 | 5000.0 | 44.7 | 124.9 |
| Test Ex. (39) | P3-83 | 5.2 | 11.2 | 5000.0 | 44.6 | 124.2 |
| Test Ex. (40) | P3-96 | 5.1 | 10.3 | 5000.0 | 48.5 | 124.5 |
| Test Ex. (41) | P3-104 | 5.2 | 10.4 | 5000.0 | 48.0 | 128.3 |

From the above Table 7, it can be seen that when a green organic electroluminescent element is manufactured using the material for an organic electroluminescent element of the present invention as a light-emitting auxiliary layer material, not only can the driving voltage of the organic electroluminescent element be lowered, but also the light-emitting efficiency and lifespan can be significantly improved, compared to when Comparative Compound 1 or Comparative Compound 5 is used.

It can be seen that the element characteristics are better when Comparative Compound 5 is used as a light-emitting auxiliary layer material than when Comparative Compound 1 is used, and that the element characteristics differ depending on whether a substituent is further substituted on the phenyl at position 9 of 9,9-diphenyl-9H-fluorenyl group and the type of substituent substituted on the amine group.

The compounds of the present invention used in the examples of Table 7 are the same as Comparative Compound 5 in that one of the phenyls at position 9 of the 9,9-diphenyl-9H-fluorenyl group is substituted with a substituent other than hydrogen, but there is a difference in whether or not dibenzofuran is substituted on the amine group substituted on the other phenyl. That is, while the compounds of the present invention have an amine group substituted at position 1 of dibenzofuran and $Ar^2$ substituted at position 8, or an amine group substituted at position 2 of dibenzofuran and $Ar^3$ substituted at position 9, Comparative Compound 5 differs in that an amine group is substituted at position 2 of dibenzofuran and a hydrogen is bonded at position 9.

From that the characteristics of the element are improved when the compound of the present invention is used as a light-emitting auxiliary layer material due to these differences, it can be seen that when a substituent is substituted at a specific position of dibenzofuran, the chemical and physical characteristics of the compound change, which also affects the performance of the element.

Therefore, by summarizing Tables 4, 6 and 7, it can be seen that among the amine compounds substituted with 9,9-diphenyl-9H-fluorenyl group and dibenzofuran, a compound in which an amine group is substituted on one benzene ring of dibenzofuran and a substituent is substituted on the other benzene ring of dibenzofuran is more suitable as a light-emitting auxiliary layer material, and a structure in which the amine group substituted on one benzene ring and the substituent substituted on the other benzene ring is substituted in asymmetrical positions (the structure in which when an amine group is substituted at position 1, another substituent is substituted at position 8, and when an amine group is substituted at position 2, another substituent is substituted at position 9.) is more suitable.

Although the exemplary embodiments of the present invention have been described for illustrative purposes, those skilled in the art to which the present invention pertains will be capable of various modifications without departing from the essential characteristics of the present invention. The scope of the present invention shall be construed on the basis of the accompanying claims, and it shall be construed that all of the technical arts included within the scope equivalent to the claims belong to the present invention.

What is claimed is:

1. A compound of Formula 1:

<Formula 1>

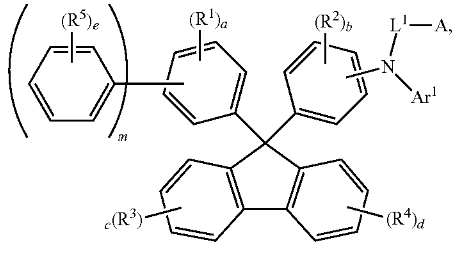

wherein:

A is Formula A-1 or Formula A-2:

<Formula A-1>

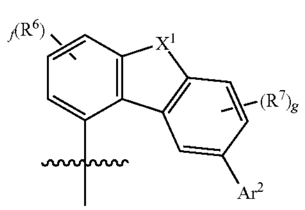

<Formula A-2>

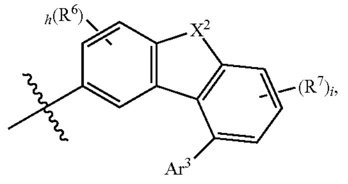

$R^1$ to $R^4$ are each independently selected from the group consisting of hydrogen, deuterium, $C_6$-$C_{20}$ aryl group, $C_2$-$C_{18}$ heterocyclic group containing at least one heteroatom of O, N, S, Si and P, a $C_1$-$C_{20}$ alkyl group, and adjacent groups thereof may be bonded to each other to form a benzene ring, $R^5$ is selected from the group consisting of hydrogen, deuterium, a $C_1$-$C_{20}$ alkyl group, and a $C_6$-$C_{18}$ aryl group, $R^6$ to $R^9$ are selected from the group consisting of hydrogen, deuterium, a $C_1$-$C_{20}$ alkyl group, and a $C_6$-$C_{18}$ aryl group, and adjacent groups thereof may be bonded to each other to form a benzene ring, a is an integer of 0 to 5, b to d are each an integer of 0 to 4, e is an integer of 0 to 5, m is an integer of 0 to 2, f and i are each an integer of 0 to 3, $X^1$ and $X^2$ are O or S, $L^1$ is selected from the group consisting of a single bond, a $C_2$-$C_{18}$ heterocyclic group containing at least one heteroatom of O, N, S, Si and P, $Ar^1$ is selected from the group consisting of a $C_6$-$C_{30}$ aryl group, a fluorenyl group, and a $C_2$-$C_{30}$ heterocyclic group containing at least one heteroatom of O, N, S, Si and P, $Ar^2$ and $Ar^3$ are each independently selected from the group consisting of a $C_6$-$C_{18}$ aryl group, a fluorenyl group, and $C_2$-$C_{18}$ heterocyclic group containing at least one heteroatom of O, N, S, Si and P, and the aryl group, the arylene group, the fluorenyl group, the heterocyclic group, the alkyl group, and the benzene ring formed by adjacent groups may be each optionally substituted with one or more substituents selected from the group consisting of deuterium, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, and a $C_1$-$C_{20}$ alkyl group.

2. The compound of claim 1, wherein Formula 1 is represented by one of Formula 2-1 to Formula 2-4:

<Formula 2-1>

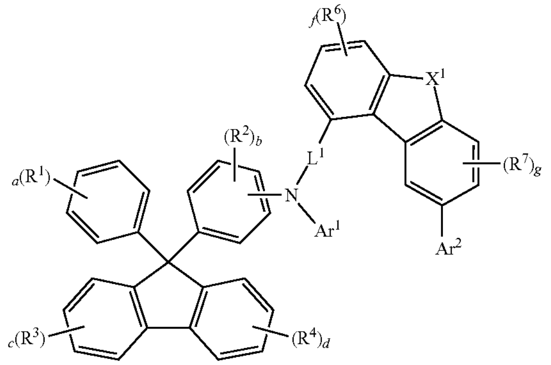

<Formula 2-2>

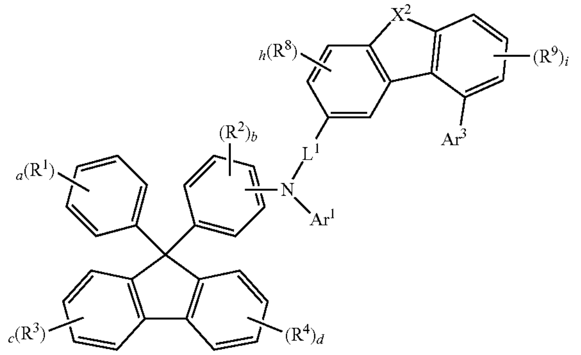

<Formula 2-3>

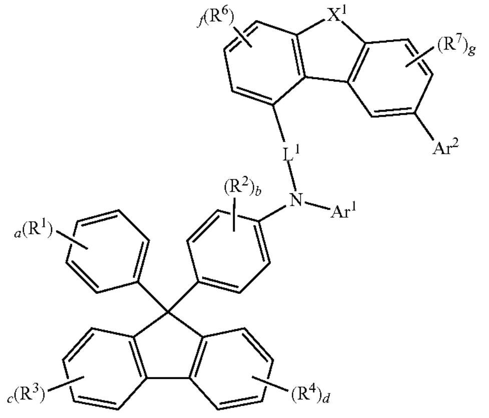

-continued

<Formula 2-4>

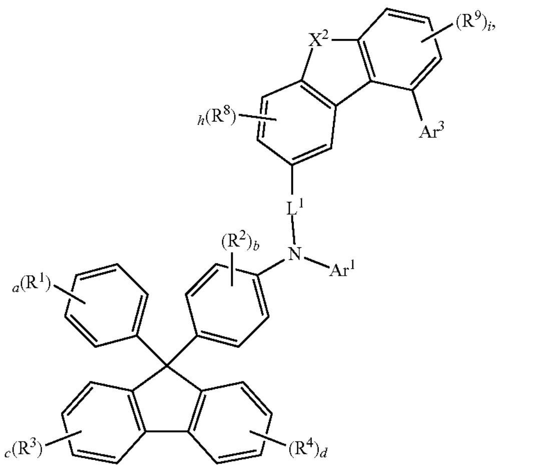

wherein $R^1$ to $R^4$, $R^6$ to $R^9$, $X^1$, $X^2$, $L^1$, $Ar^1$ to $Ar^3$, a to d, f to i are the same as defined in Formula 1.

3. The compound of claim 1, wherein Formula 1 is represented by one of Formula 3-1 to Formula 3-4:

<Formula 3-1>

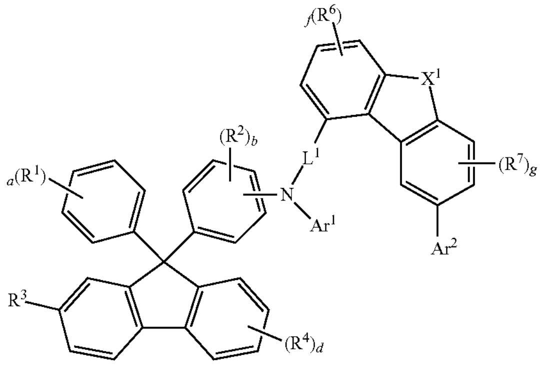

<Formula 3-2>

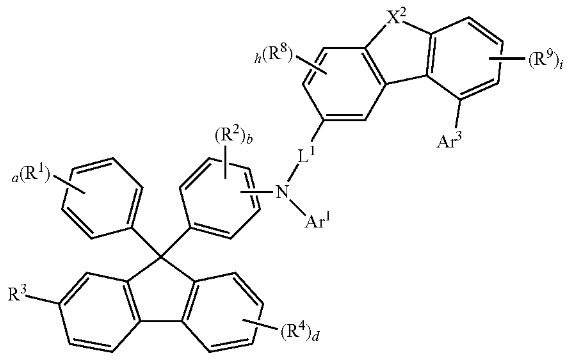

-continued
<Formula 3-3>
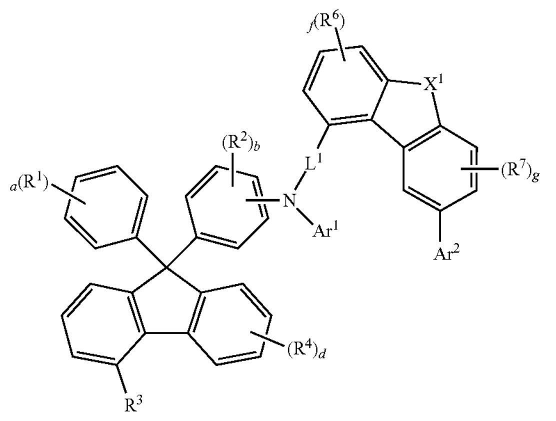
<Formula 3-4>
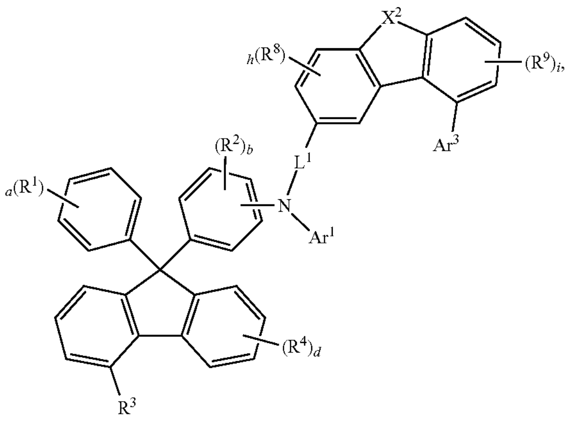
wherein $R^1$, $R^2$, $R^3$, $R^4$, $R^6$ to $R^9$, $X^1$, $X^2$, $L^1$, $Ar^1$ to $Ar^3$, a, b, d, f to i are the same as defined in Formula 1.
4. The compound of claim 1, wherein Formula 1 is represented by one of Formula 4-1 to Formula 4-8:
<Formula 4-1>
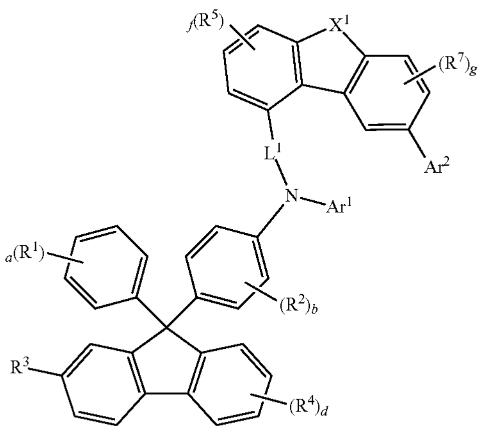
-continued
<Formula 4-2>
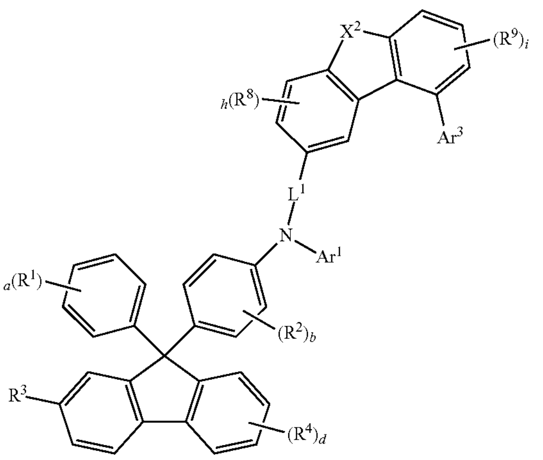
<Formula 4-3>
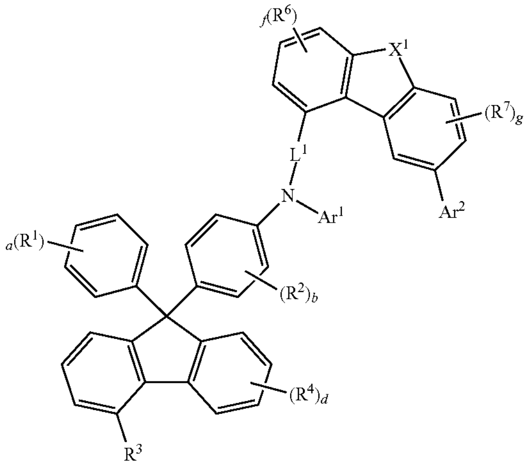
<Formula 4-4>
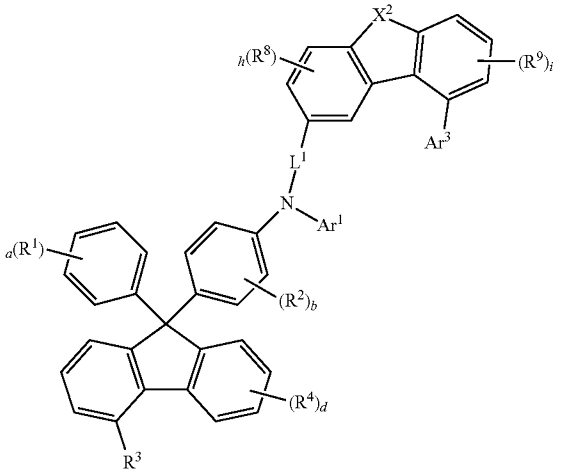

-continued
<Formula 4-5>
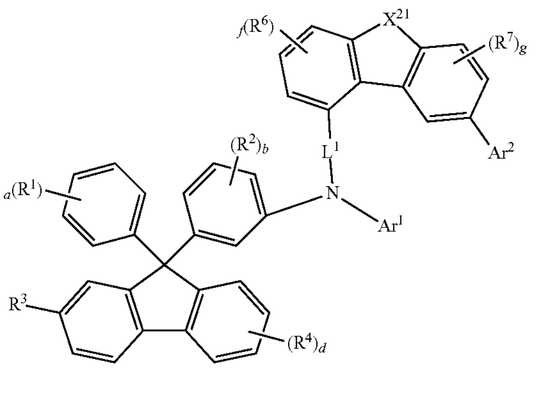
<Formula 4-6>
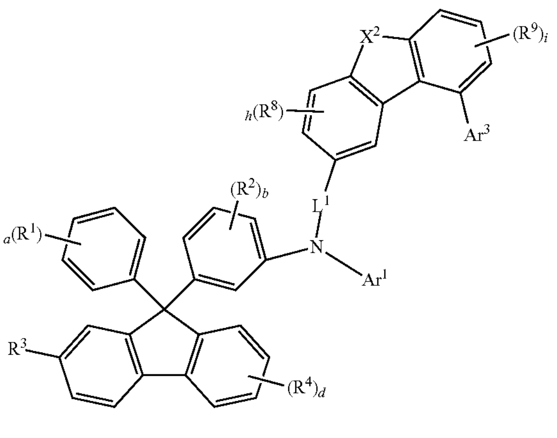
<Formula 4-7>
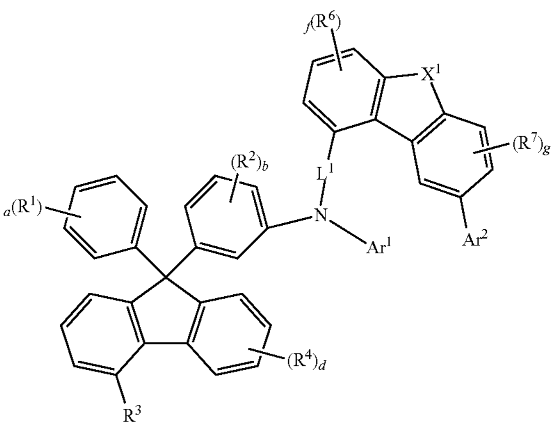
-continued
<Formula 4-8>
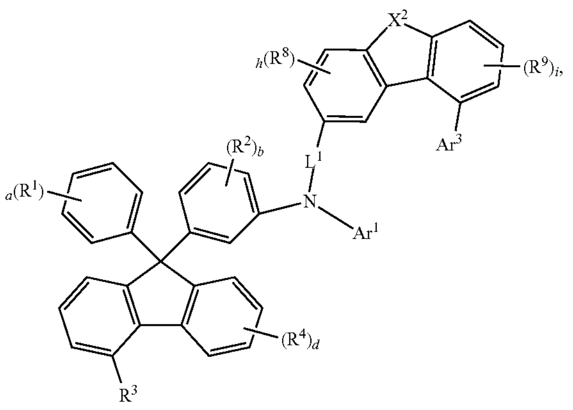
wherein $R^1$, $R^2$, $R^3$, $R^4$, $R^6$ to $R^9$, $X^1$, $X^2$, $L^1$, $Ar^1$ to $Ar^3$, a, b, d, f to i are the same as defined in Formula 1.
5. The compound of claim 1, wherein Formula 1 is represented by Formula 5-1 or Formula 5-2:
<Formula 5-1>
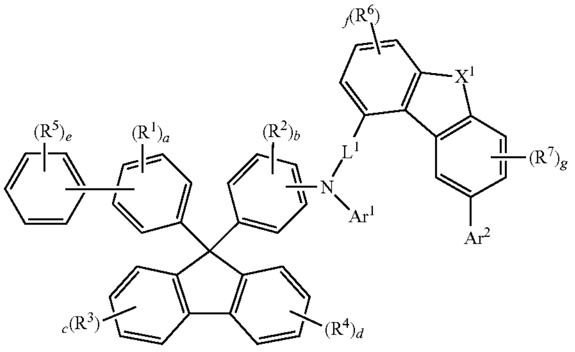
<Formula 5-2>
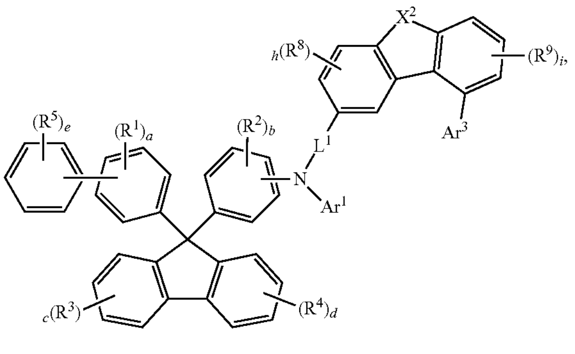
wherein $R^1$ to $R^9$, $X^1$, $X^2$, $L^1$, $Ar^1$ to $Ar^3$, a to i are the same as defined in Formula 1.

6. The compound of claim 1, wherein Formula 1 is represented by Formula 6-1 or Formula 6-2:

<Formula 6-1>

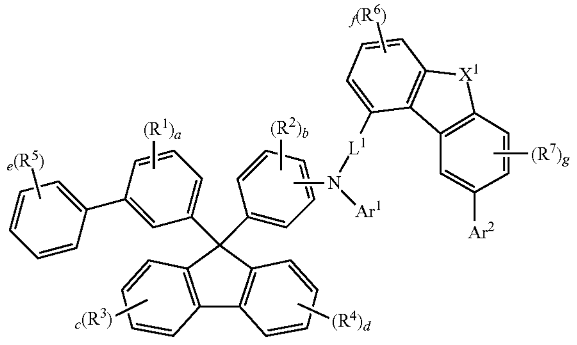

<Formula 6-2>

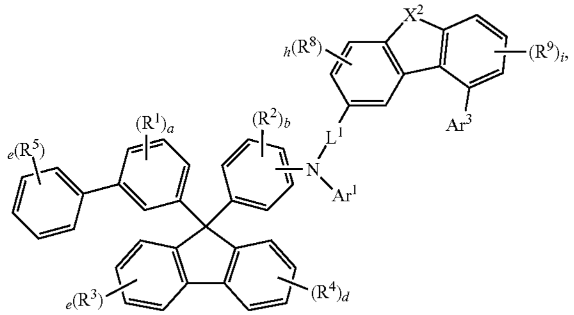

wherein $R^1$ to $R^9$, $X^1$, $X^2$, $L^1$, $Ar^1$ to $Ar^3$, a to i are the same as defined in Formula 1.

7. The compound of claim 1, wherein Formula 1 is represented by one of Formula 7-1 to Formula 7-4:

<Formula 7-1>

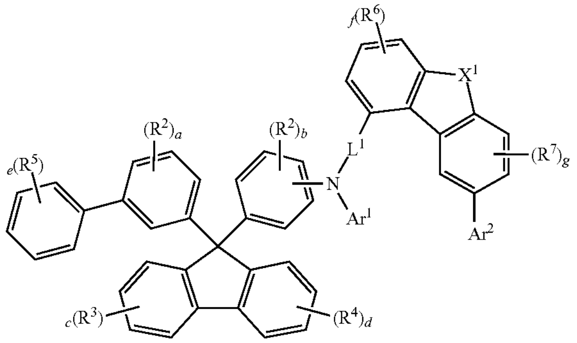

-continued

<Formula 7-2>

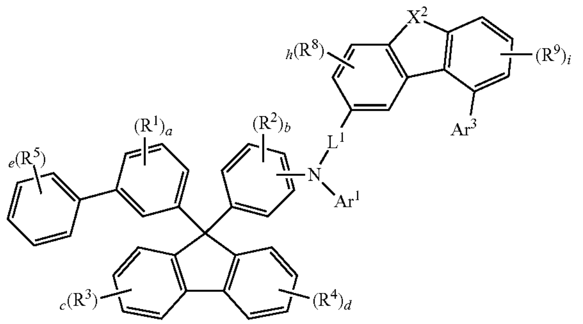

<Formula 7-3>

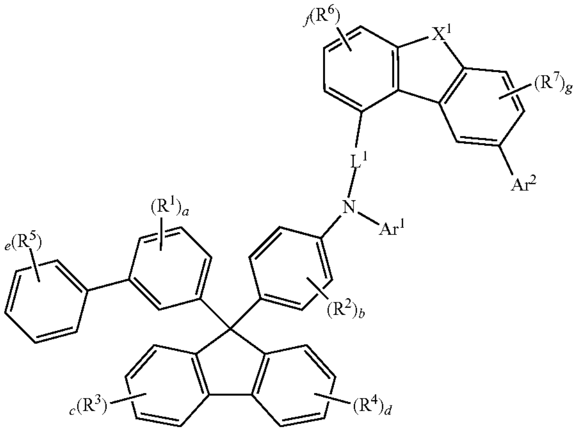

<Formula 7-4>

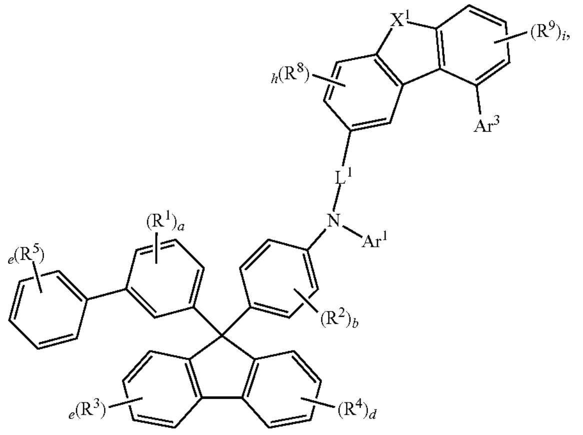

wherein $R^1$ to $R^9$, $X^1$, $X^2$, $L^1$, $Ar^1$ to $Ar^3$, a to i are the same as defined in Formula 1.

8. The compound of claim 1, wherein at least one of $Ar^1$ to $Ar^3$ is selected from the group consisting of Formula Ar-1 to Ar-6:

<Formula Ar-1>

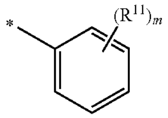

-continued

<Formula Ar-2>

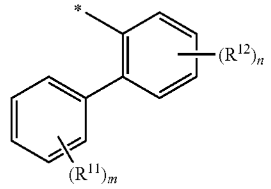

<Formula Ar-3>

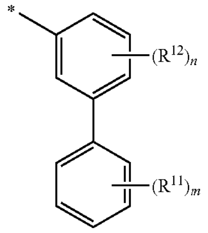

<Formula Ar-4>

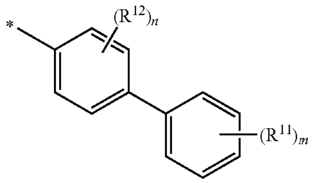

<Formula Ar-5>

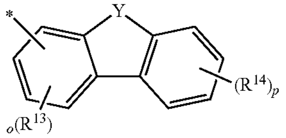

<Formula Ar-6>

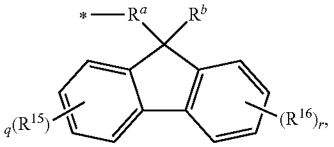

wherein:

$R^{11}$ to $R^{16}$ are each independently selected from the group consisting of deuterium, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, a $C_1$-$C_{20}$ alkyl group, and adjacent groups may be bonded to each other to form a benzene ring, m is an integer of 0 to 5, n, p, q and r are each an integer of 0 to 4, o is an integer of 0 to 3, and when each of these is an integer of 2 or more, each of $R^{13}$s, each of $R^{14}$s, each of $R^{15}$s, each of $R^{16}$s are the same as or different from each other, Y is S, O, or C ($R^1$) ($R^2$), $R^a$ is selected from the group consisting of a single bond, $C_6$-$C_{18}$ arylene group, and a $C_2$-$C_{18}$ heterocyclic group comprising at least one heteroatom selected from the group consisting of O, N, S, Si and P, and $R_1$, $R_2$, and $R^b$ are each independently selected from the group consisting of deuterium, a $C_6$-$C_{30}$ aryl group, a fluorenyl group, a $C_2$-$C_{30}$ heterocyclic group comprising at least one heteroatom selected from the group consisting of O, N, S, Si and P, a $C_3$-$C_{30}$ aliphatic ring group, a $C_1$-$C_{20}$ alkyl group, and $R_1$ and $R_2$ may be bonded to each other to form a ring.

9. The compound of claim 1, wherein both $Ar^2$ and $Ar^3$ are $C_6$-$C_{18}$ aryl group.

10. The compound of claim 1, wherein the compound represented by Formula 1 is one of the following compounds:

P1-1

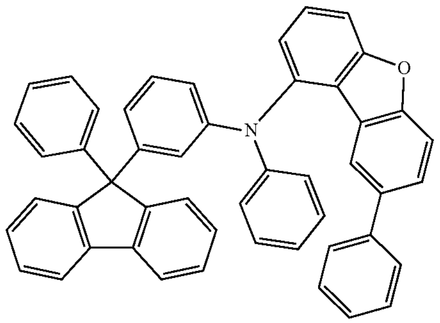

P1-2

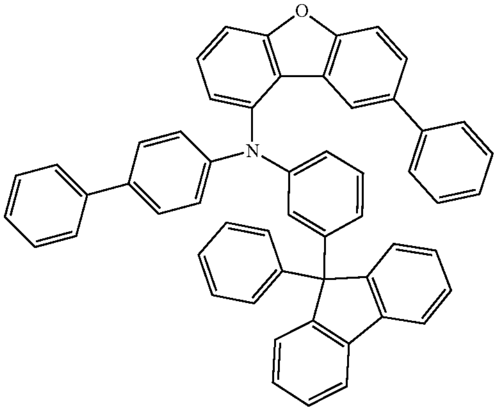

P1-3

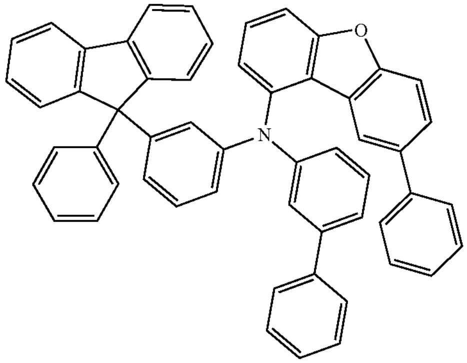

P1-4

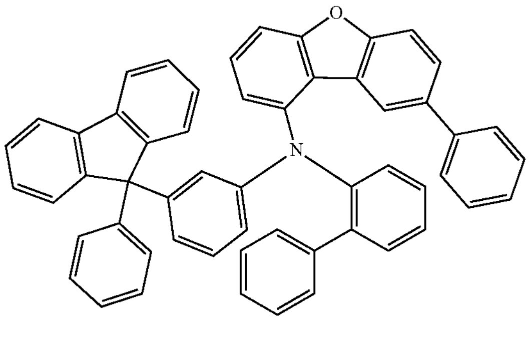

-continued
P1-5
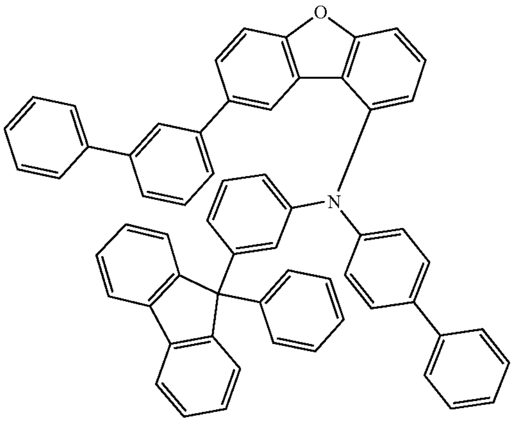
P1-6
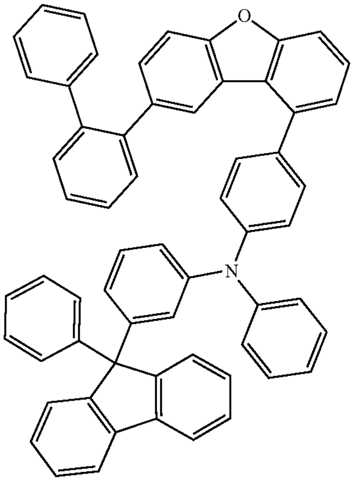
P1-7
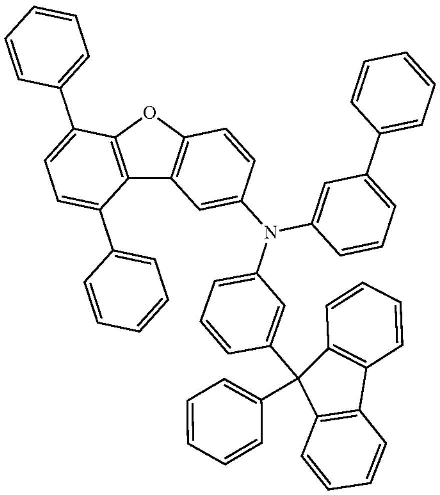
-continued
P1-8
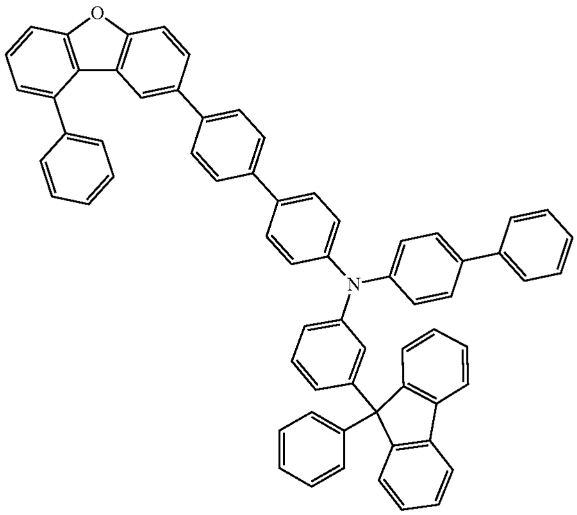
P1-9
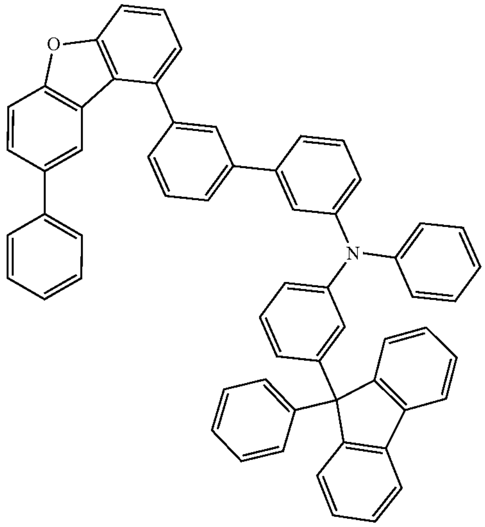
P1-10
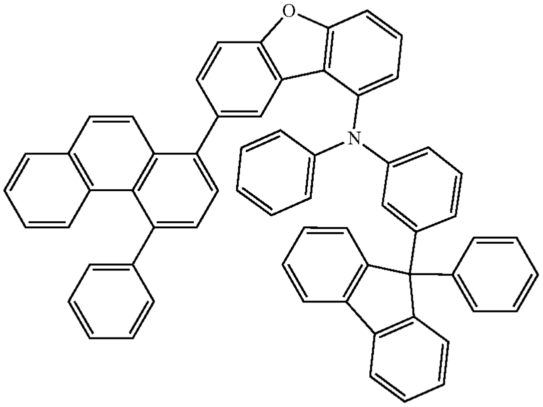

-continued
P1-11
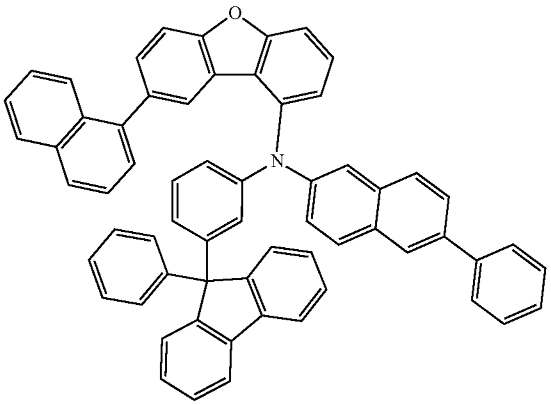
P1-12
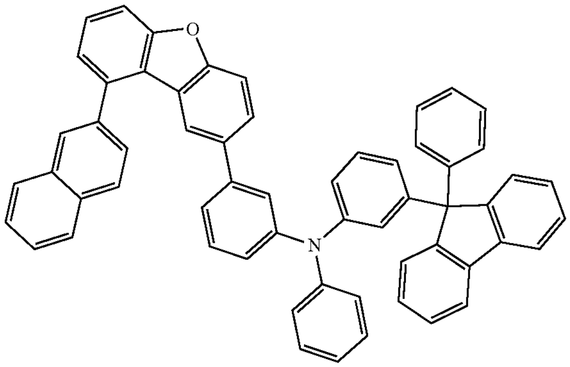
P1-13
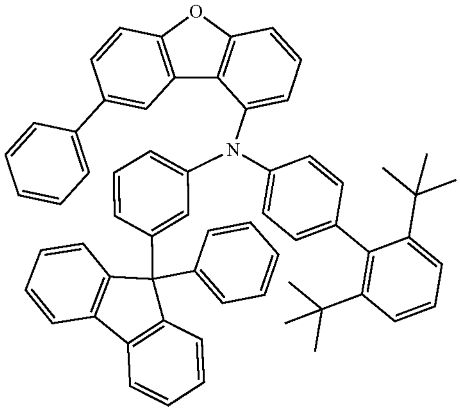
P1-14
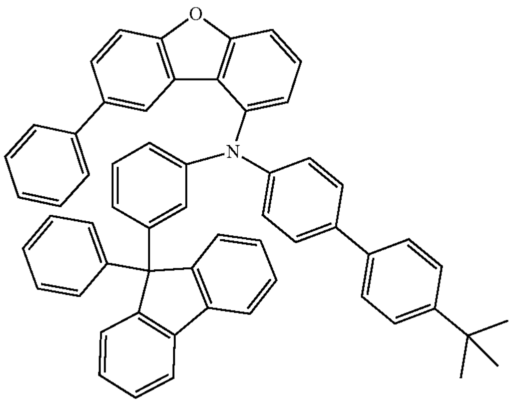
-continued
P1-15
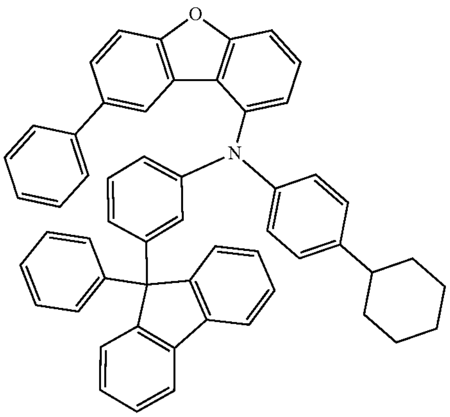
P1-16
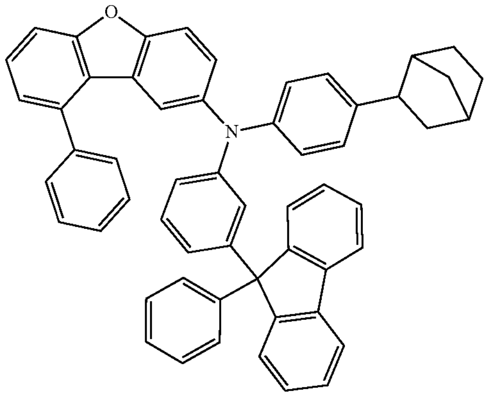
P1-17
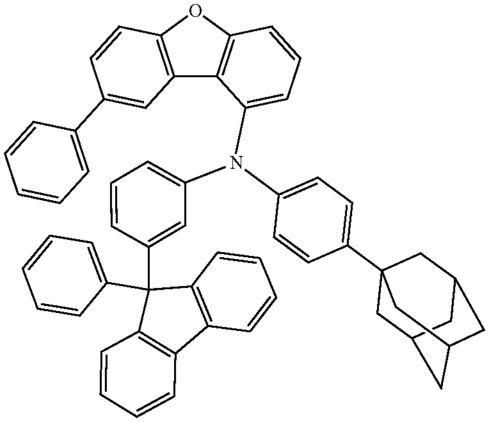

-continued
P1-18
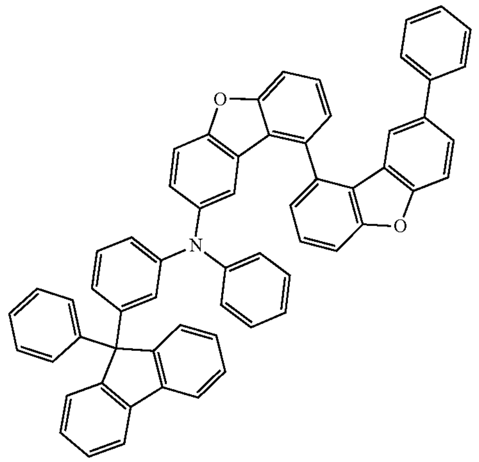
P1-19
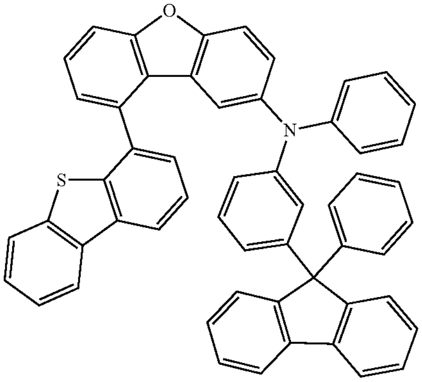
P1-20
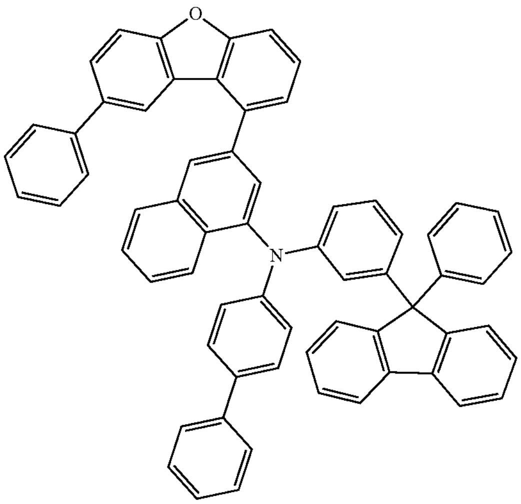
-continued
P1-21
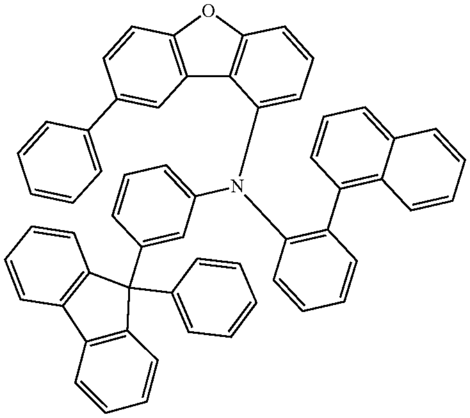
P1-22
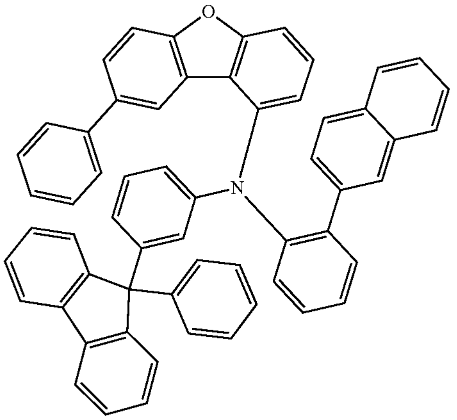
P1-23
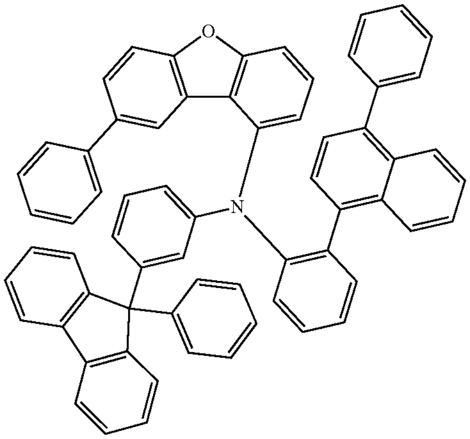

-continued
P1-24
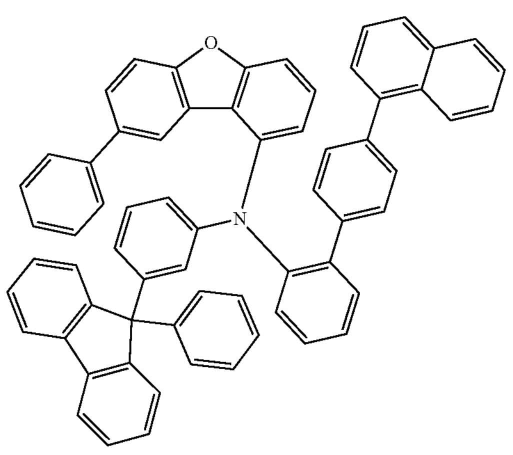
P1-25
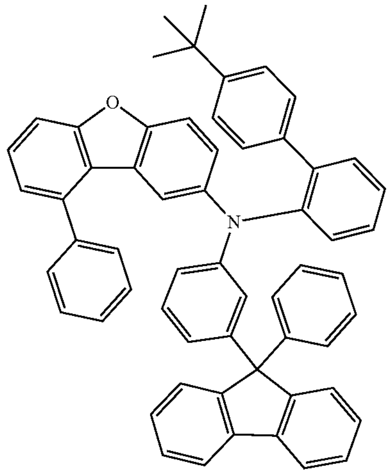
P1-26
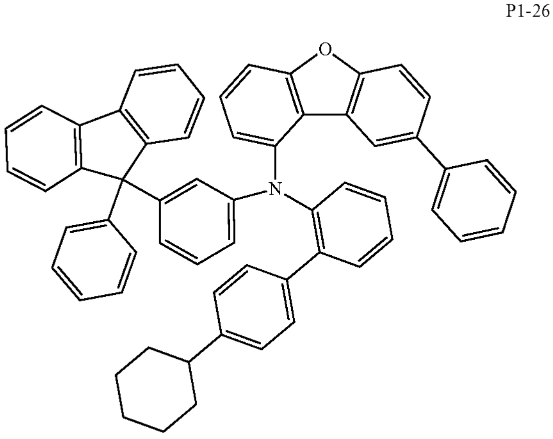
-continued
P1-27
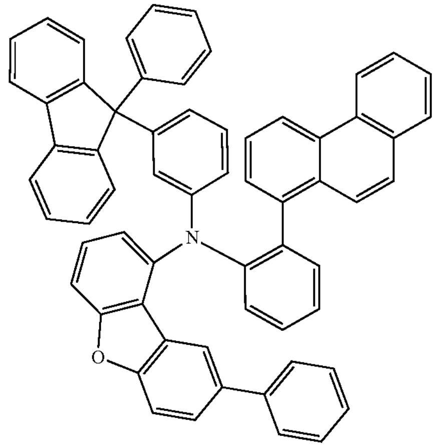
P1-28
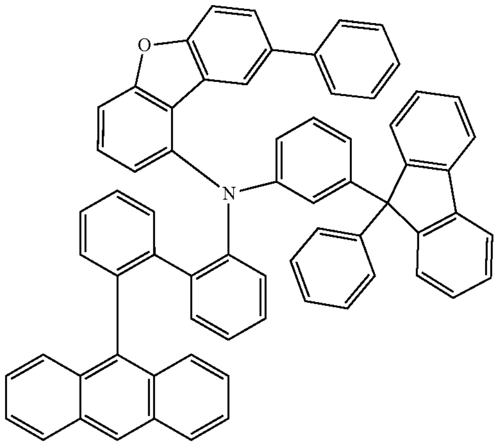
P1-29
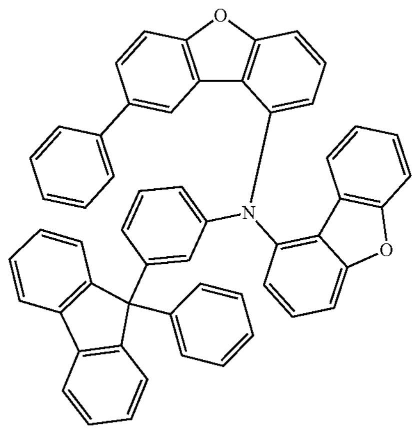

-continued
P1-30
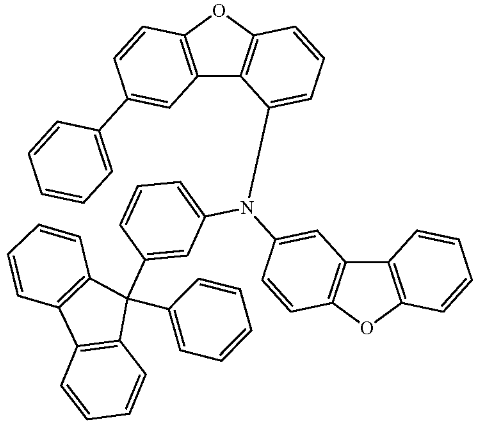
P1-31
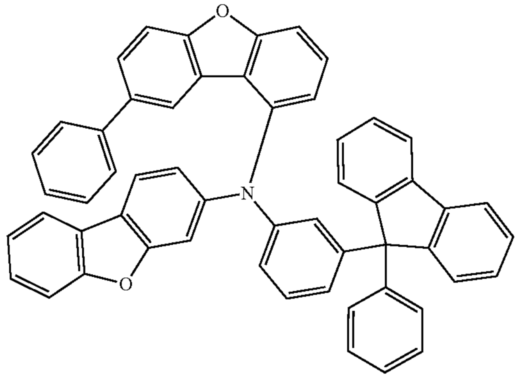
P1-32
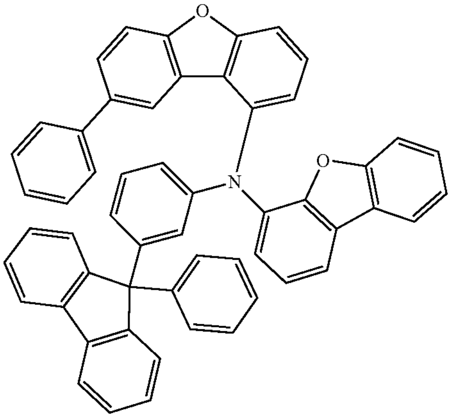
-continued
P1-33
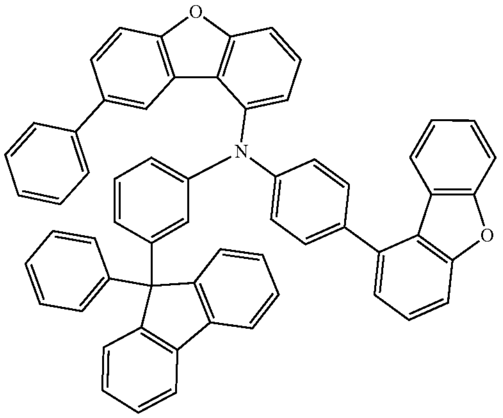
P1-34
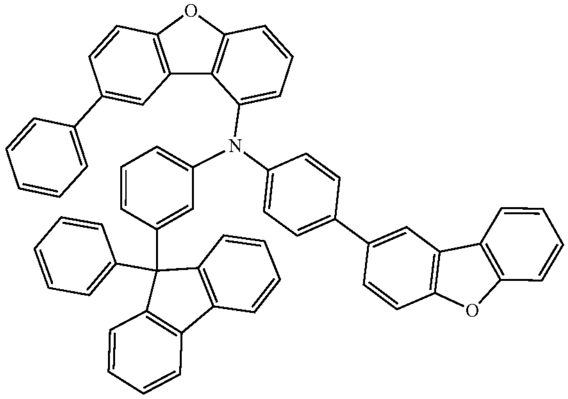
P1-35
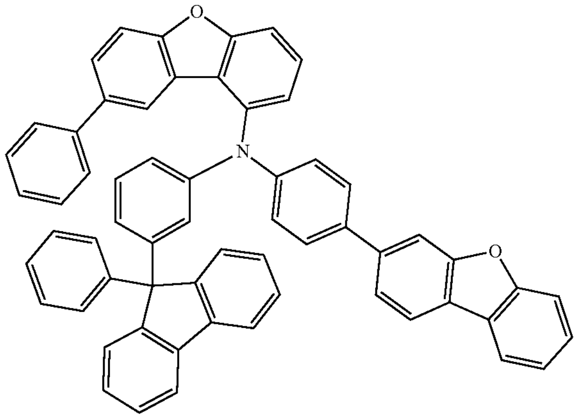

-continued
P1-36
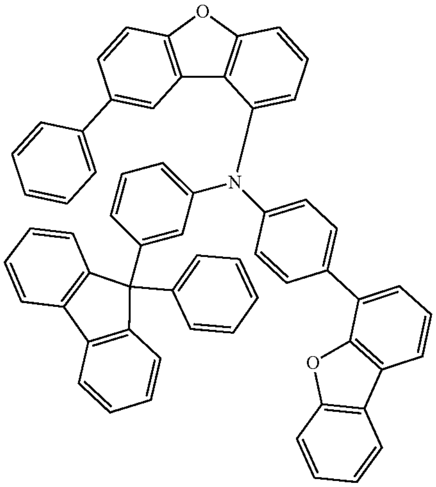
P1-37
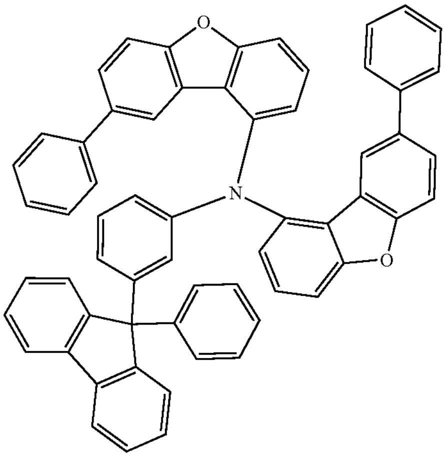
P1-38
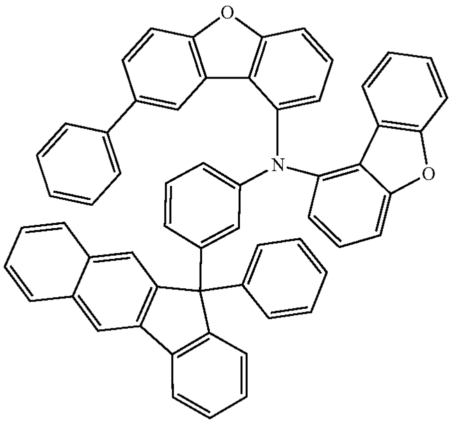
-continued
P1-39
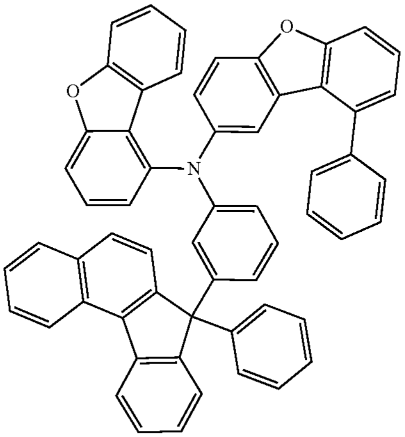
P1-40
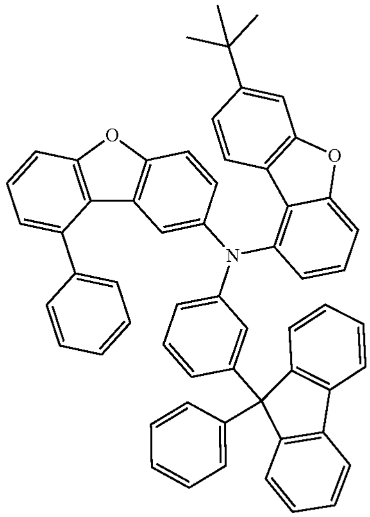
P1-41
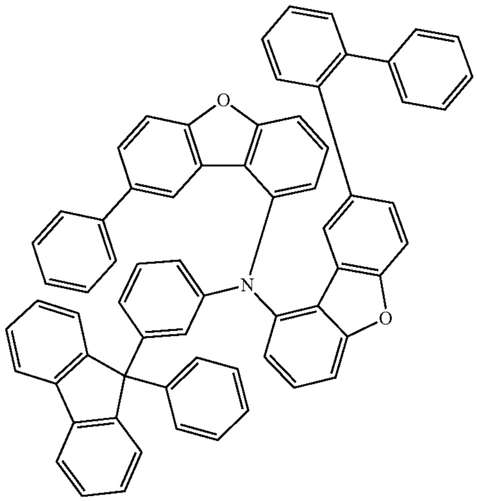

-continued
P1-42
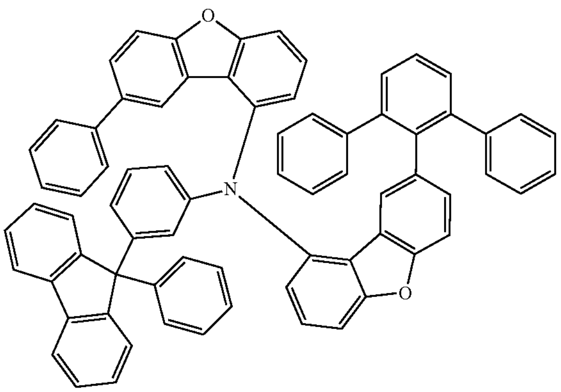
P1-43
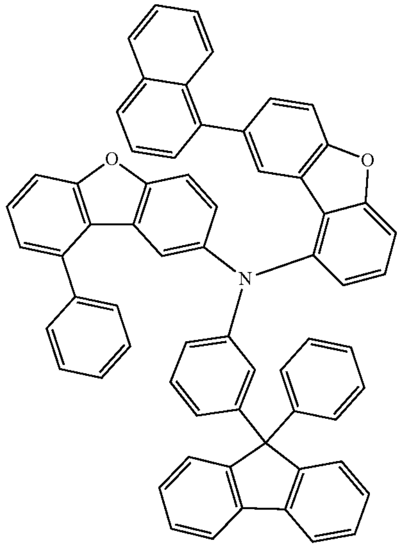
P1-44
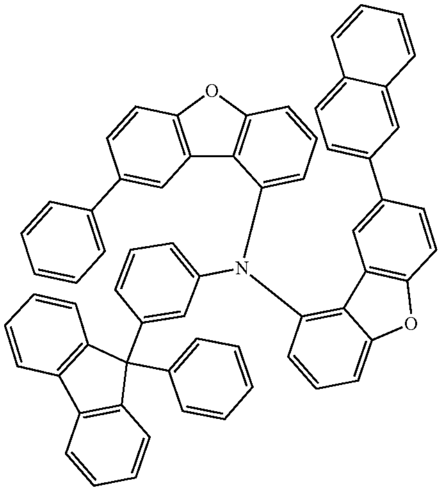
-continued
P1-45
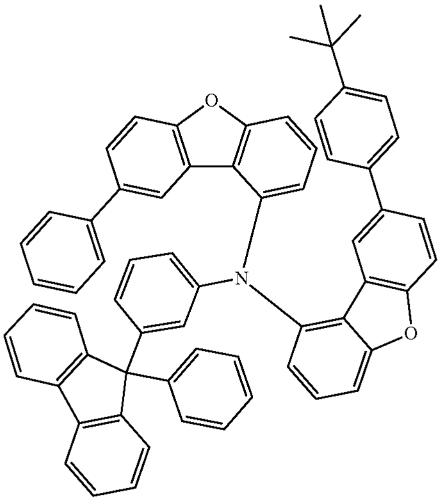
P1-46
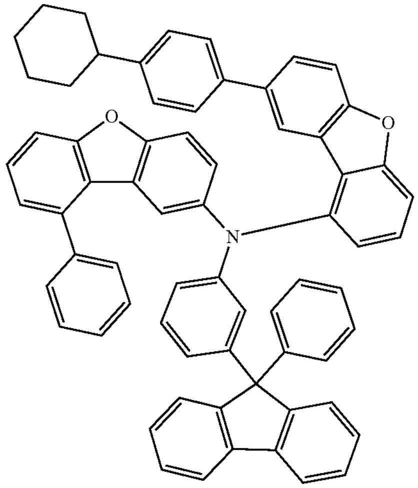
P1-47
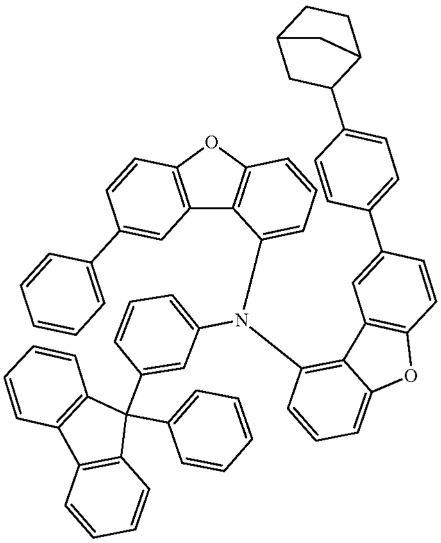

-continued
P1-48
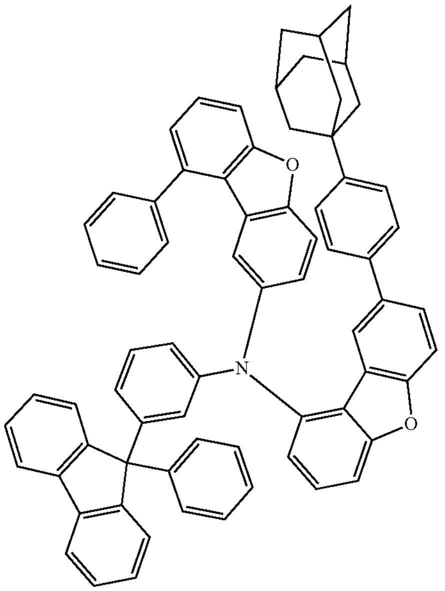
P1-49
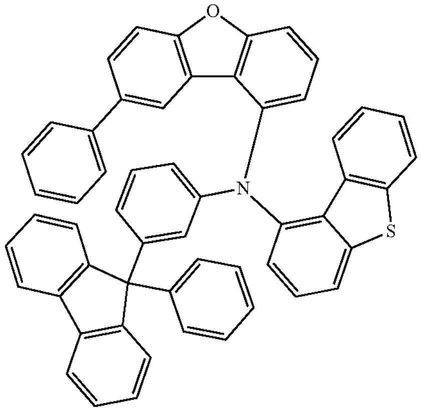
P1-50
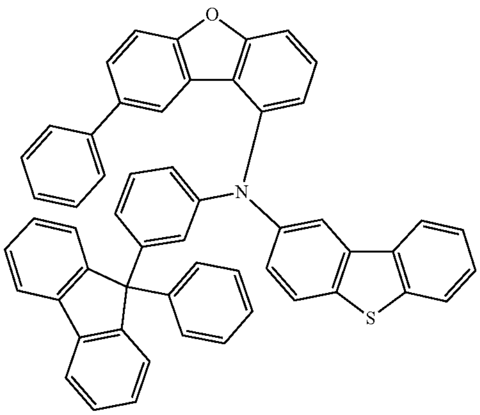
-continued
P1-51
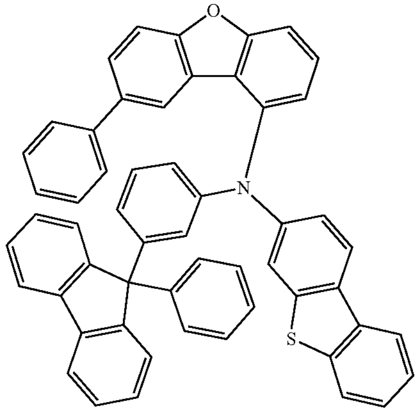
P1-52
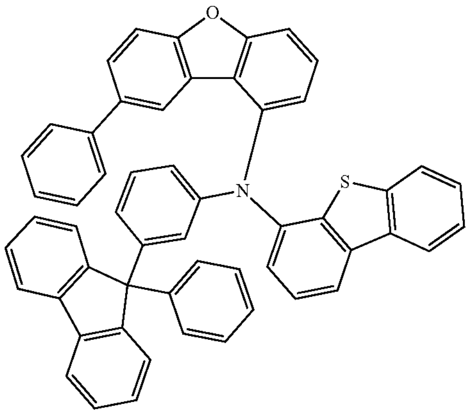
P1-53
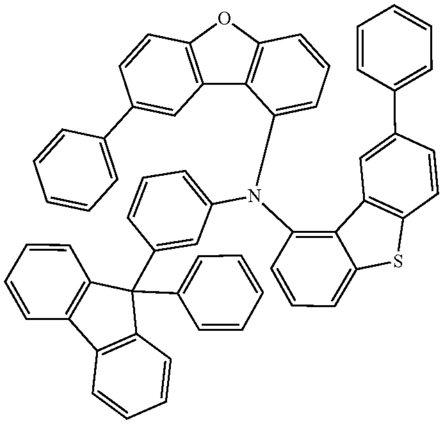

-continued
P1-54
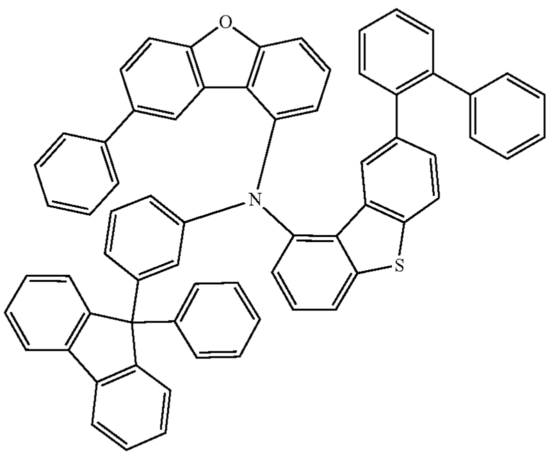
P1-55
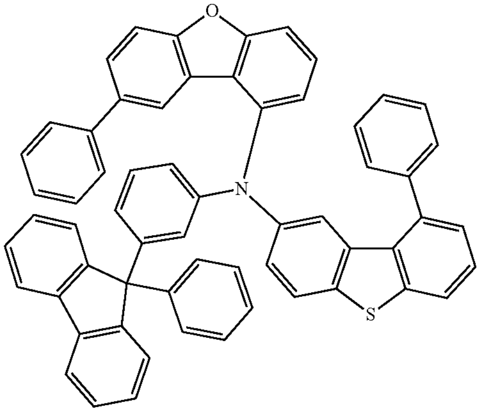
P1-56
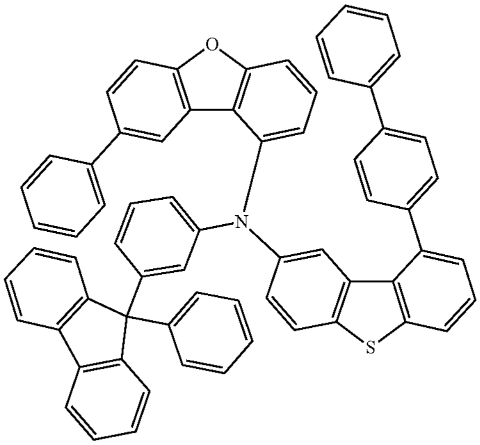
-continued
P1-57
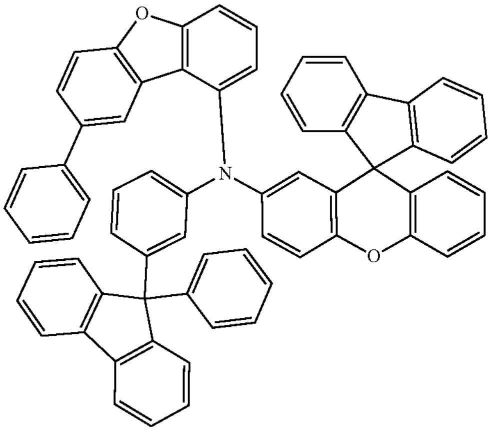
P1-58
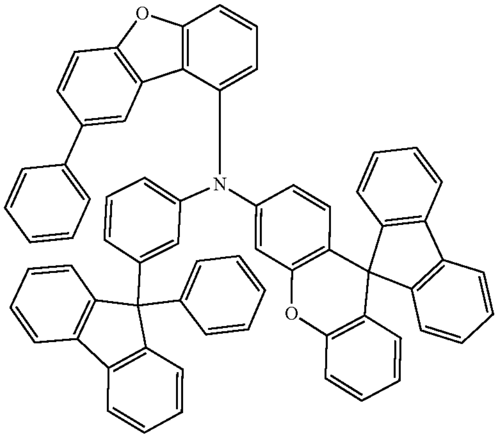
P1-59
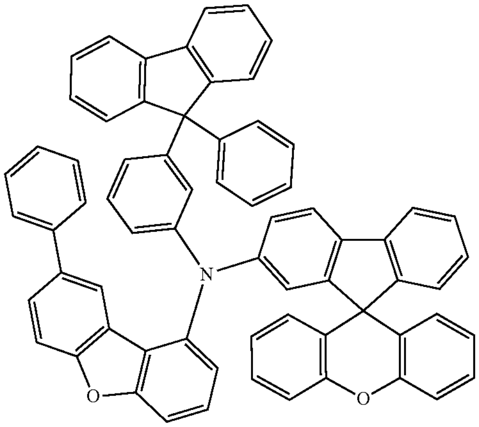

-continued
P1-60
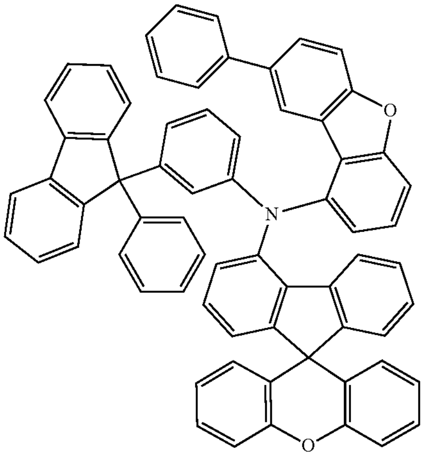
P1-61
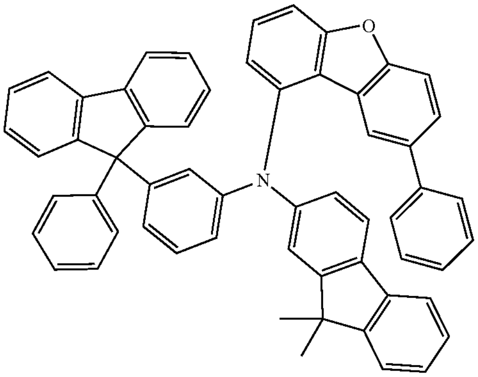
P1-62
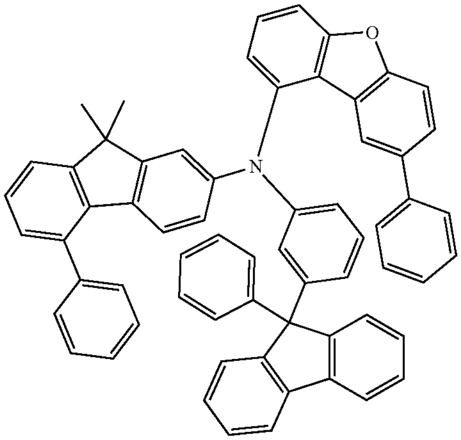
-continued
P1-63
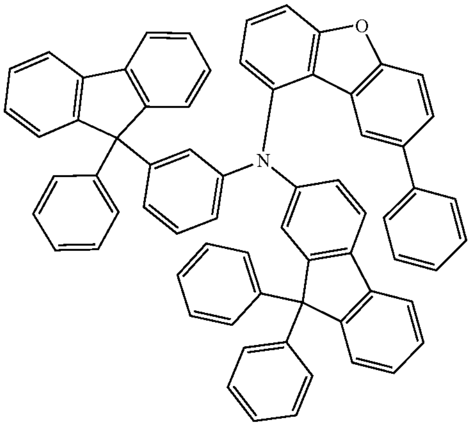
P1-64
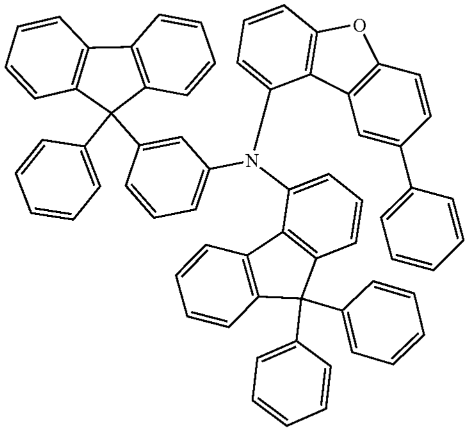
P1-65
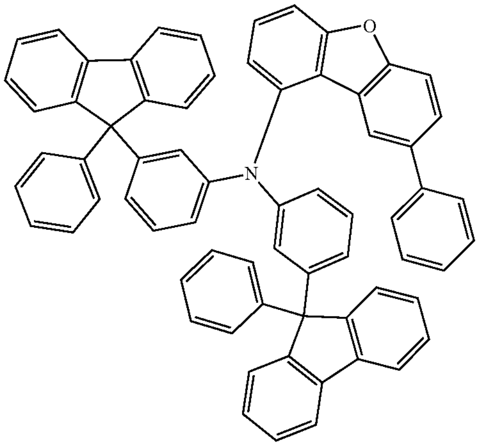

-continued
P1-66
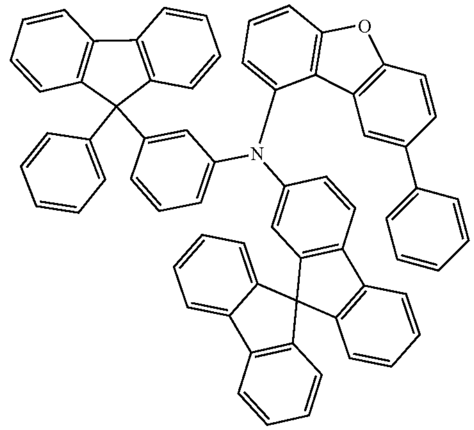
P1-67
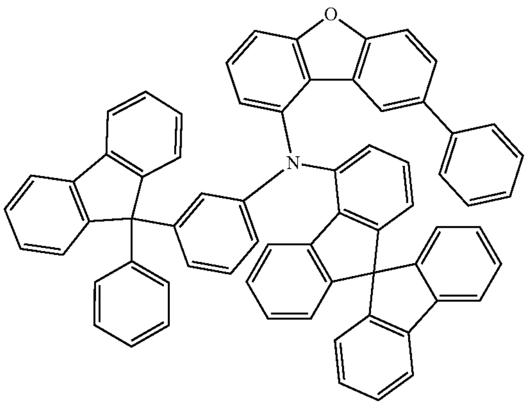
P1-68
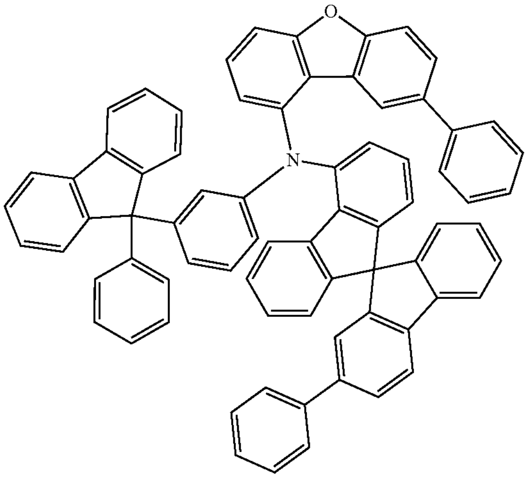
-continued
P1-69
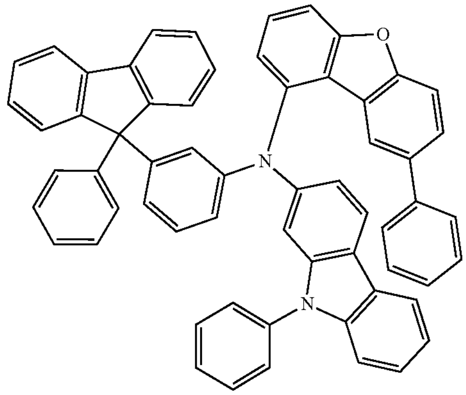
P1-70
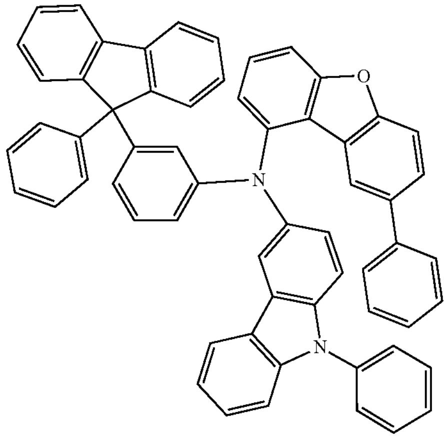
P1-71
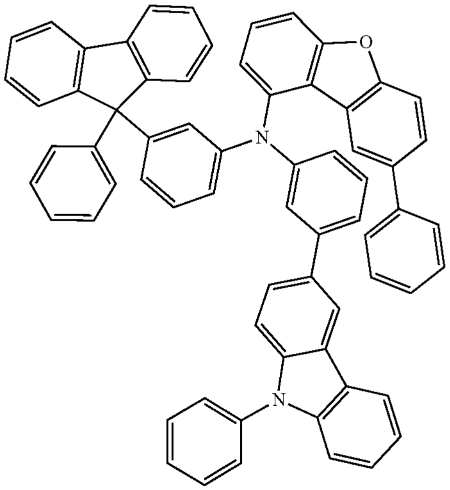

-continued
P1-72
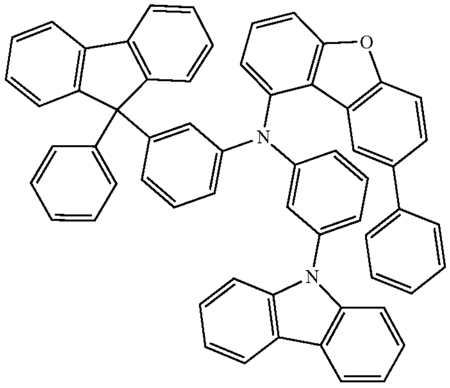
P1-73
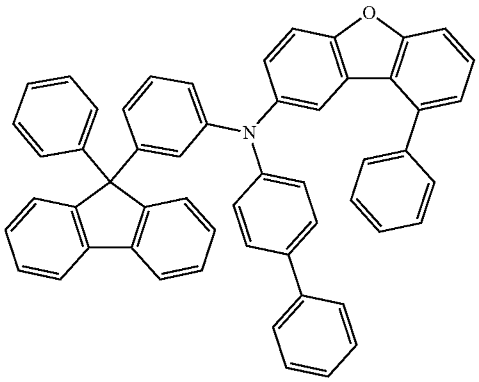
P1-74
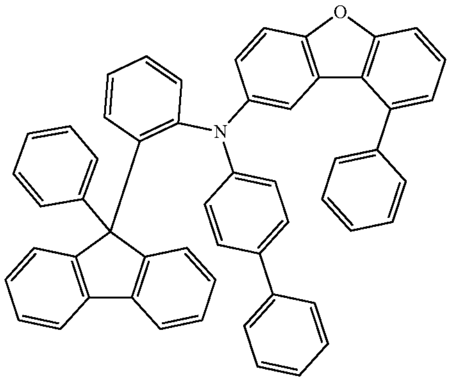
P1-75
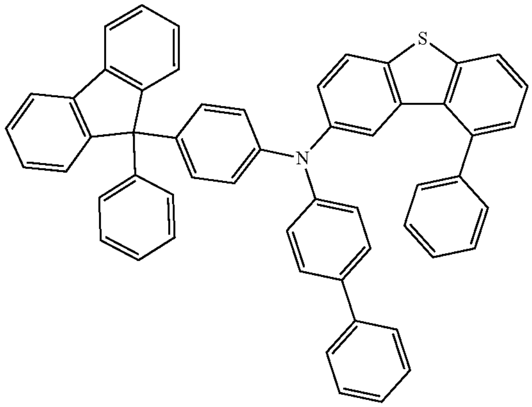
-continued
P1-76
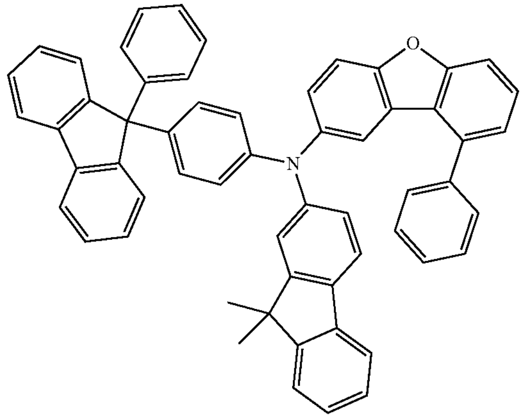
P1-77
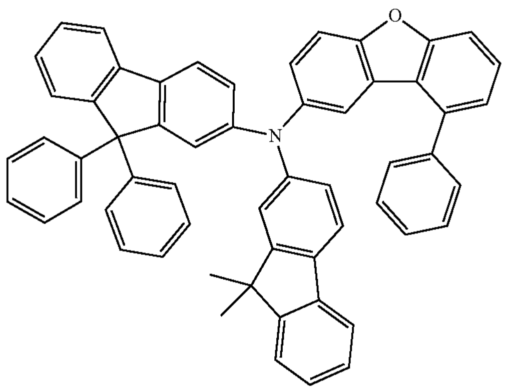
P1-78
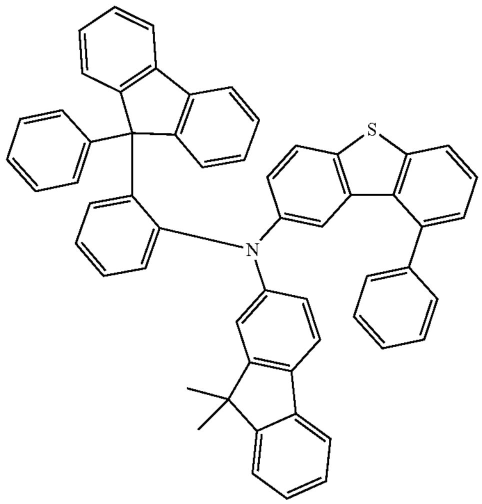

-continued
P1-79
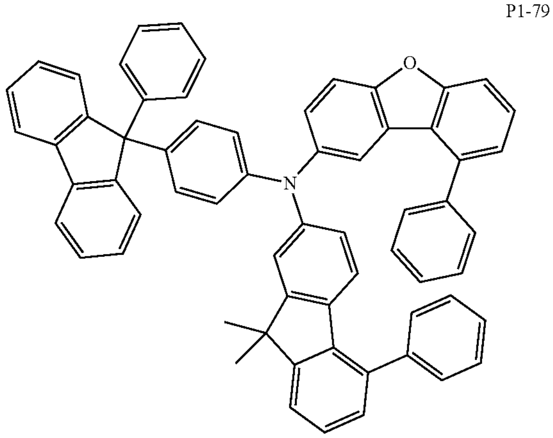
P1-80
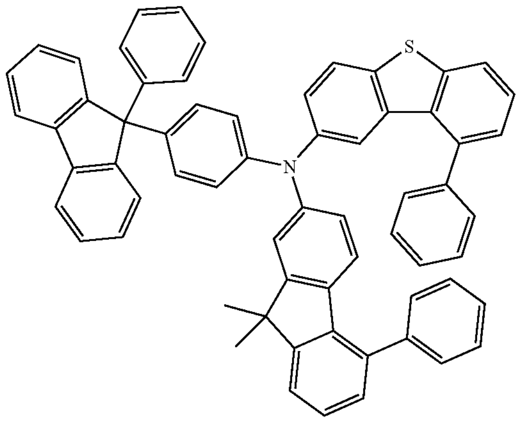
P1-81
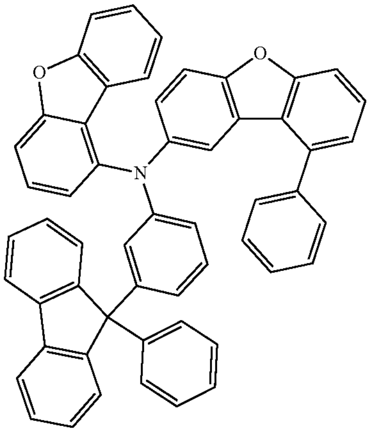
-continued
P1-82
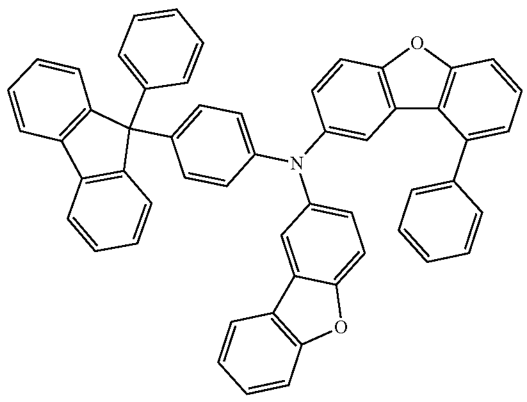
P1-83
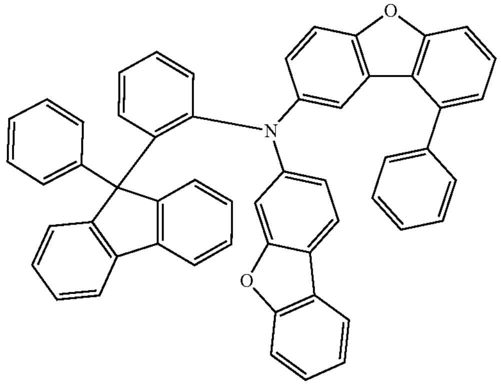
P1-84
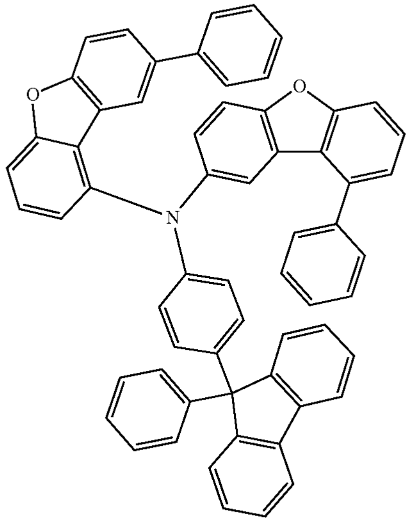

-continued
P1-85
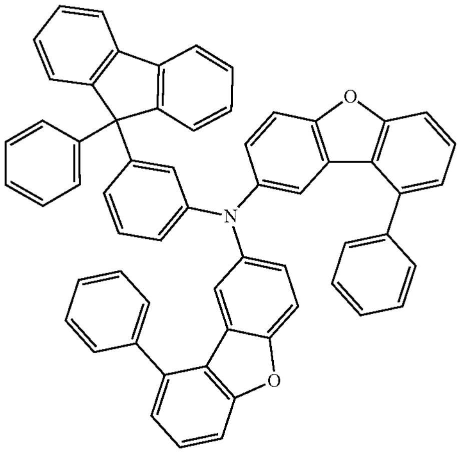
P1-86
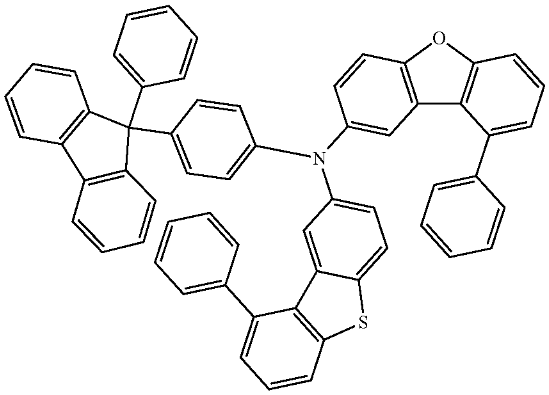
P1-87
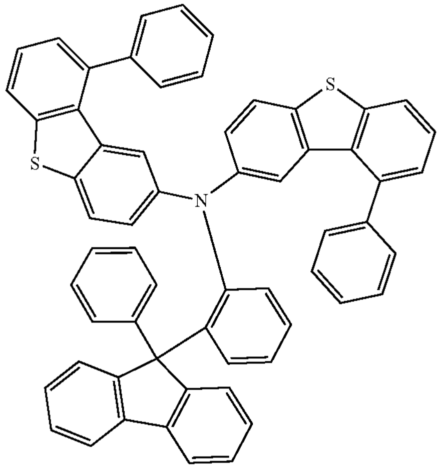
-continued
P1-88
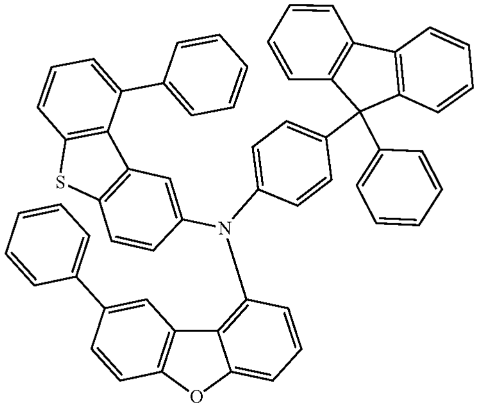
P1-89
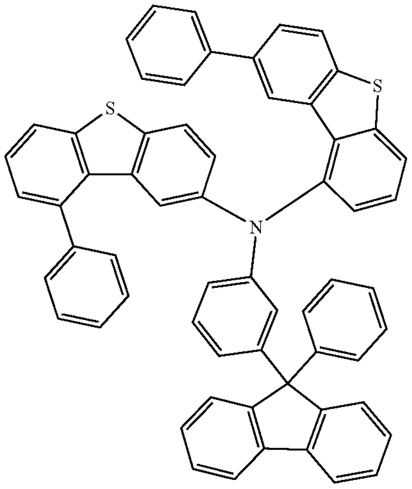
P1-90
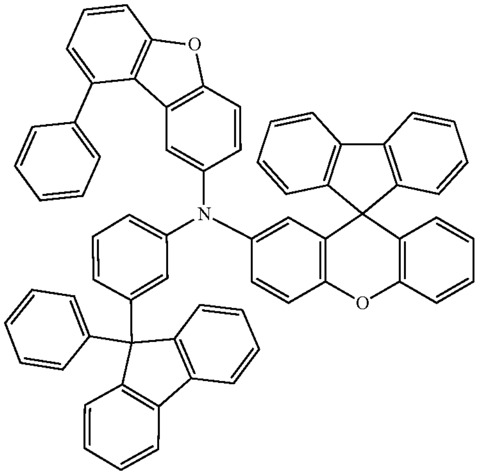

-continued
P1-91
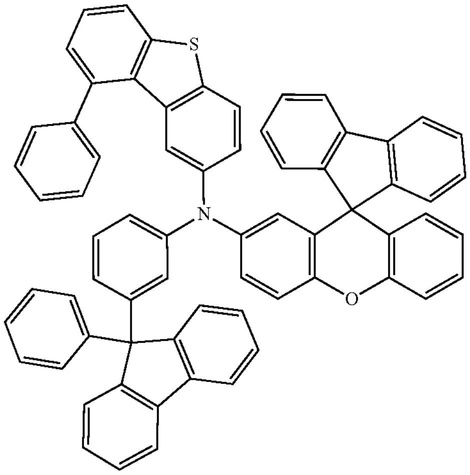
P1-92
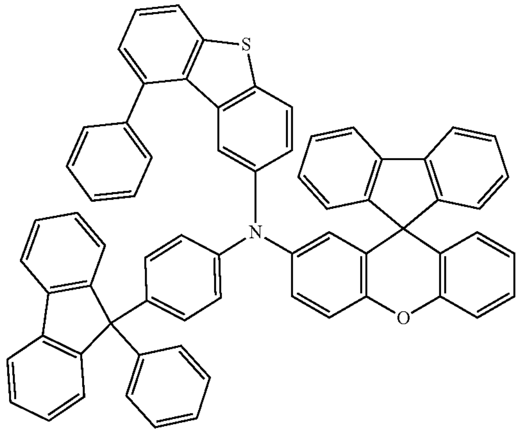
P1-93
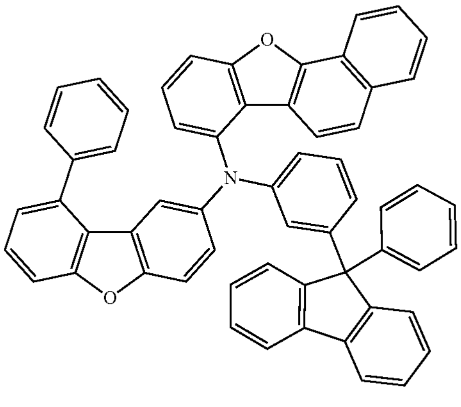
P1-94
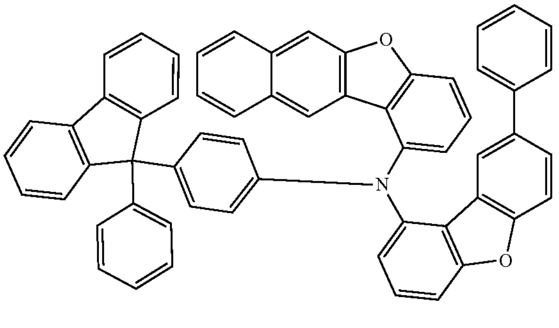
-continued
P1-95
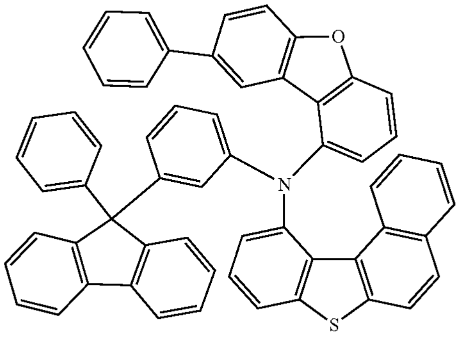
P1-96
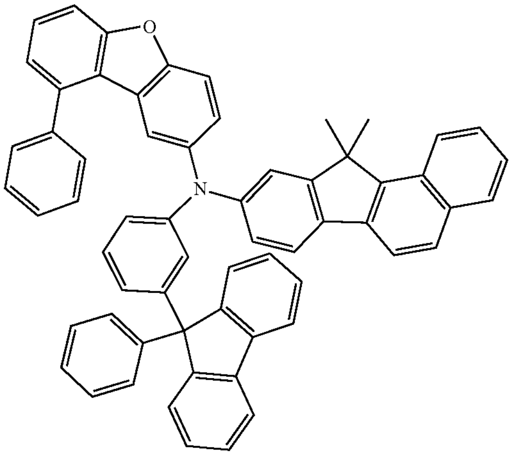
P1-97
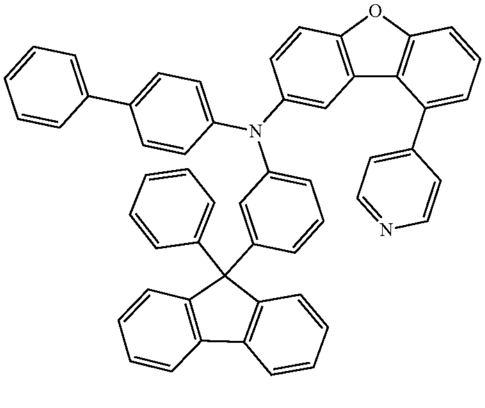
P1-98
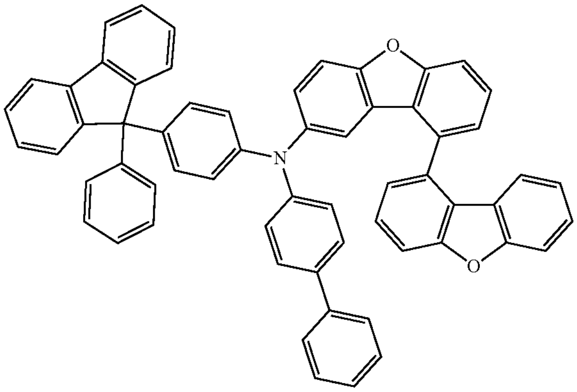

-continued
P1-99
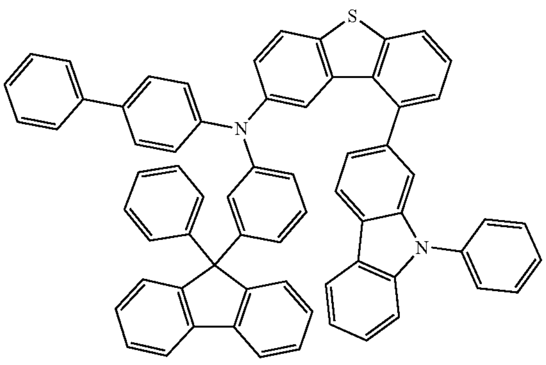
P1-100
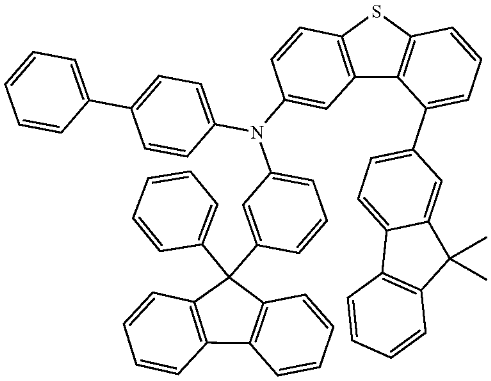
P1-101
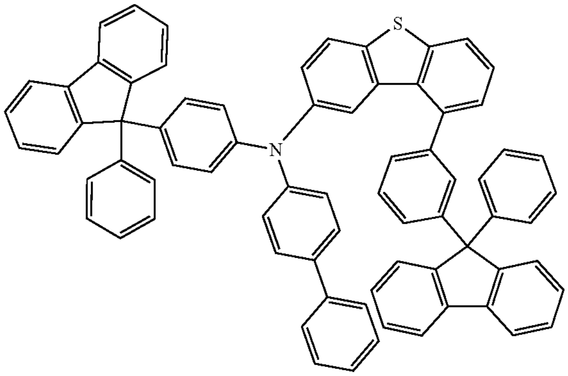
P1-102
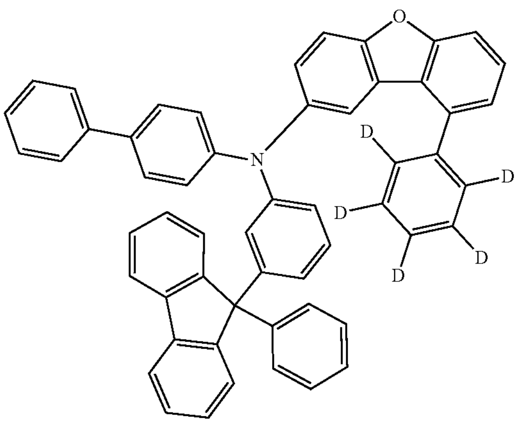
-continued
P1-103
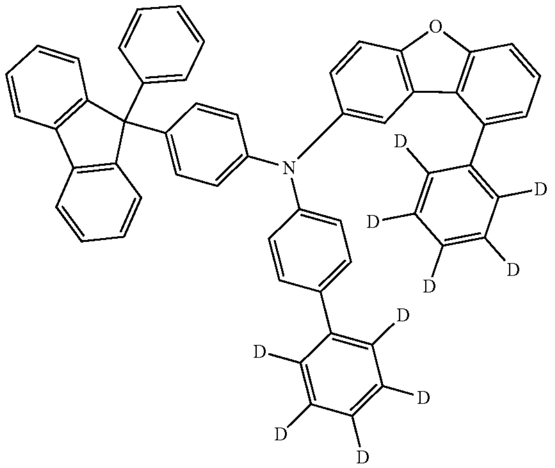
P1-104
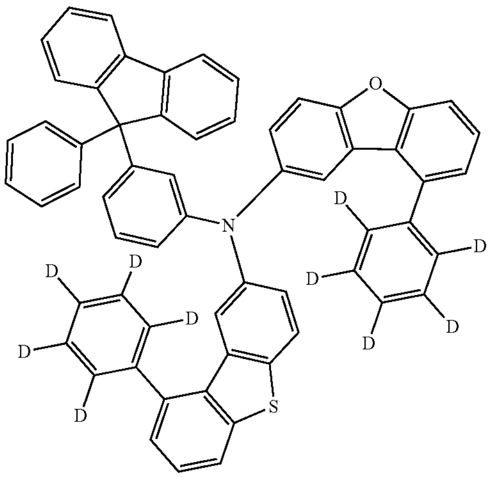
P1-105
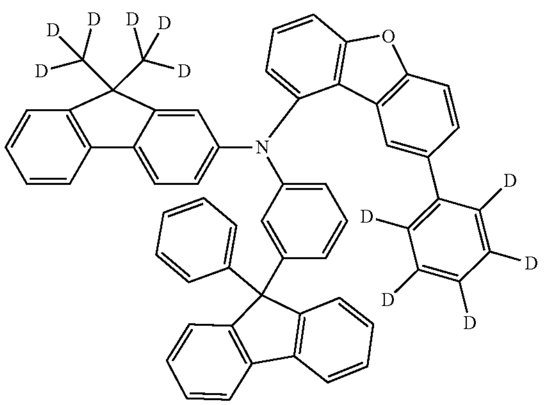

-continued
P1-106
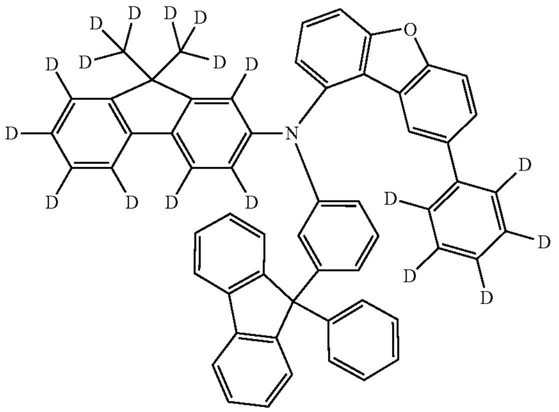
P1-107
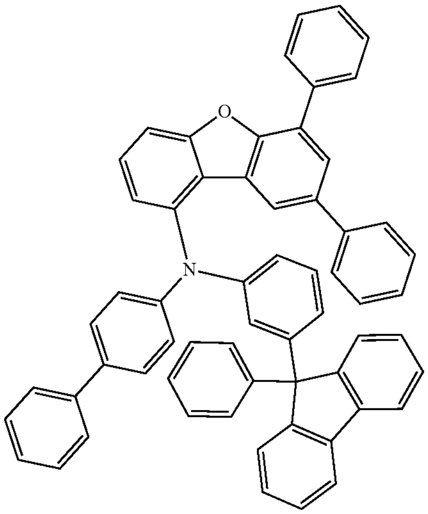
P1-108
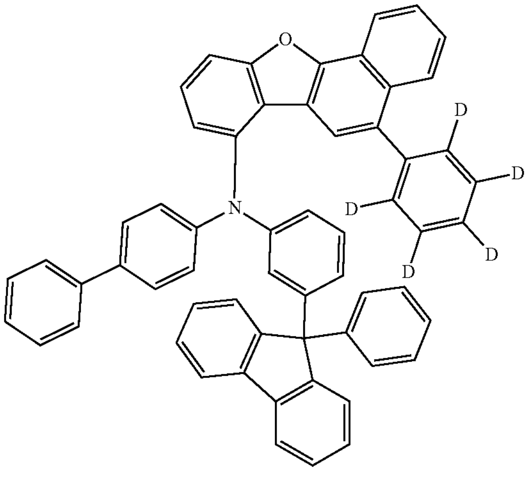
-continued
P2-1
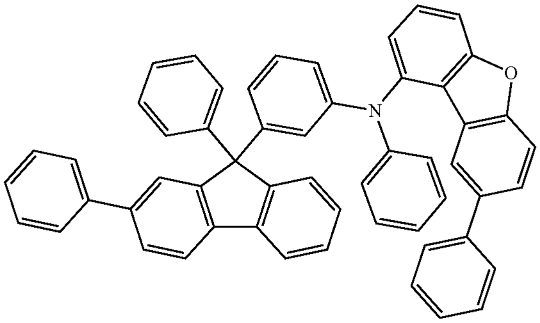
P2-2
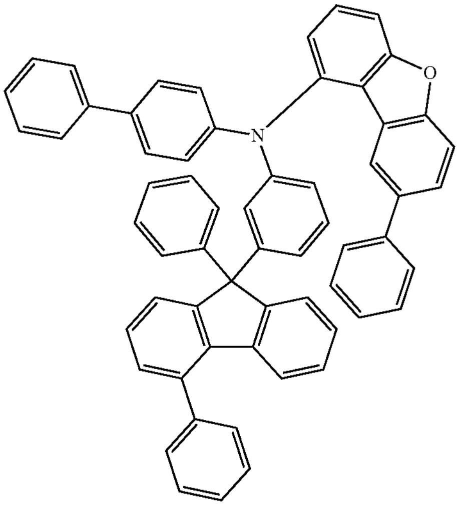
P2-3
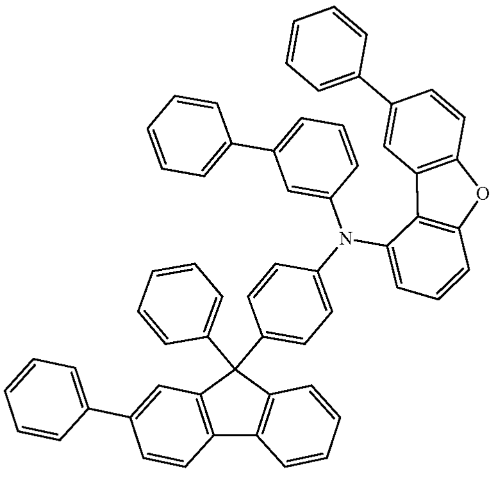

-continued
P2-4
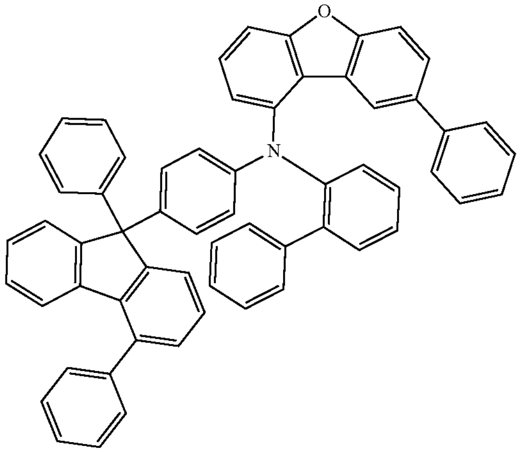
P2-5
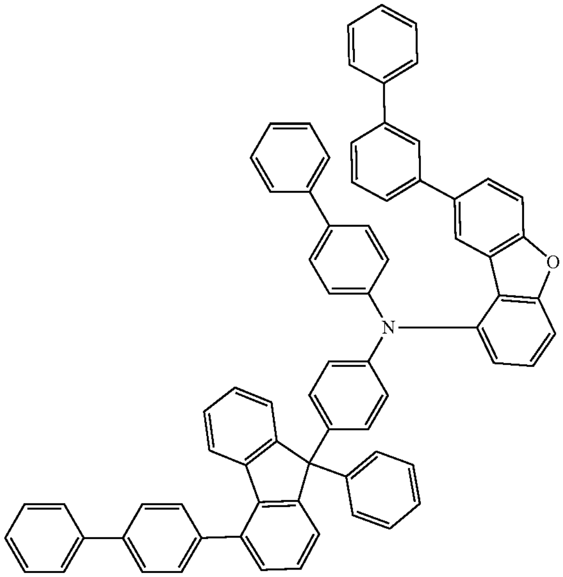
P2-6
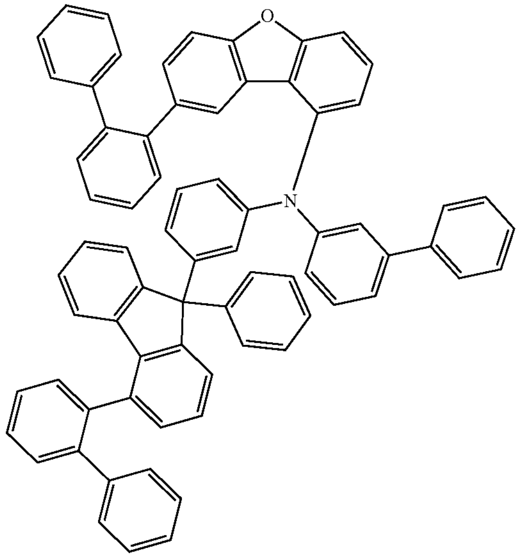
-continued
P2-7
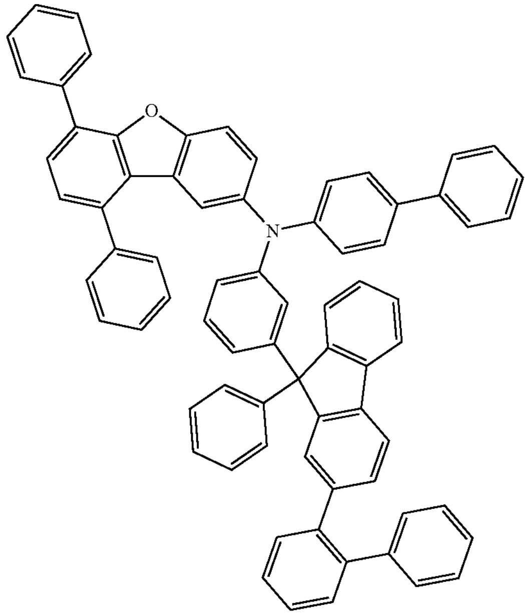
P2-8
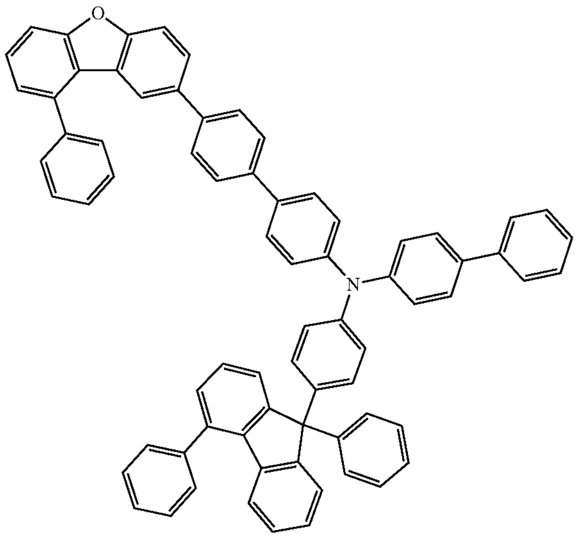

-continued
P2-9
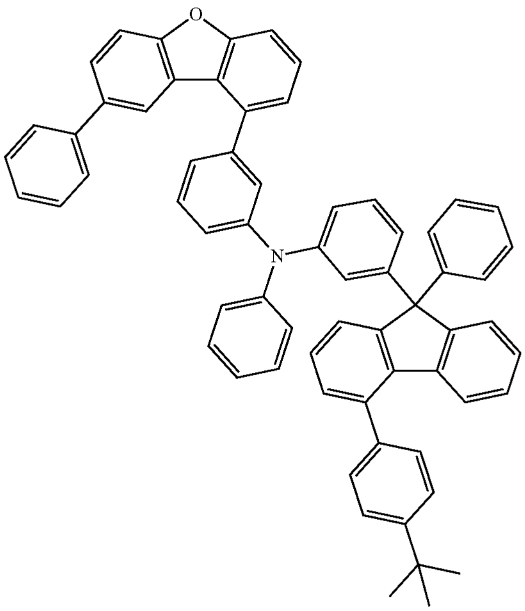
P2-11
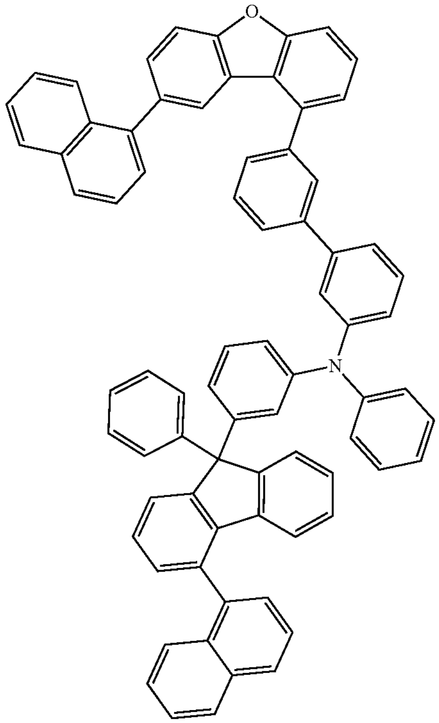
P2-10
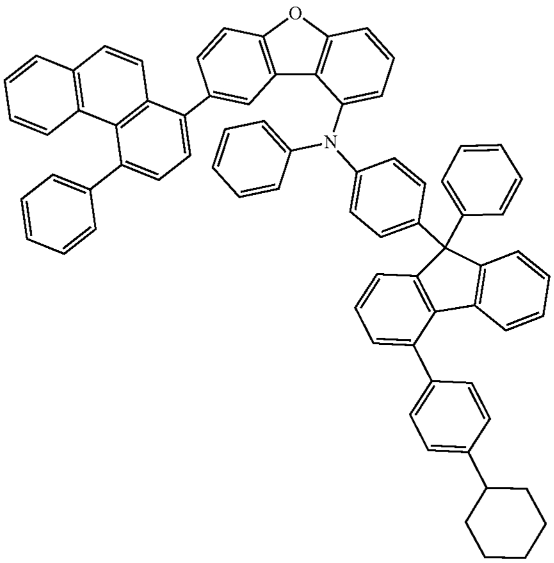
P2-12
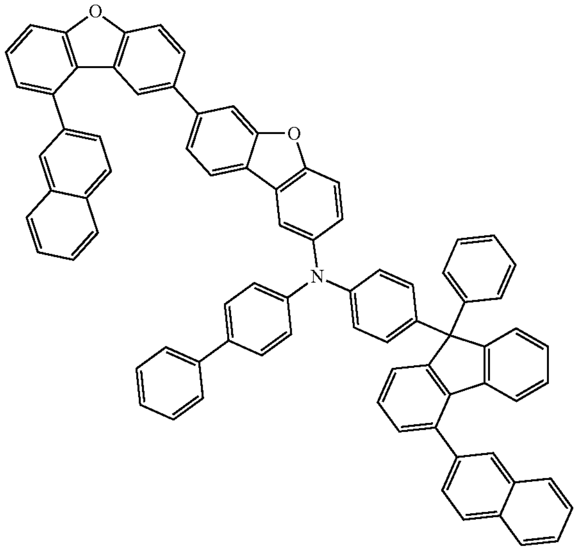

-continued
P2-13
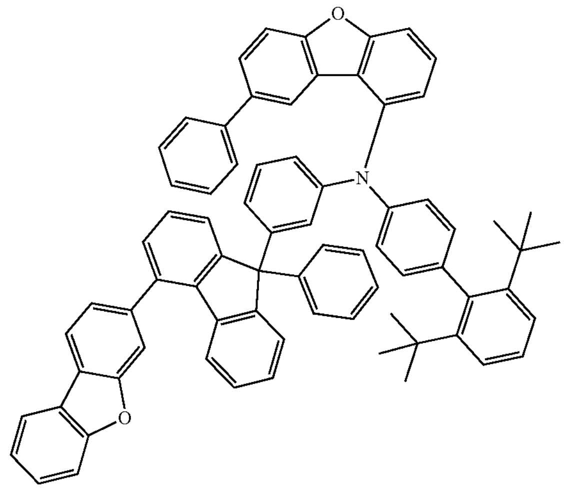
P2-14
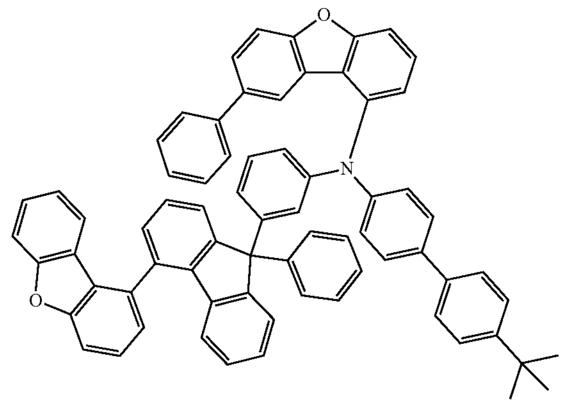
P2-15
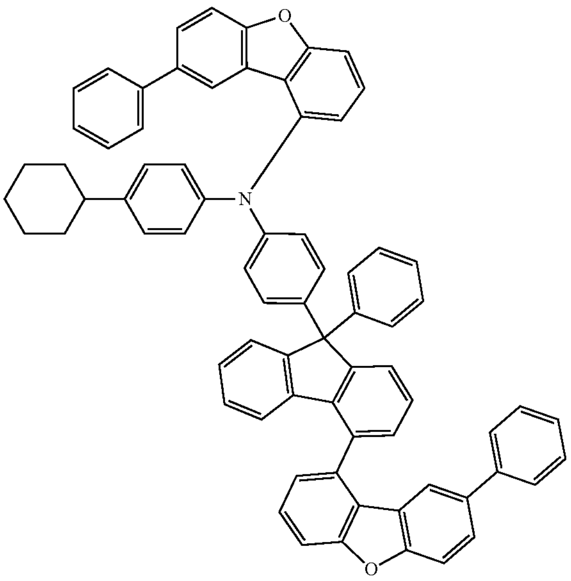
-continued
P2-16
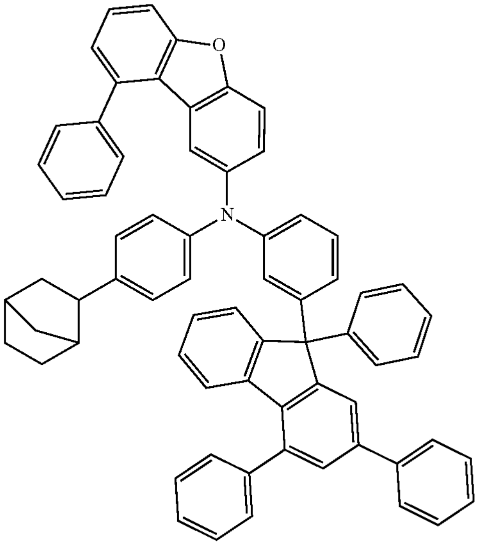
P2-17
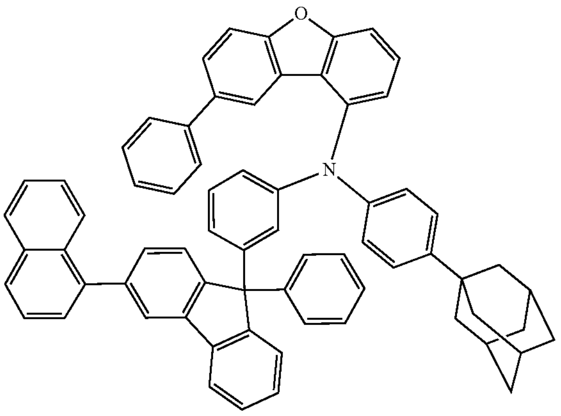
P2-18
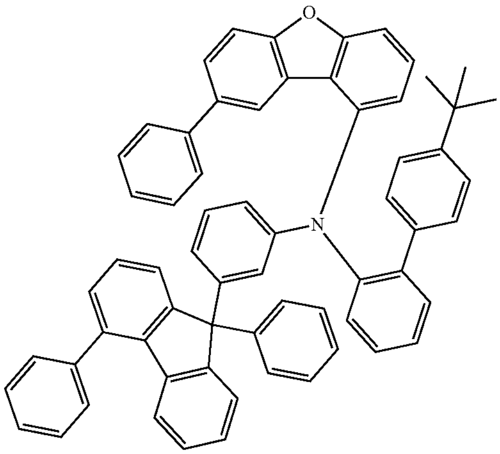

-continued
P2-19
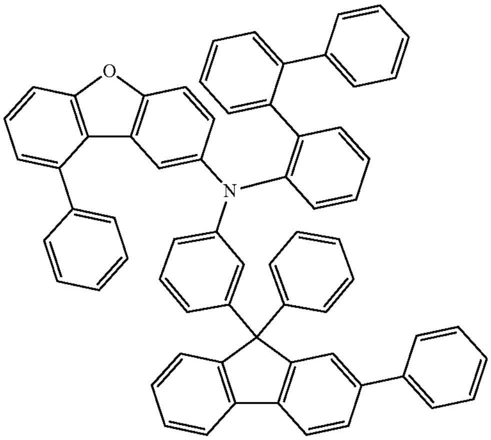
P2-20
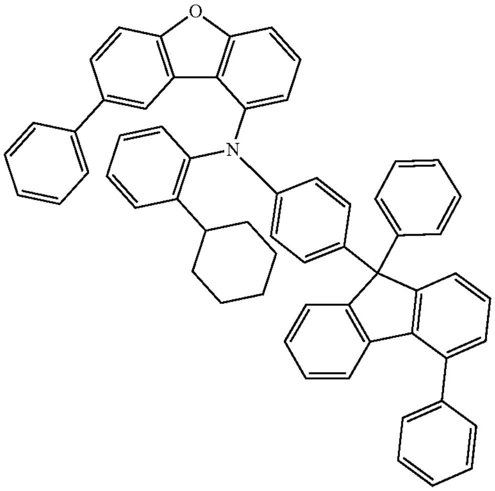
P2-21
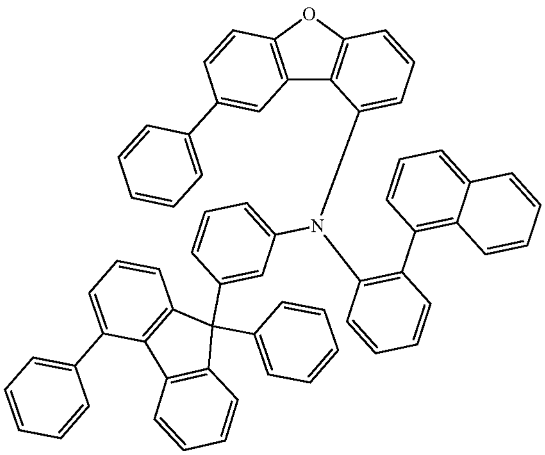
-continued
P2-22
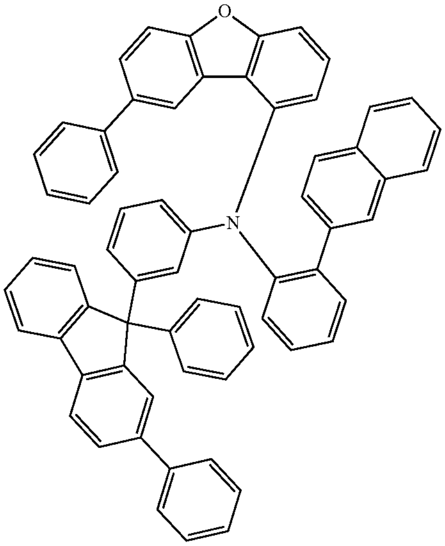
P2-23
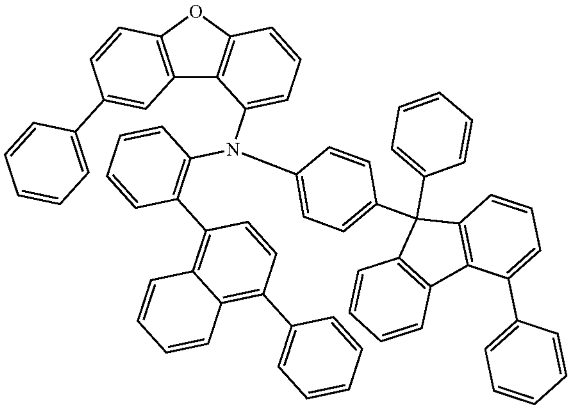
P2-24
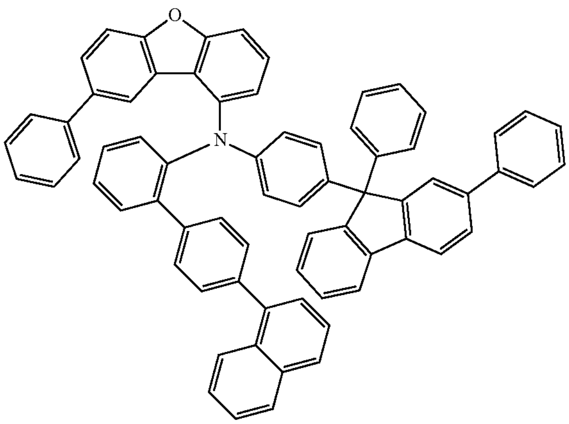

-continued
P2-25
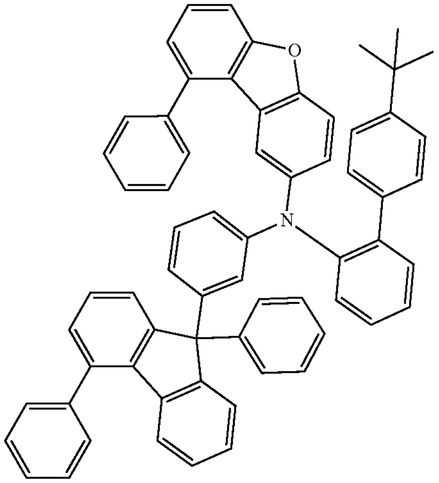
P2-26
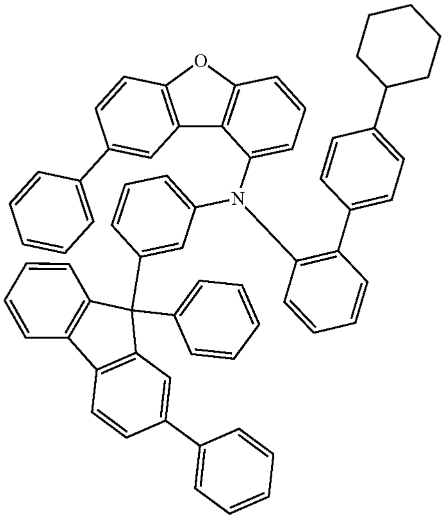
P2-27
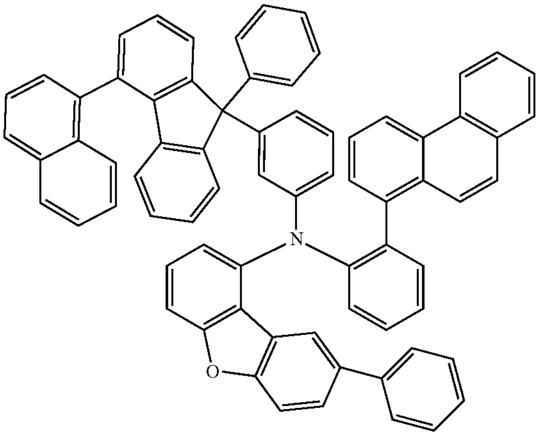
-continued
P2-28
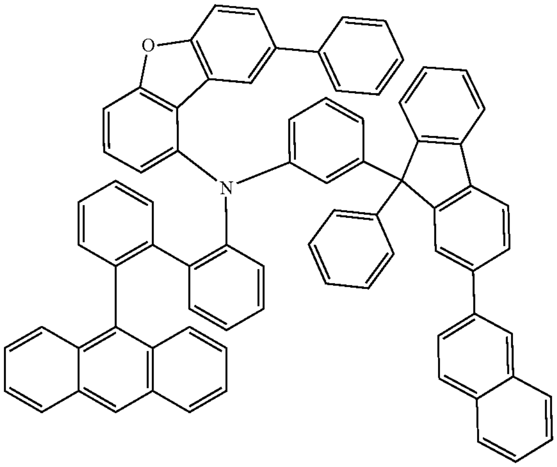
P2-29
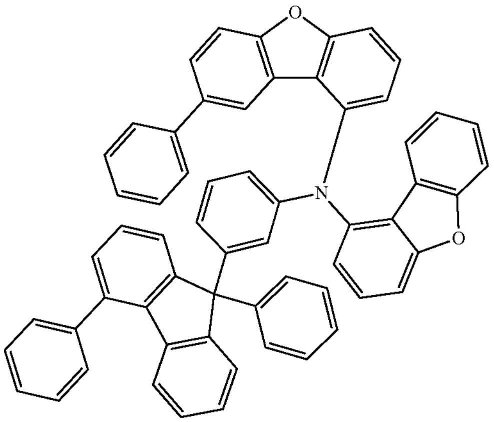
P2-30
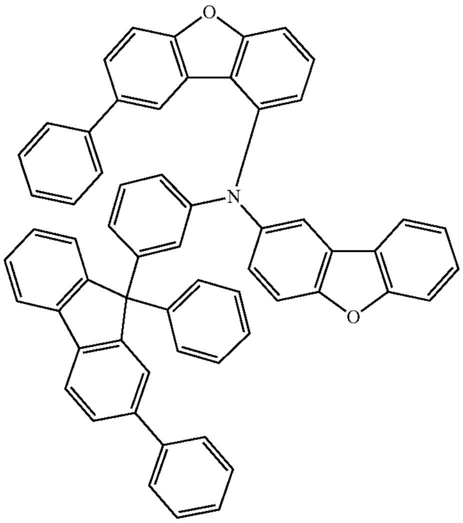

-continued
P2-31
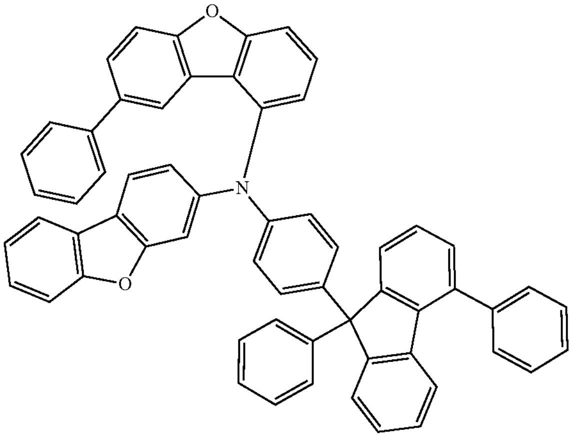
P2-32
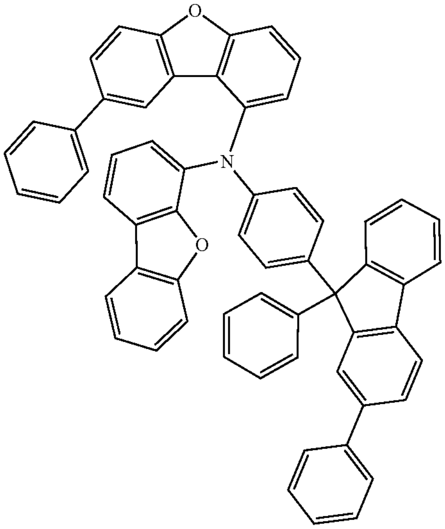
P2-33
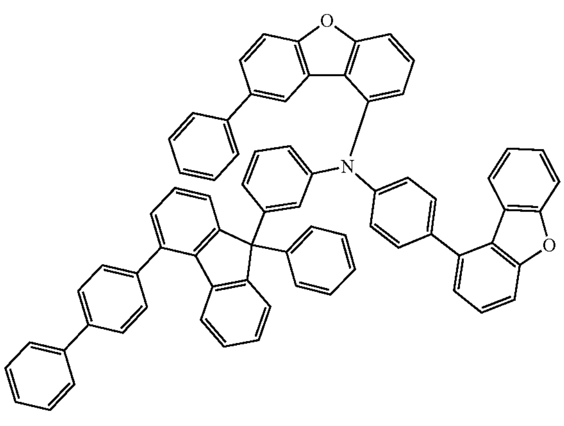
-continued
P2-34
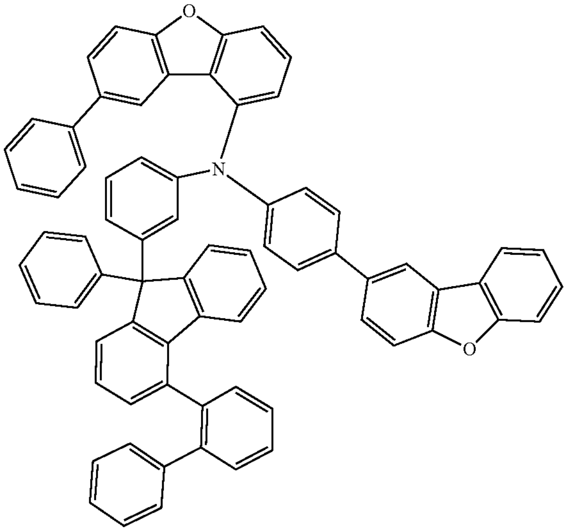
P2-35
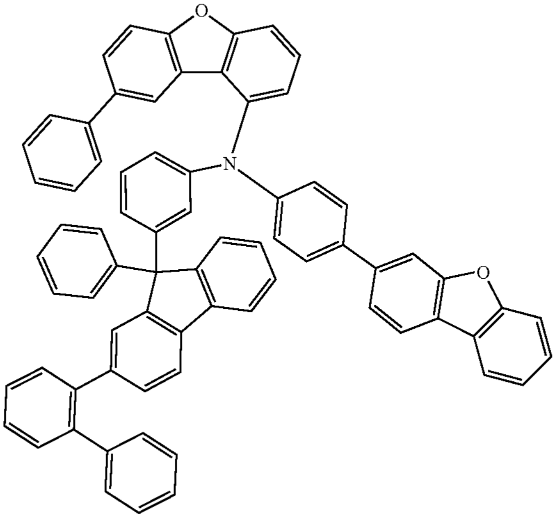
P2-36
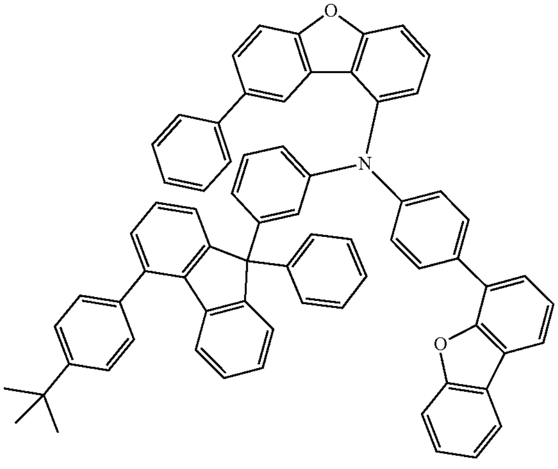

-continued
P2-37
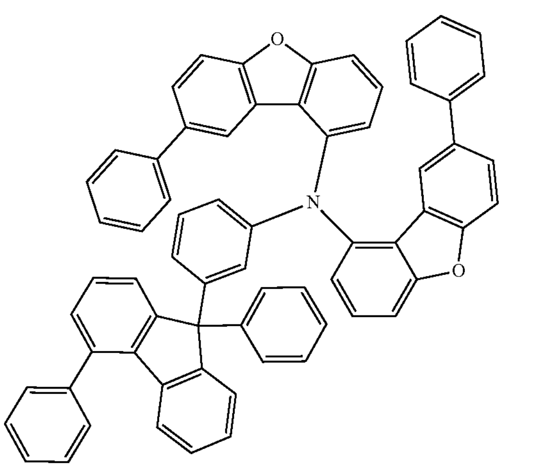
P2-38
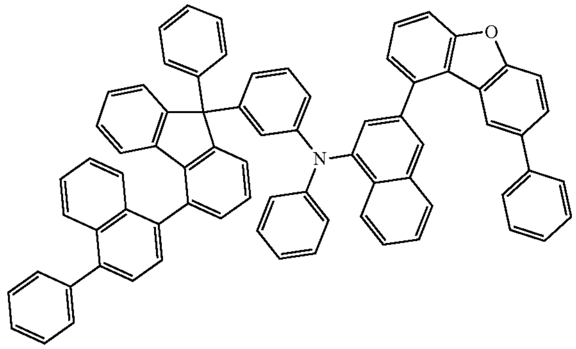
P2-39
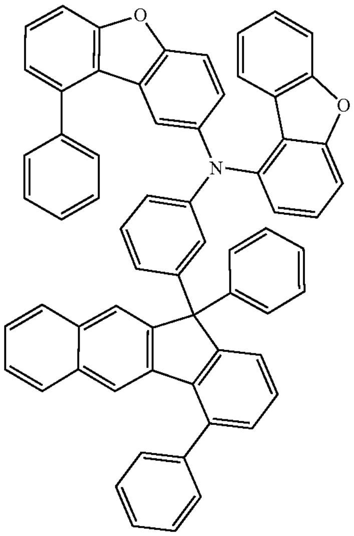
-continued
P2-40
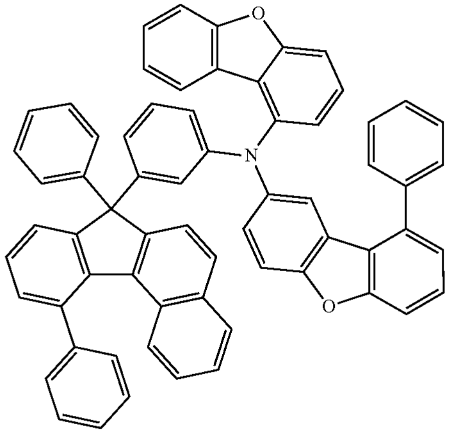
P2-41
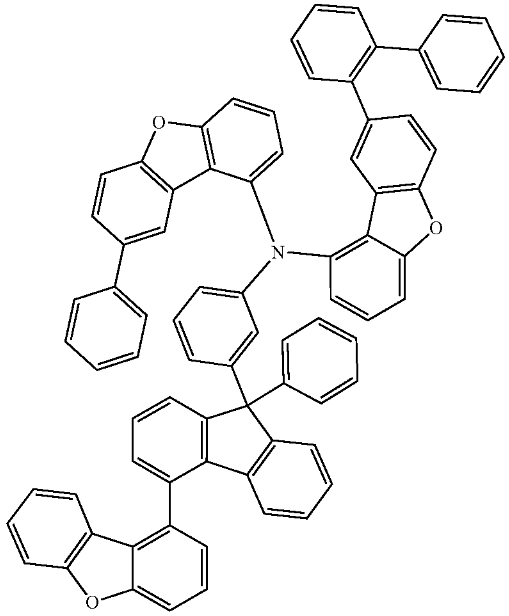
P2-42
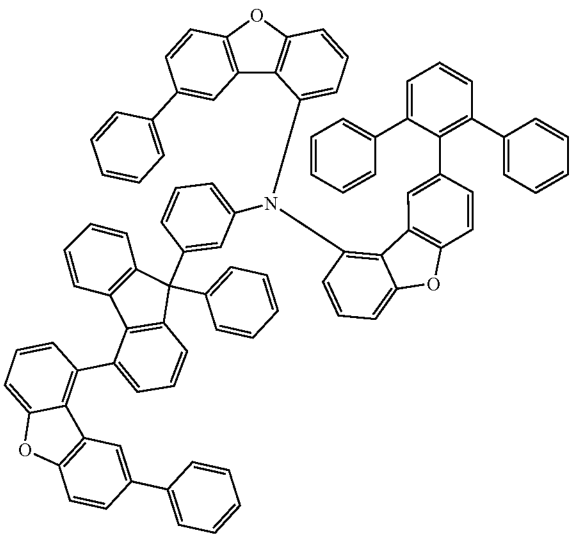

-continued
P2-43
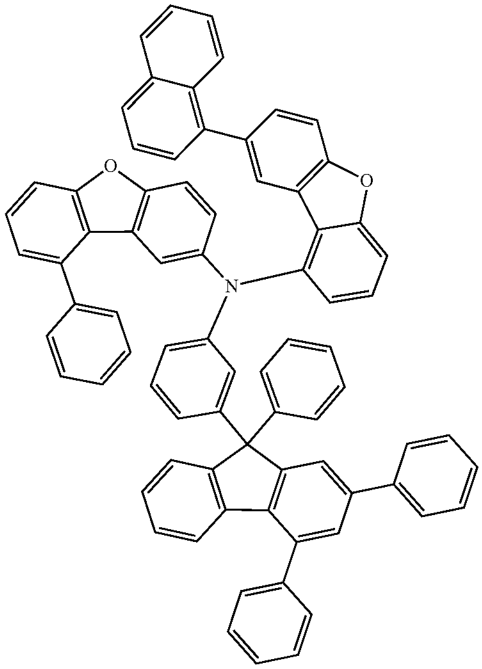
-continued
P2-45
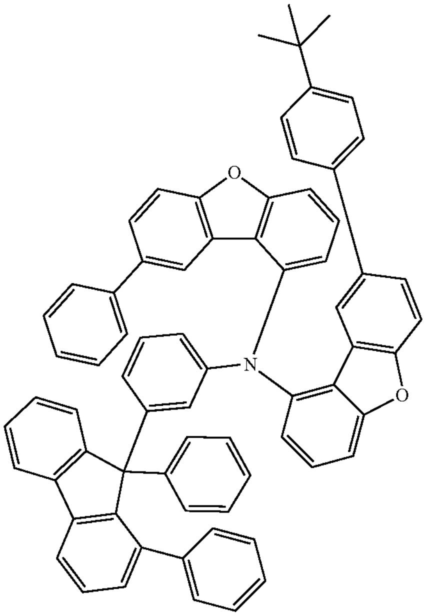
P2-44
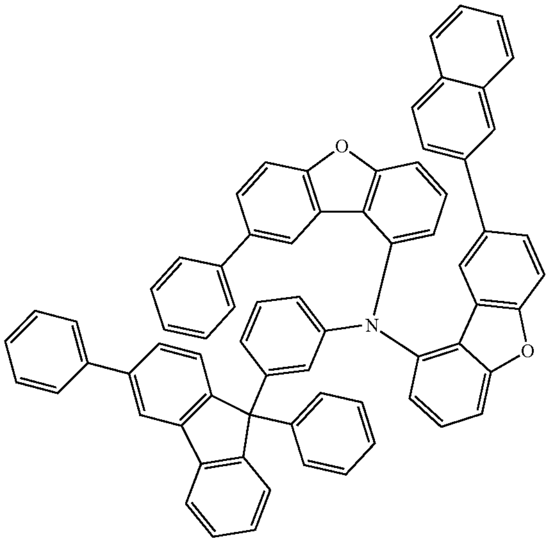
P2-46
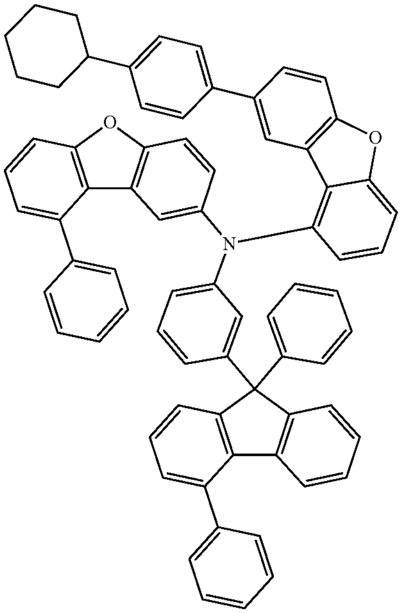

-continued
P2-47
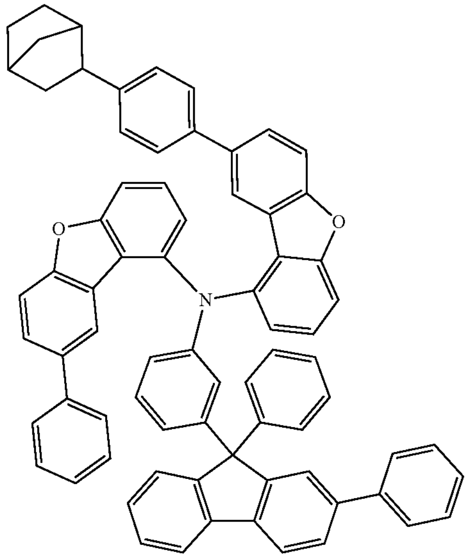
P2-48
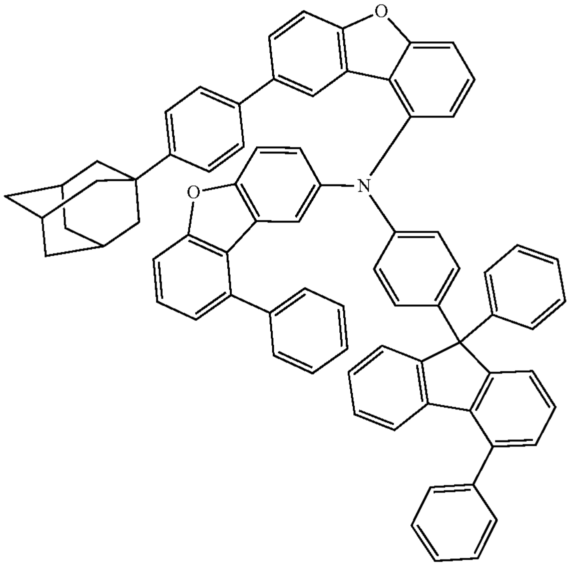
P2-49
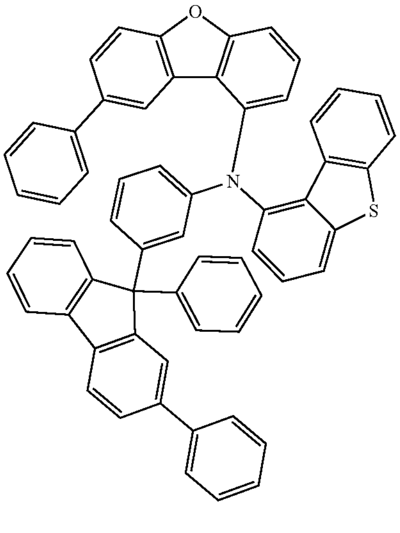
-continued
P2-50
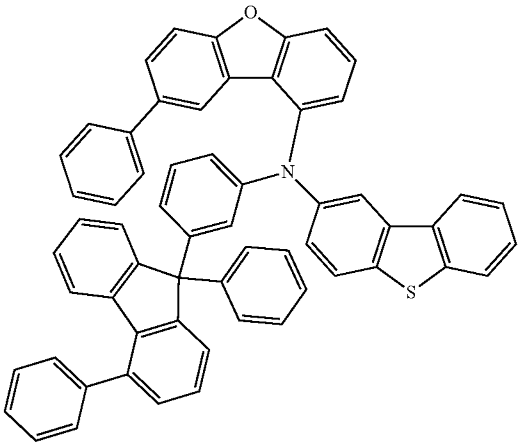
P2-51
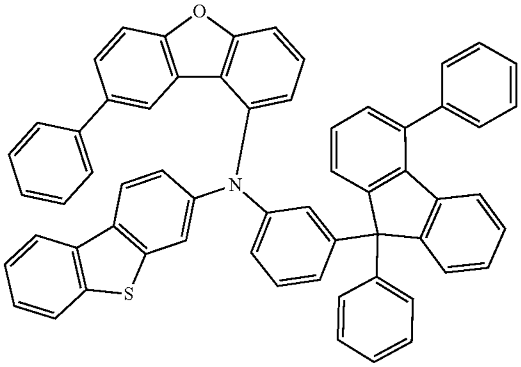
P2-52
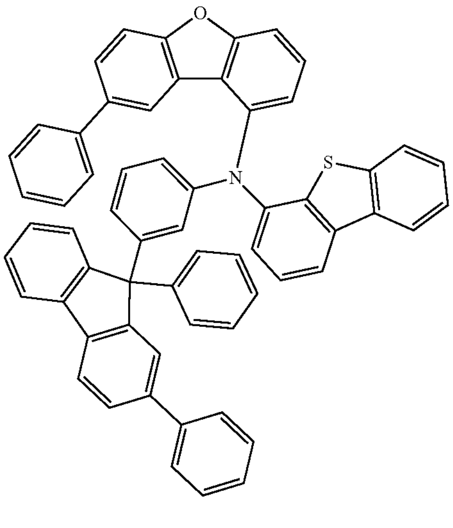

-continued
P2-53
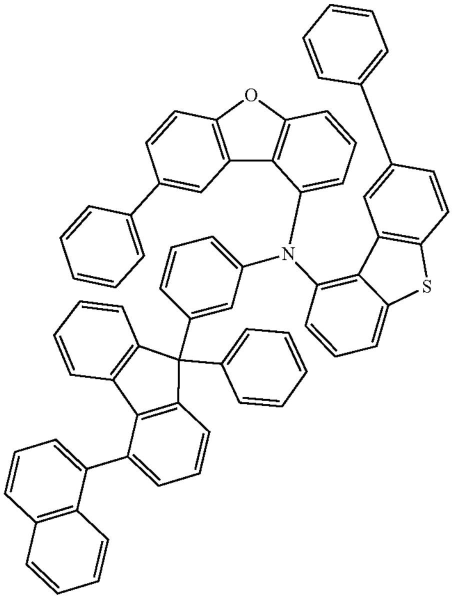
P2-54
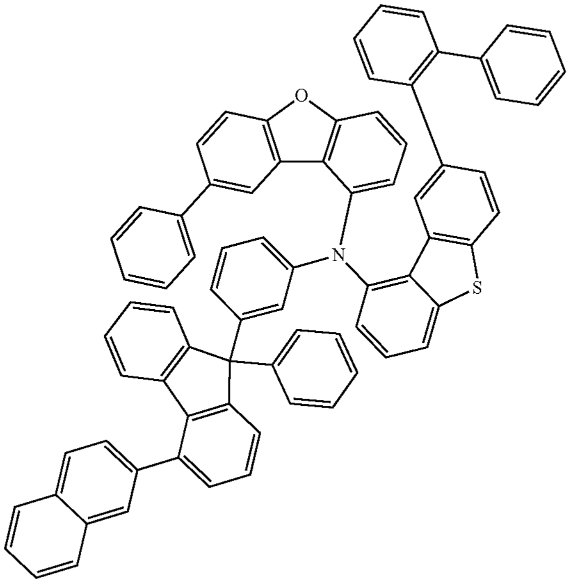
P2-55
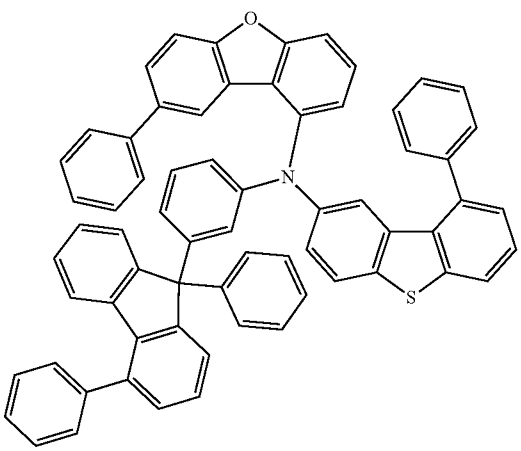
-continued
P2-56
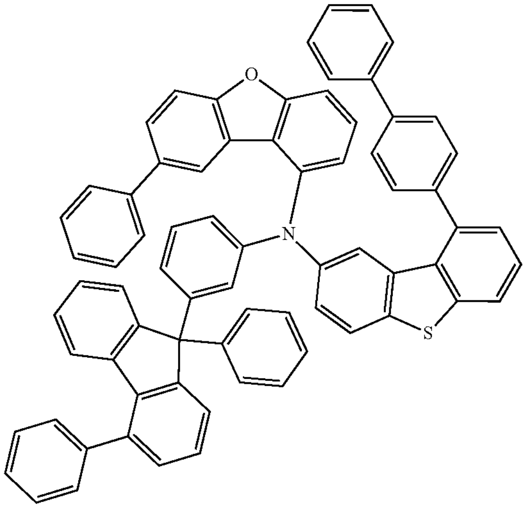
P2-57
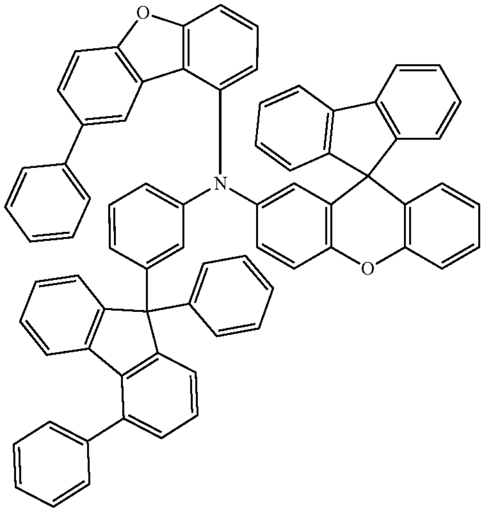
P2-58
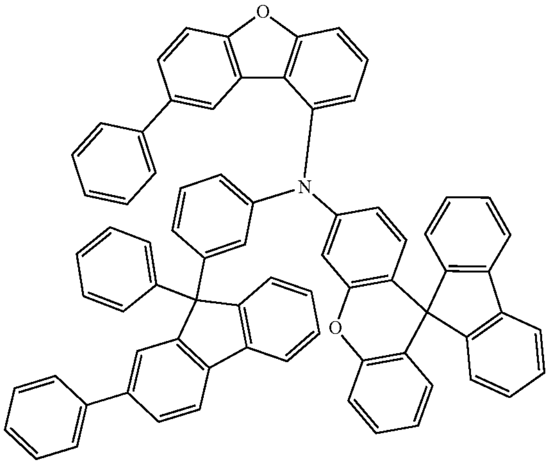

-continued
P2-59
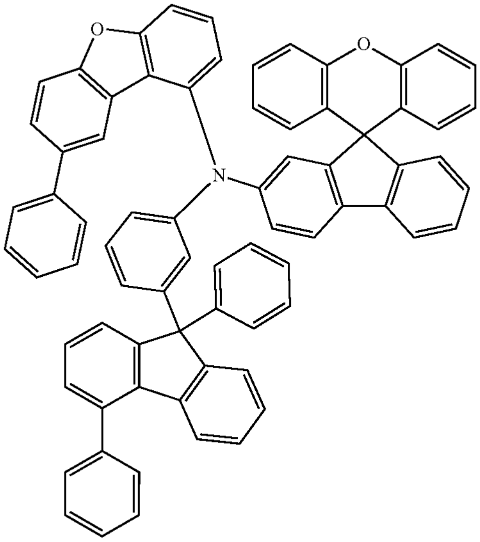
P2-60
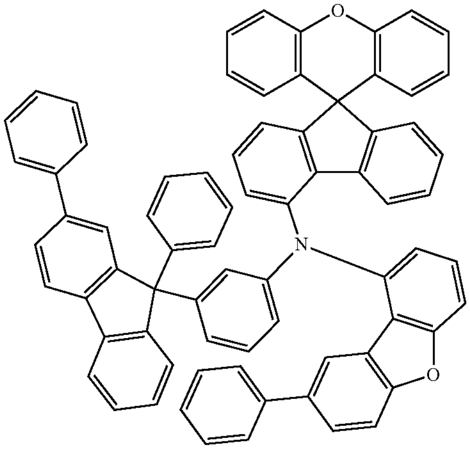
P2-61
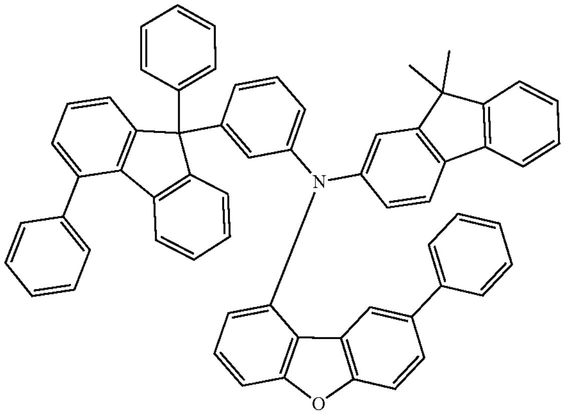
-continued
P2-62
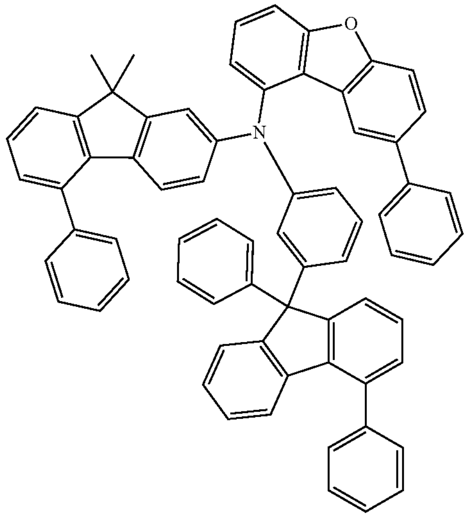
P2-63
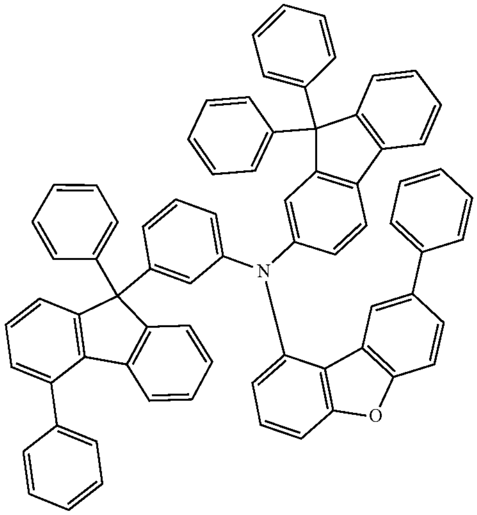
P2-64
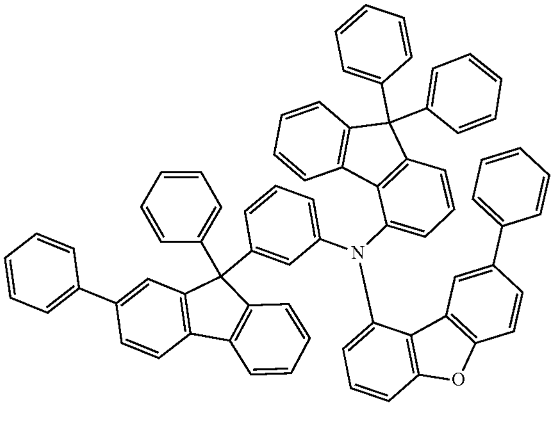

-continued
P2-65
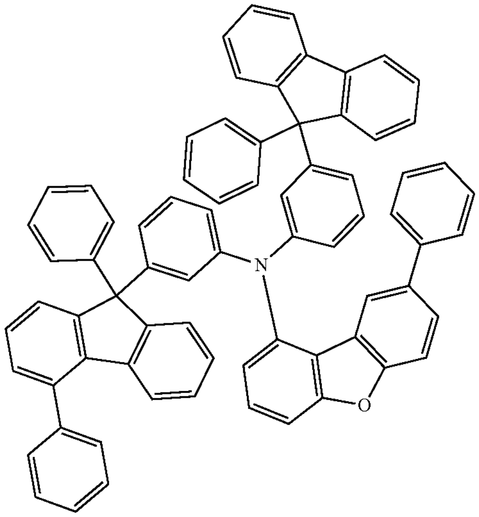
P2-66
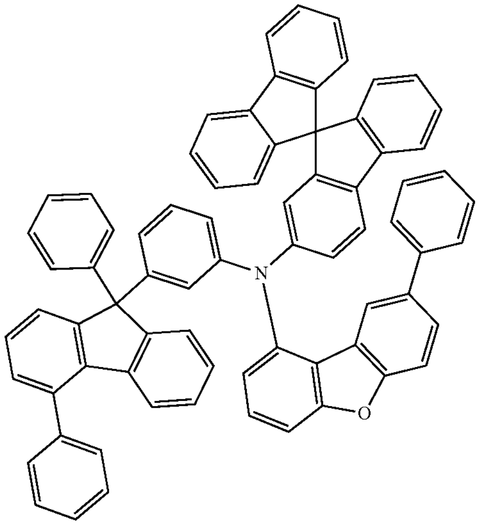
P2-67
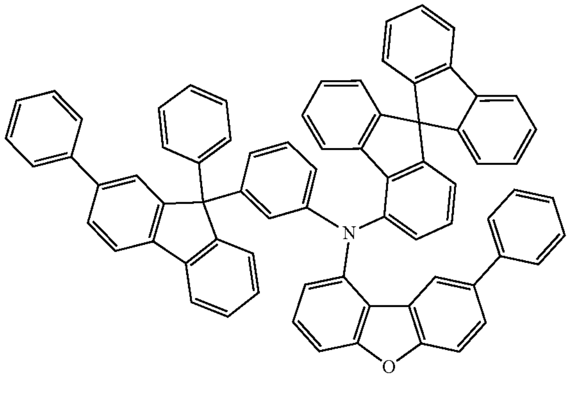
-continued
P2-68
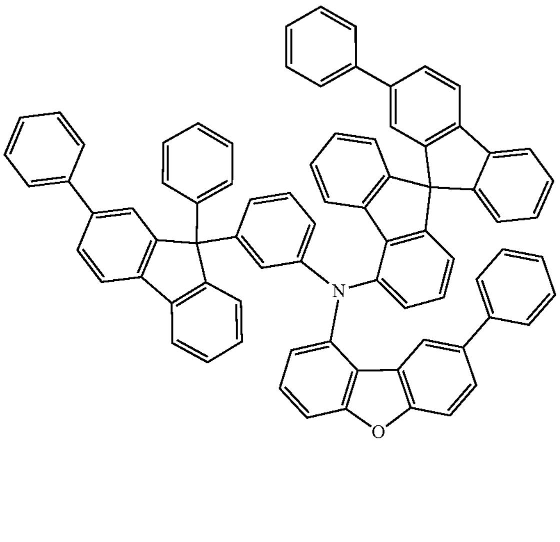
P2-69
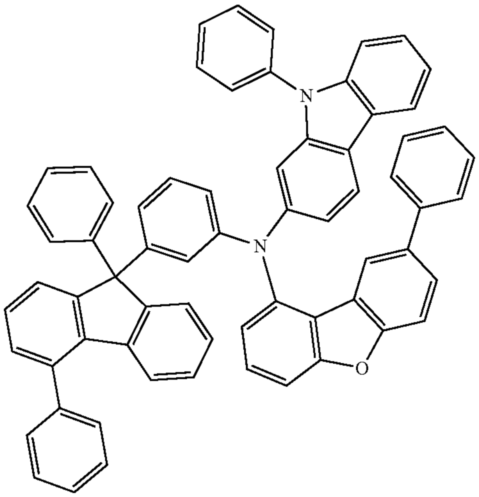
P2-70
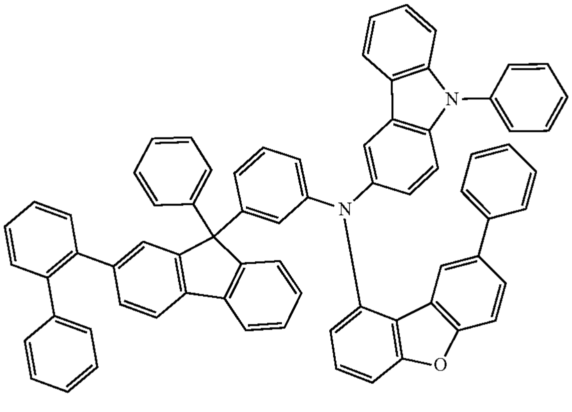

-continued
P2-71
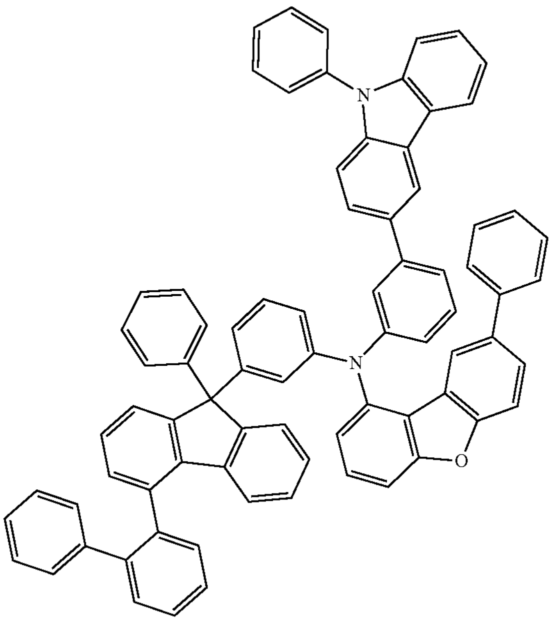
P2-72
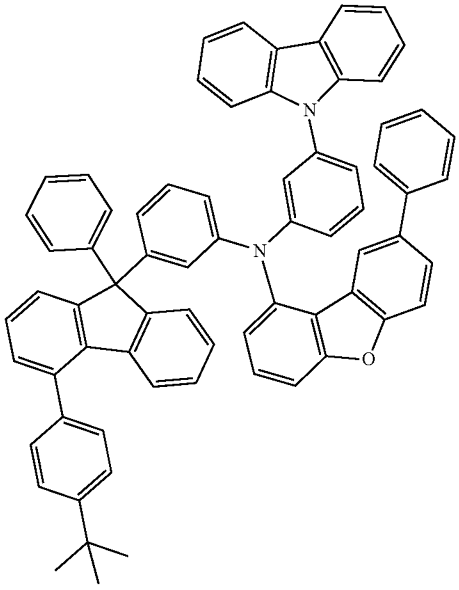
P2-73
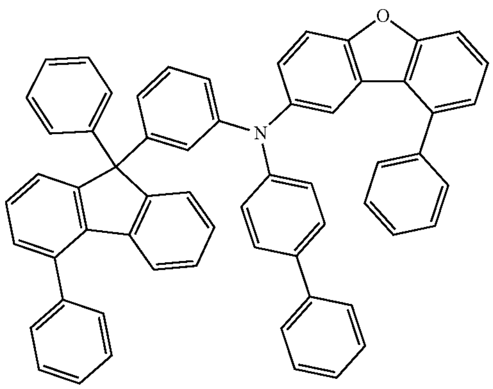
-continued
P2-74
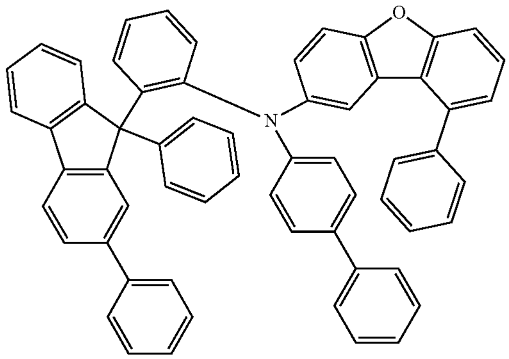
P2-75
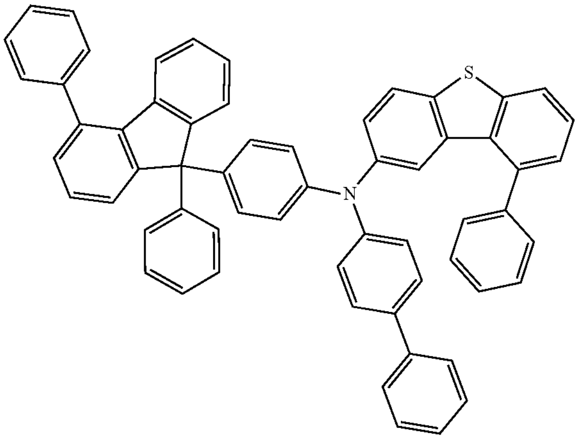
P2-76
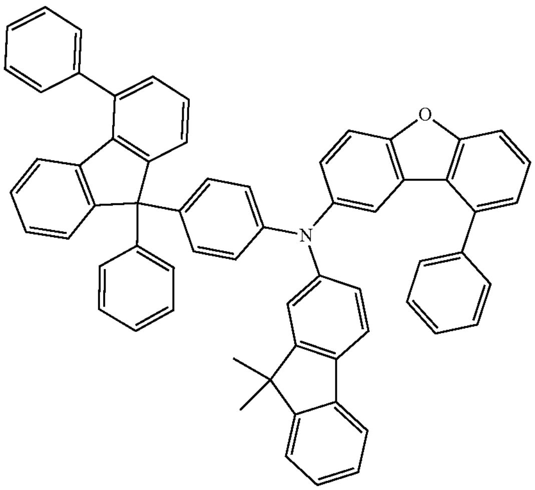

-continued
P2-77
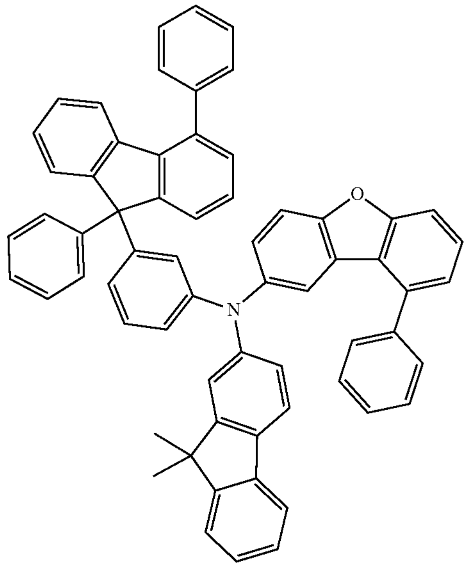
P2-78
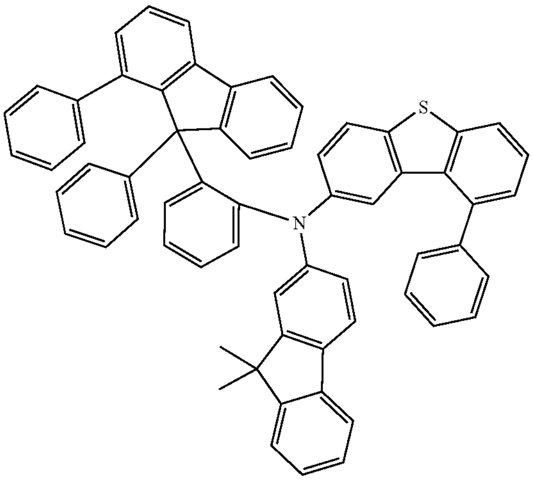
P2-79
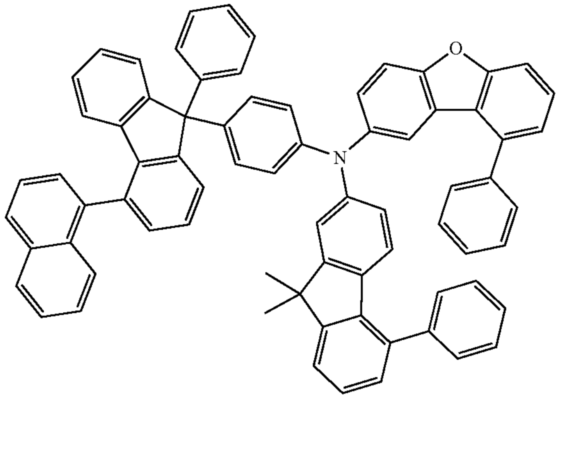
-continued
P2-80
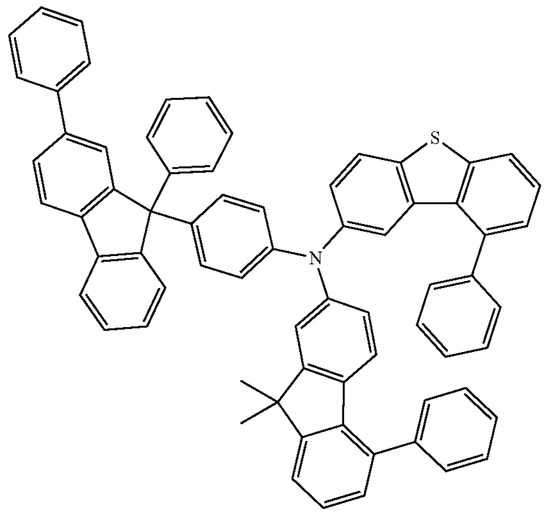
P2-81
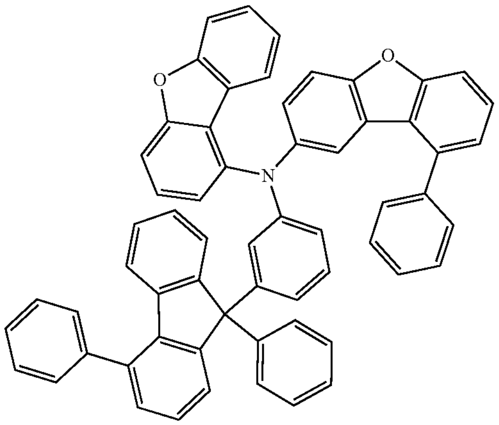
P2-82
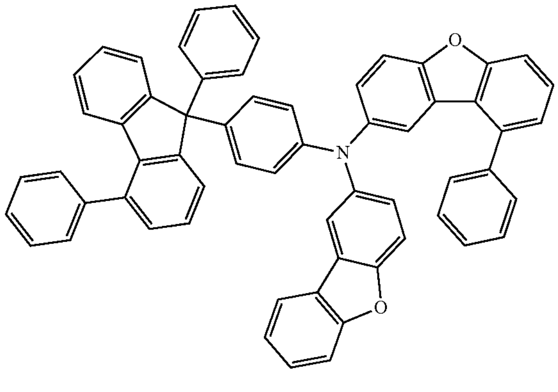

-continued
P2-83
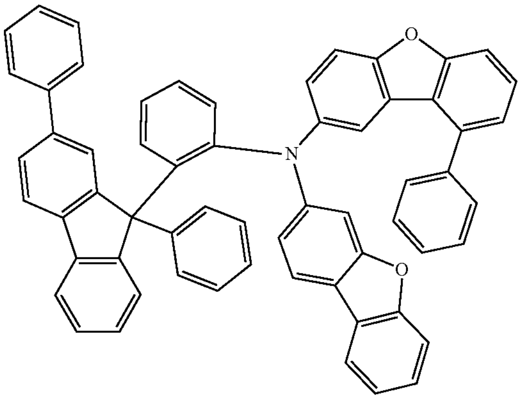
P2-84
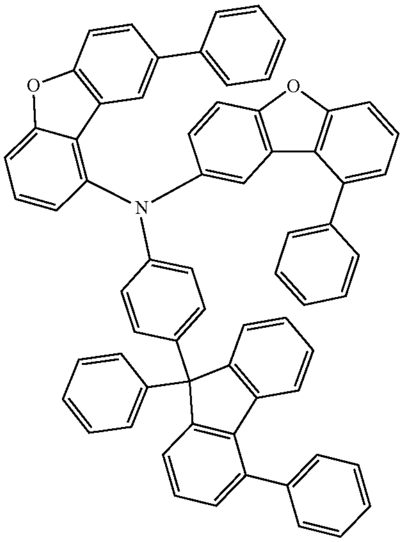
P2-85
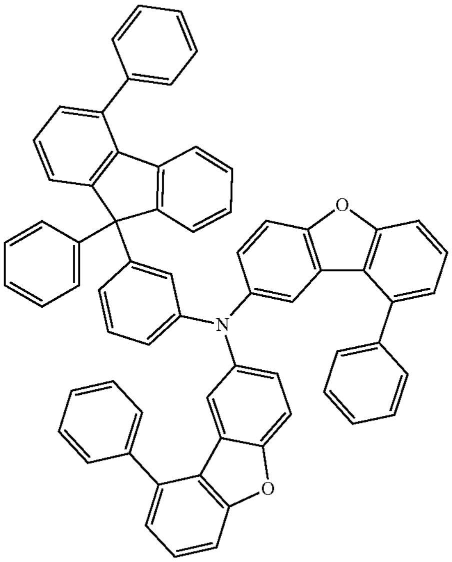
-continued
P2-86
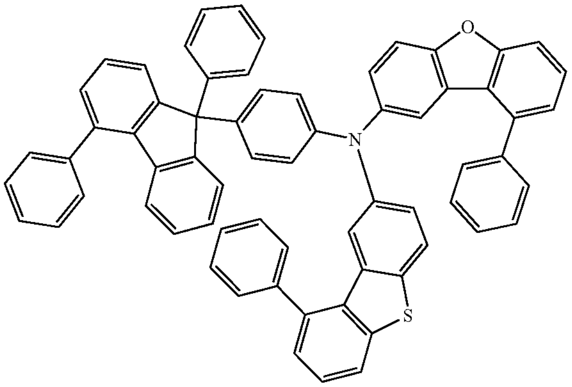
P2-87
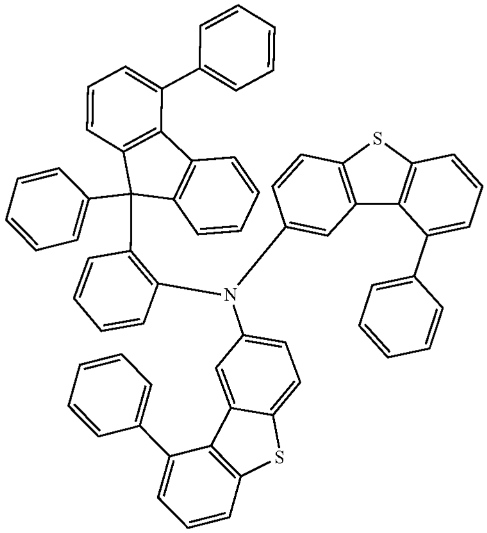
P2-88
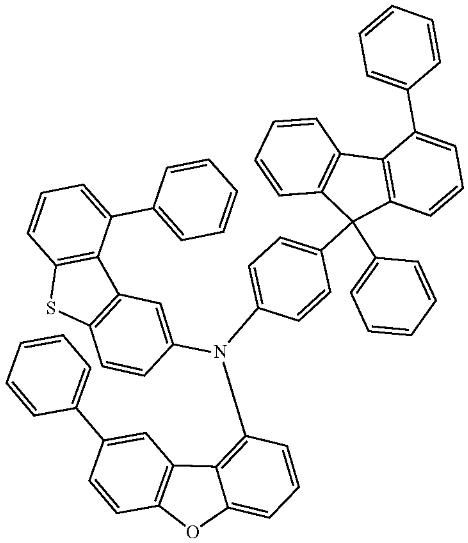

P2-89
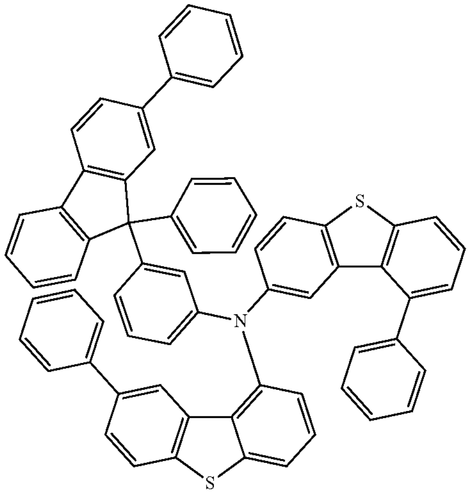
P2-90
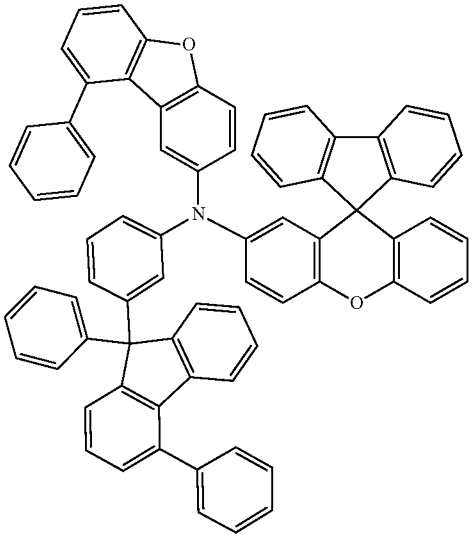
P2-91
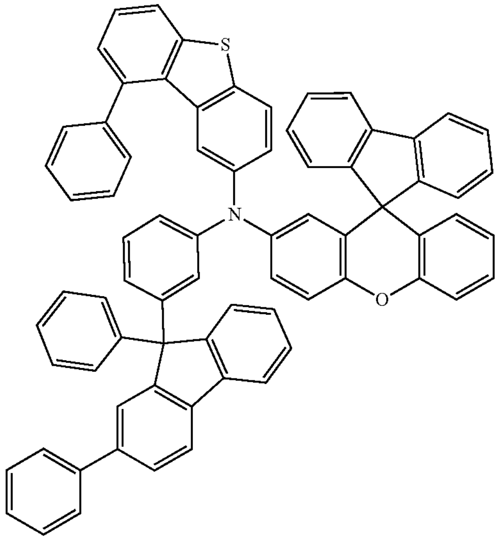
P2-92
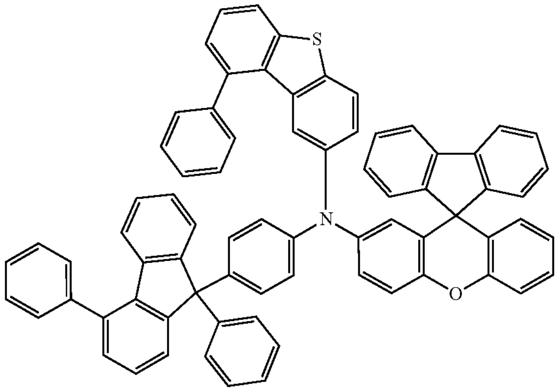
P2-93
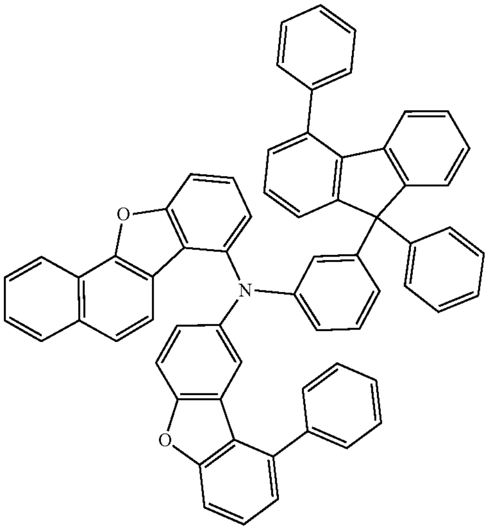
P2-94
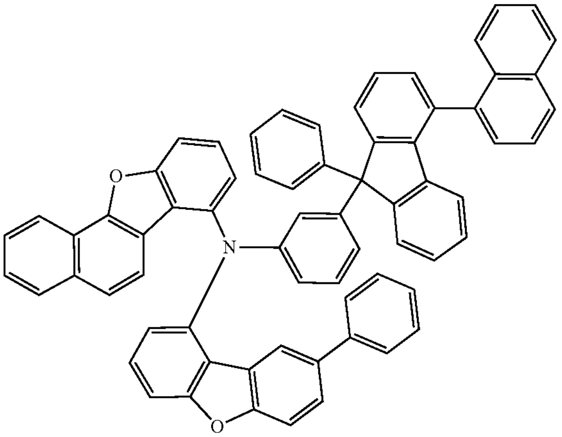

-continued
P2-95
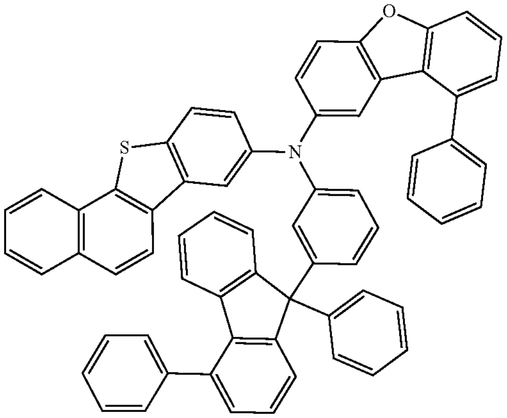
P2-96
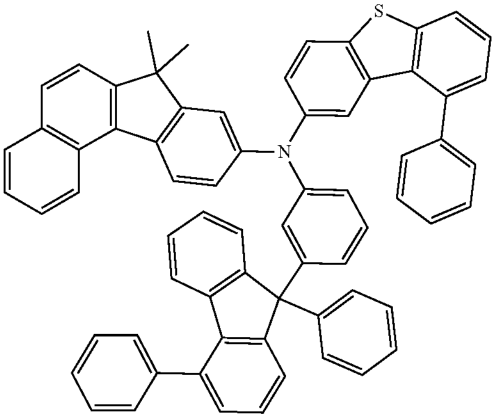
P2-97
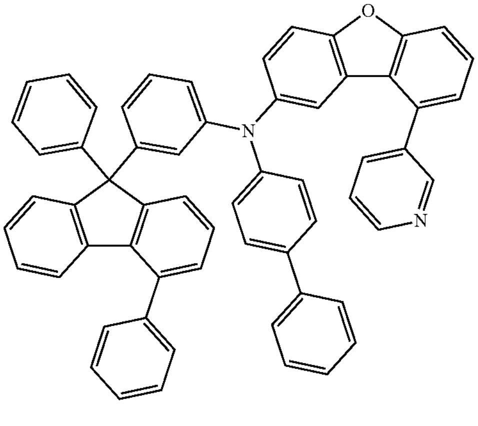
-continued
P2-98
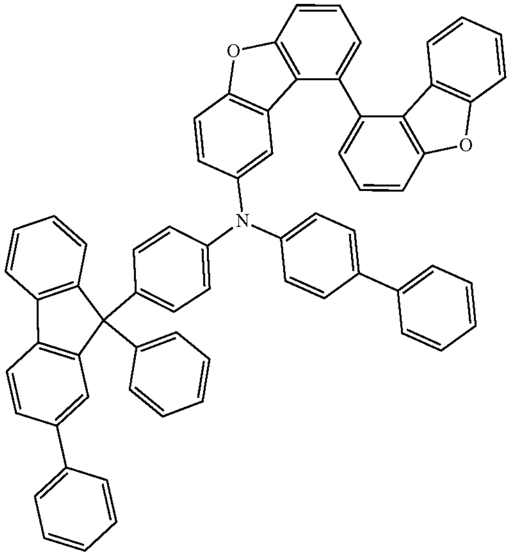
P2-99
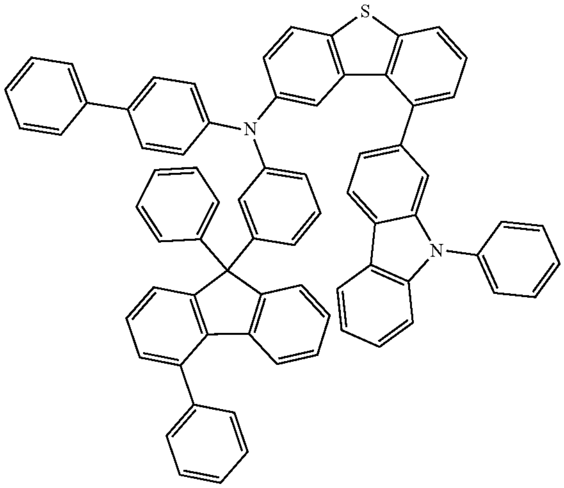
P2-100
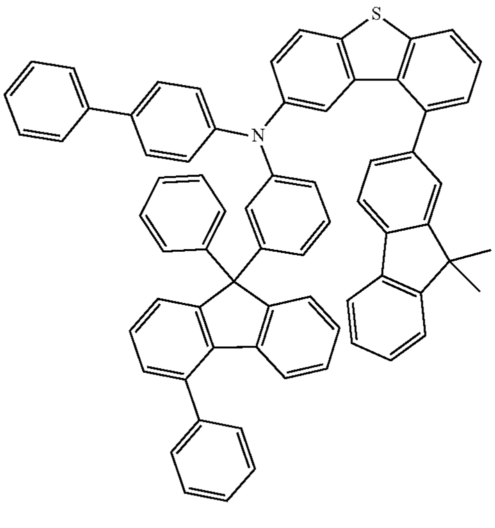

-continued
P2-101
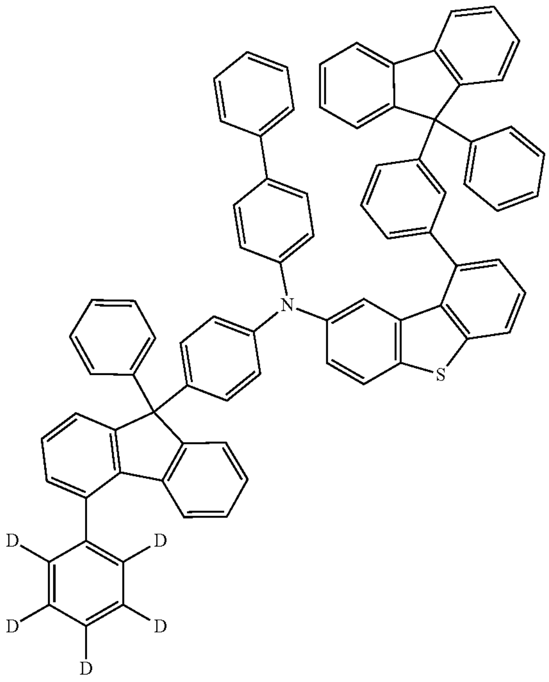
P2-102
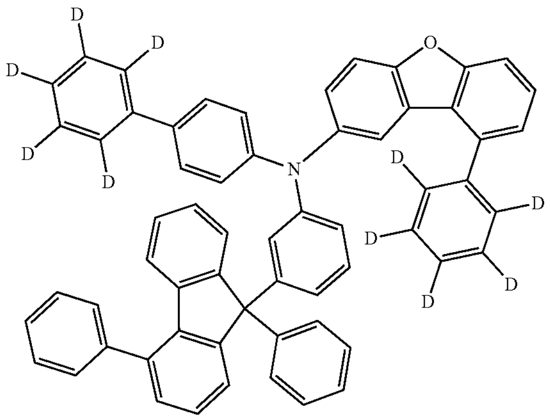
-continued
P2-103
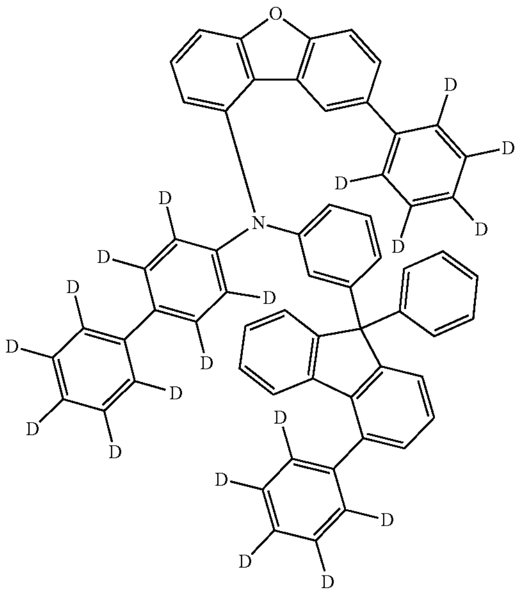
P2-104
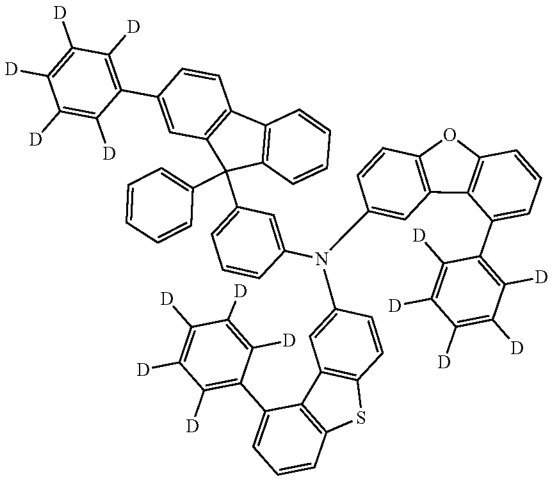
P2-105
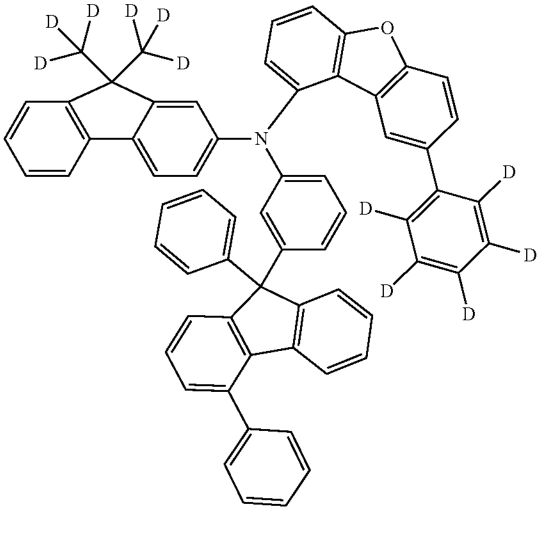

-continued
P2-106
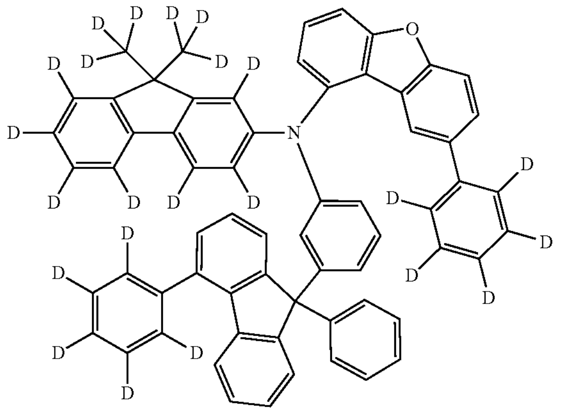
P2-107
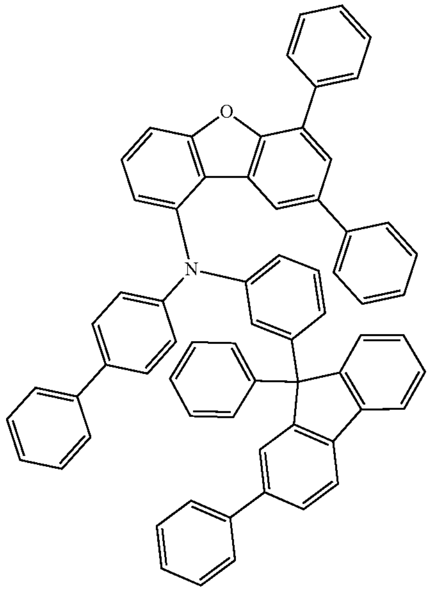
P2-108
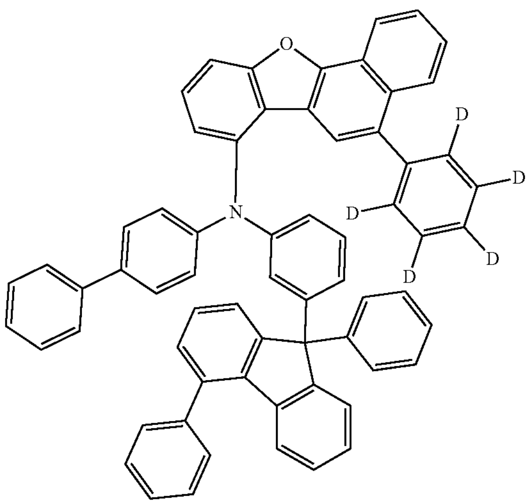
-continued
P3-1
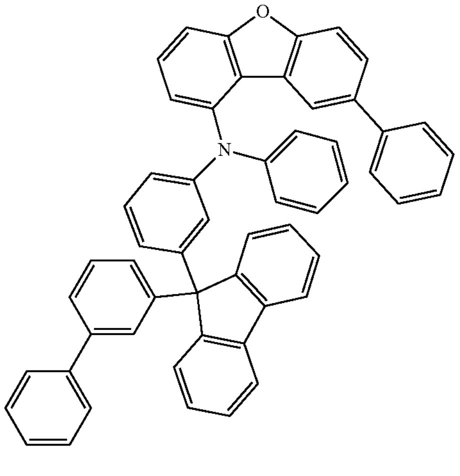
P3-2
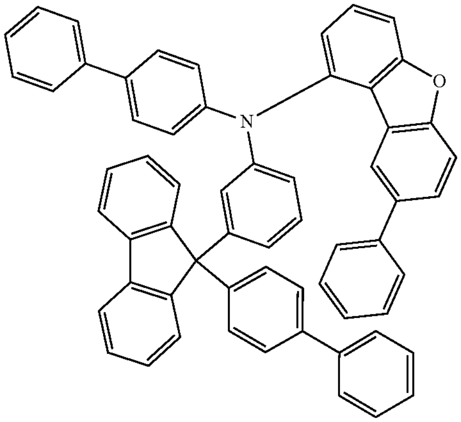
P3-3
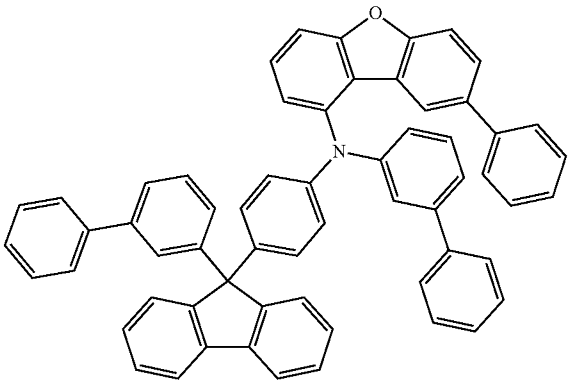

-continued
P3-4
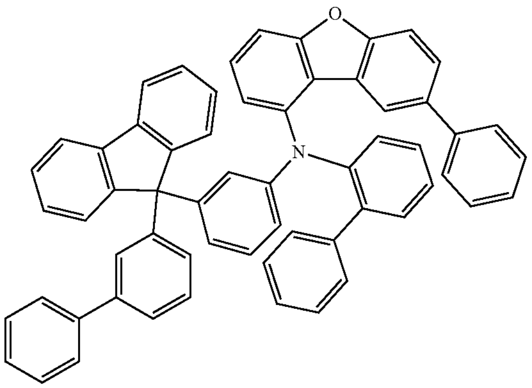
P3-5
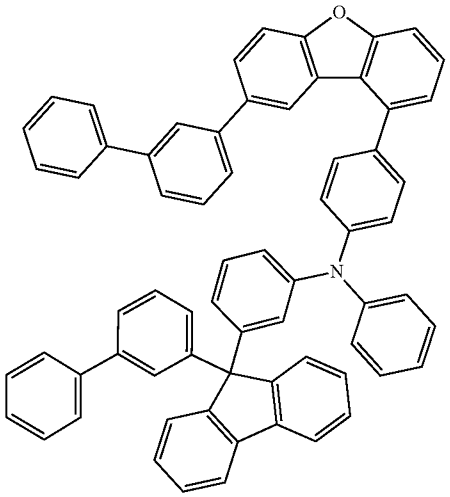
P3-6
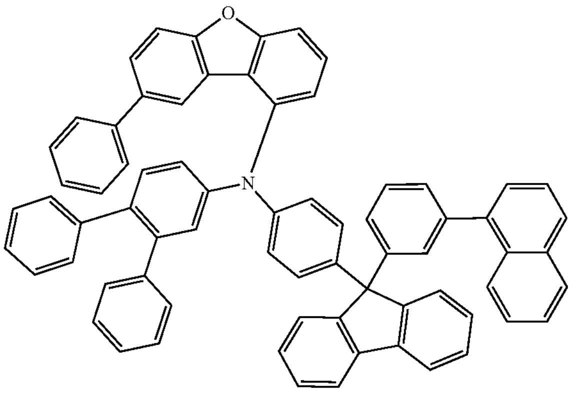
-continued
P3-7
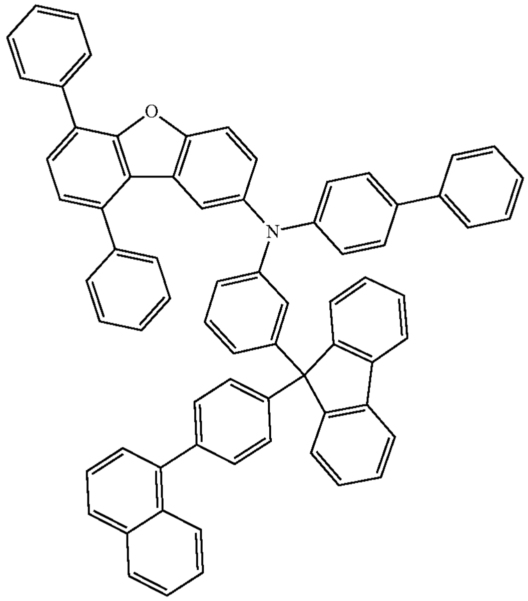
P3-8
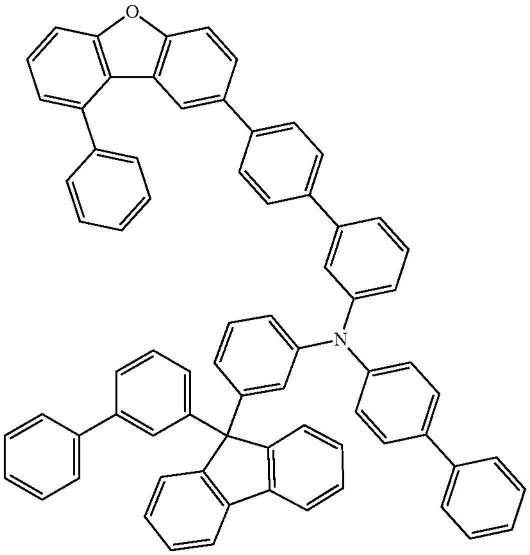

-continued
P3-9
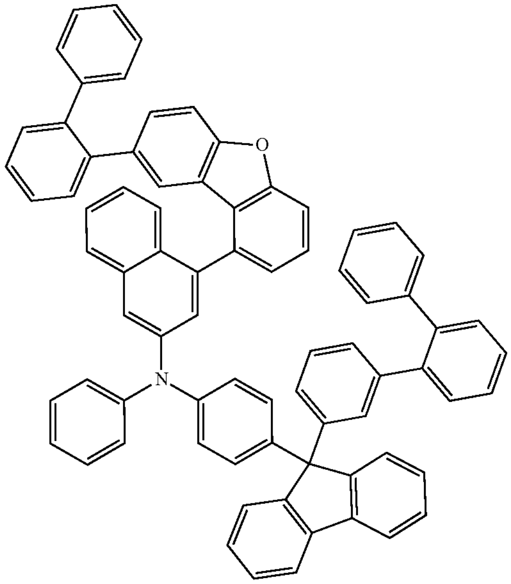
P3-10
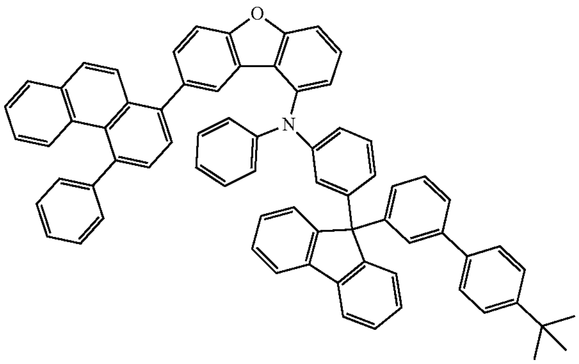
P3-11
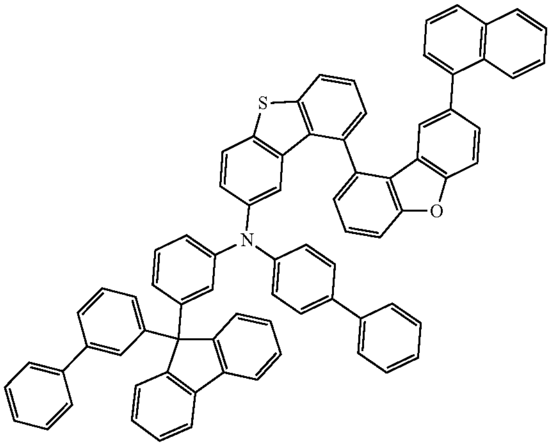
-continued
P3-12
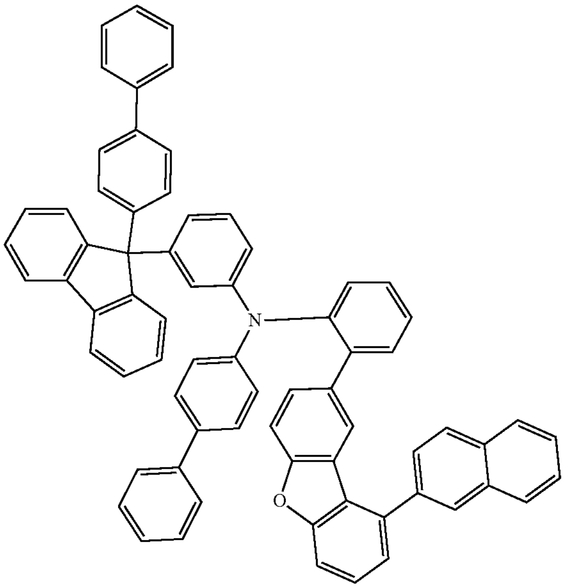
P3-13
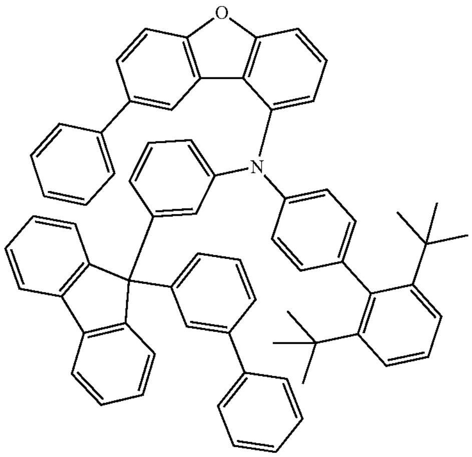
P3-14
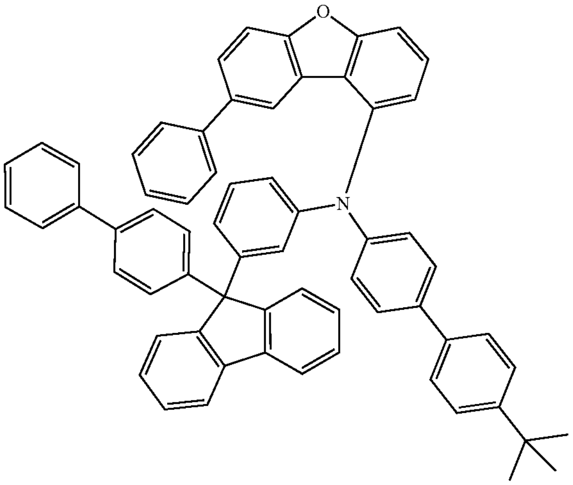

-continued
P3-15
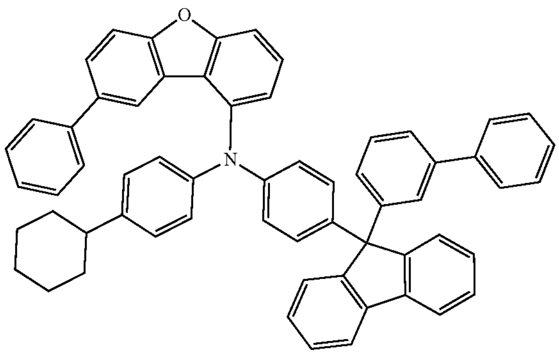
P3-16
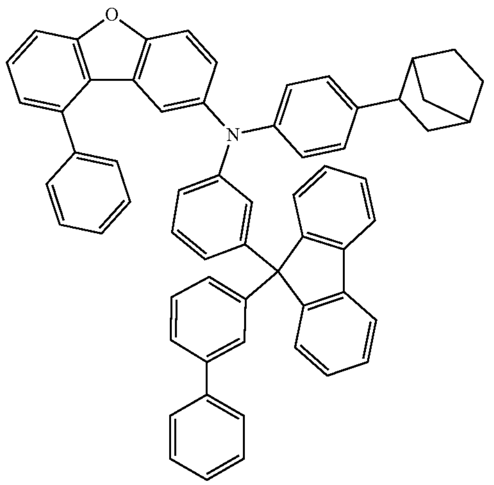
P3-17
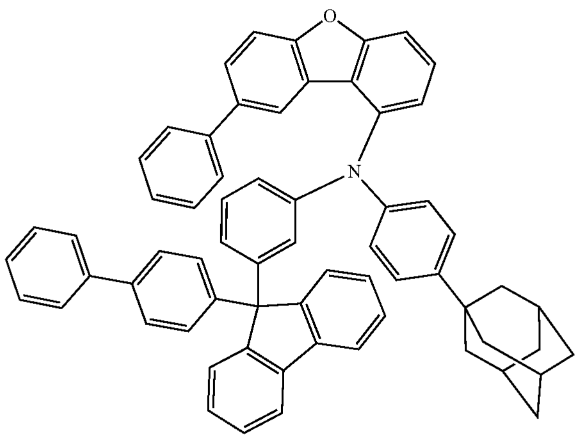
-continued
P3-18
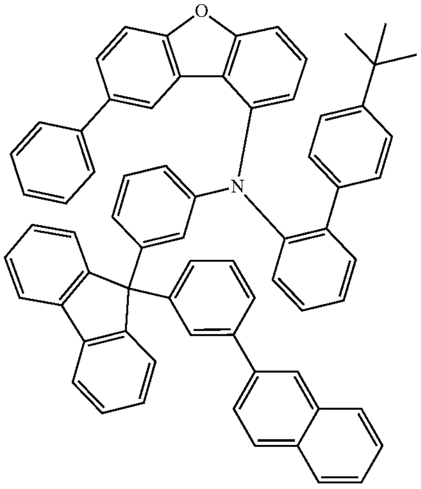
P3-19
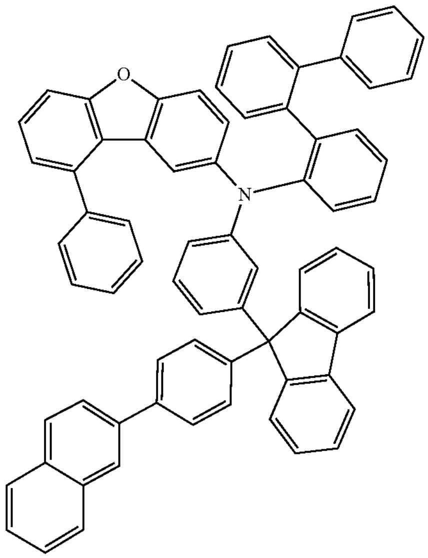
P3-20
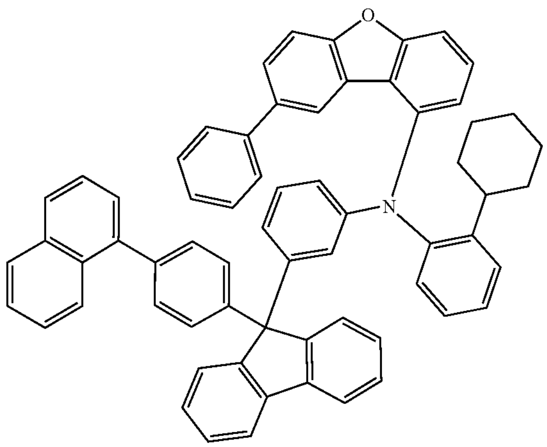

-continued
P3-21
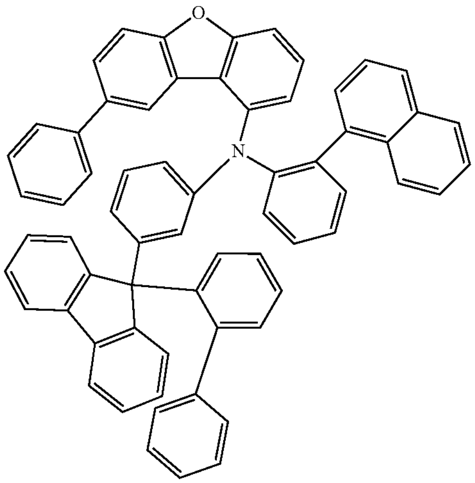
P3-22
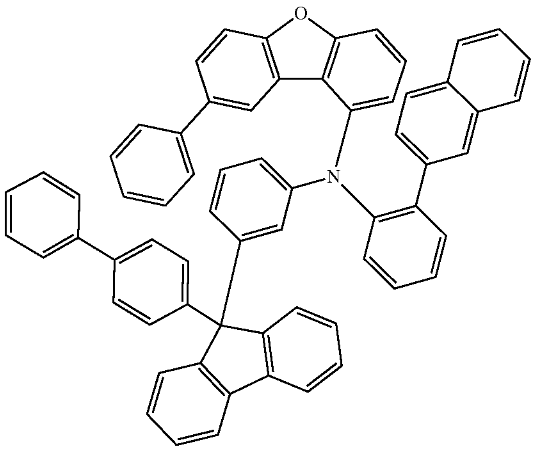
P3-23
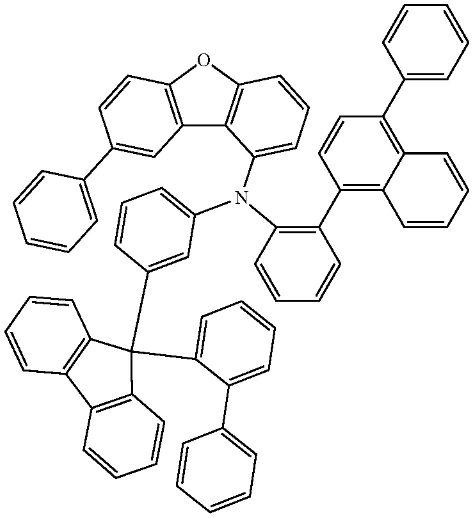
-continued
P3-24
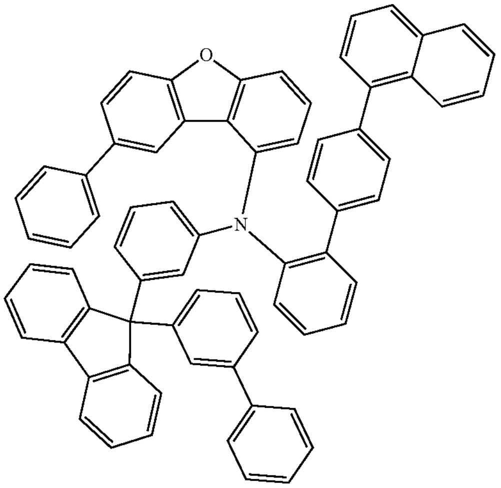
P3-25
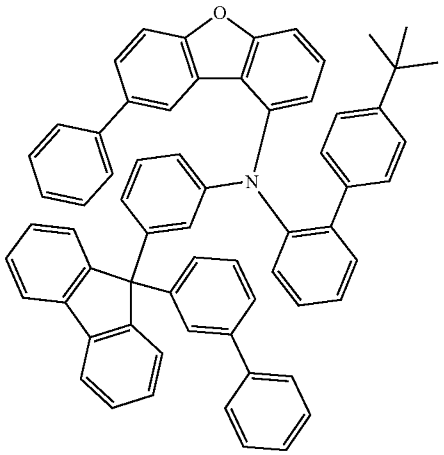
P3-26
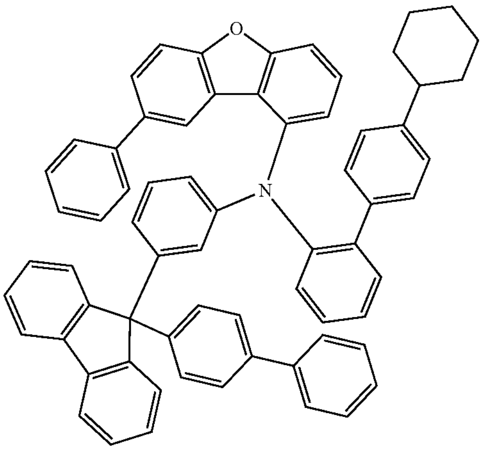

P3-27
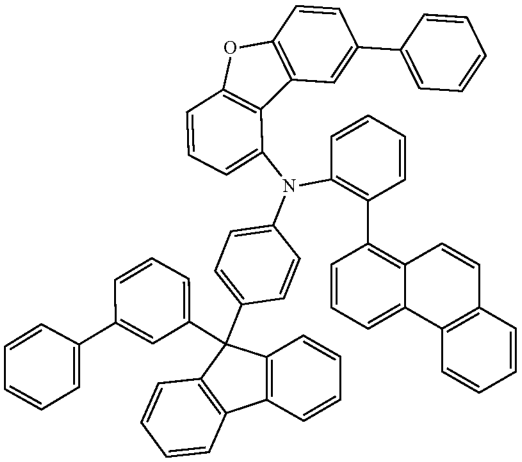
P3-28
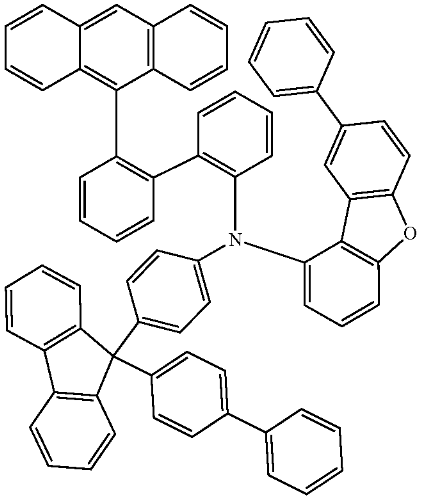
P3-29
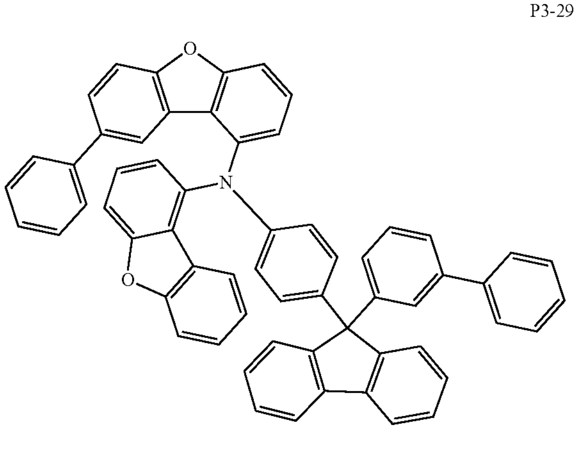
P3-30
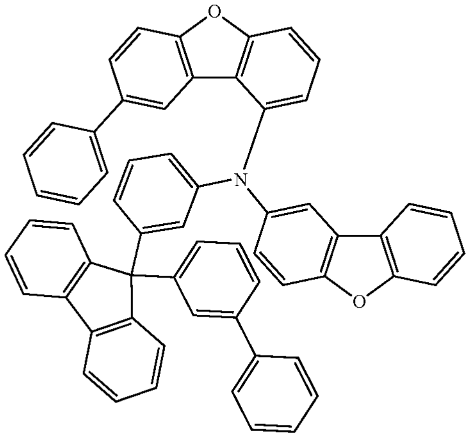
P3-31
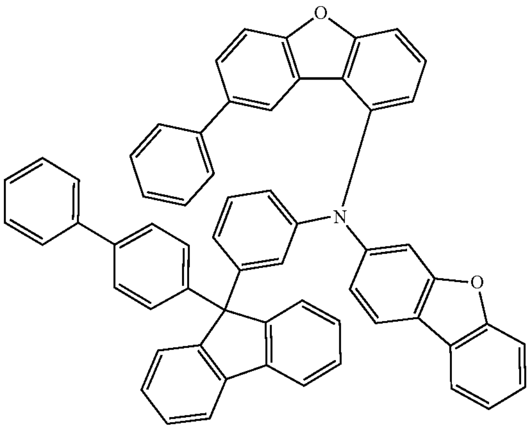
P3-32
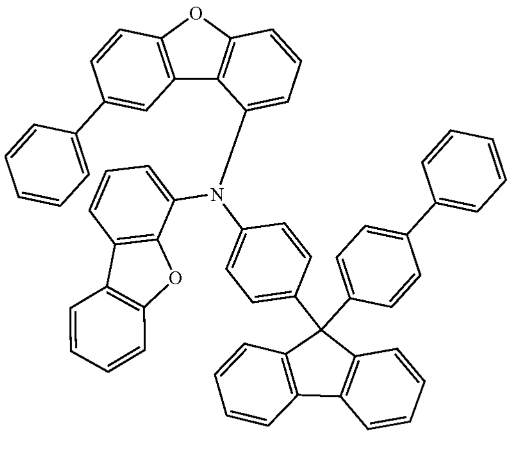

-continued
P3-33
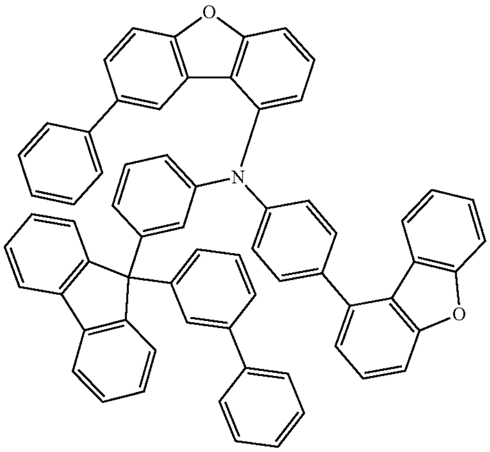
P3-34
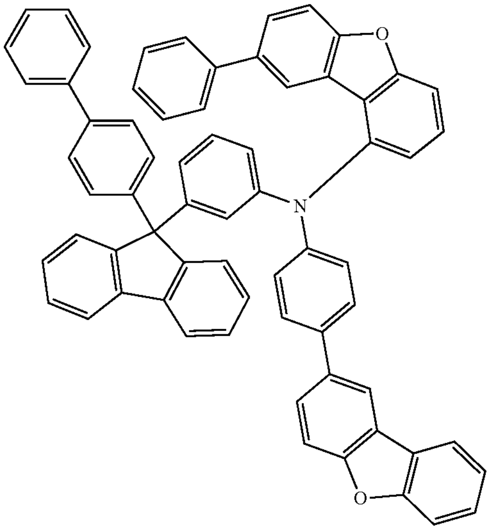
P3-35
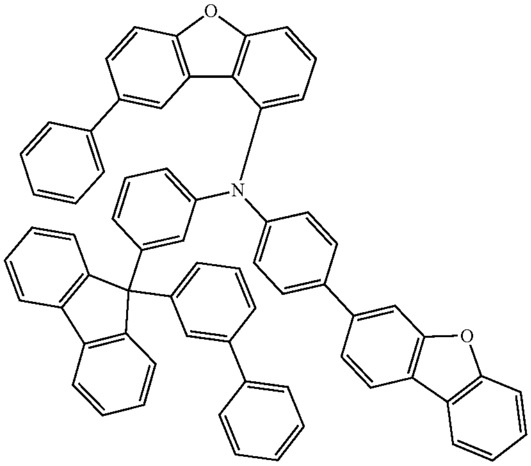
-continued
P3-36
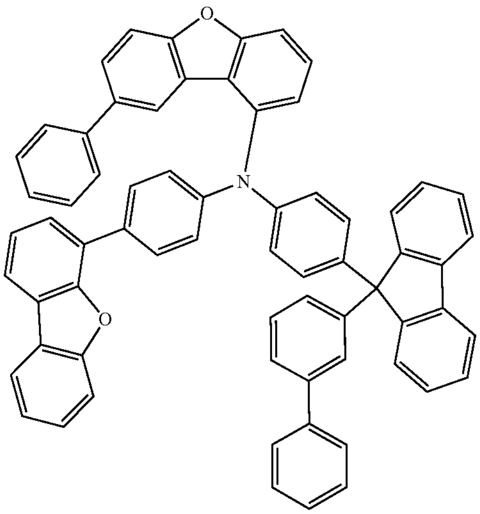
P3-37
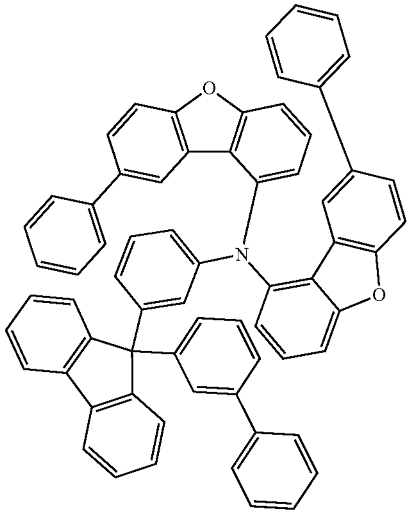
P3-38
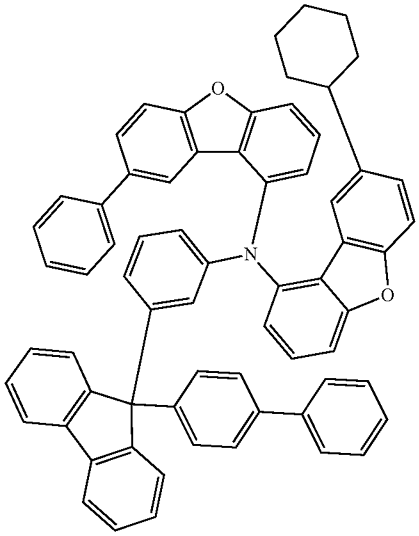

-continued
P3-39
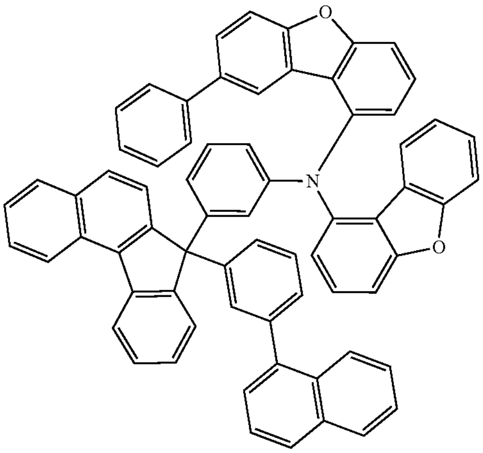
P3-40
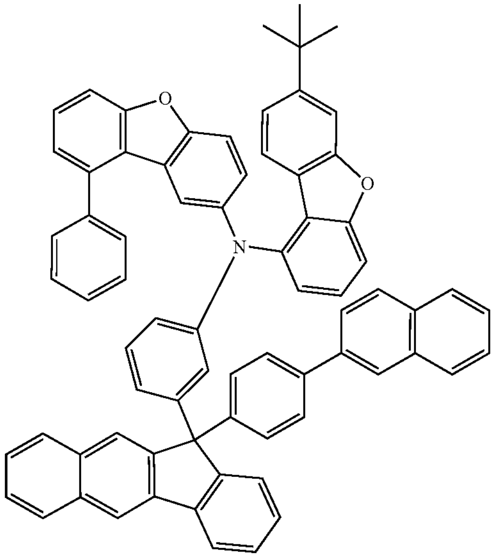
P3-41
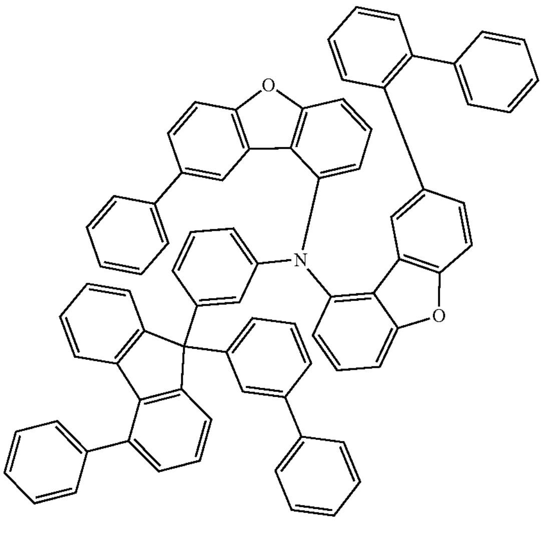
-continued
P3-42
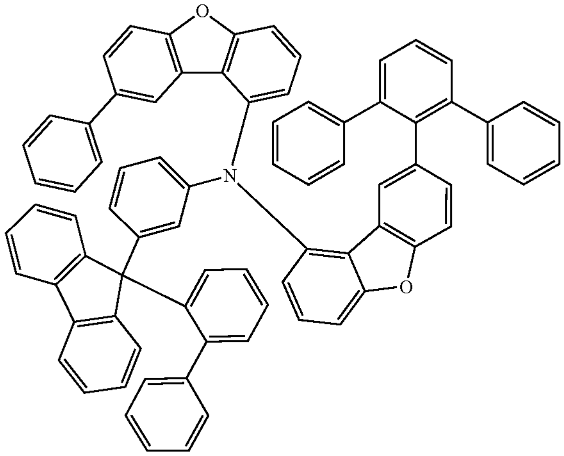
P3-43
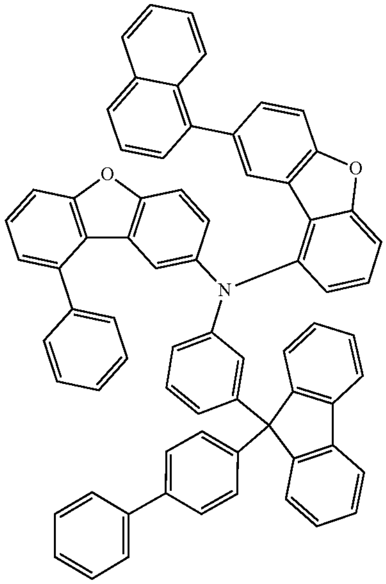
P3-44
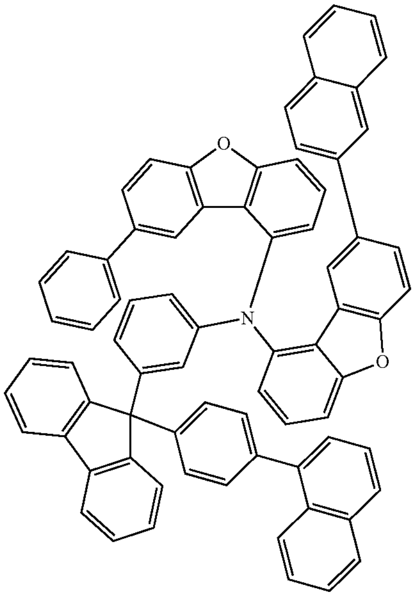

-continued
P3-45
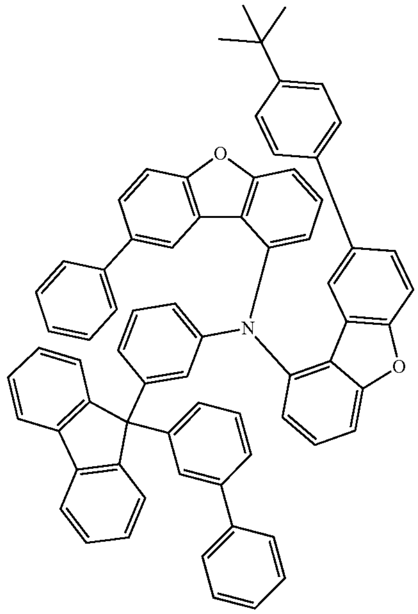
P3-46
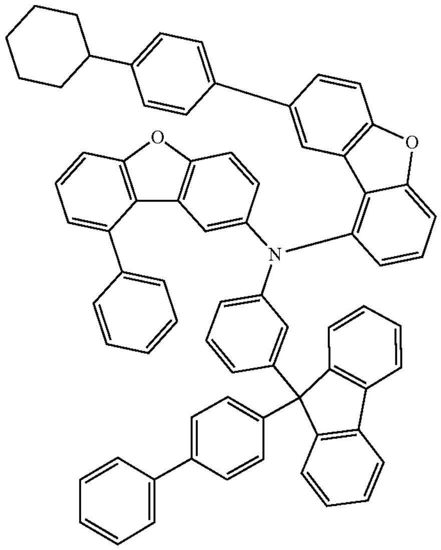
-continued
P3-47
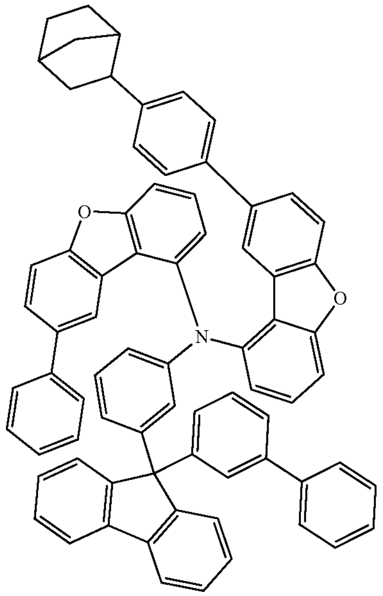
P3-48
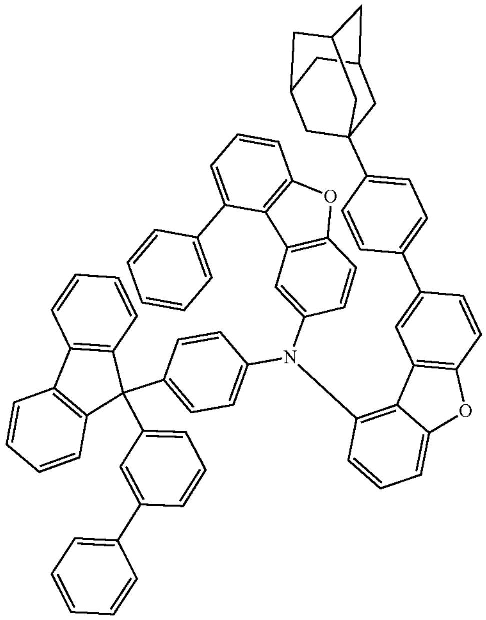
P3-49
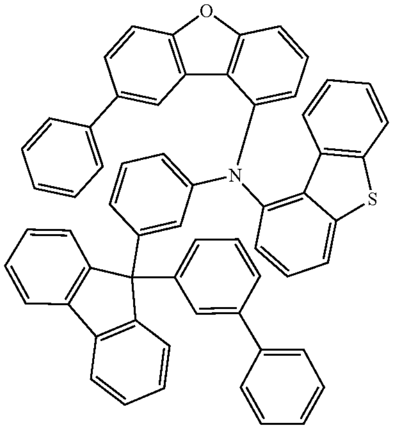

-continued
P3-50
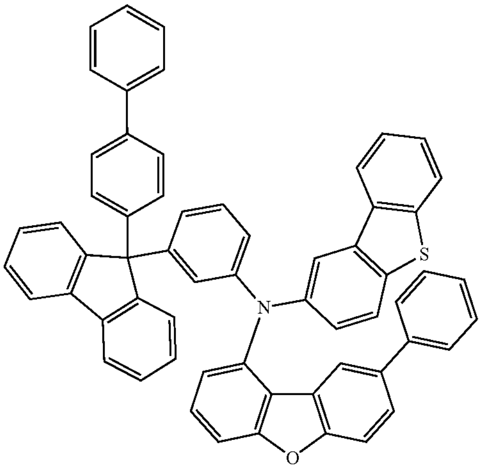
P3-51
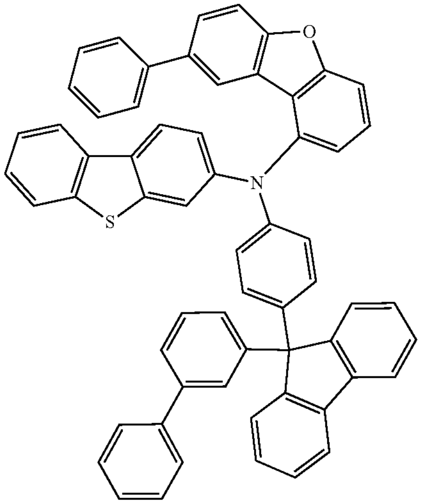
P3-52
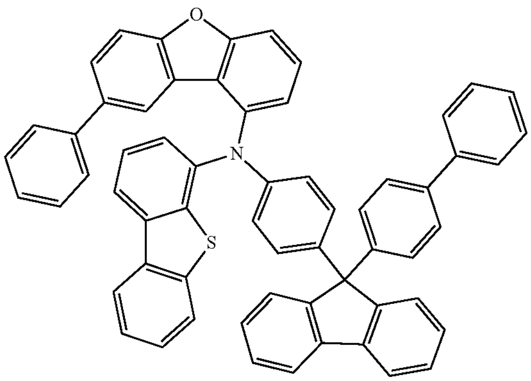
P3-53
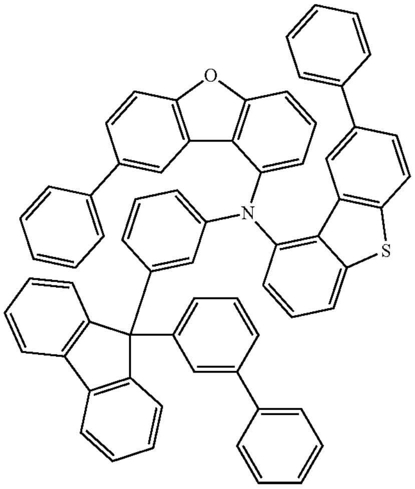
P3-54
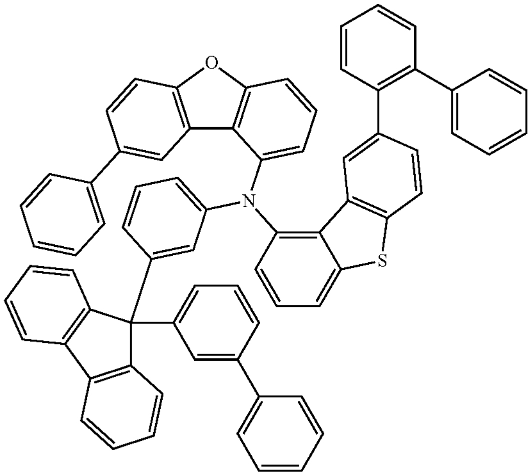
P3-55
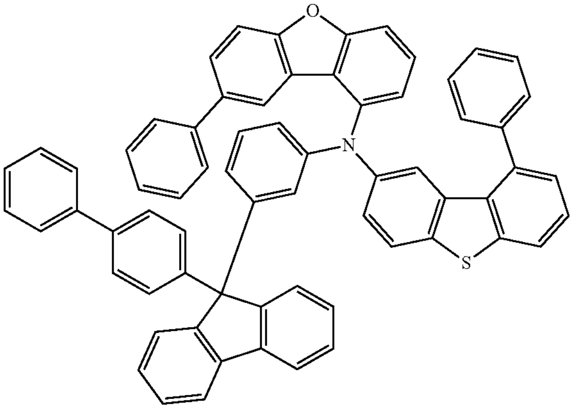

-continued
P3-56
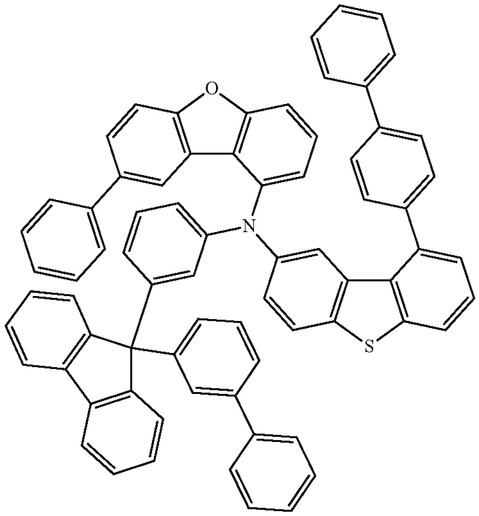
P3-57
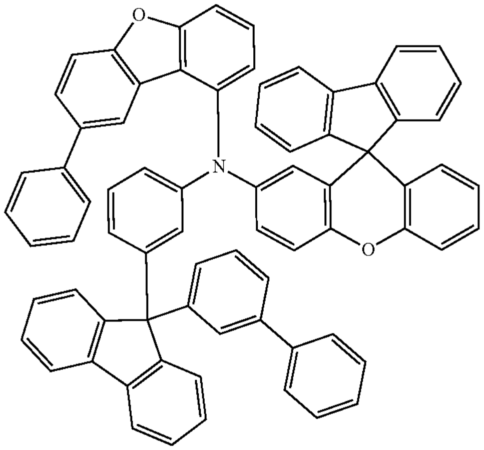
P3-58
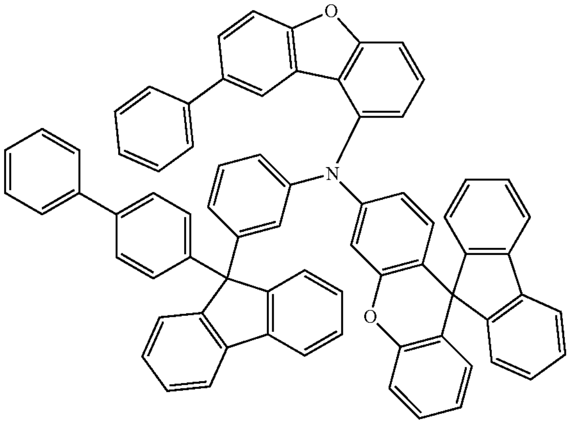
-continued
P3-59
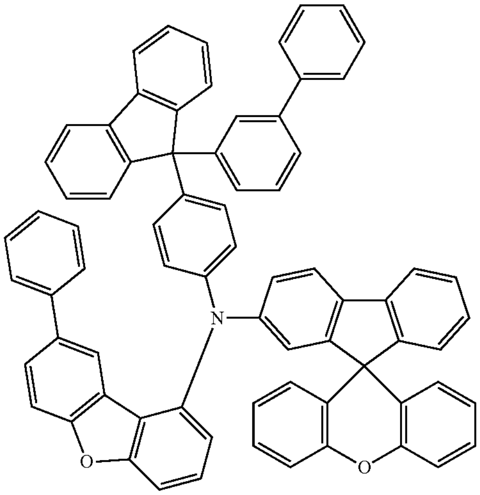
P3-60
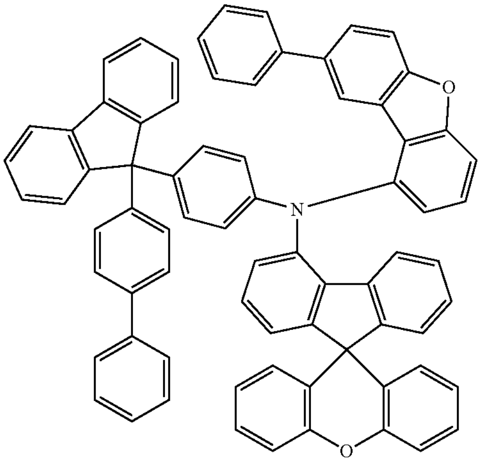
P3-61
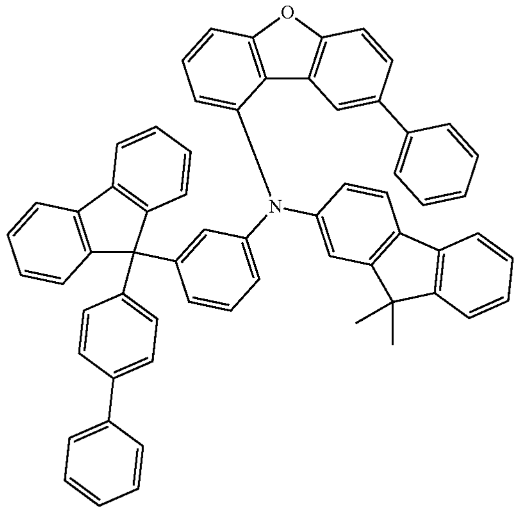

-continued
P3-62
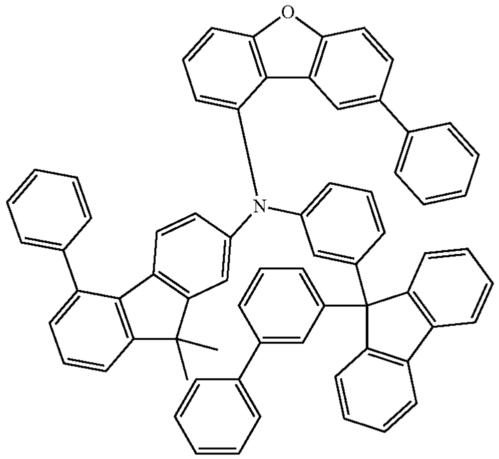
P3-63
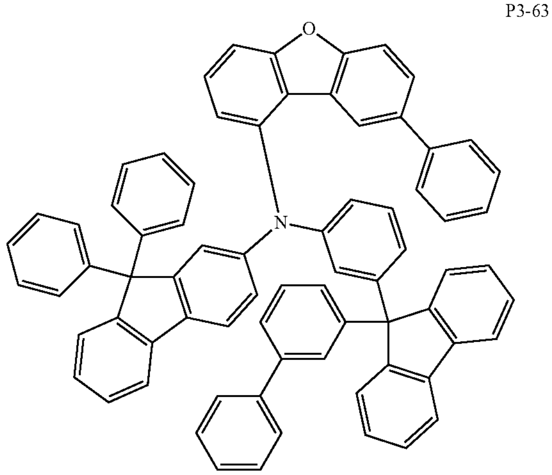
P3-64
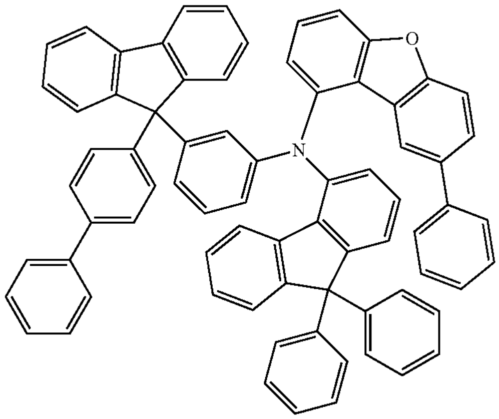
-continued
P3-65
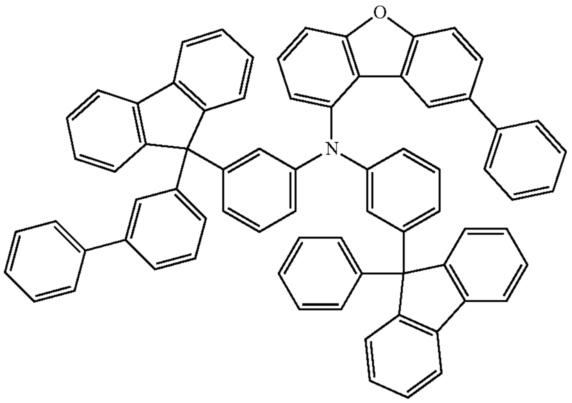
P3-66
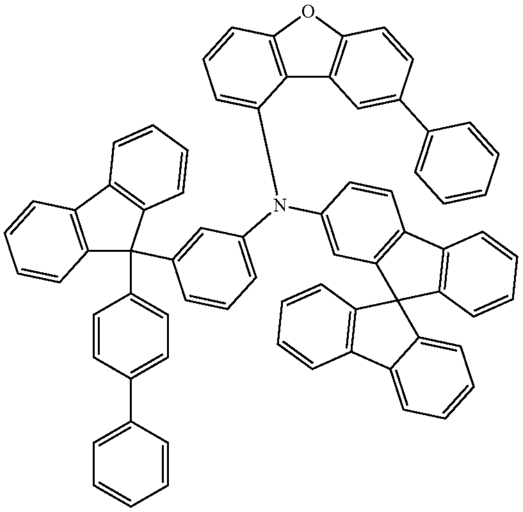
P3-67
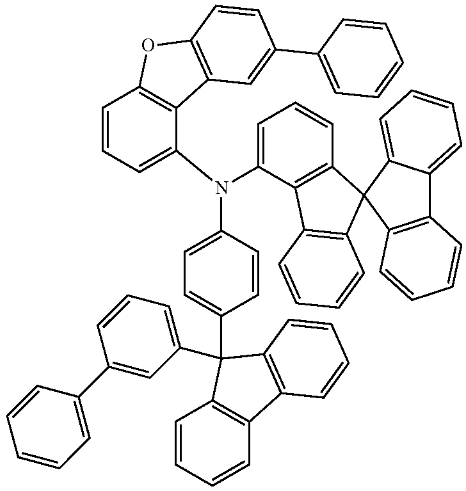

-continued
P3-68
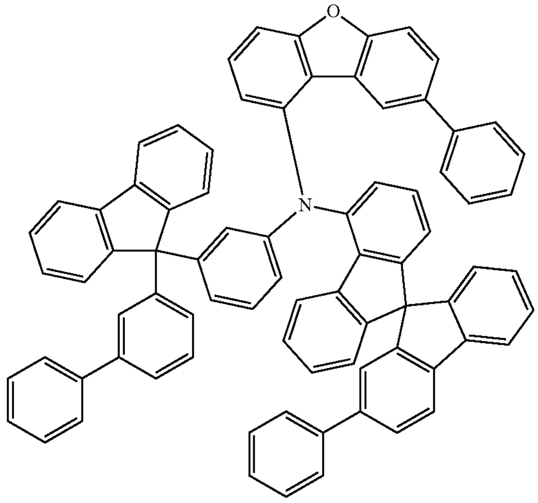
P3-69
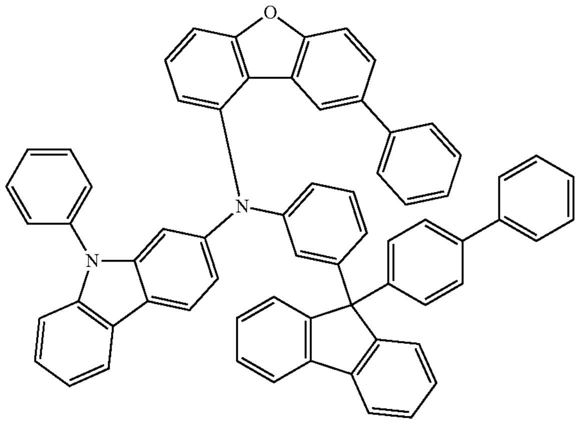
P3-70
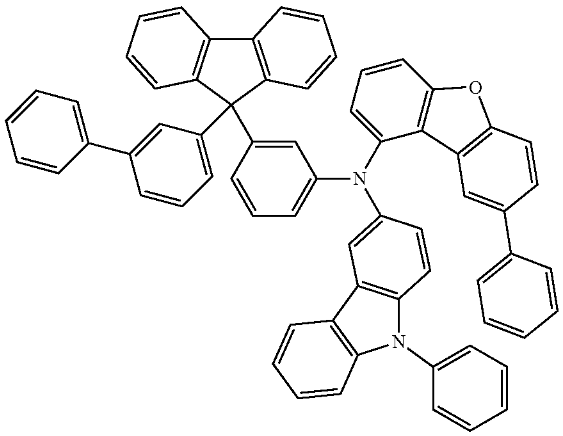
-continued
P3-71
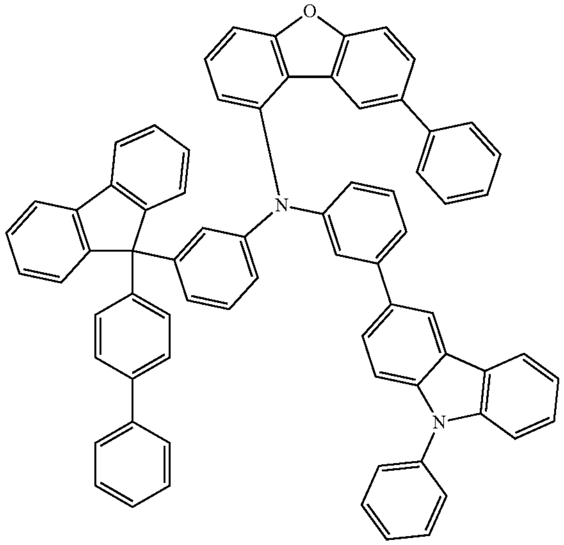
P3-72
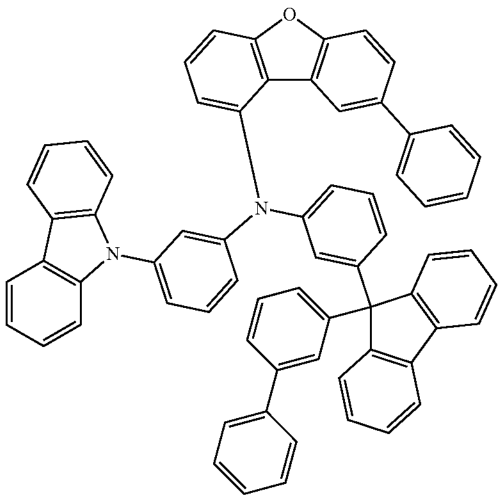
P3-72
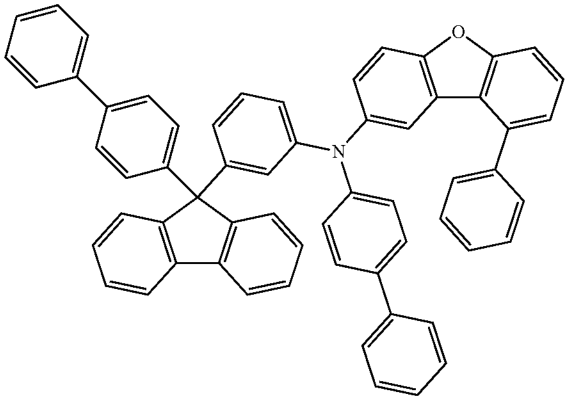

-continued
P3-74
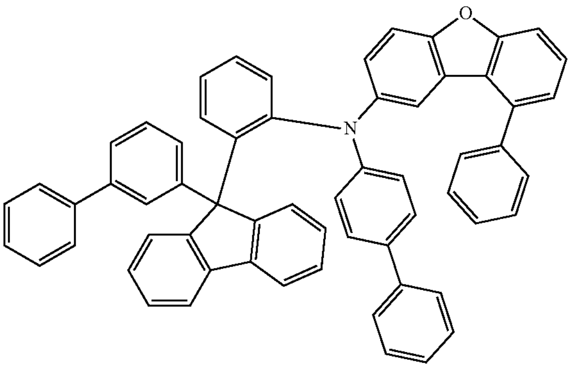
P3-75
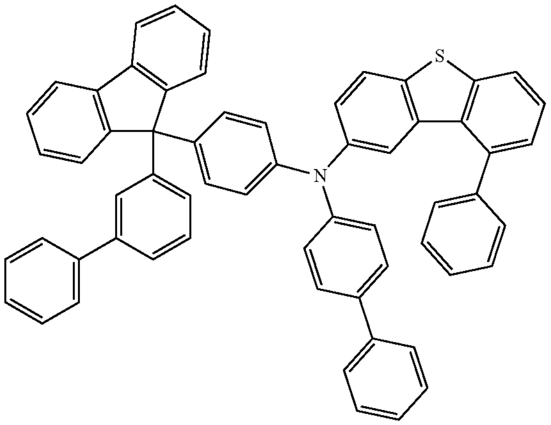
P3-76
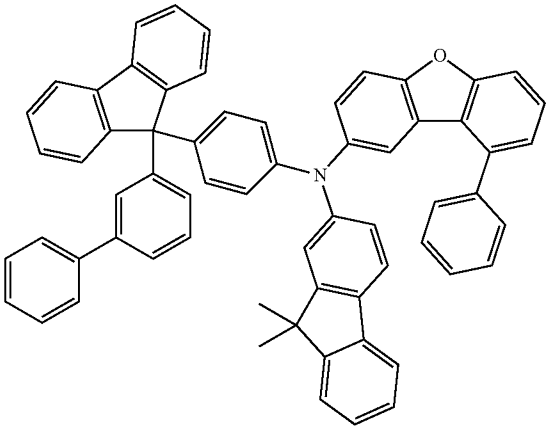
-continued
P3-77
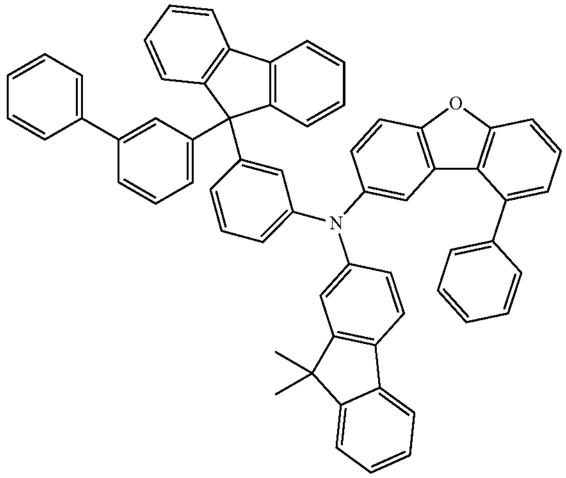
P3-78
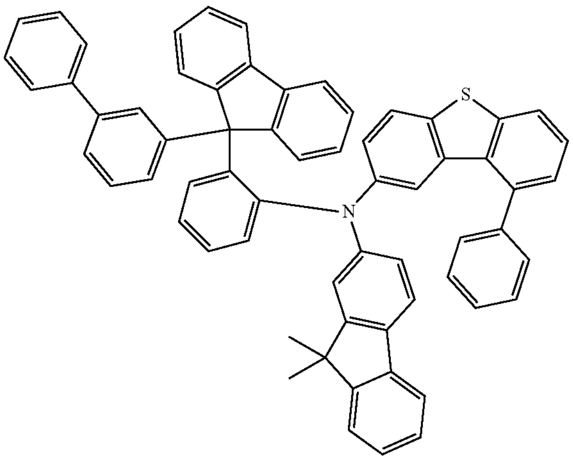
P3-79
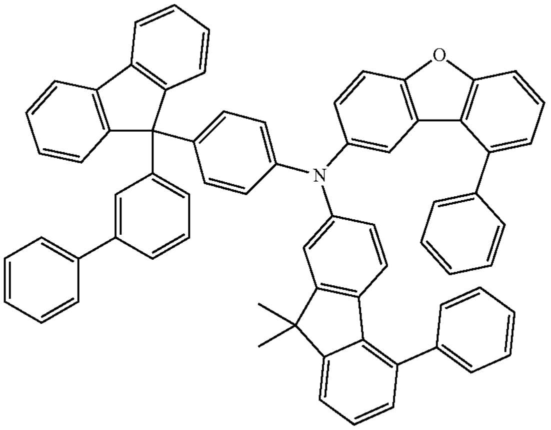

-continued
P3-80
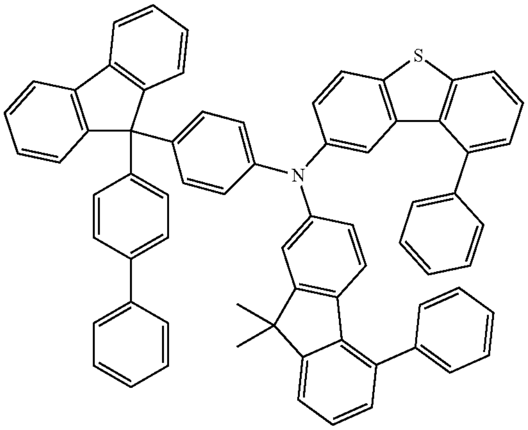
P3-81
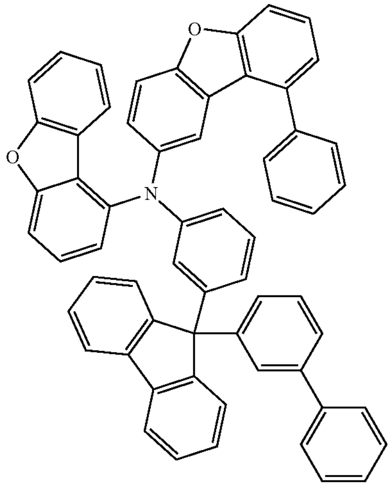
P3-82
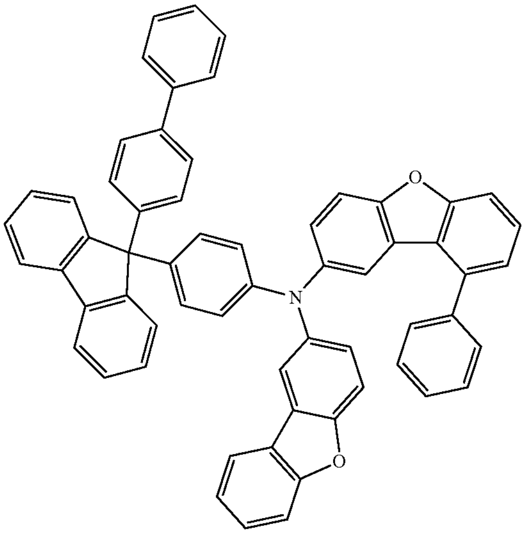
-continued
P3-83
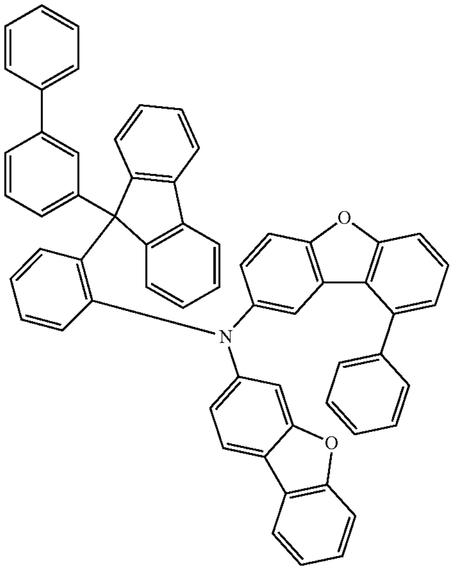
P3-84
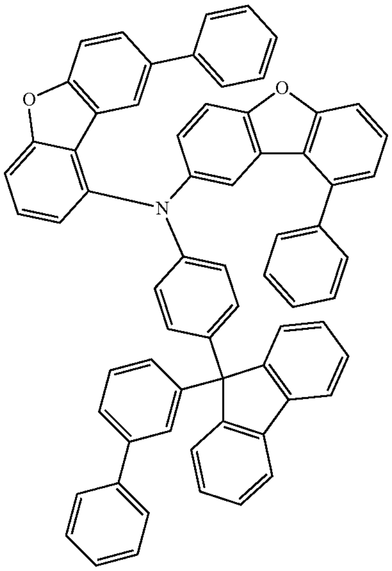
P3-85
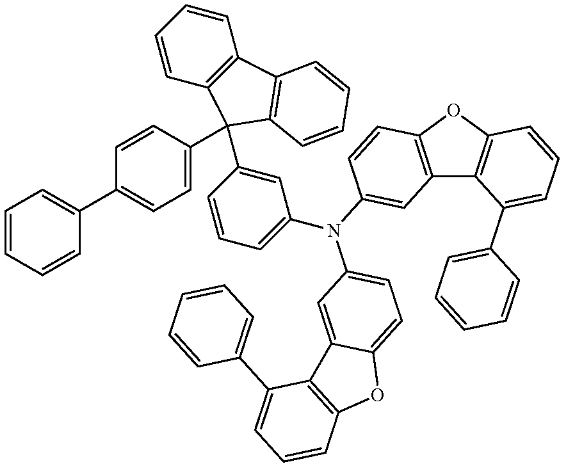

-continued
P3-86
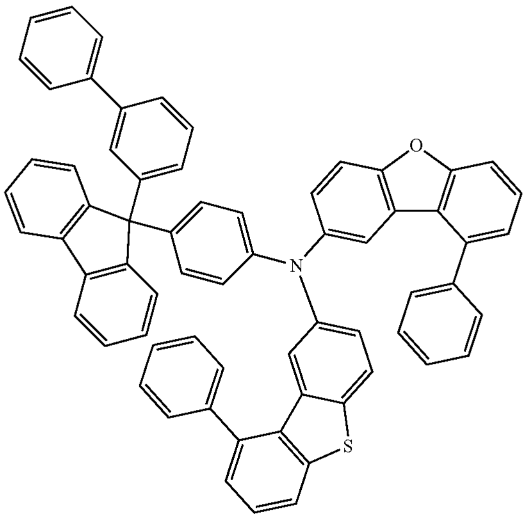
P3-87
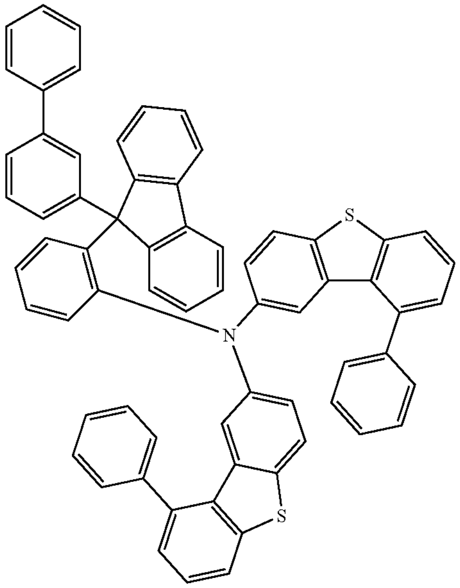
P3-88
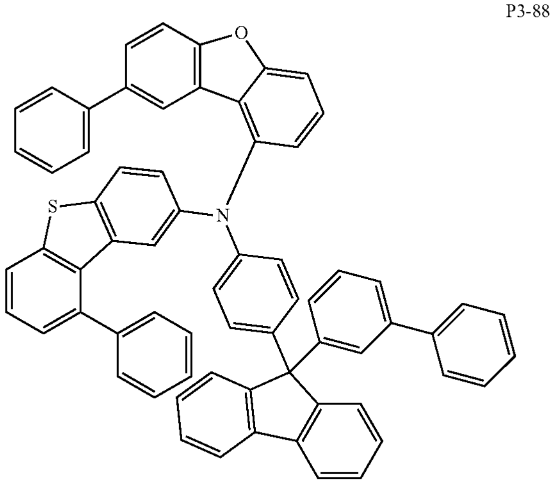
-continued
P3-89
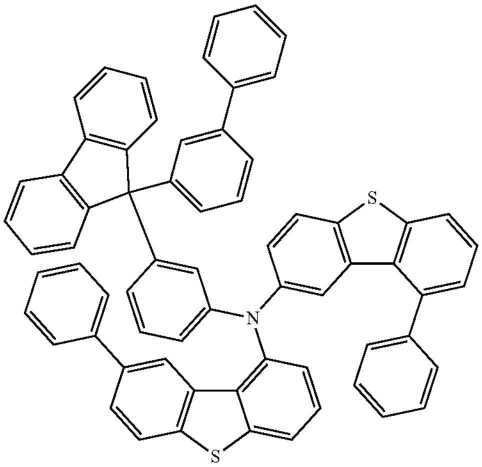
P3-90
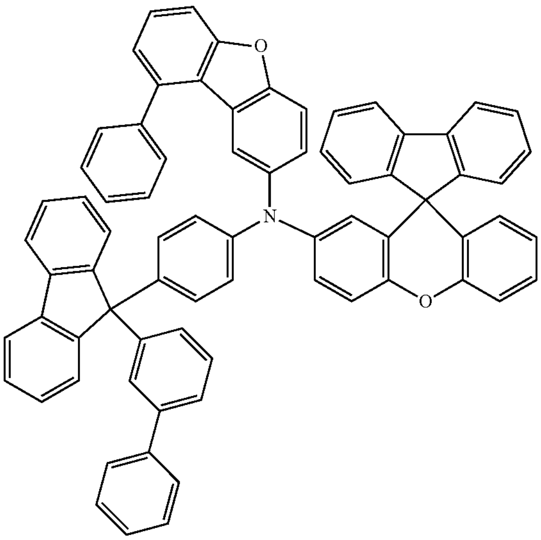
P3-91
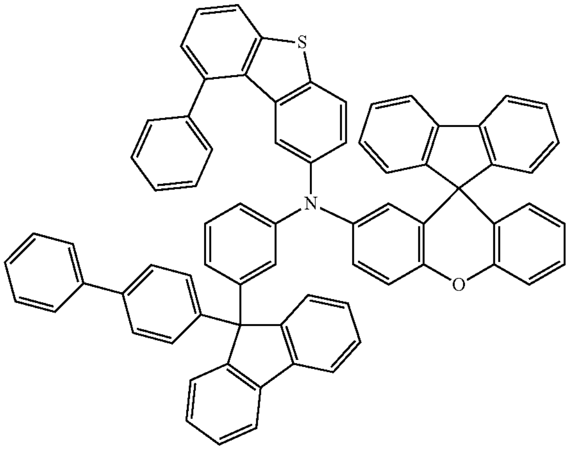

-continued
P3-92
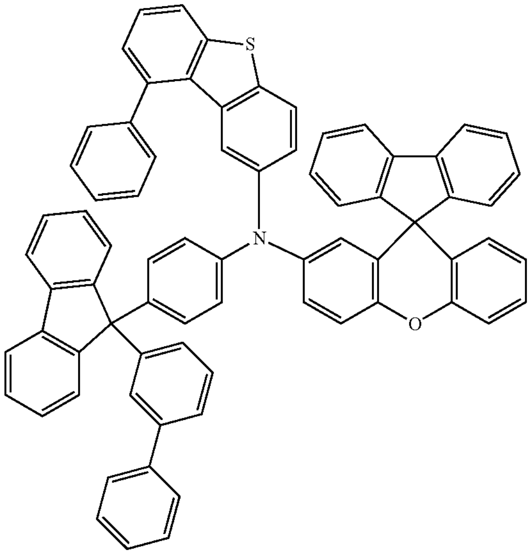
P3-93
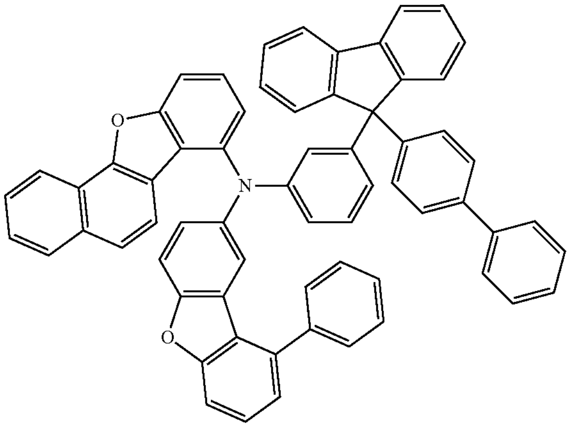
P-94
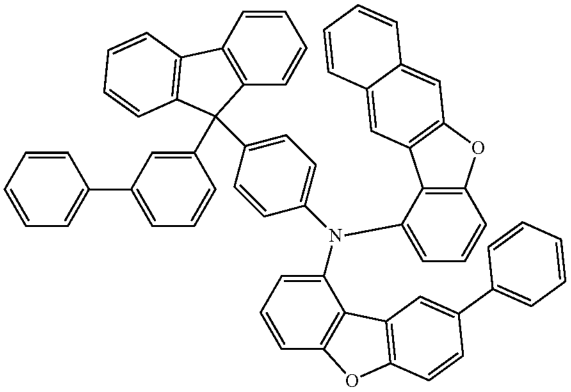
-continued
P3-95
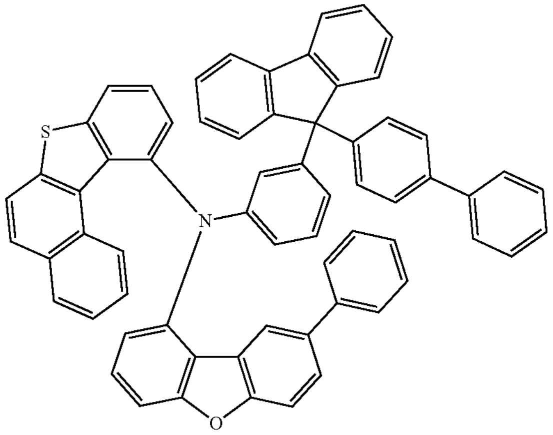
P3-96
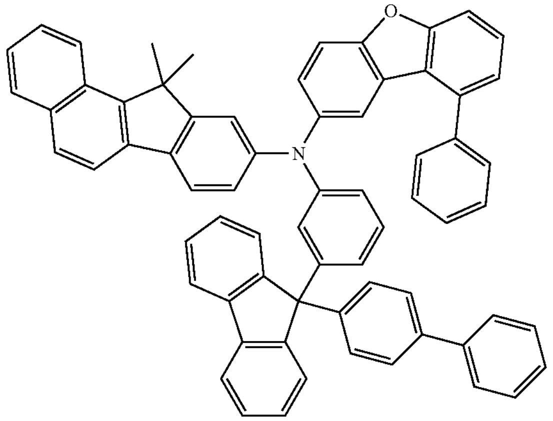
P3-97
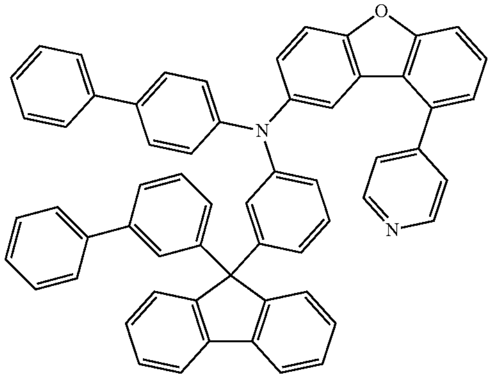

-continued
P3-98
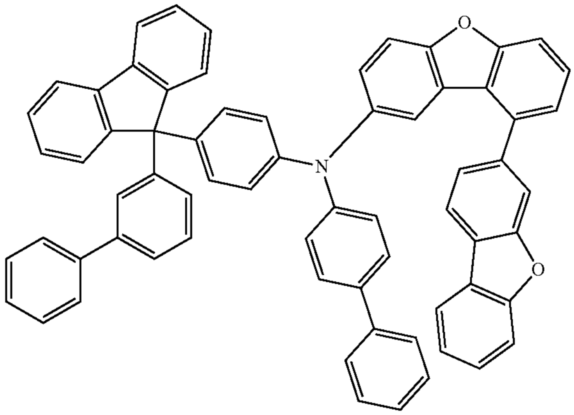
P3-99
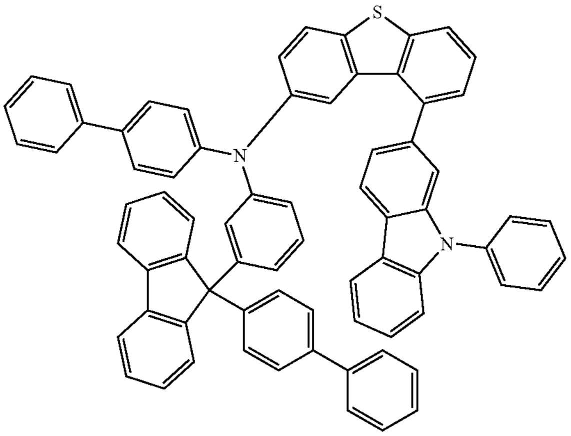
P3-100
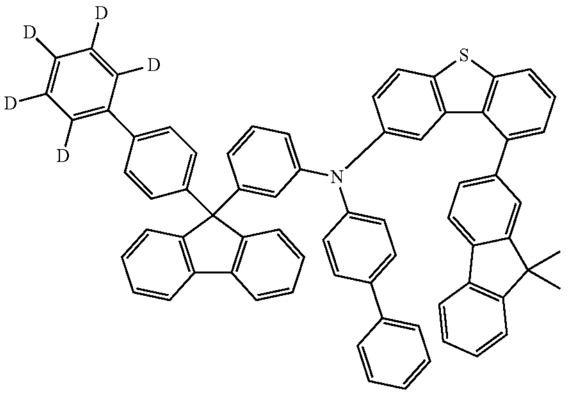
-continued
P3-101
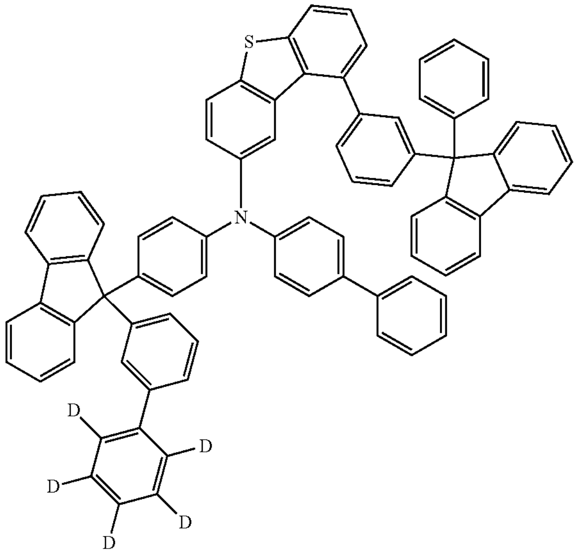
P3-102
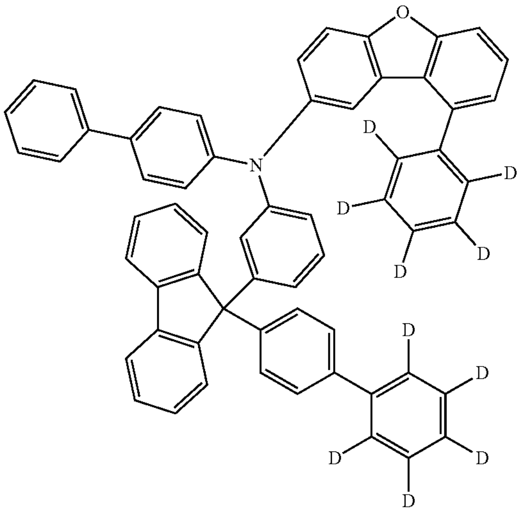

-continued
P3103
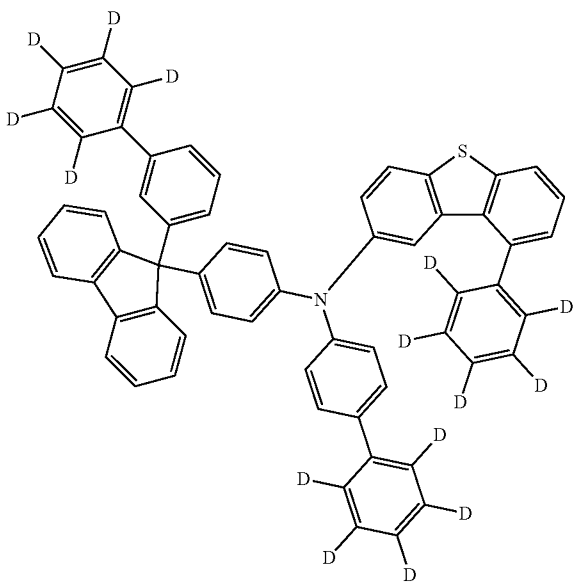
P3-104
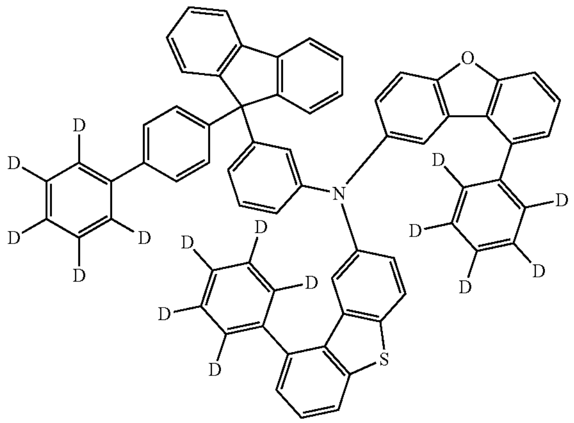
P3-1054
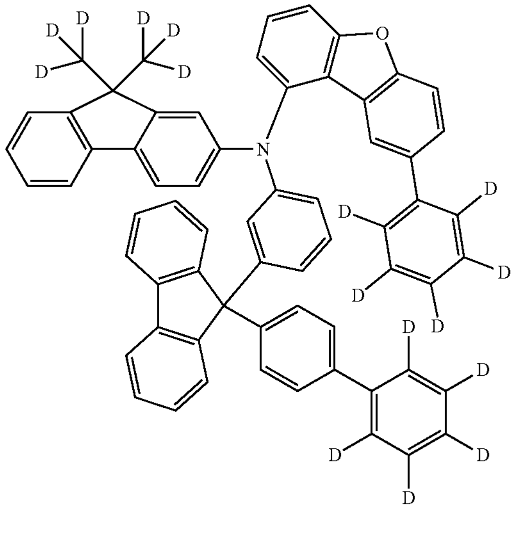
-continued
P3-106
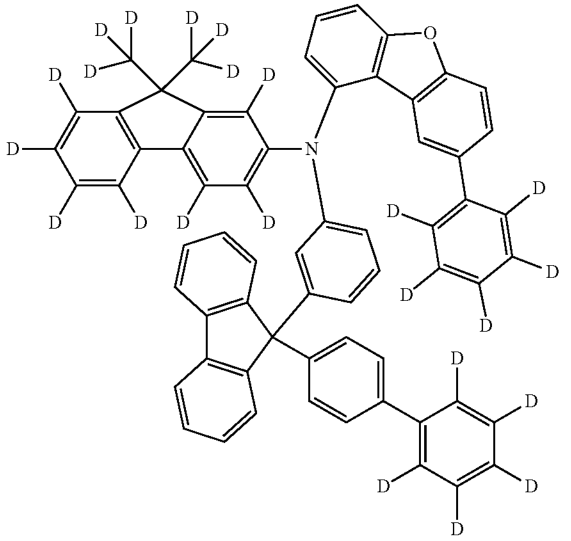
P3-107
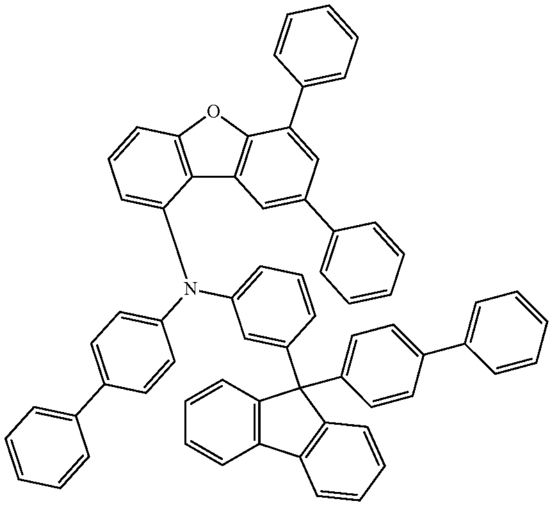
P3-108
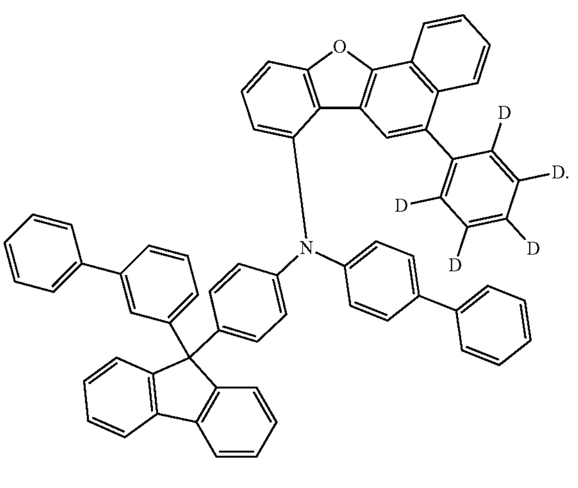

11. An organic electric element comprising a first electrode, a second electrode, and an organic material layer between the first electrode and the second electrode, wherein the organic material layer comprises the compound of Formula 1 of claim 1.

12. The organic electric element of claim 11, wherein the organic material layer further comprises a light-emitting layer between the first electrode and the second electrode, and a light-emitting auxiliary layer between the light-emitting layer and the first electrode, and the light-emitting auxiliary layer comprises the compound of Formula 1.

13. The organic electric element of claim 11, wherein the organic material layer comprises two or more stacks, and the two or more stacks each comprise a hole transport layer, a light-emitting layer and an electron transport layer formed sequentially on the first electrode.

14. The organic electric element of claim 13, wherein the organic material layer further comprises a charge generation layer between the two or more stacks.

15. The organic electric element of claim 11, wherein the organic electric element further comprises a layer for improving luminous efficiency, and the layer for improving luminous efficiency is formed on one side of both sides of the first electrode or the second, and the one side not facing the organic material layer.

16. An electronic device comprising a display device and a control unit for driving the display device, wherein the display device comprises the organic electric element of claim 11.

17. The electronic device of claim 16, wherein the organic electric element is selected from the group consisting of an organic electroluminescent element, an organic solar cell, an organic photo conductor, an organic transistor, an element for monochromatic illumination and a quantum dot display.

* * * * *